US012015248B2

(12) United States Patent
Adachi et al.

(10) Patent No.: US 12,015,248 B2
(45) Date of Patent: Jun. 18, 2024

(54) CONTINUOUS-WAVE ORGANIC THIN-FILM DISTRIBUTED FEEDBACK LASER AND ELECTRICALLY DRIVEN ORGANIC SEMICONDUCTOR LASER DIODE

(71) Applicants: KYUSHU UNIVERSITY, NATIONAL UNIVERSITY CORPORATION, Fukuoka (JP); KOALA TECH INC., Fukuoka (JP)

(72) Inventors: Chihaya Adachi, Fukuoka (JP); Sangarange Don Atula Sandanayaka, Fukuoka (JP); Toshinori Matsushima, Fukuoka (JP); Kou Yoshida, Fukuoka (JP); Jean-Charles Ribierre, Fukuoka (JP); Fatima Bencheikh, Fukuoka (JP); Kenichi Goushi, Fukuoka (JP); Takashi Fujihara, Fukuoka (JP)

(73) Assignees: KYUSHU UNIVERSITY, NATIONAL UNIVERSITY CORPORATION, Fukuoka (JP); KOALA TECH INC., Fukuoka (JP)

( * ) Notice: Subject to any disclaimer, the term of this patent is extended or adjusted under 35 U.S.C. 154(b) by 0 days.

(21) Appl. No.: 18/316,000

(22) Filed: May 11, 2023

(65) Prior Publication Data

US 2023/0283050 A1    Sep. 7, 2023

Related U.S. Application Data

(62) Division of application No. 17/674,668, filed on Feb. 17, 2022, now Pat. No. 11,909,177, which is a
(Continued)

(30) Foreign Application Priority Data

Sep. 2, 2016   (JP) ................................ 2016-171542
Oct. 5, 2016   (JP) ................................ 2016-197484
(Continued)

(51) Int. Cl.
*H01S 5/36*      (2006.01)
*H01S 3/13*      (2006.01)
(Continued)

(52) U.S. Cl.
CPC .............. *H01S 5/36* (2013.01); *H01S 3/1305* (2013.01); *H01S 5/04253* (2019.08); *H01S 5/1215* (2013.01); *H01S 5/1231* (2013.01)

(58) Field of Classification Search
None
See application file for complete search history.

(56) References Cited

U.S. PATENT DOCUMENTS 4,023,993 A * 5/1977 Scifres .................... H01S 5/187
                                                      438/494
5,881,089 A   3/1999 Berggren
(Continued)

FOREIGN PATENT DOCUMENTS

CN   101388523 A   3/2009
CN   201927885 U   8/2011
(Continued)

OTHER PUBLICATIONS

Office Action dated May 25, 2023 issued in the related EP patent application No. 18751087.0.
(Continued)

*Primary Examiner* — Tuan N Nguyen
(74) *Attorney, Agent, or Firm* — BROWDY AND NEIMARK, P.L.L.C.

(57) ABSTRACT

Disclosed are a current excitation type organic semiconductor laser containing a pair of electrodes, an organic laser
(Continued)

active layer and an optical resonator structure between the pair of electrodes and a laser having an organic layer on a distributed feedback grating structure. The lasers include a continuous-wave laser, a quasi-continuous-wave laser and an electrically driven semiconductor laser diode.

8 Claims, 62 Drawing Sheets

Related U.S. Application Data division of application No. 16/328,894, filed as application No. PCT/JP2017/033366 on Sep. 1, 2017, now Pat. No. 11,539,190.

(30) Foreign Application Priority Data

| Feb. 2, 2017 | (JP) | ................ | 2017-017936 |
| Feb. 7, 2017 | (JP) | ................ | 2017-020797 |
| Jul. 12, 2017 | (JP) | ................ | 2017-136063 |

(51) Int. Cl.
*H01S 5/042* (2006.01)
*H01S 5/12* (2021.01)

(56) References Cited

U.S. PATENT DOCUMENTS

| 6,111,906 | A | 8/2000 | Muroya |
| 6,259,717 | B1 | 7/2001 | Stone et al. |
| 6,704,335 | B1* | 3/2004 | Koyama ............. H10K 50/182 |
| | | | 313/503 |
| 6,807,211 | B1 | 10/2004 | Cok et al. |
| 7,348,516 | B2 | 3/2008 | Sun et al. |
| 7,965,037 | B2 | 6/2011 | Yokoyama et al. |
| 2003/0209972 | A1 | 11/2003 | Holmes |
| 2003/0235229 | A1 | 12/2003 | Deng et al. |
| 2004/0101008 | A1 | 5/2004 | Kurtz |
| 2004/0247008 | A1 | 12/2004 | Scheuer et al. |
| 2005/0047458 | A1 | 3/2005 | Nomura et al. |
| 2005/0195472 | A1 | 9/2005 | Tang et al. |
| 2006/0013343 | A1 | 1/2006 | El-Gamal et al. |
| 2006/0133437 | A1 | 6/2006 | Forrest |
| 2007/0104242 | A1 | 5/2007 | Kudo et al. |
| 2008/0006820 | A1 | 1/2008 | Schols et al. |
| 2008/0187017 | A1 | 8/2008 | Linder |
| 2009/0058274 | A1 | 3/2009 | Yokoyama et al. |
| 2009/0135874 | A1 | 5/2009 | Liu |
| 2009/0323747 | A1 | 12/2009 | Nakanotani et al. |
| 2010/0054291 | A1 | 3/2010 | Yukawa |
| 2011/0226317 | A1 | 9/2011 | Xu et al. |
| 2011/0229073 | A1 | 9/2011 | Sirringhaus et al. |
| 2013/0003066 | A1 | 1/2013 | Han et al. |
| 2013/0153861 | A1 | 6/2013 | Kaminska et al. |
| 2014/0126602 | A1 | 5/2014 | Shapira et al. |
| 2014/0321485 | A1 | 10/2014 | Seidel et al. |
| 2015/0212266 | A1 | 7/2015 | Czornomaz et al. |
| 2015/0280142 | A1 | 10/2015 | Arai et al. |
| 2015/0311664 | A1 | 10/2015 | Bulovic et al. |
| 2016/0130138 | A1 | 5/2016 | Bulovic et al. |
| 2016/0141838 | A1 | 5/2016 | Gillin et al. |
| 2017/0069863 | A1 | 3/2017 | Kato |

FOREIGN PATENT DOCUMENTS

| CN | 102916340 A | 2/2013 |
| CN | 104659651 A | 5/2015 |
| CN | 104684917 A | 6/2015 |
| EP | 0706243 A | 4/1996 |
| EP | 0878883 A1 | 11/1998 |
| JP | 4-100287 A | 4/1992 |
| JP | 10-256653 A | 9/1998 |
| JP | 10-321941 | 12/1998 |
| JP | 11-195838 A | 7/1999 |
| JP | 2002-217489 A | 8/2002 |
| JP | 2002-329913 A | 11/2002 |
| JP | 2004-186599 A | 7/2004 |
| JP | 2004-214276 A | 7/2004 |
| JP | 2005-039236 A | 2/2005 |
| JP | 2005-041178 A1 | 2/2005 |
| JP | 2005-85942 A | 3/2005 |
| JP | 2007-329142 A | 12/2007 |
| JP | 2008-524870 A | 7/2008 |
| JP | 2008-251683 A | 10/2008 |
| JP | 2009-48837 A | 3/2009 |
| JP | 2010-80948 A | 4/2010 |
| JP | 2010-529669 A | 8/2010 |
| JP | 2013-518429 A | 5/2013 |
| JP | 2015-149403 A | 8/2015 |
| TW | 200509484 A | 3/2005 |
| TW | 200509487 A | 3/2005 |
| TW | 201315562 A | 4/2013 |
| TW | 201328091 A | 7/2013 |
| WO | 2005/053124 A1 | 6/2005 |
| WO | 2006/068883 A1 | 6/2006 |
| WO | 2006/136346 A1 | 12/2006 |
| WO | 2007/029718 A1 | 3/2007 |
| WO | 2008/149276 A1 | 12/2008 |
| WO | 2011/093883 A1 | 8/2011 |
| WO | 2012/115218 A1 | 8/2012 |

OTHER PUBLICATIONS

International Preliminary Report on Patentability of Chapter I, i.e., International Search Opinion issued in PCT/JP2017/033366, dated Mar. 5, 2019.
International Search Report and Search Opinion issued in PCT/JP2017/033366, dated Nov. 8, 2017.
International Search Report and Search Opinion issued in PCT/JP2018/005362, dated Apr. 10, 2018.
Vasdekis et al., Low threshold edge emitting polymer distributed feedback laser based on a square latticeAppl. Phys. Lett. 2005, 86, 161102.
Riechel et al., A nearly diffraction limited surface emitting conjugated polymer laser utilizing a twodimensional photonic band structure, Appl. Phys. Lett. 2000, 77, 2310.
Kamutsch et al., Improved organic semiconductor lasers based on a mixed-order distributed feedback resonator design, Appl. Phys. Lett. 90 131104 (2007).
Sandanayaka et al., Quasi-Continuous-Wave Organic Thin-Film Distributed Feedback Laser, Adv. Opt. Mater., vol. 4, No. 6, pp. 834-839, Jun. 2016.
Martins et al., Low-Threshold Nanoimprinted Lasers Using Substructured Gratings for Control of Distributed Feedback, Adv. Opt. Mater., vol. 1, No. 8, pp. 563-566, 2013.
Tsiminis et al., Nanoimprinted Organic Semiconductor Laser Pumped by a Light-Emitting Diode, Adv. Mater., vol. 25, No. 20, pp. 2826-2830, 2013.
Office Action dated May 12, 2020 issued in the related U.S. Appl. No. 16/338,123.
Office Action dated May 8, 2020 issued in the related Chinese patent application No. 201880003730.3 with its English Machine Translation.
Office Action dated Dec. 21, 2020 issued in the related U.S. Appl. No. 16/338,123.
Extended European Search Report dated Dec. 16, 2020 issued in the related European patent application No. 18751087.0.
Office Action dated Jan. 12, 2021 issued in the related Korean patent application No. 10-2017-0027963 with its English Machine Translation.
Chinese Office action dated Jan. 12, 2021 from corresponding Chinese application No. 201880003730.3.
Office Action dated Apr. 30, 2021 issued in the related U.S. Appl. No. 16/338,123.
Office Action dated Jul. 13, 2021 issued in the corresponding Japanese patent application No. 2019-512009 with its English Machine Translation.

(56) References Cited

OTHER PUBLICATIONS

Chinese office action dated Aug. 17, 2021, for corresponding Chinese application No. 201880003730.3.
Japanese office action dated Aug. 31, 2021, for corresponding Japanese application No. 2019-515680.
Taiwanese office action dated Aug. 16, 2021, for corresponding Taiwan application No. 1061300060.
Korean office action dated Sep. 13, 2021, for corresponding Korean application No. 10-2017-0027963.
Office Action dated Dec. 20, 2021 issued in the in the related Korean Patent Application No. 10-2019-7009287 with its English Machine Translation.
Office Action dated Nov. 13, 2023 issued in the related Taiwanese patent application 112108548 with its English Machine Translation.
Office Action dated Sep. 7, 2022 issued in the related Taiwanese patent application No. 107104331 with its English Translation.
Office Action dated Jan. 29, 2022 issued in the related Chinese patent application No. 201880003730.3 with its English Machine Translation.
Mohammad Reza Shayesteh et al., "Design and simulation of a high contrast grating organic VCSEL under electrical pumping", Organic Electronics 35 (2016) 47-52.
Daniel Schneider et al., "Laser threshold analysis of first and second order organic solidstate distributed feedback laser", Organic Light-emitting Materials and Devices VII, Proceedings of SPIE vol. 5214 (2004).
Office Action dated Feb. 22, 2022 issued in the related Japanese patent application No. 2019-515680 with its English Machine Translation.
Office Action dated Jun. 29, 2023, Issued in the corresponding Taiwanese patent application No. 112103527 with its English Translation.
Office Action dated Feb. 7, 2023 issued in the corresponding Japanese patent application No. 2022-065891 with its English Machine Translation.
Ichikawa et al., "Recent Progresses and Problems in Research Development on Organic Semiconductor Lasers", Laser Research, 2004, vol. 32, No. 9, p. 570-575.
Office Action dated May 5, 2022 issued in in the related Taiwanese patent application No. 107104331 with its English Translation.

\* cited by examiner

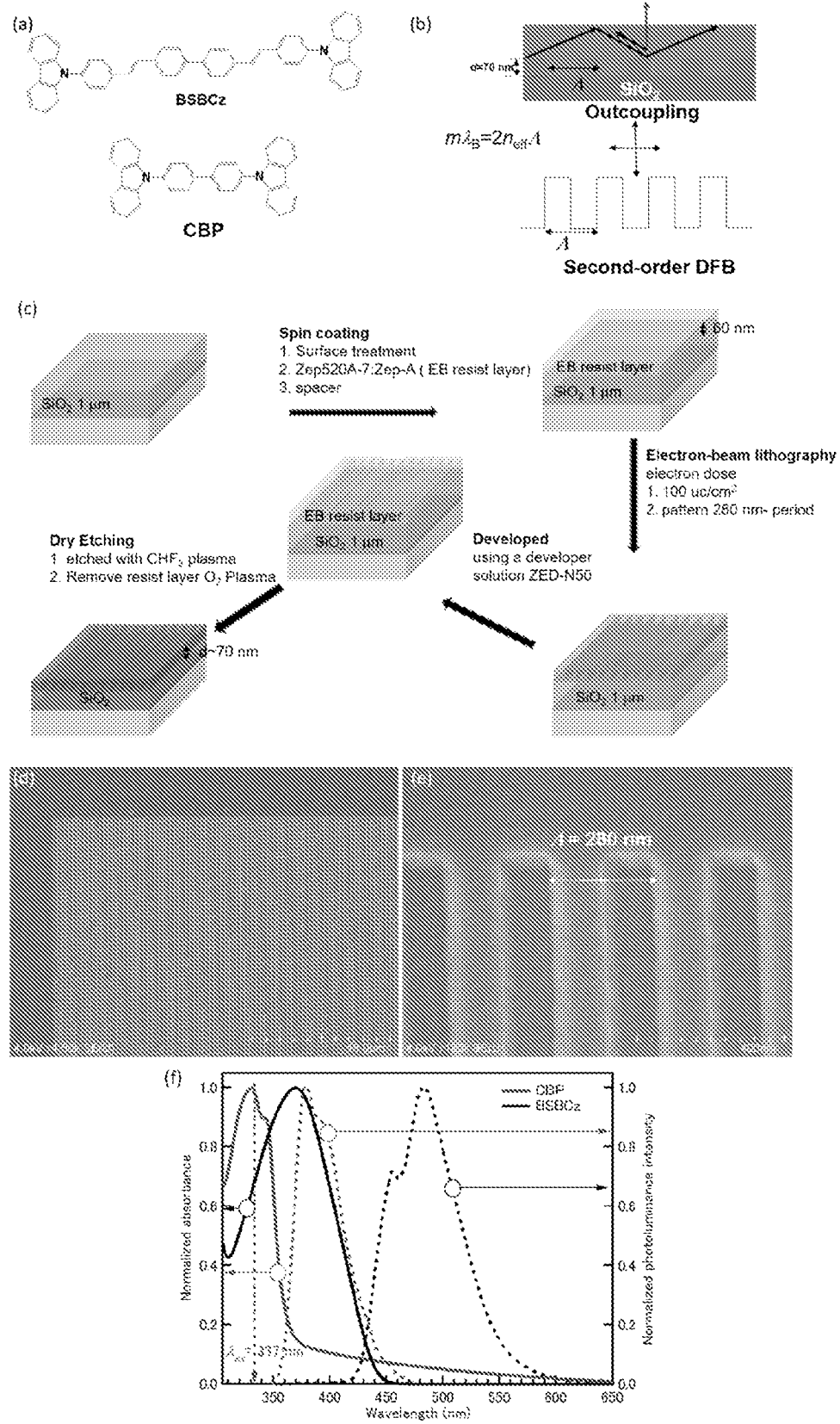
[Fig. 1]

[Fig. 2]
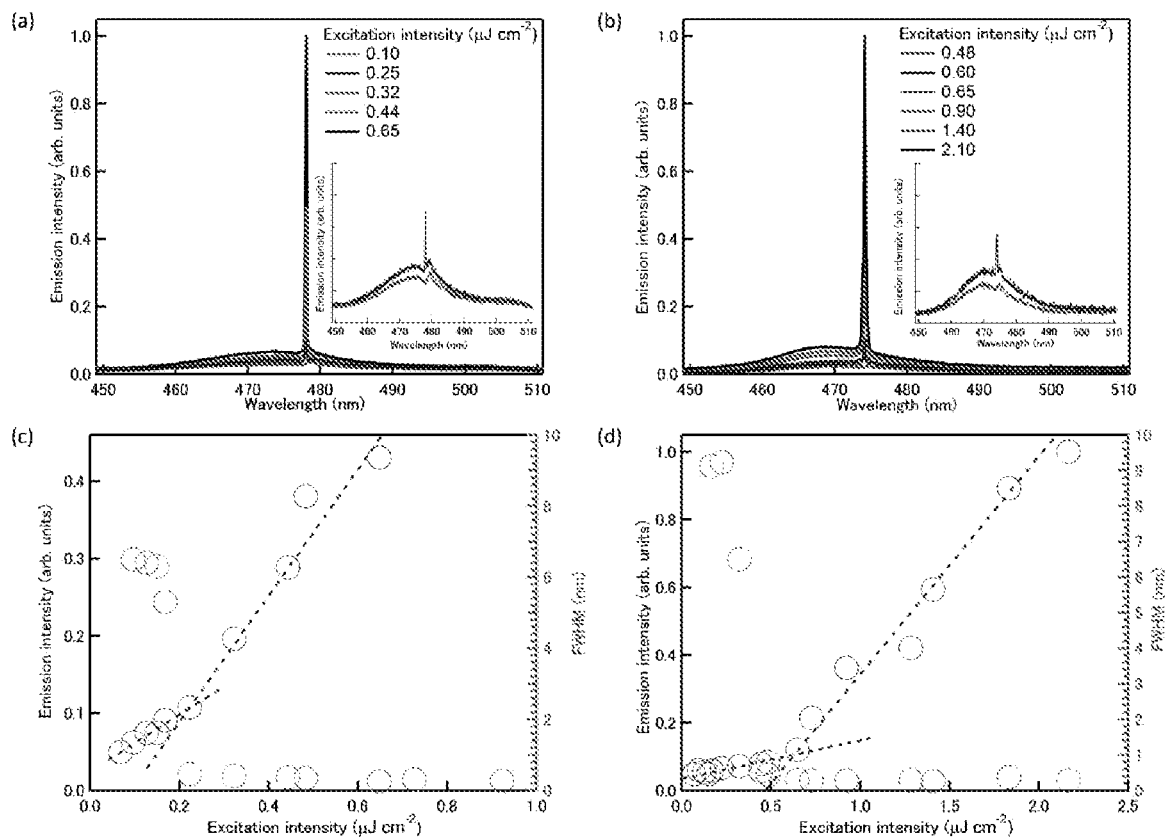
[Fig. 3]
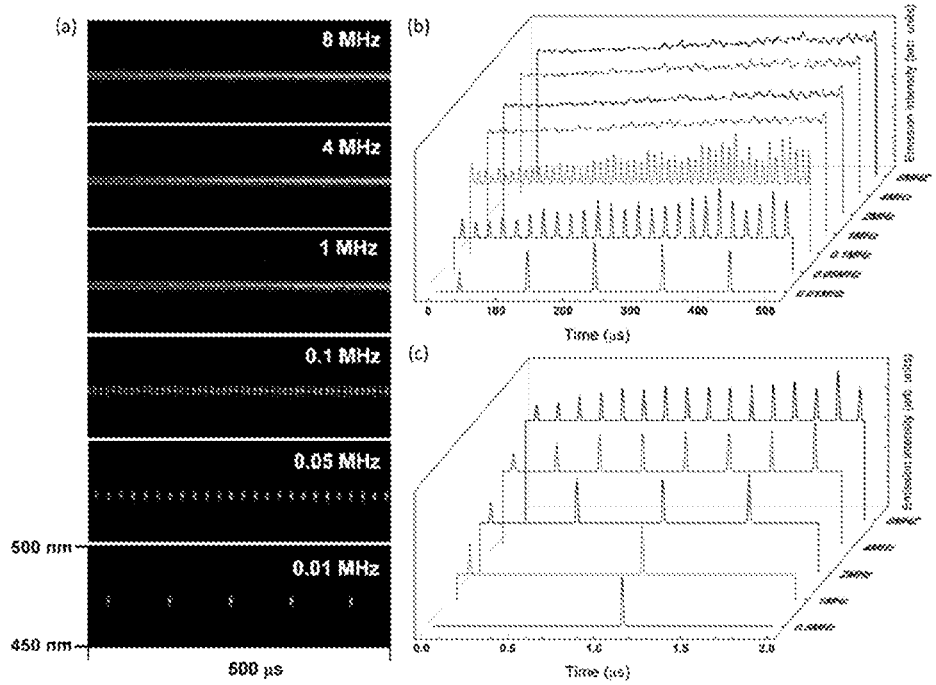

[Fig. 4]
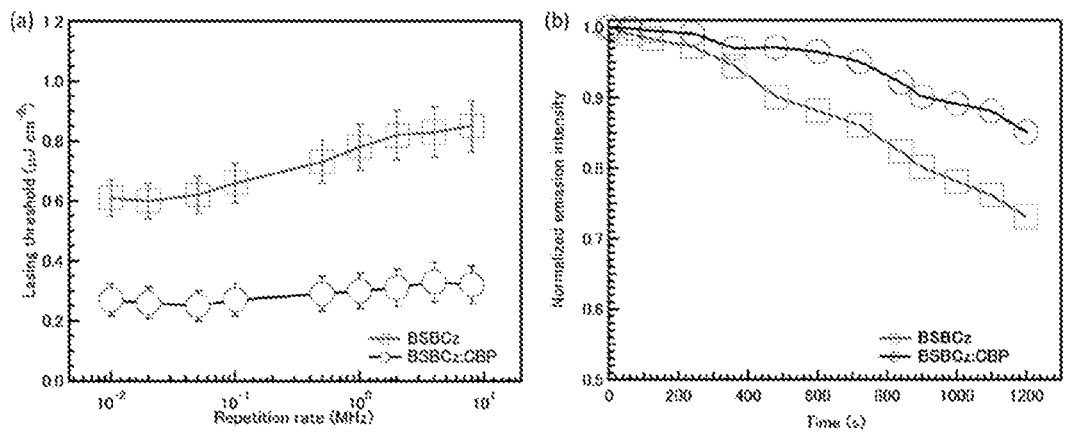
[Fig. 5]
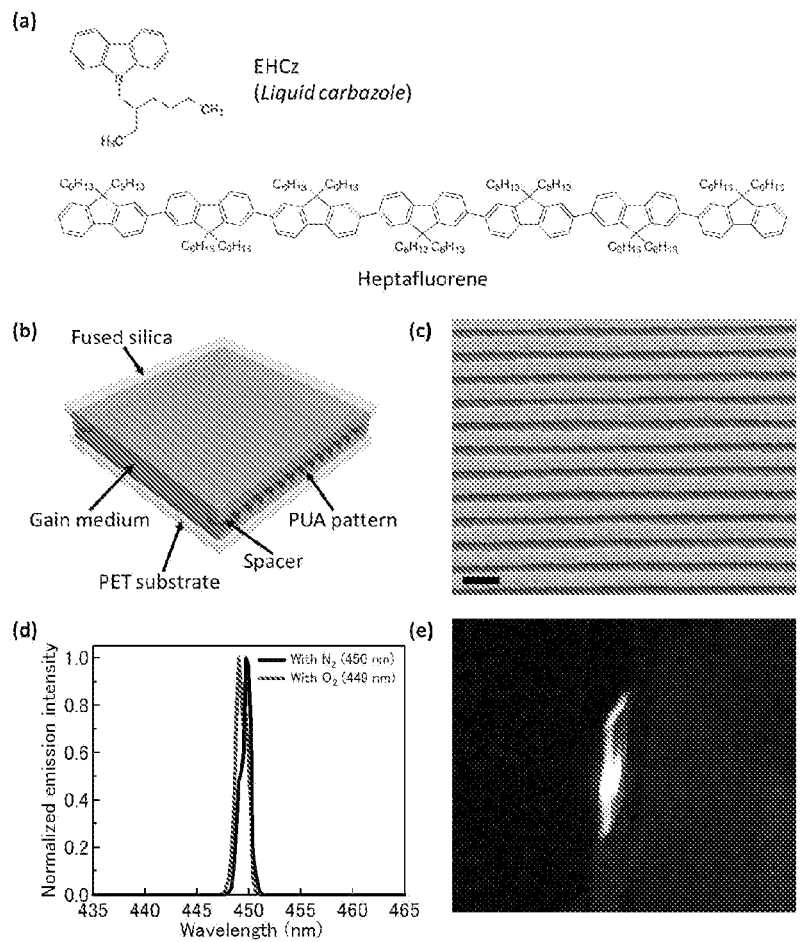

[Fig. 6]
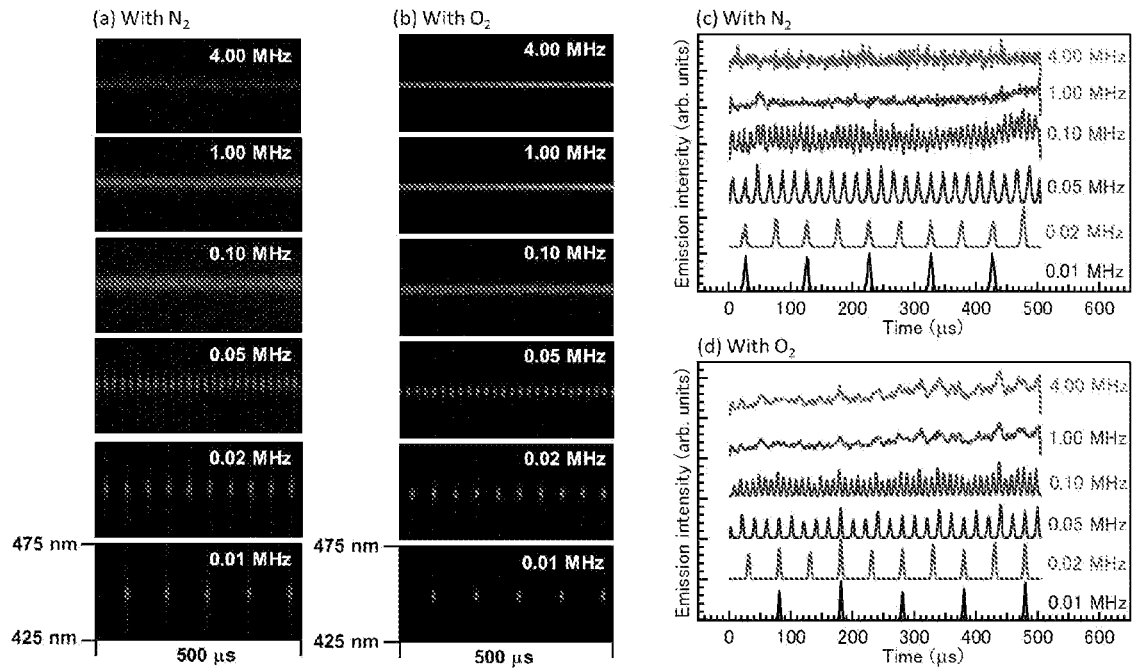
[Fig. 7]
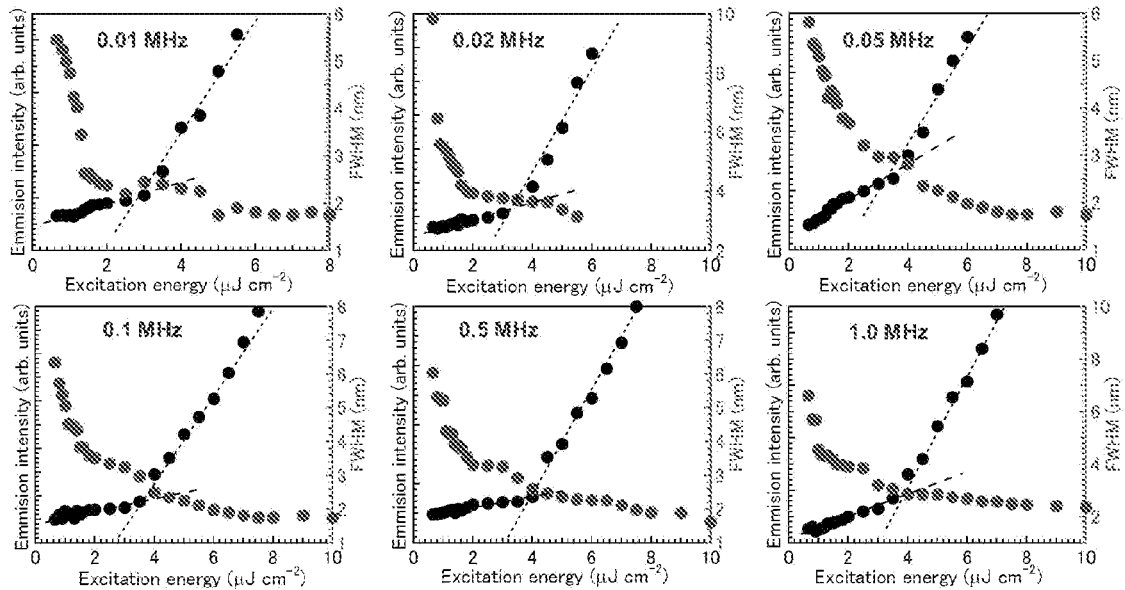

[Fig. 8]
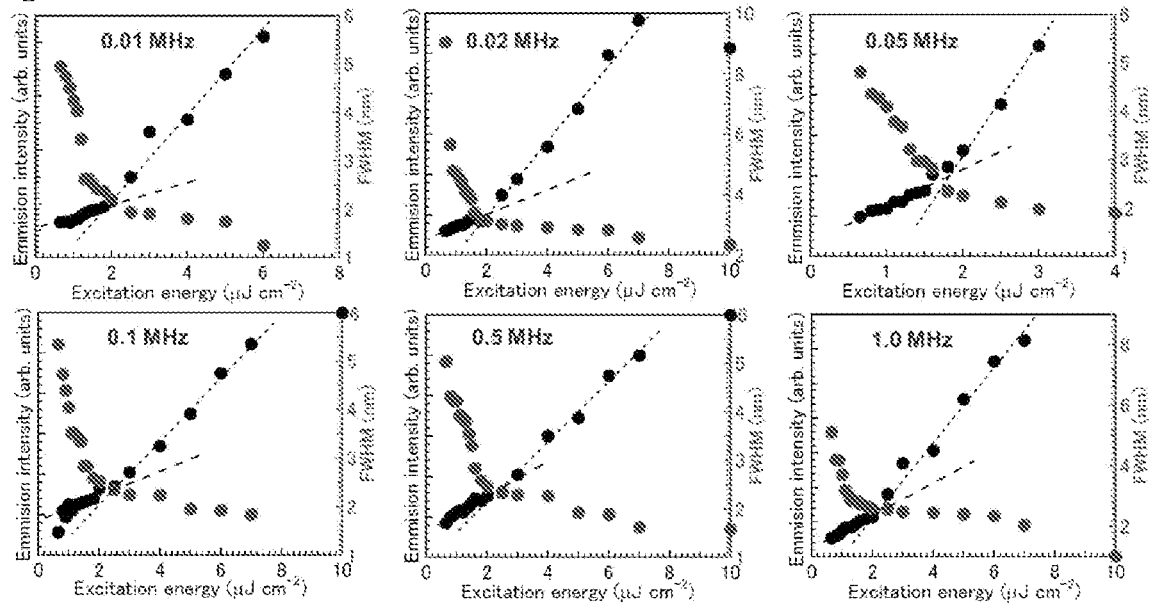
[Fig. 9]
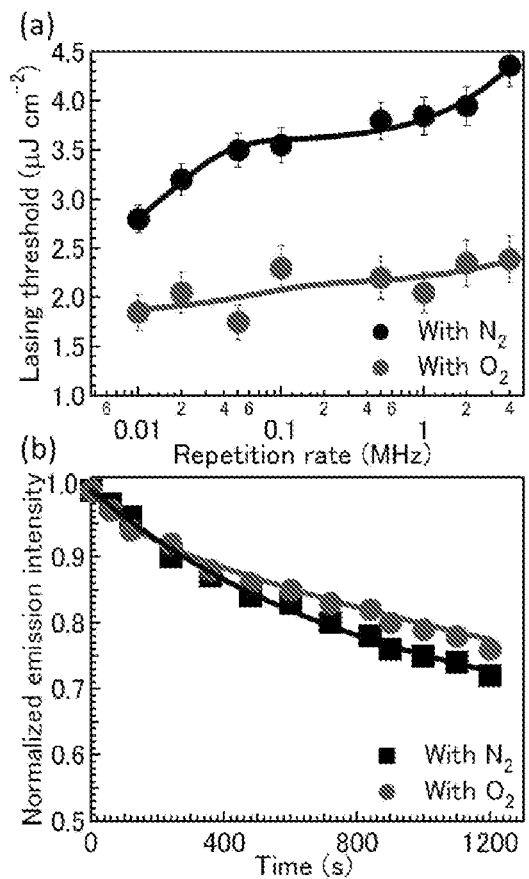

[Fig. 10]
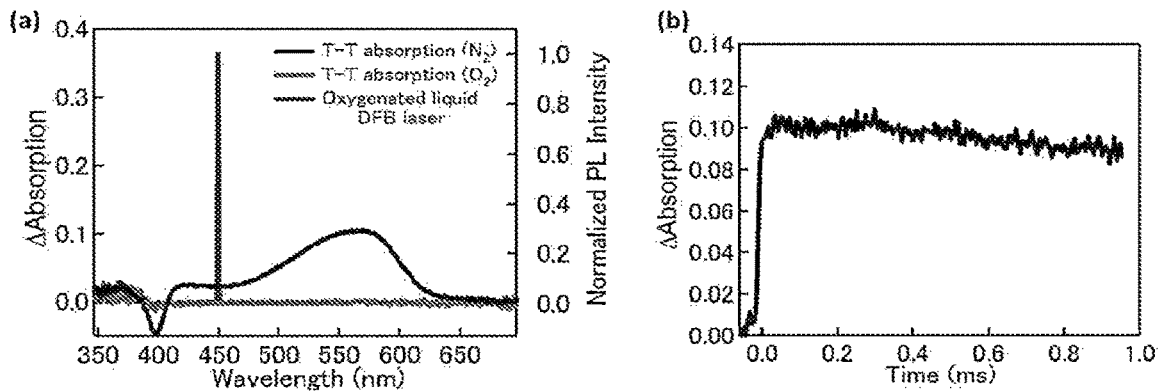
[Fig. 11]
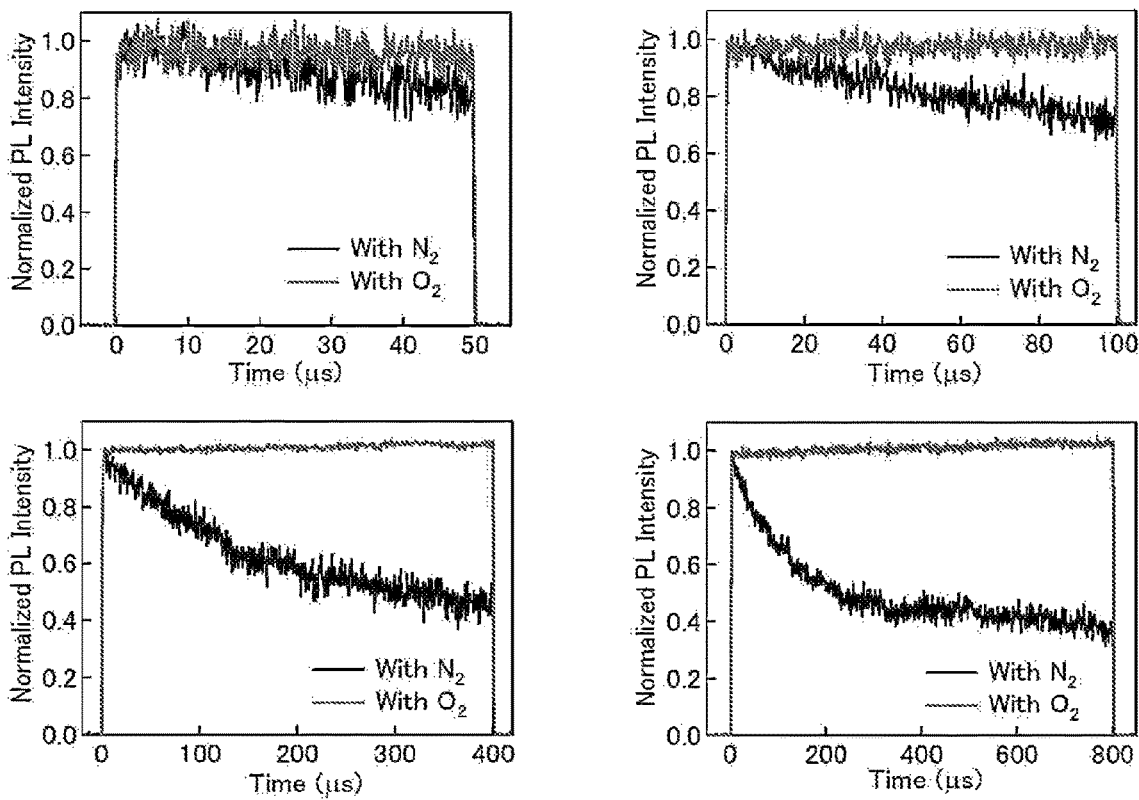

[Fig. 12]
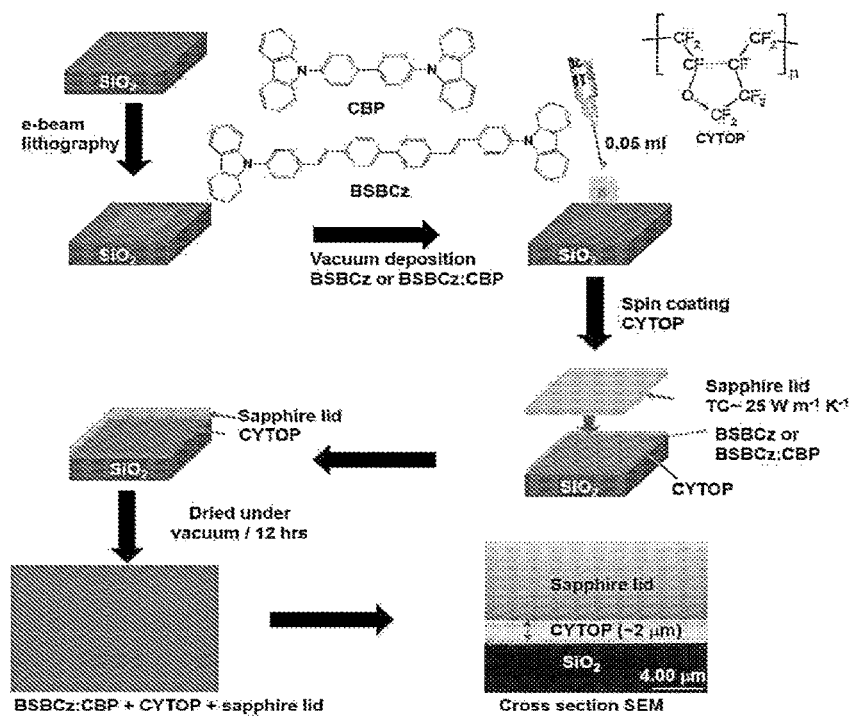
[Fig. 13]
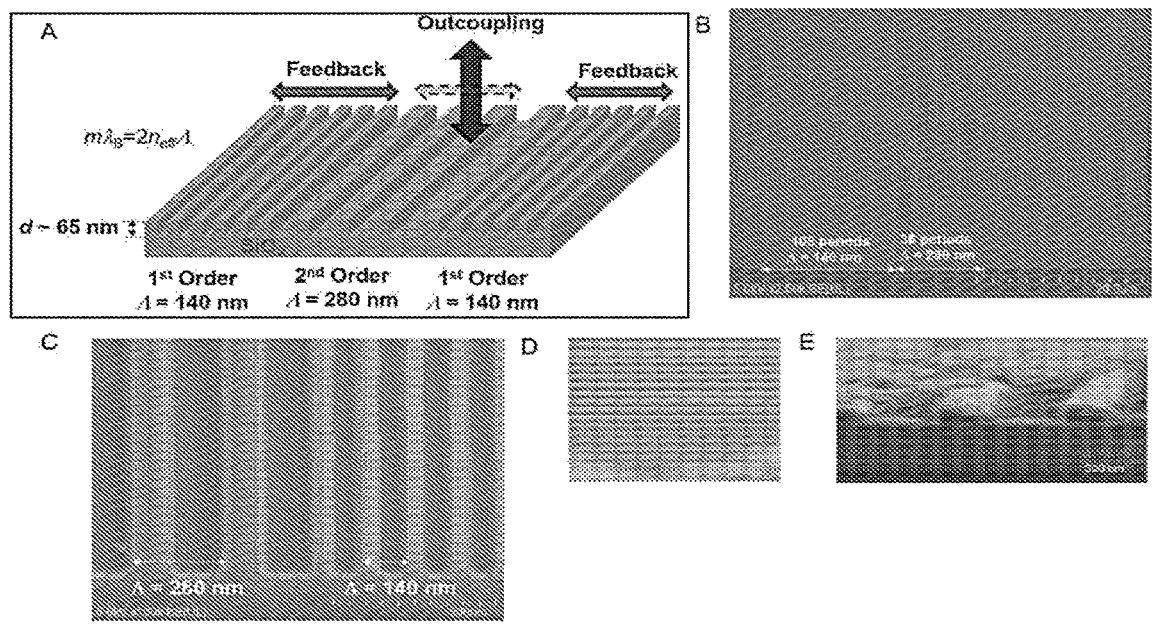

[Fig. 14]
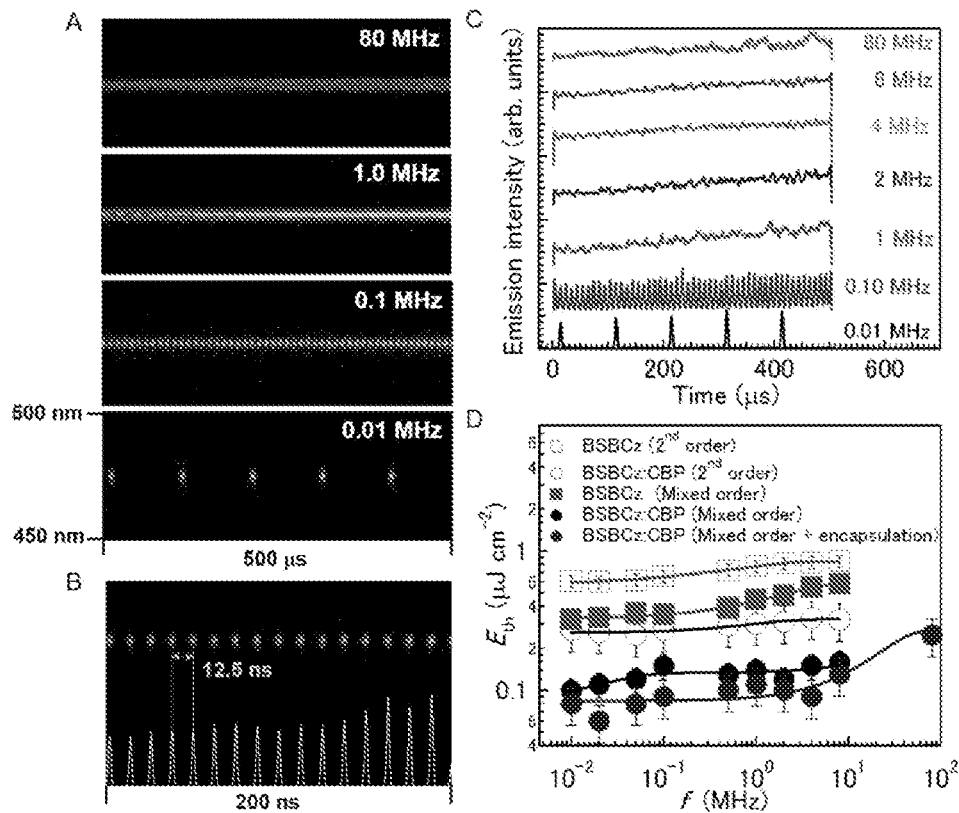
[Fig. 15]
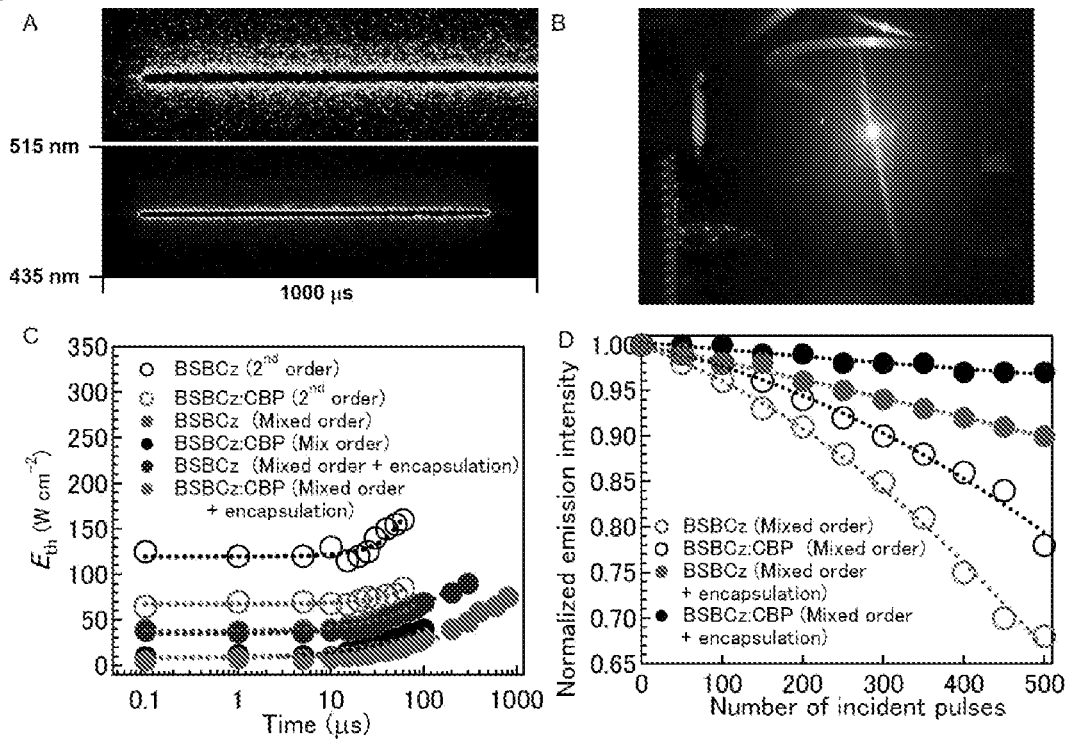

[Fig. 16]
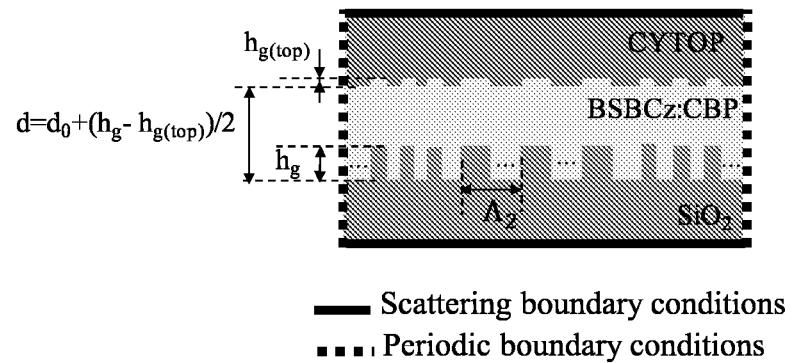
[Fig. 17]
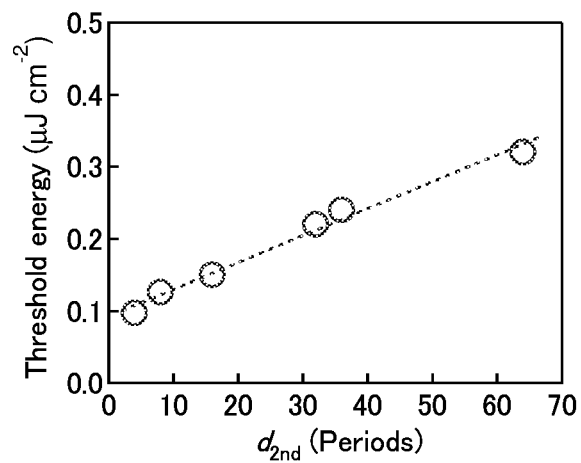

[Fig. 18]
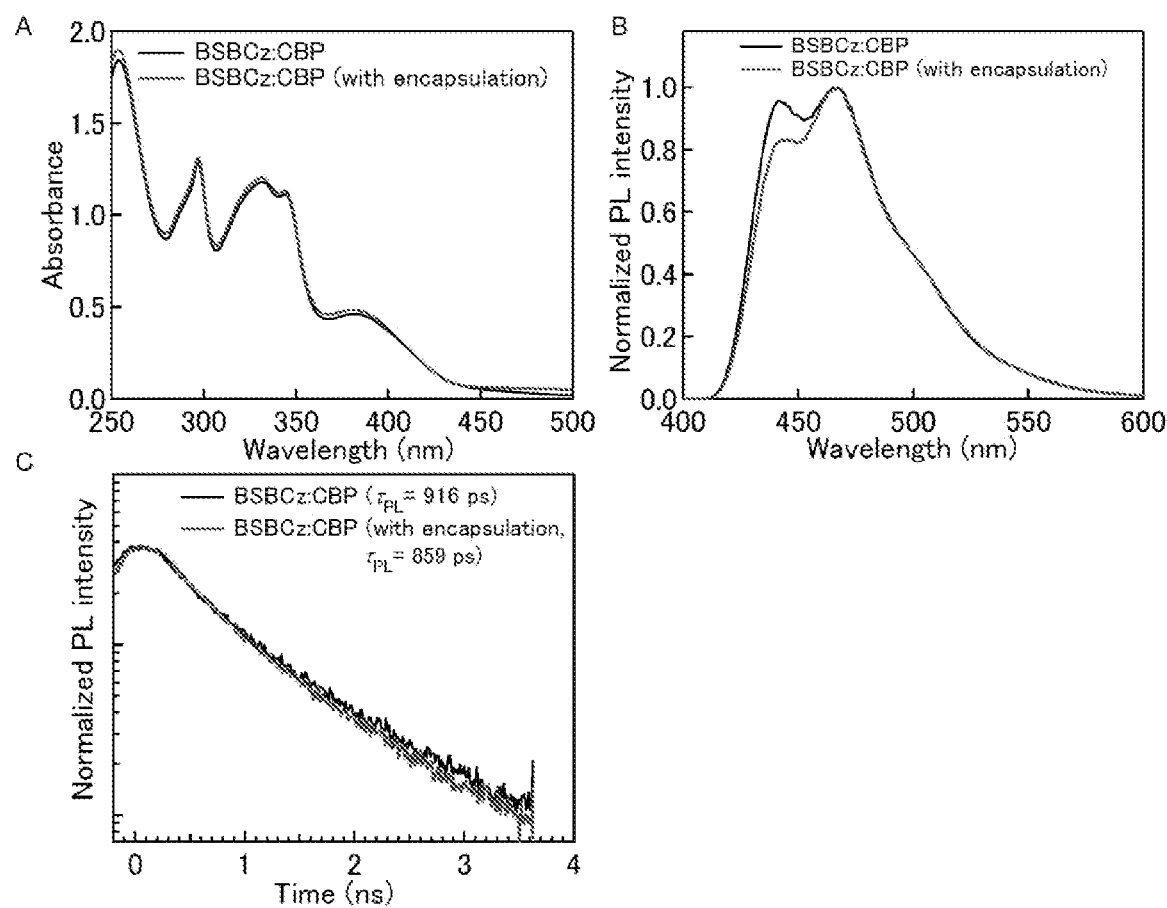

[Fig. 19]
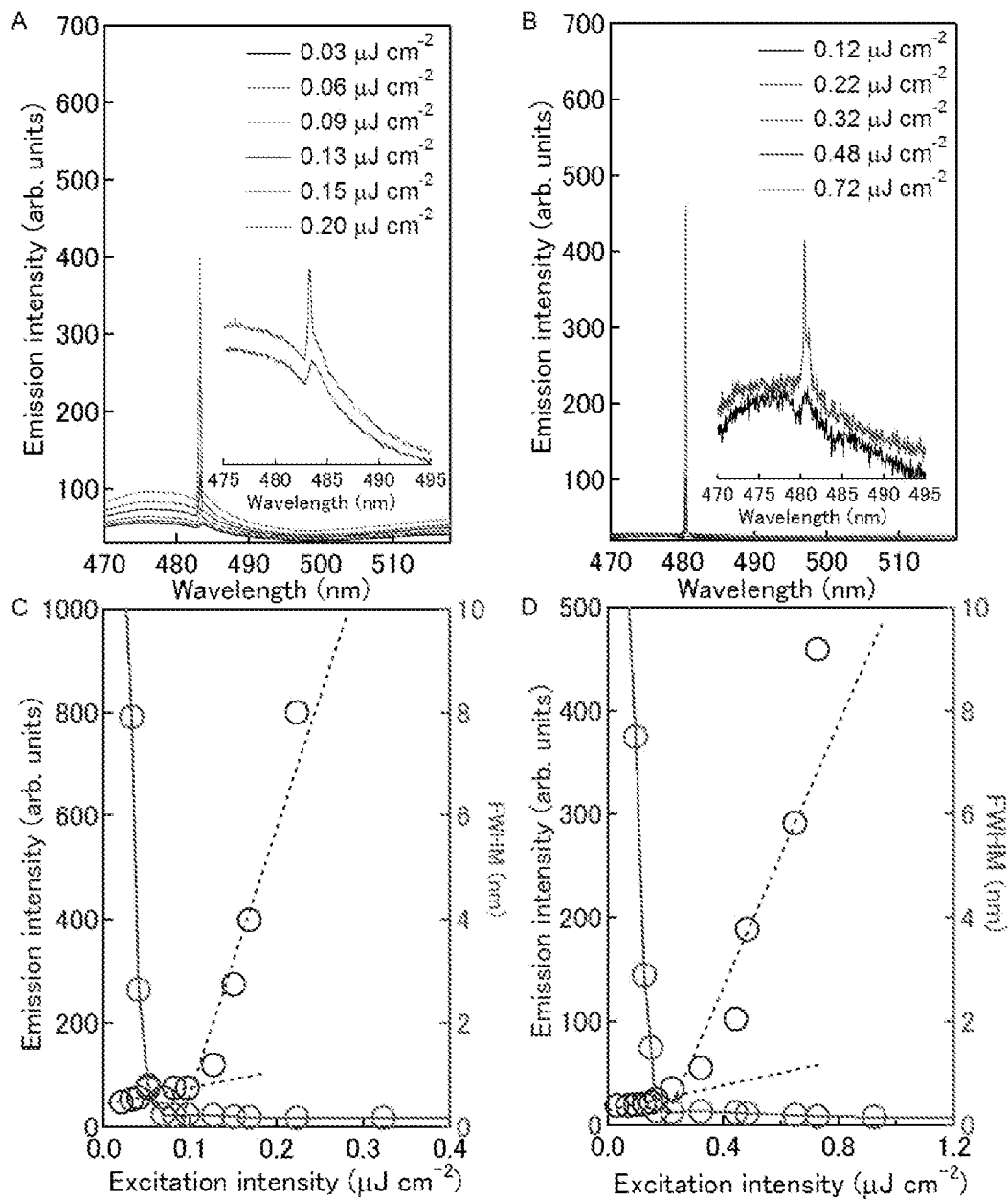

[Fig. 20]
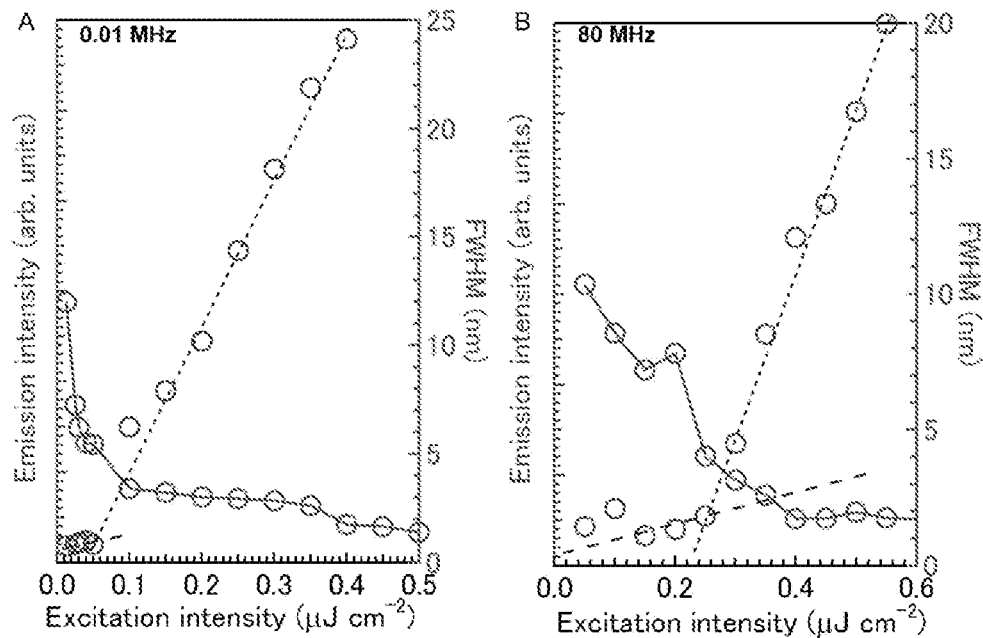
[Fig. 21]
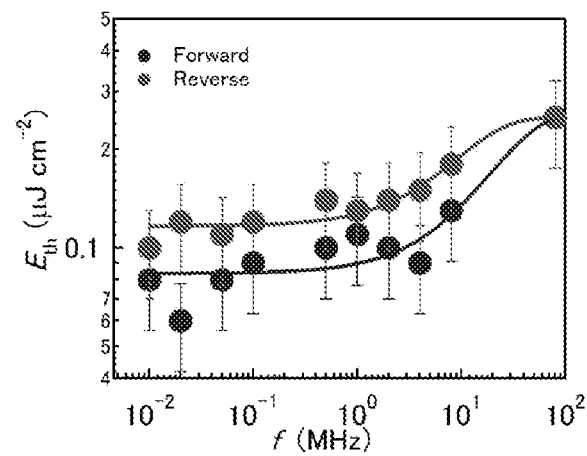

[Fig. 22]
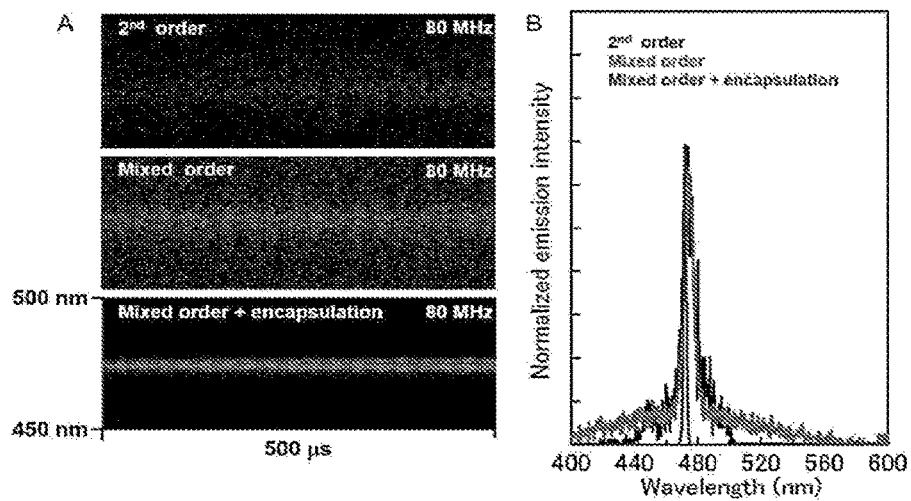
[Fig. 23]
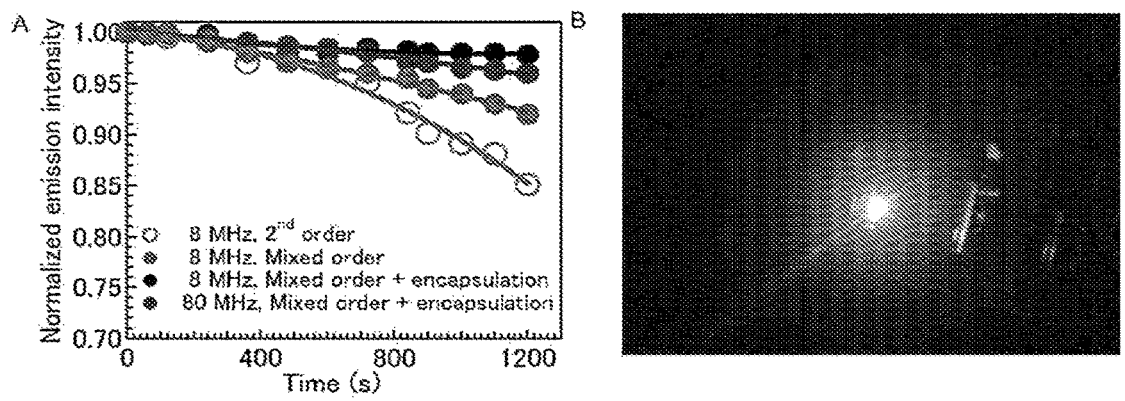
[Fig. 24]
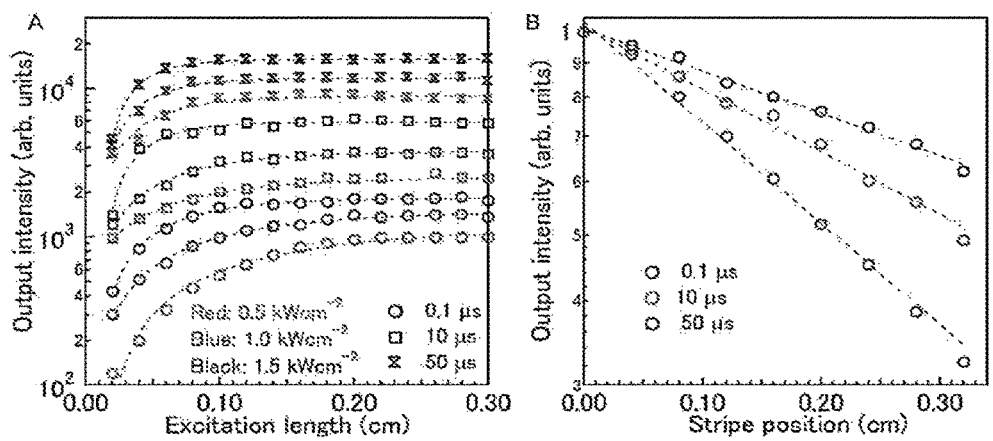

[Fig. 25]
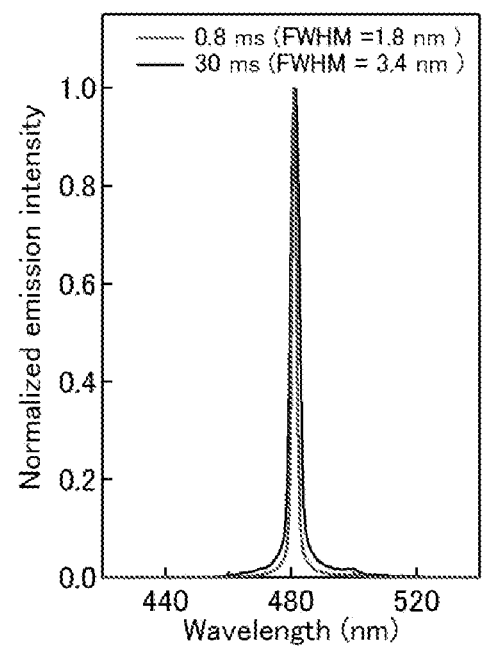
[Fig. 26]
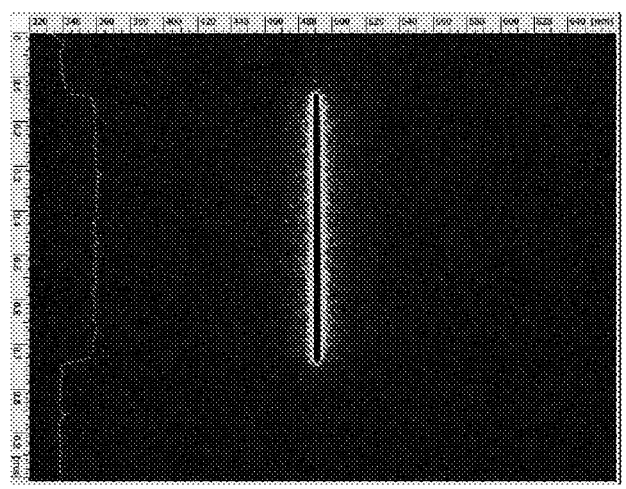

[Fig. 27]
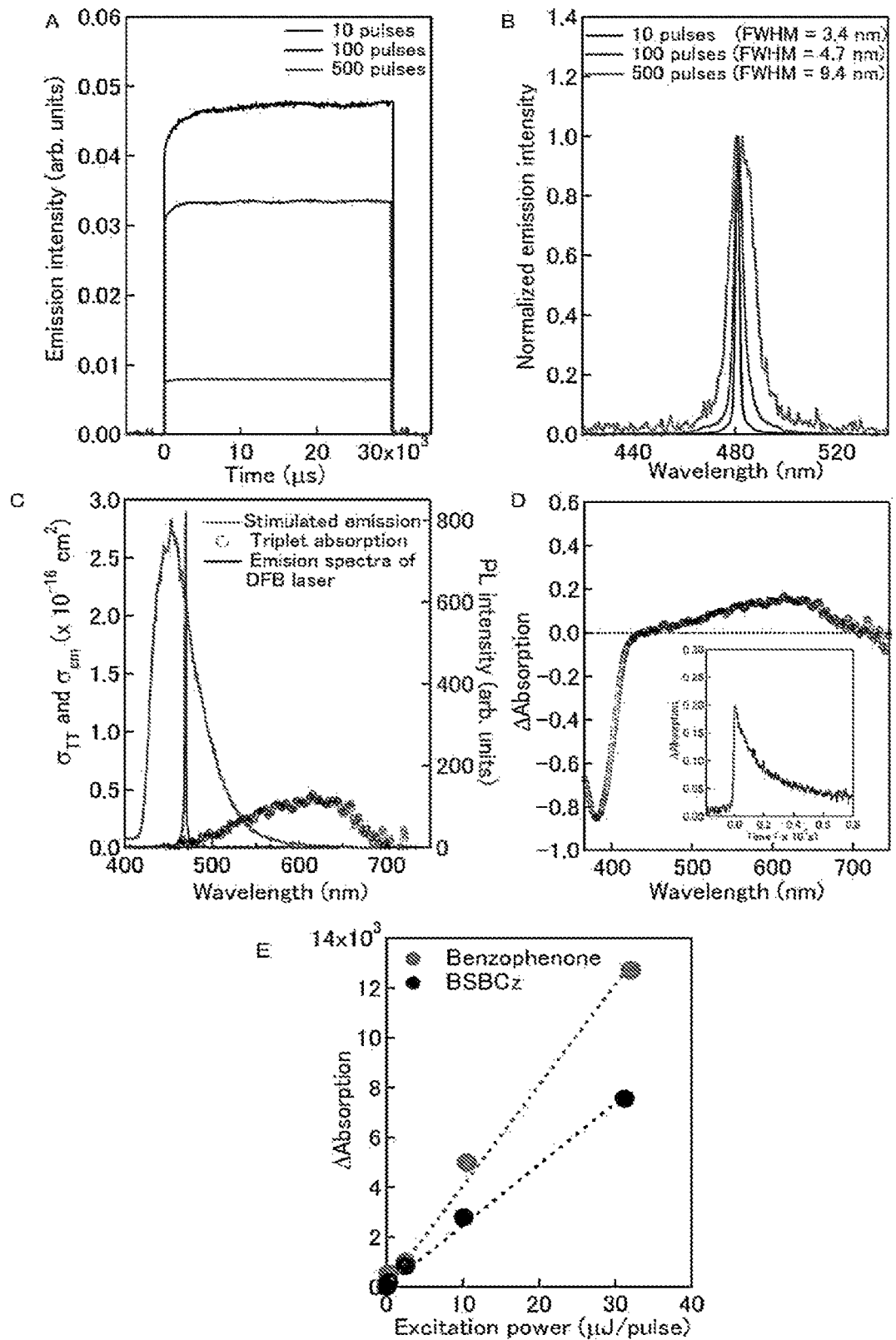

[Fig. 28]
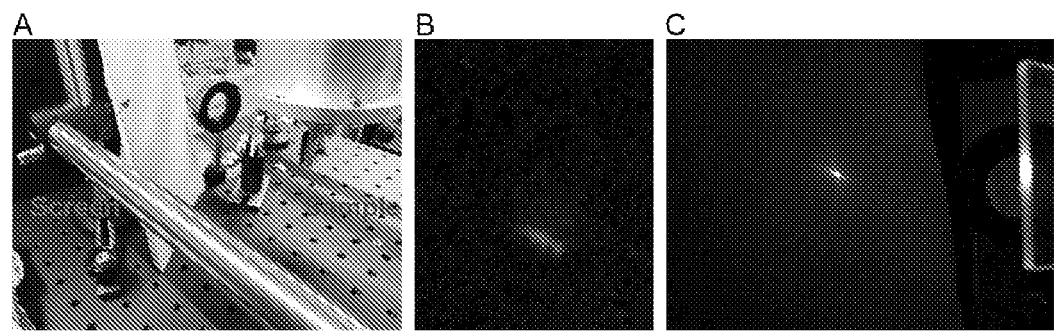
[Fig. 29]
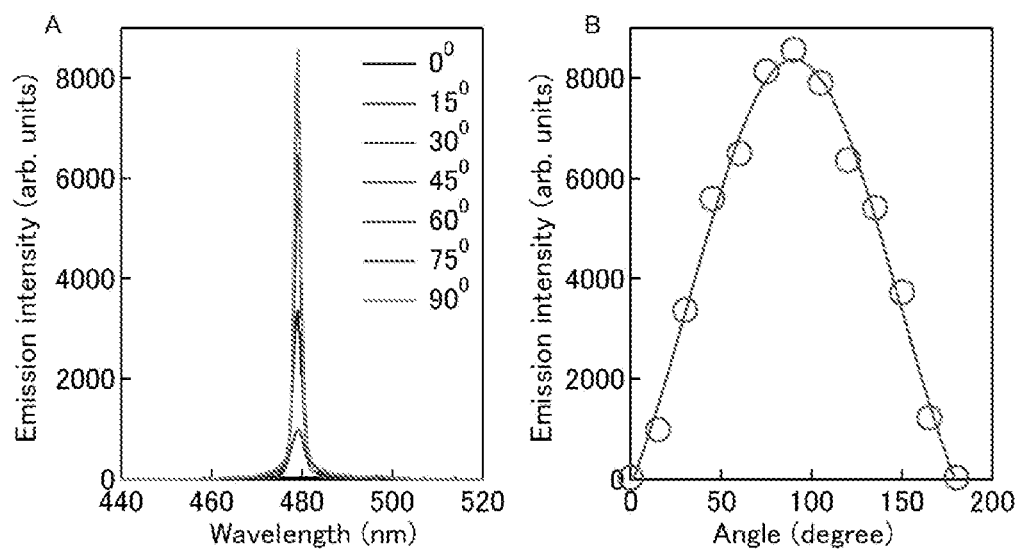

[Fig. 30]
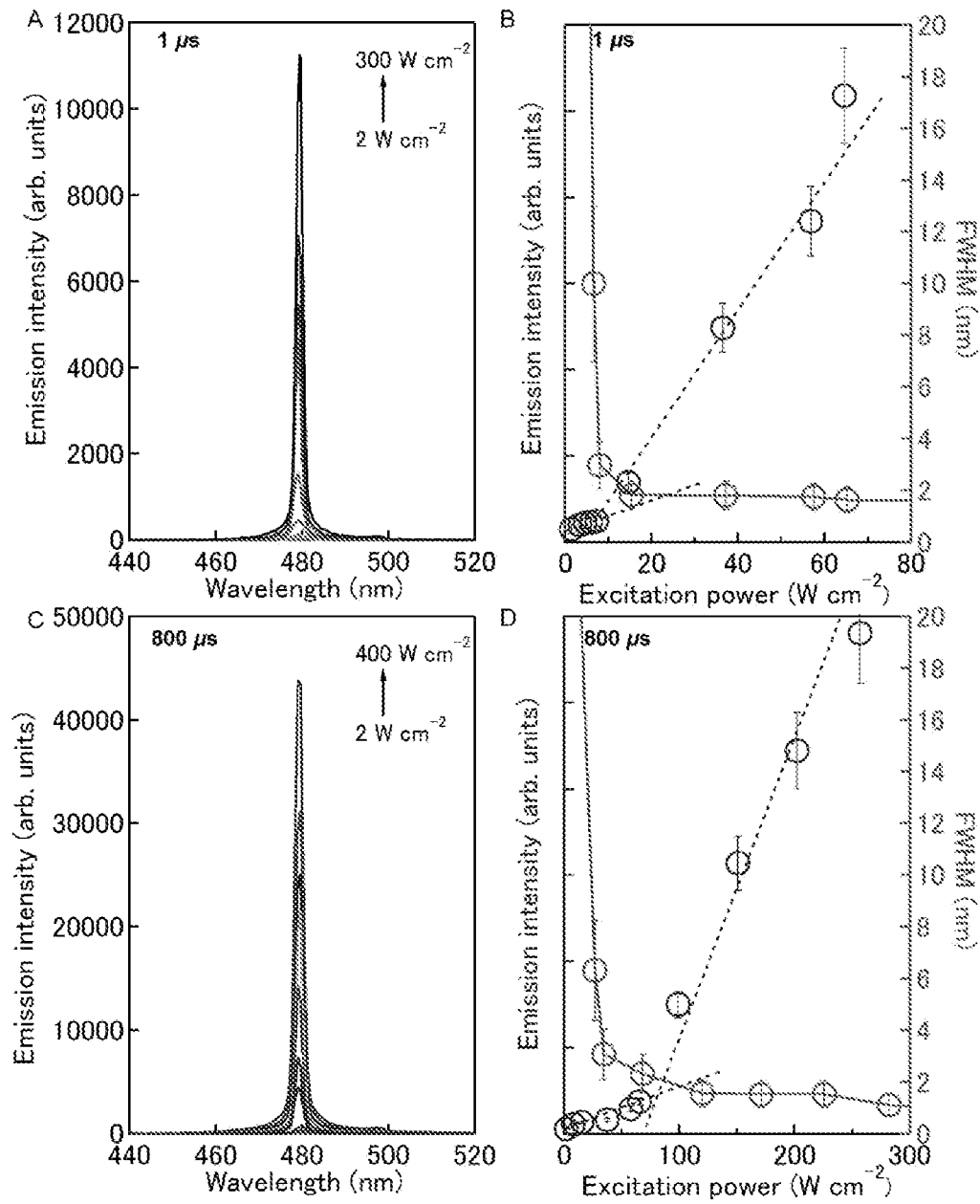

[Fig. 31]
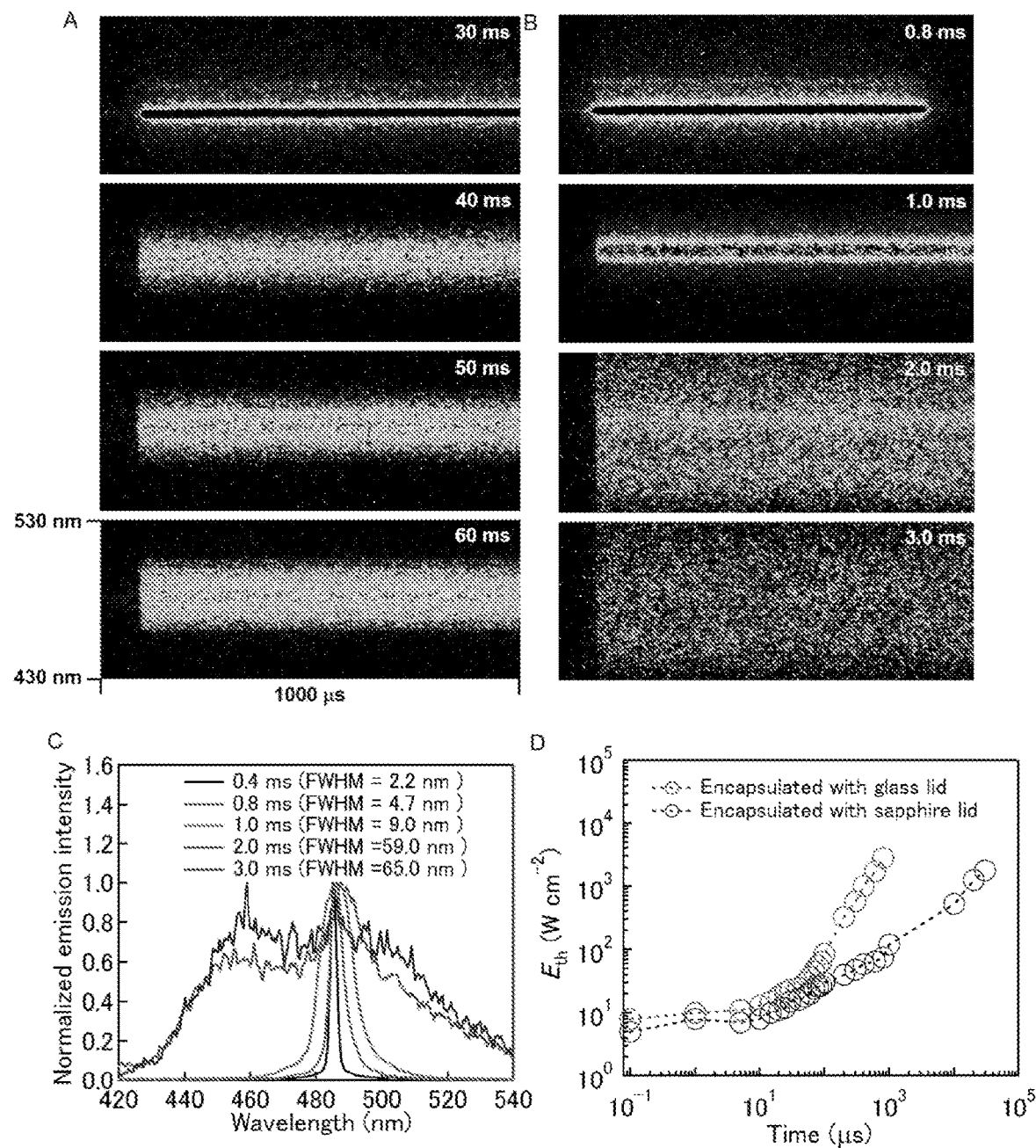

[Fig. 32]
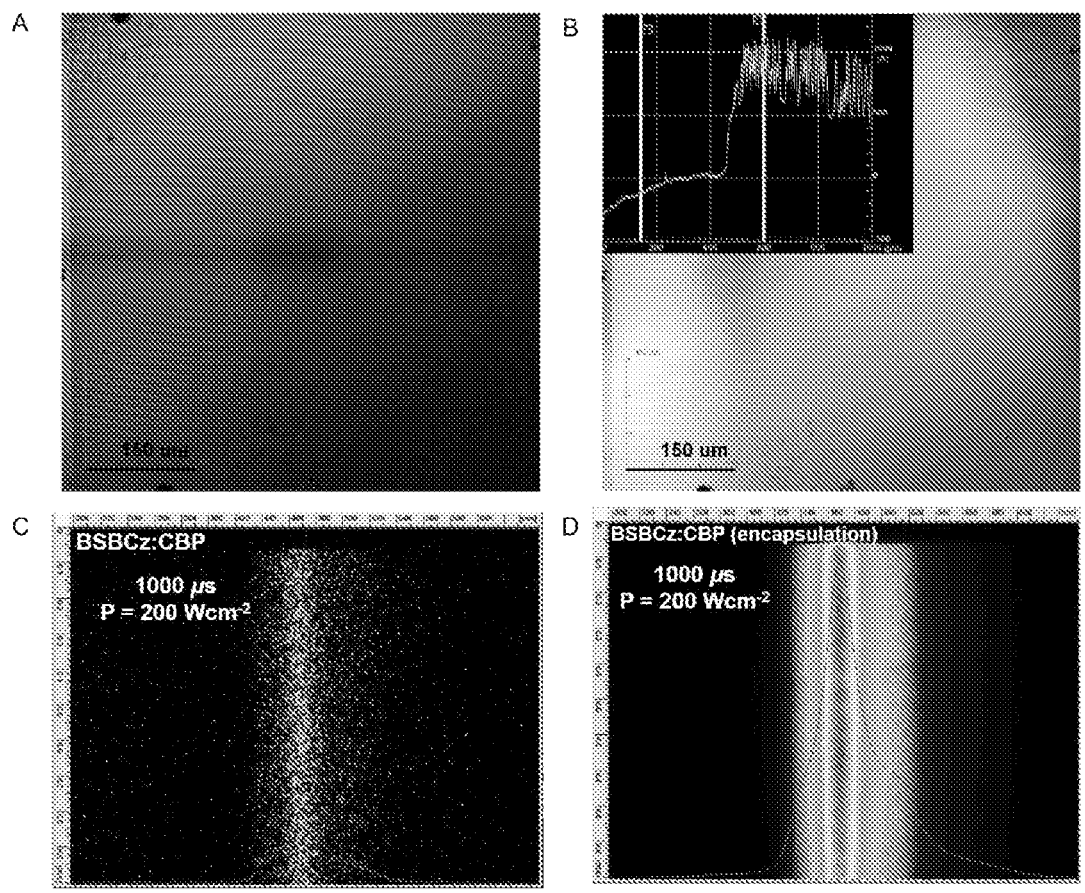
[Fig. 33]
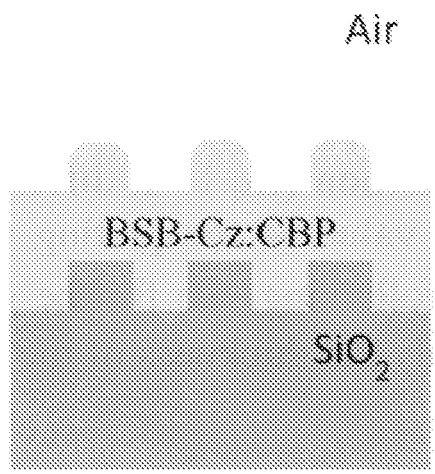

[Fig. 34]
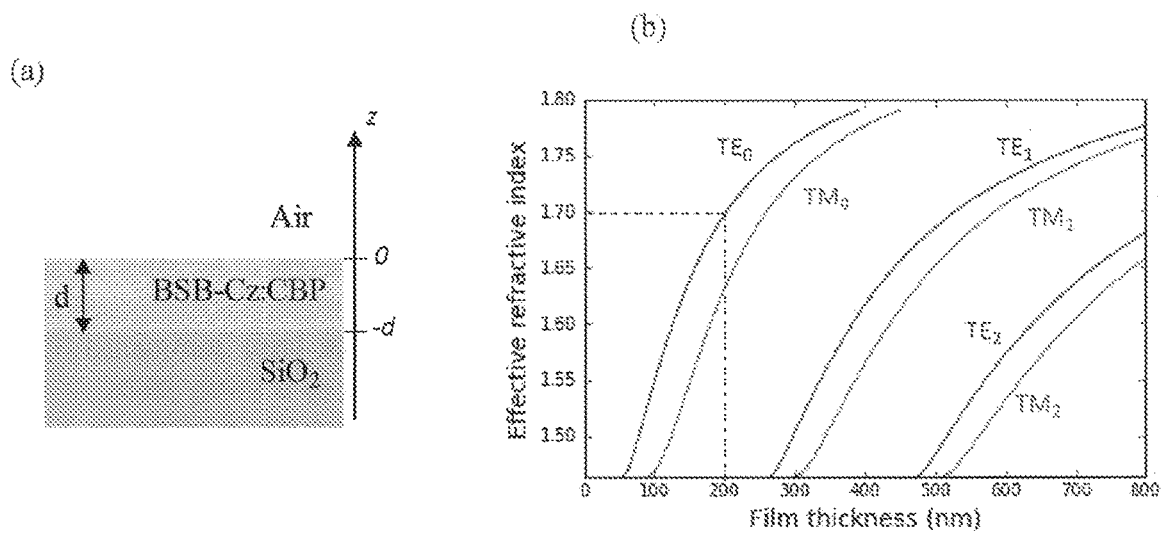
[Fig. 35]
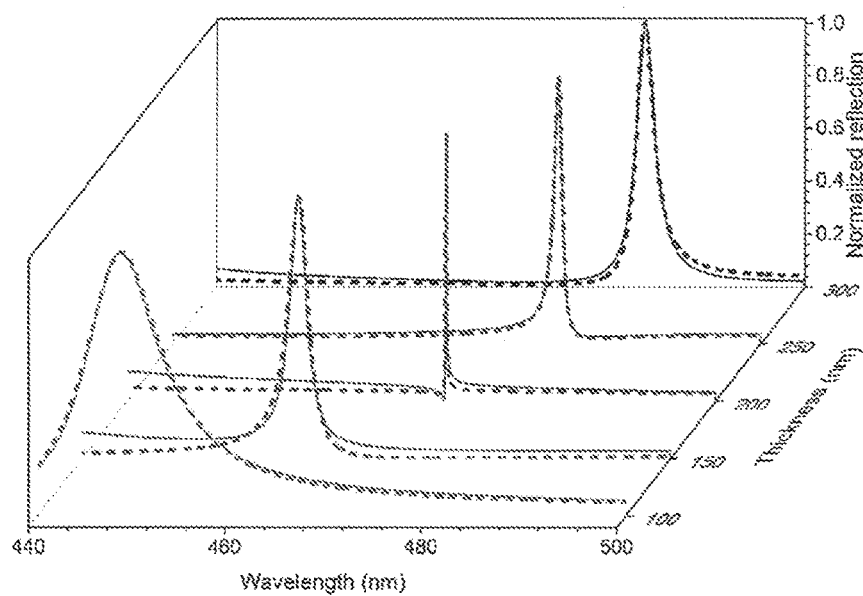

[Fig. 36]
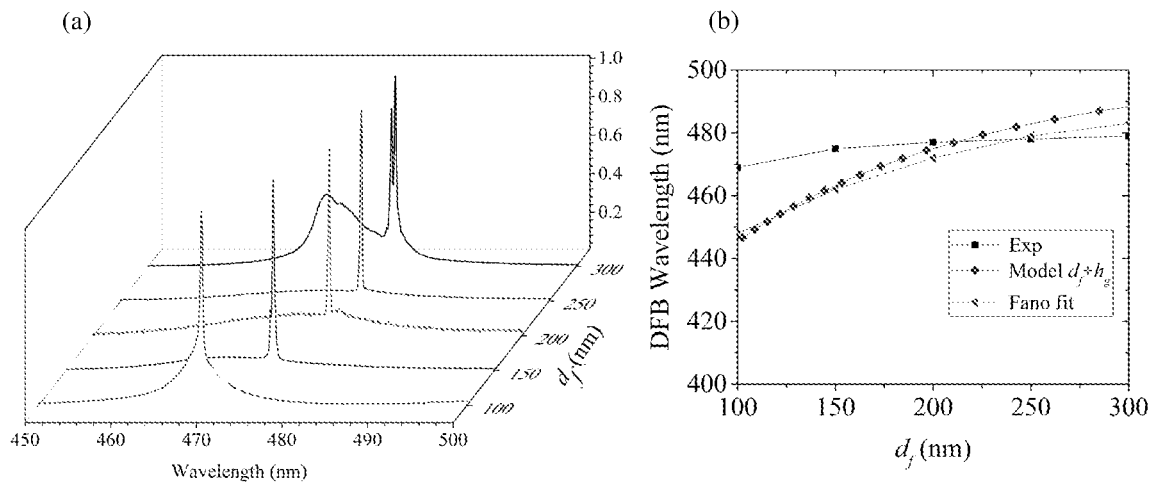
[Fig. 37]
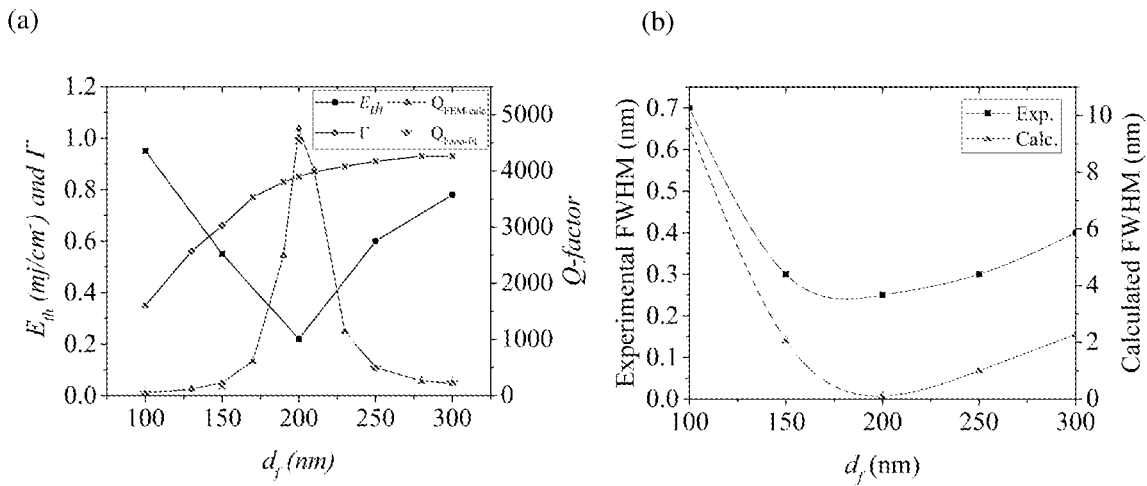

[Fig. 38]
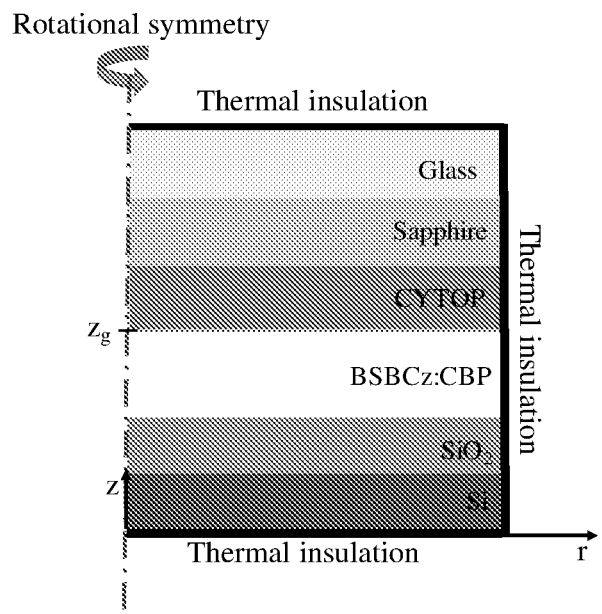
[Fig. 39]
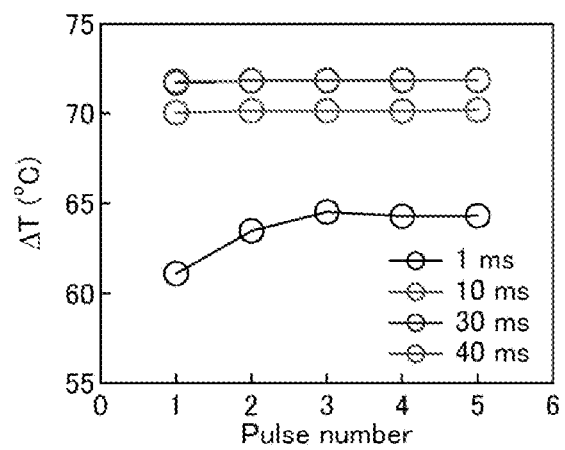

[Fig. 40]
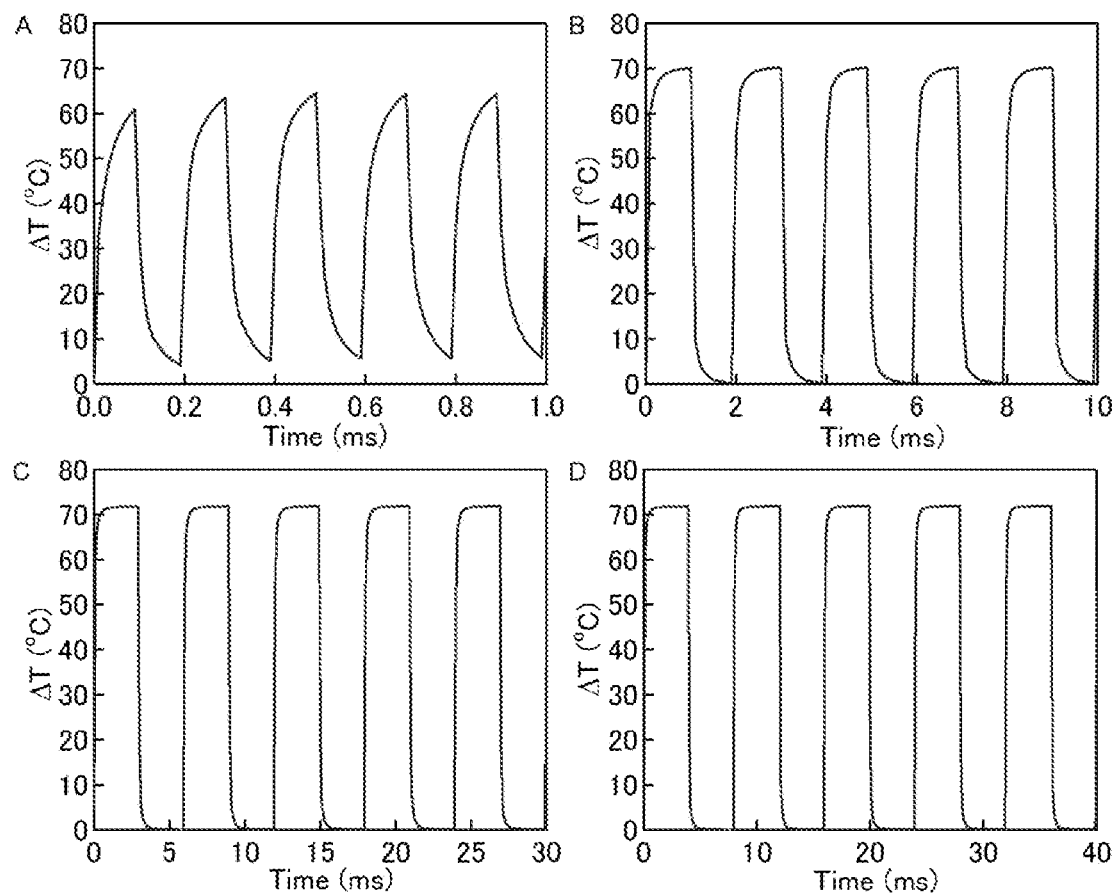
[Fig. 41]
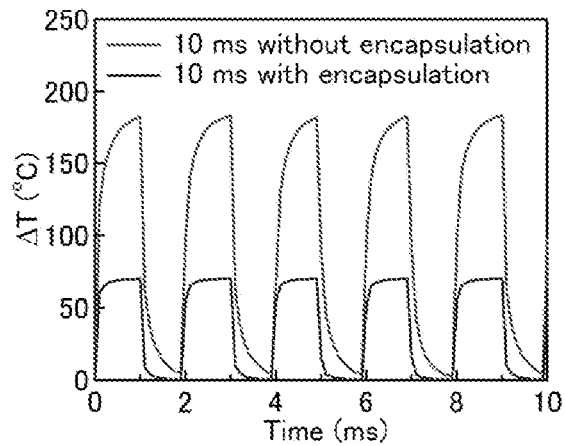

[Fig. 42]
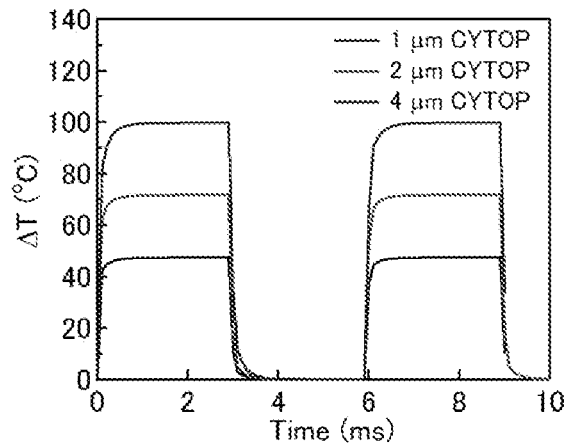
[Fig. 43]
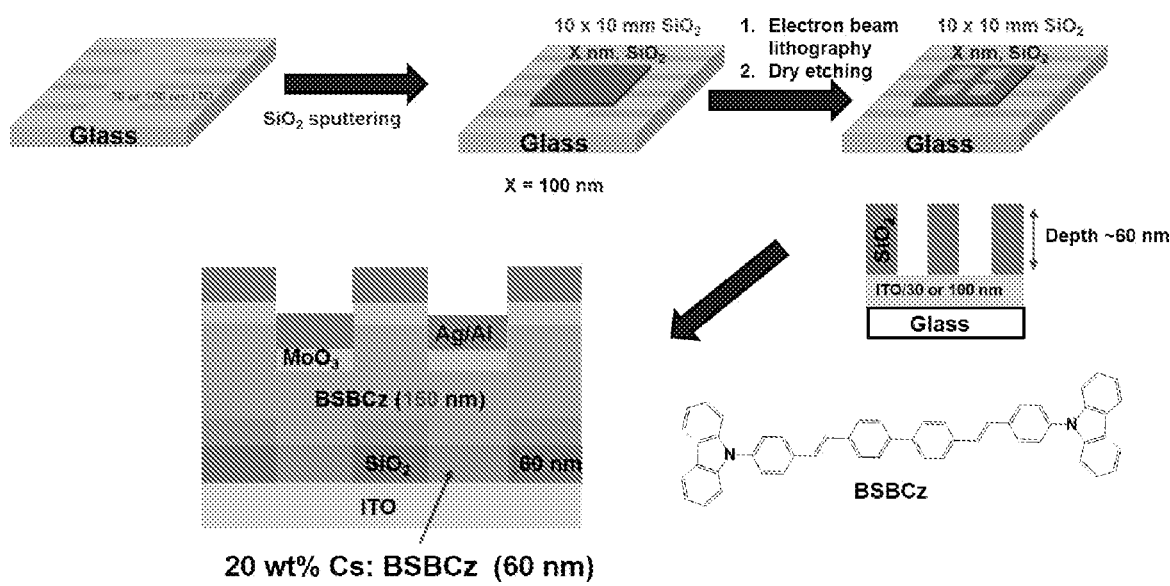

[Fig. 44A]
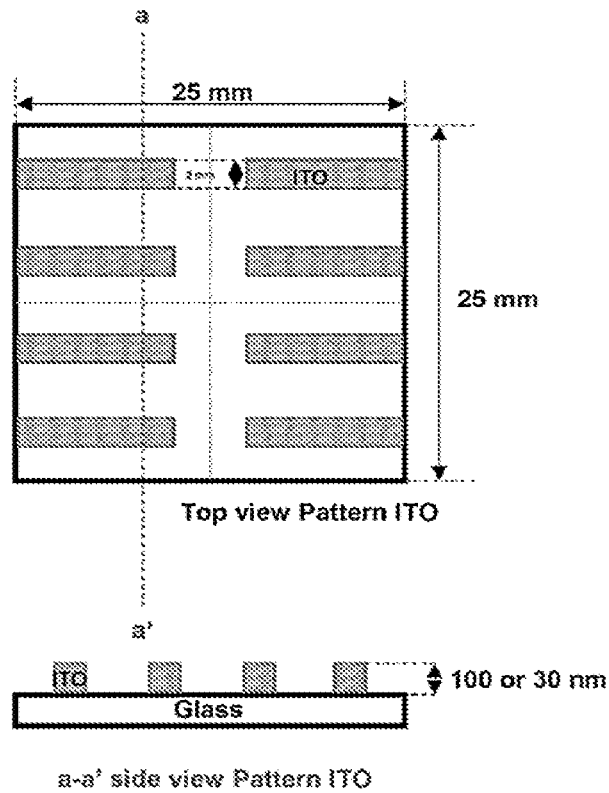
[Fig. 44B]
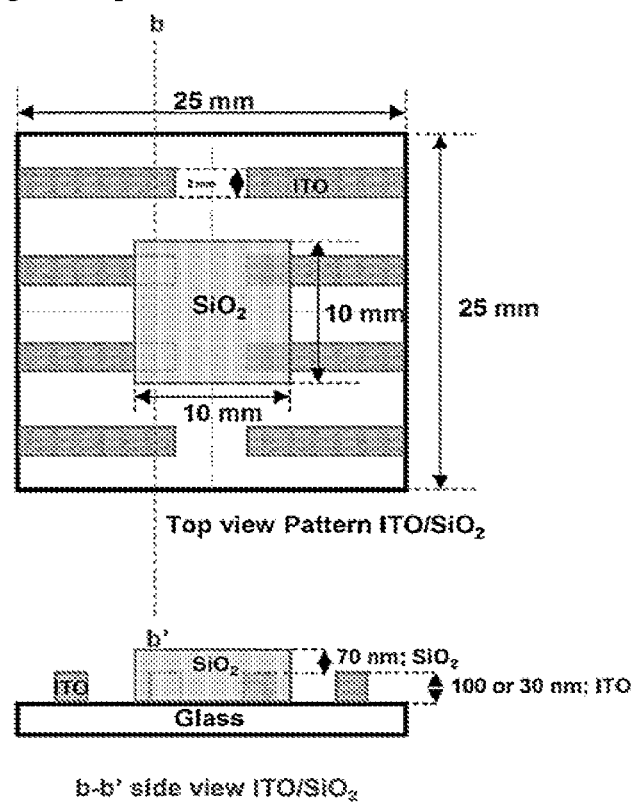

[Fig. 44C]
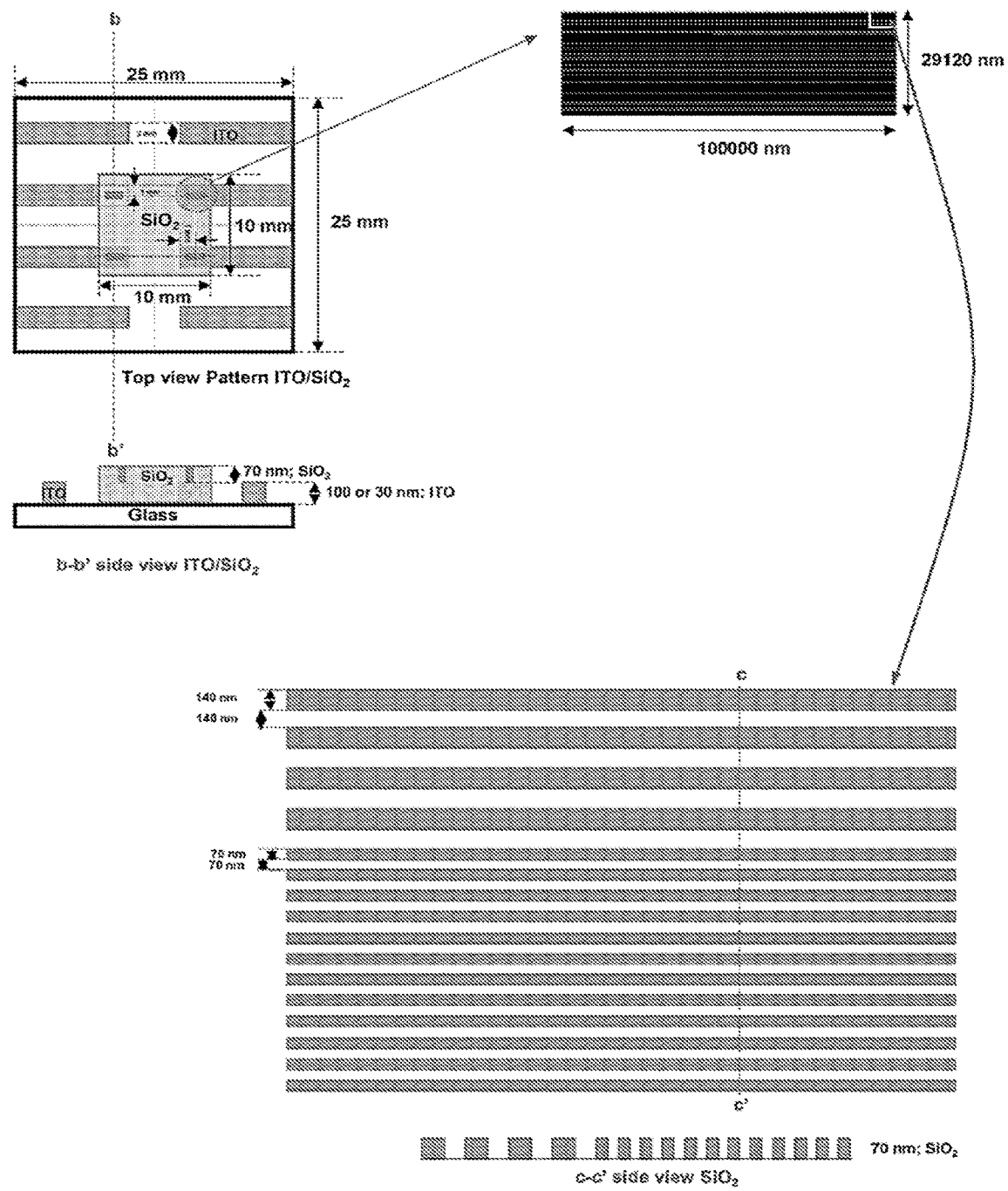

[Fig. 44D]
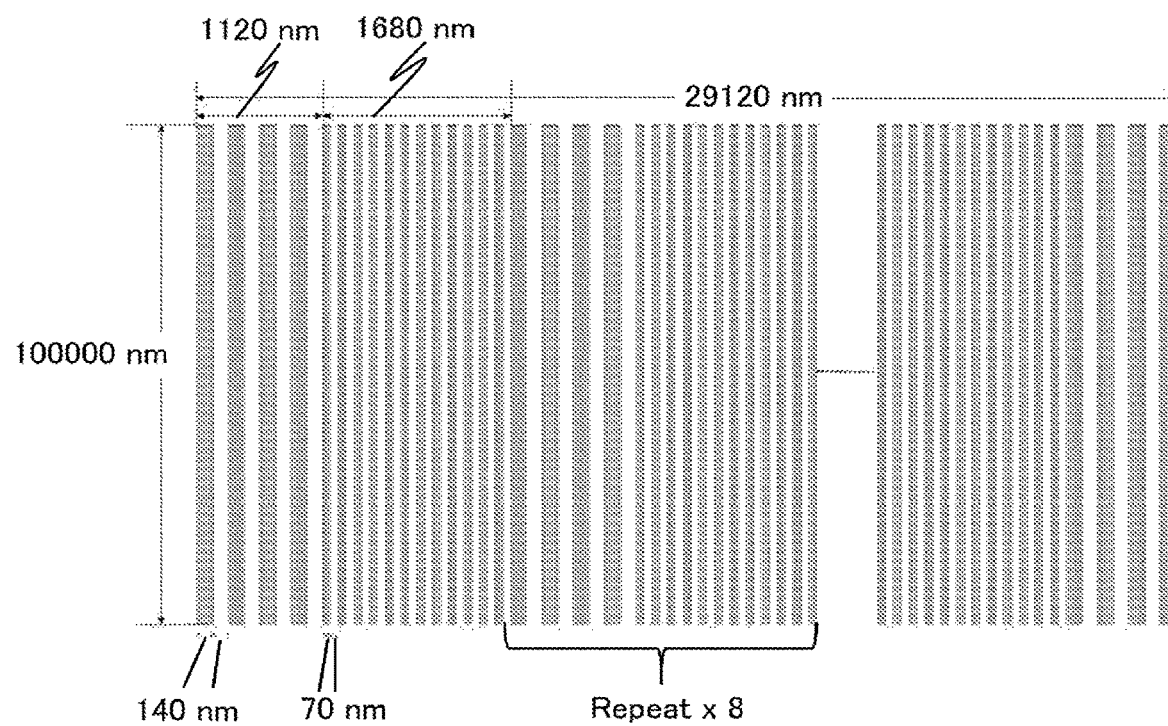

[Fig. 45]
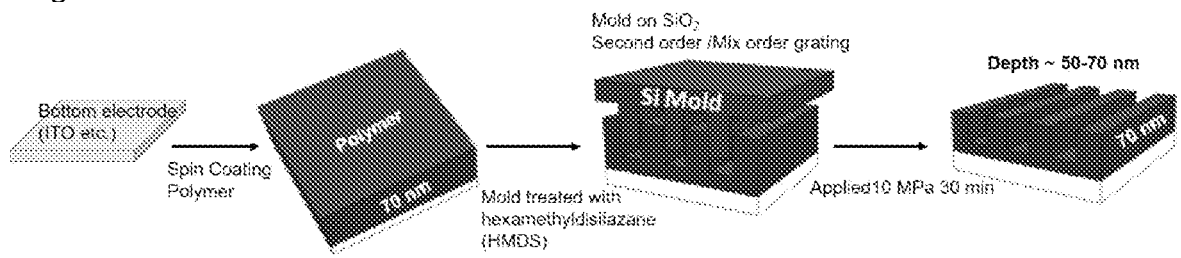
[Fig. 46]
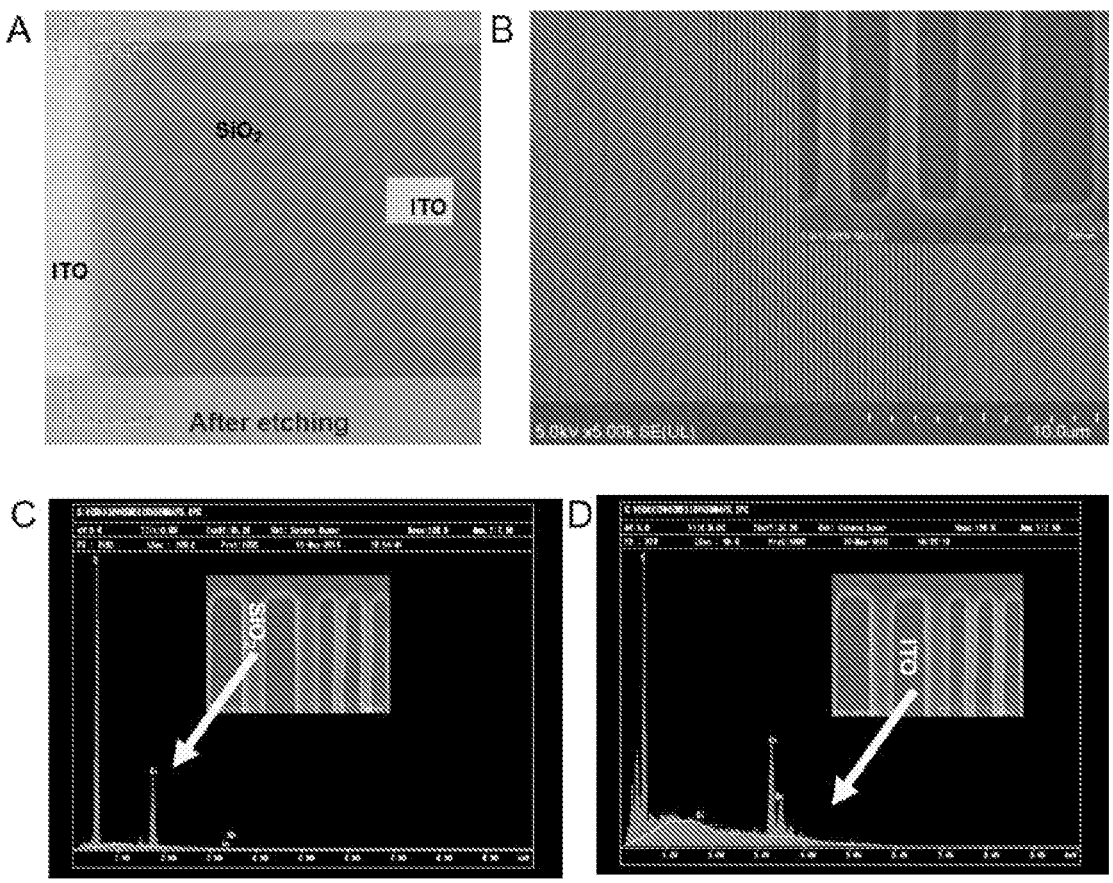

[Fig. 47]
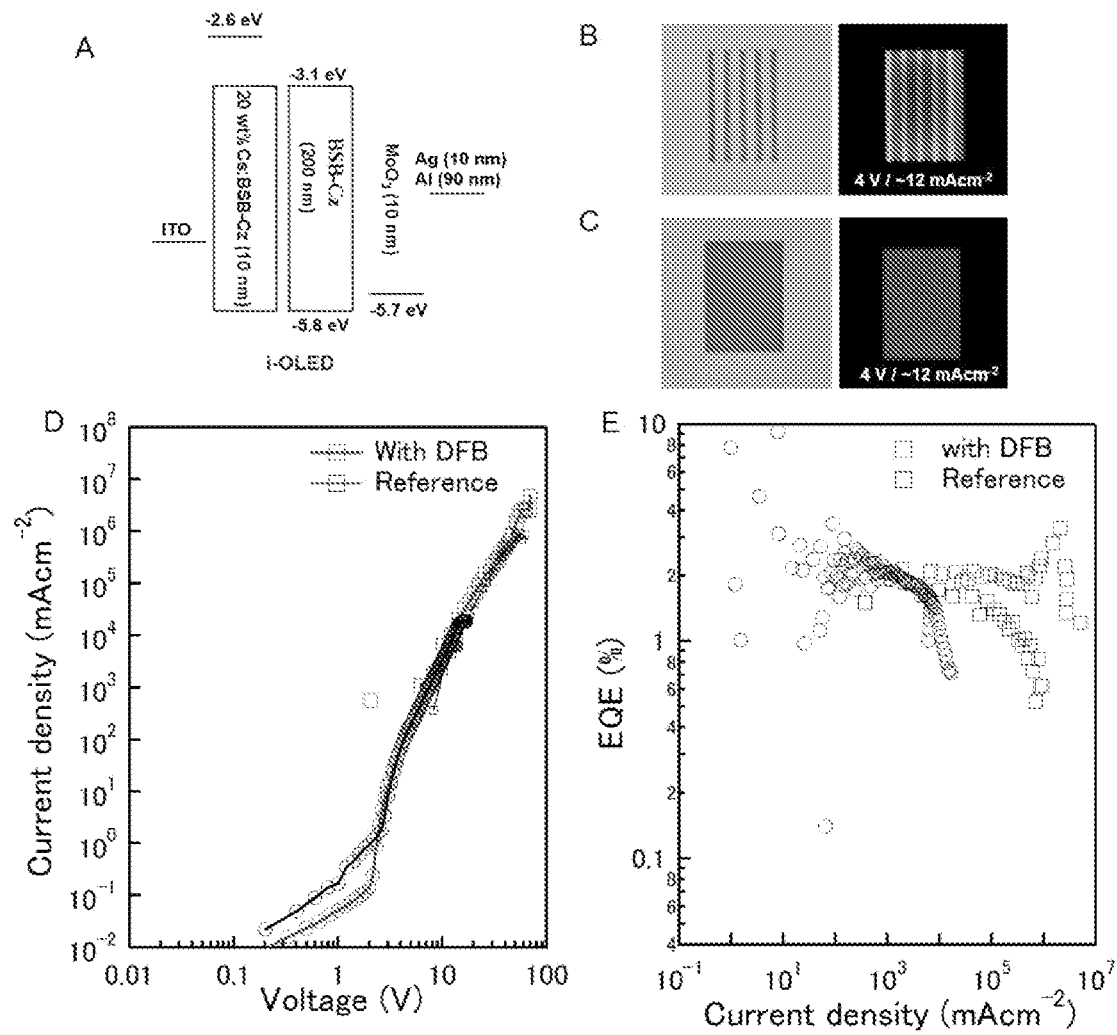
[Fig. 48]
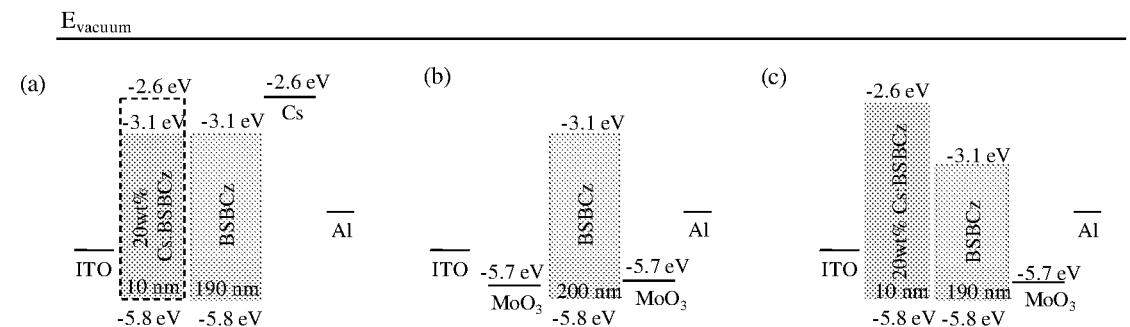

[Fig. 49]
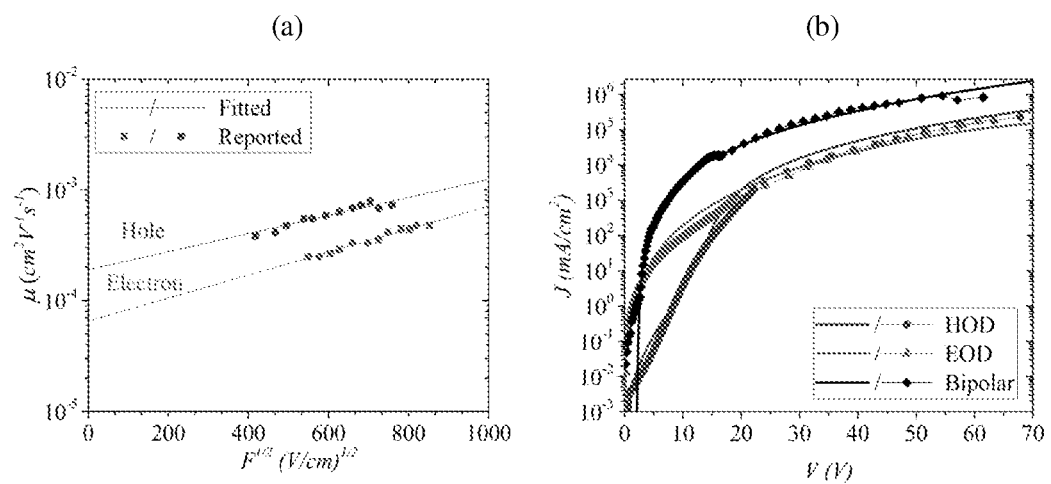
[Fig. 50]
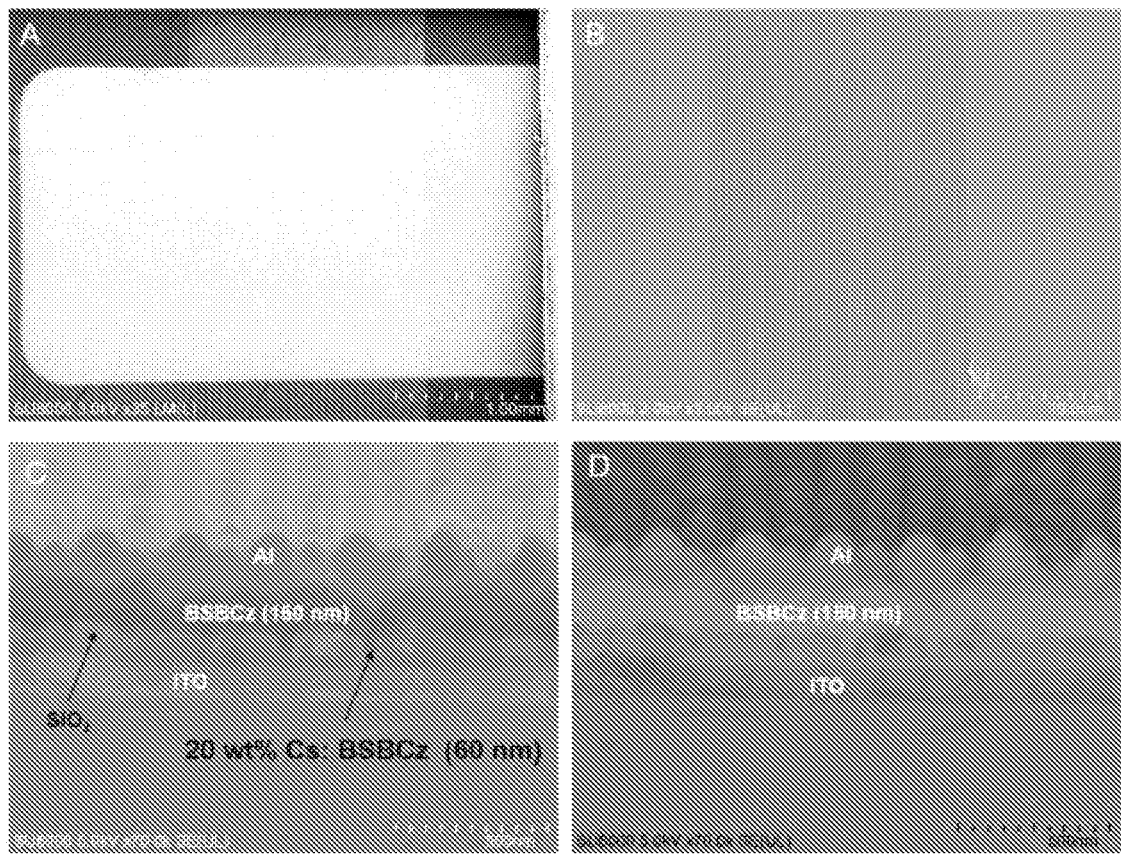

[Fig. 51]
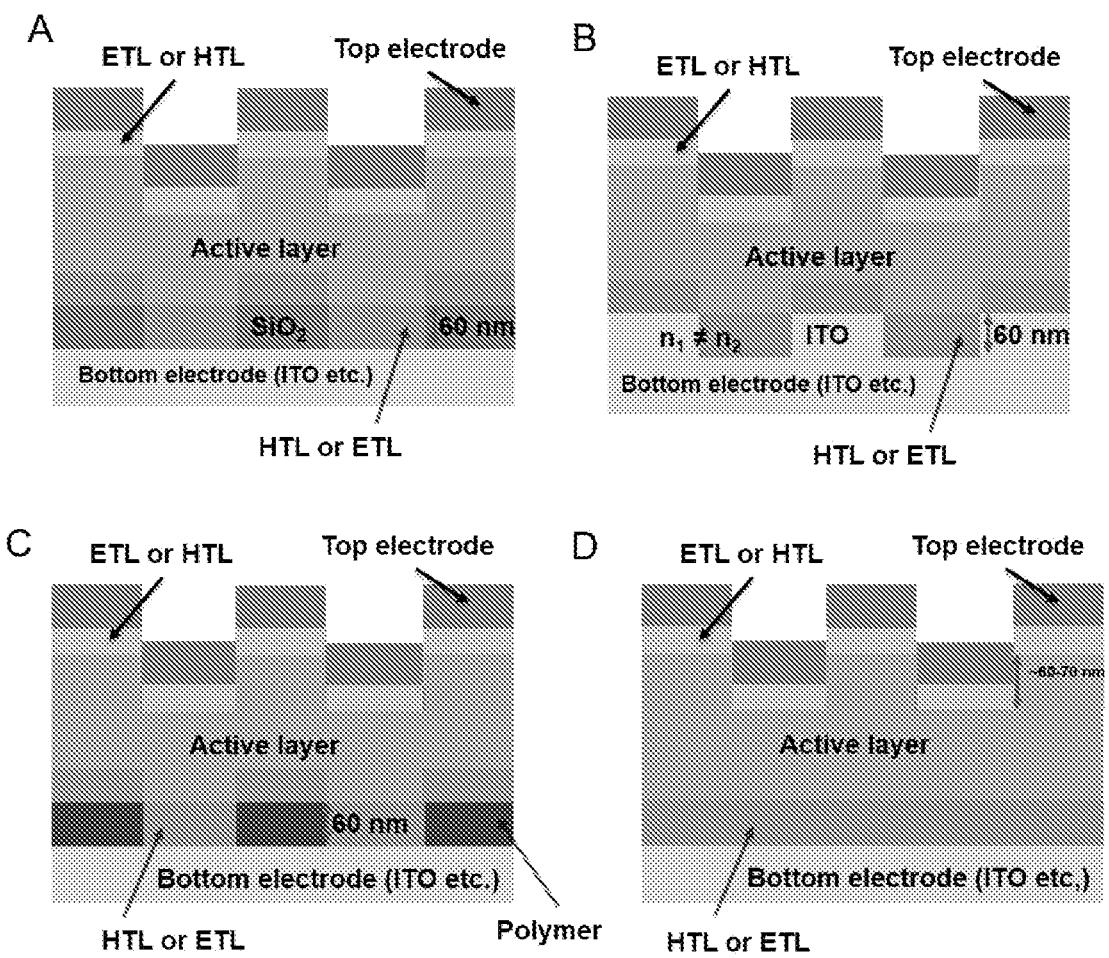
[Fig. 52]
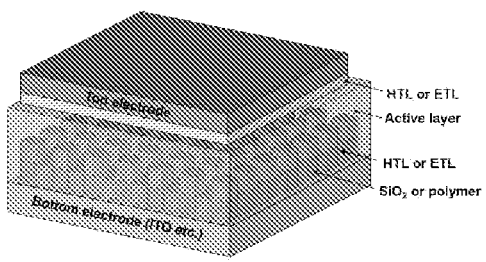

[Fig. 53]
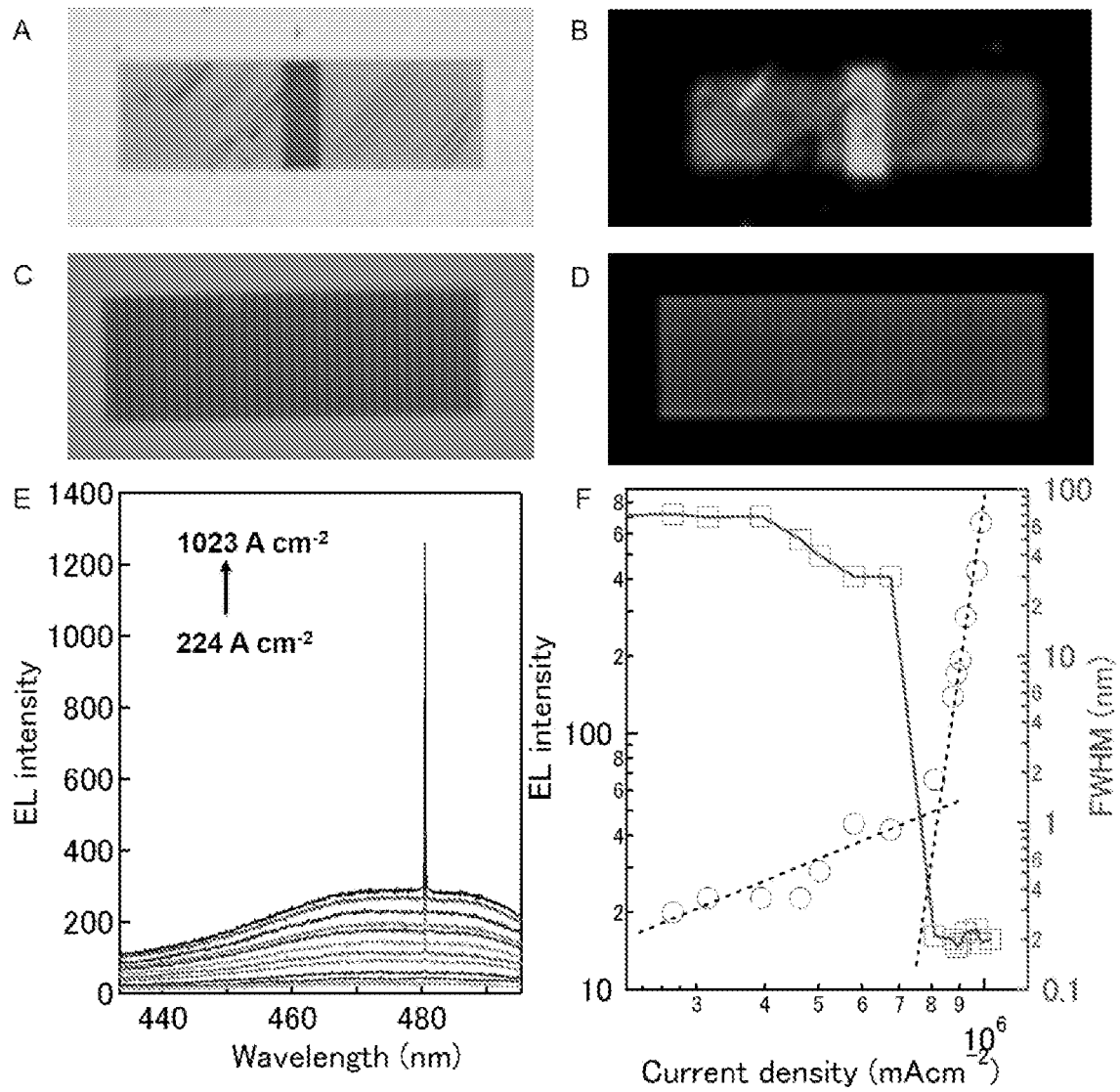
[Fig. 54]
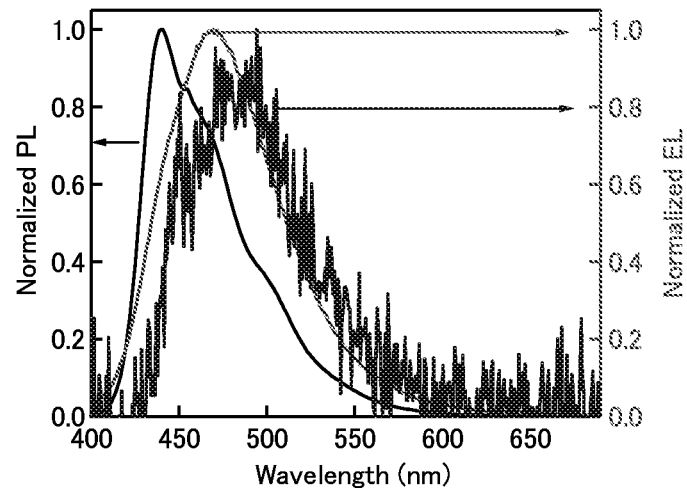

[Fig. 55]
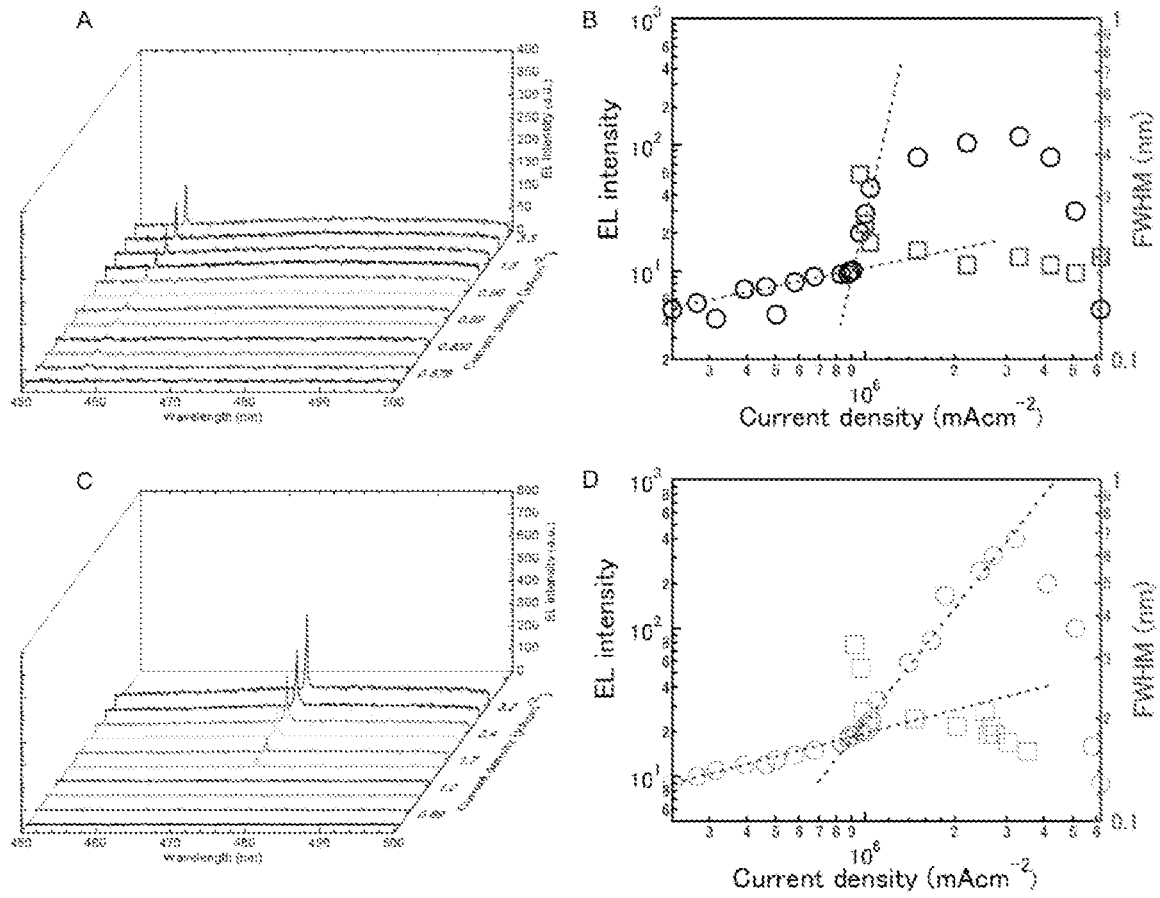
[Fig. 56]
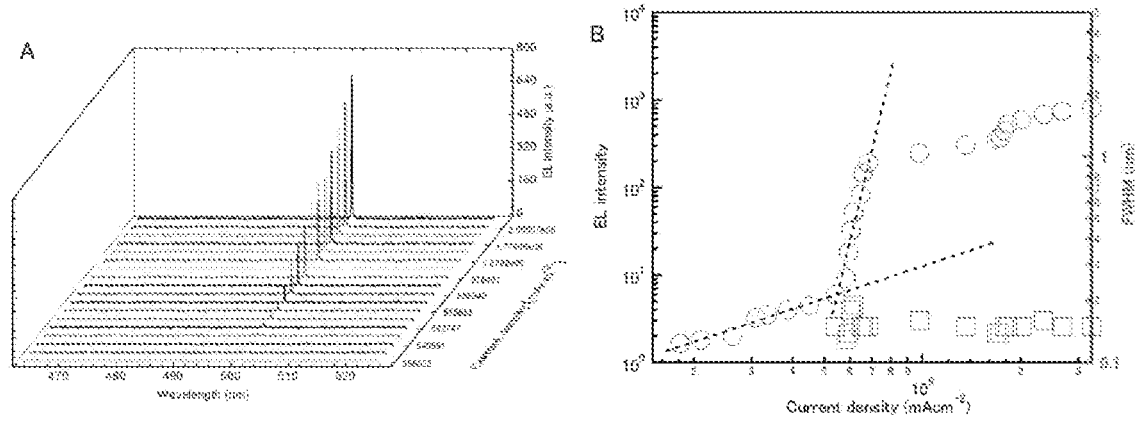

[Fig. 57]
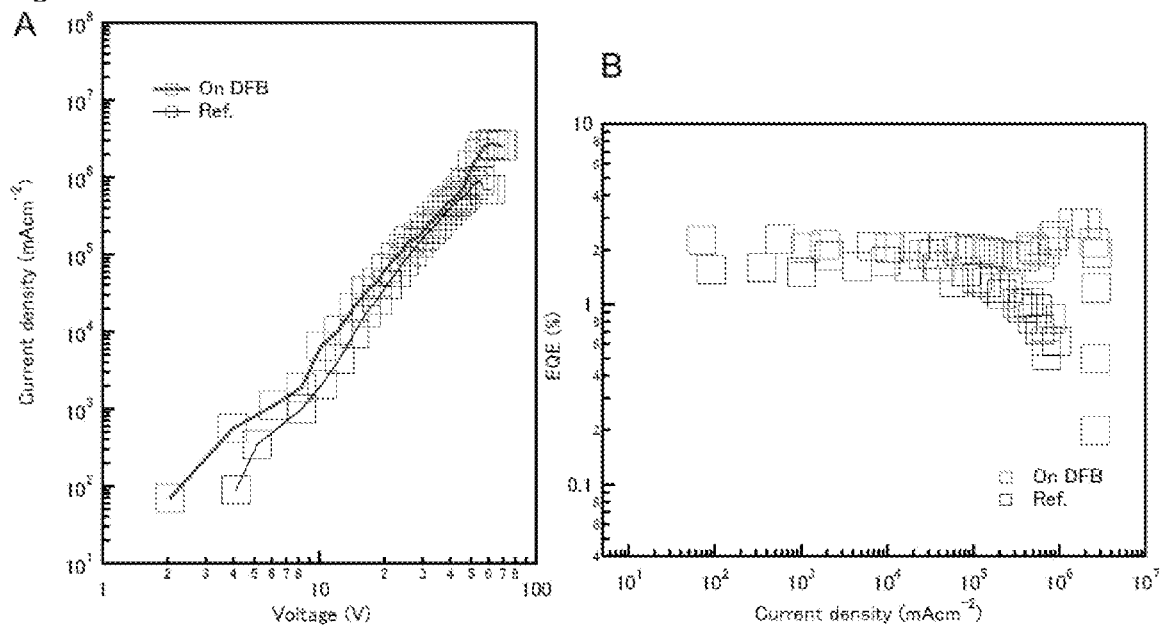
[Fig. 58]
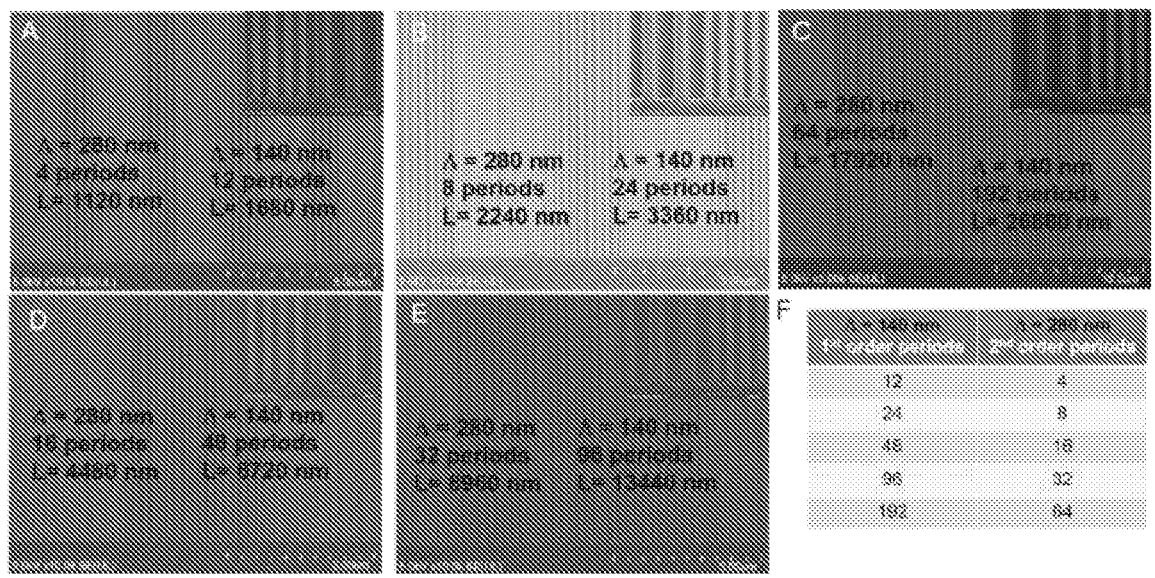

Fig. 59A (continued)
16 periods
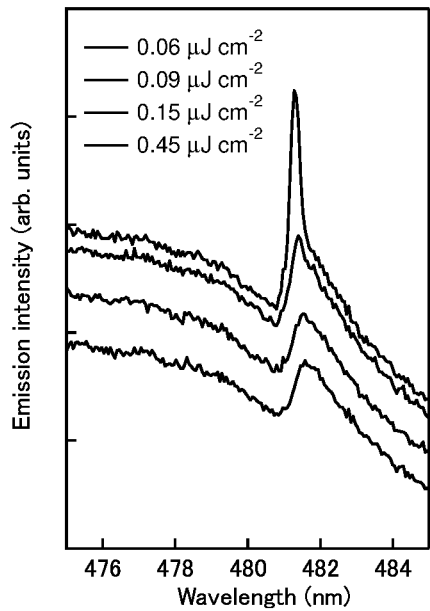
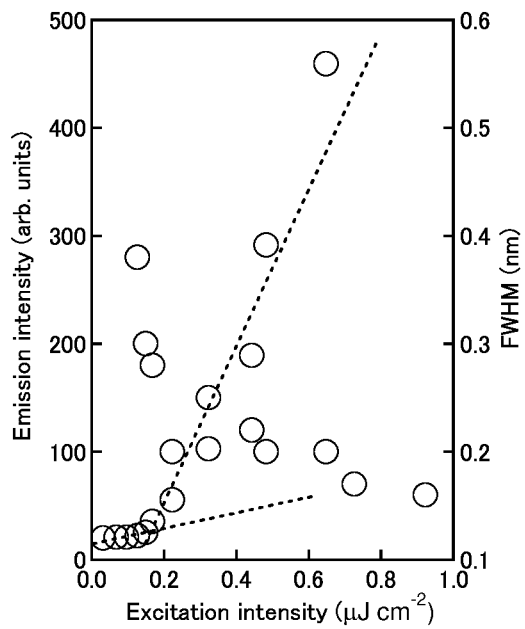
32 periods
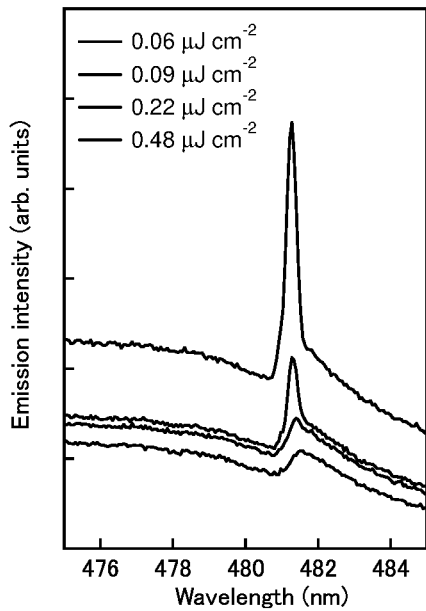
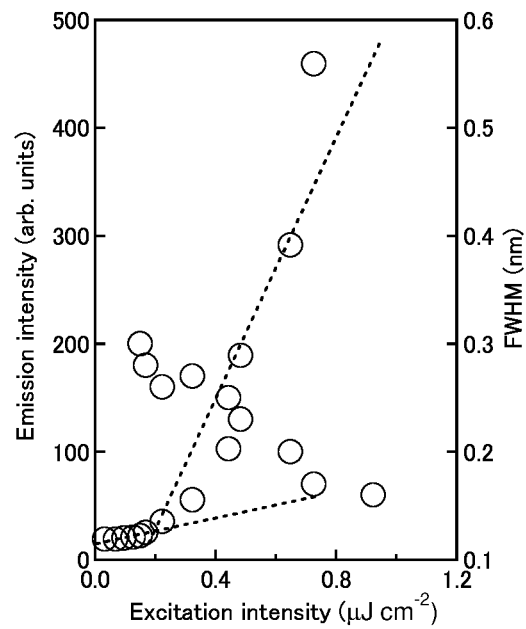

64 periods

[Fig. 60]
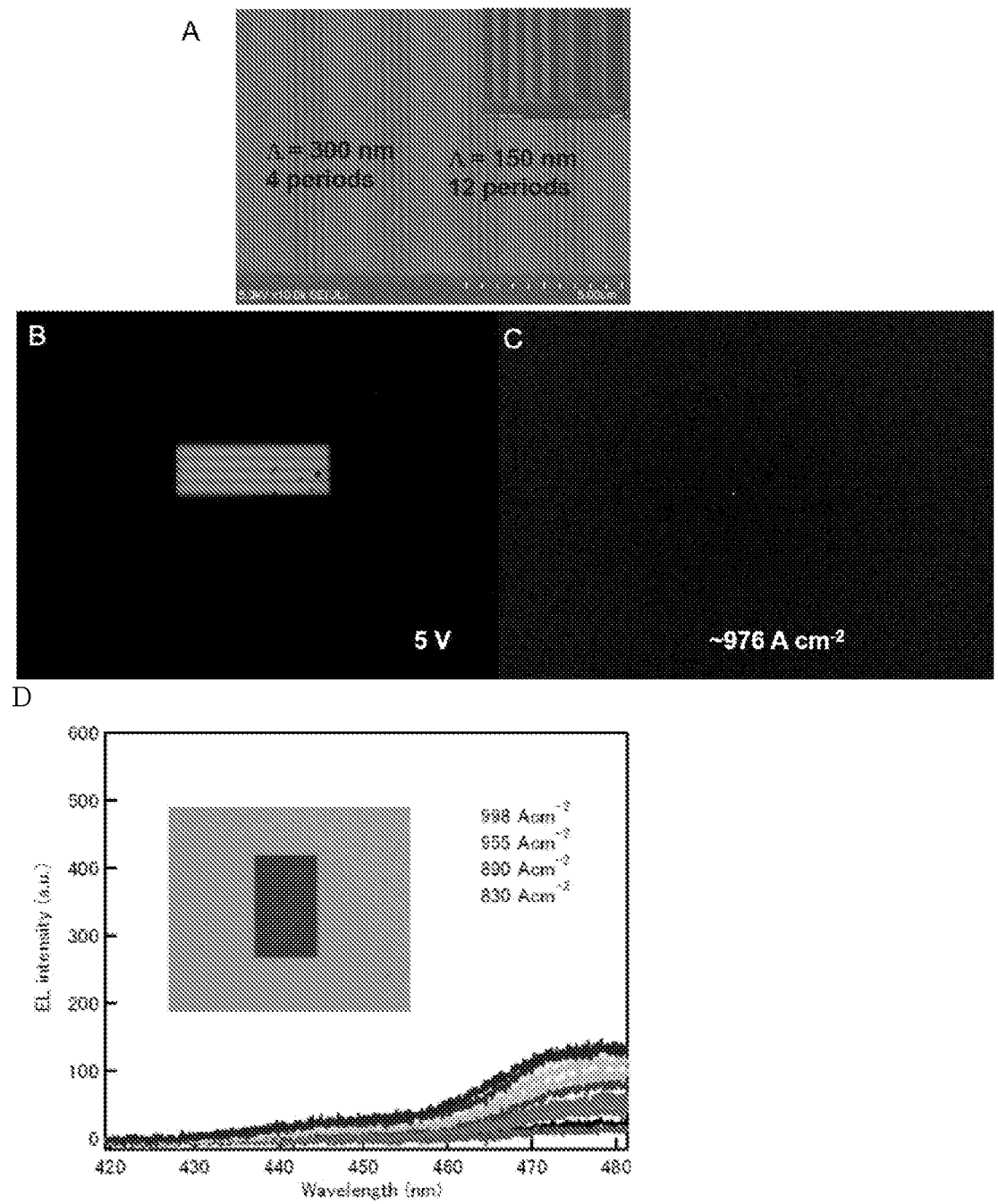

[Fig. 61]
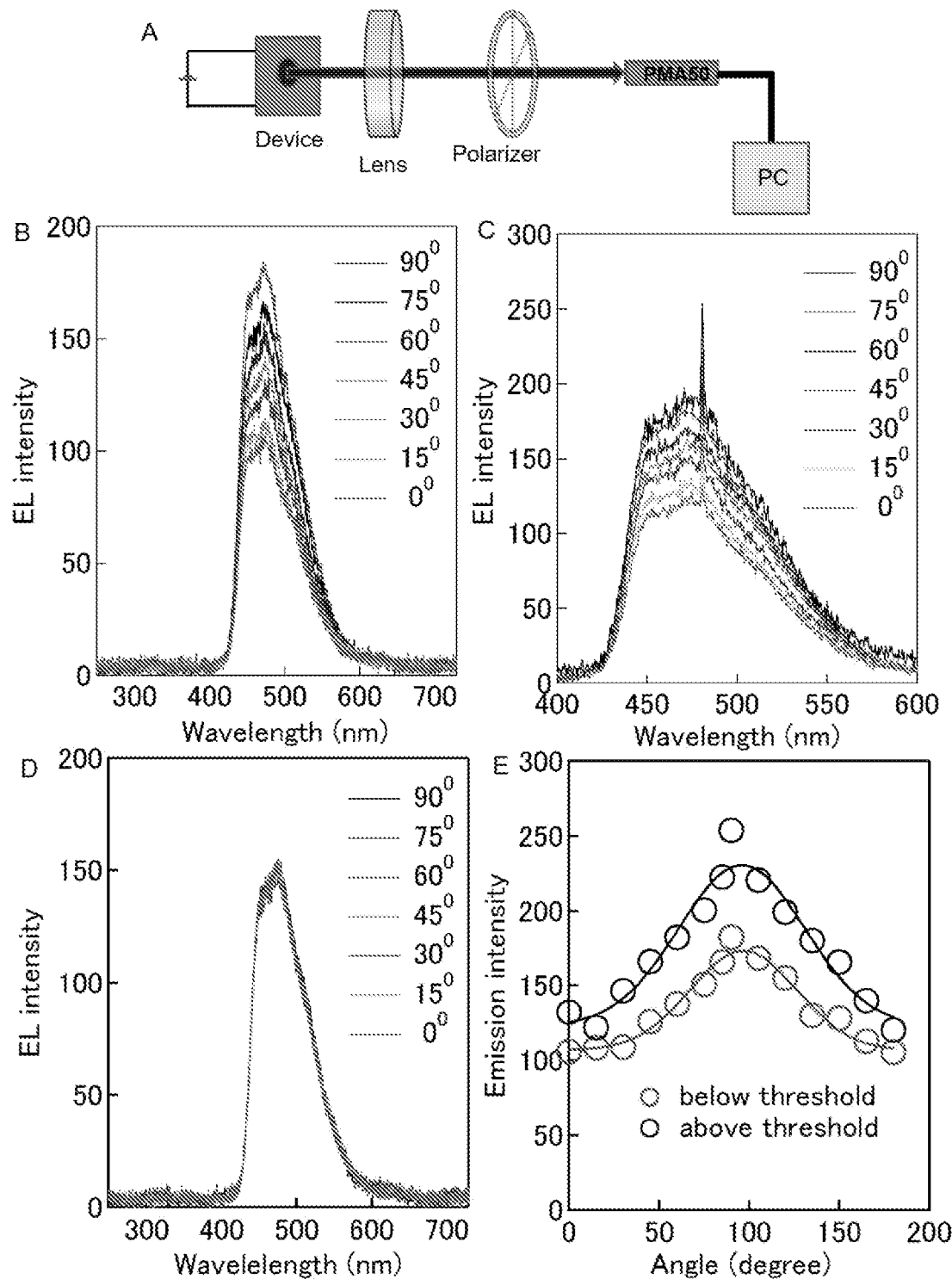

[Fig. 62]
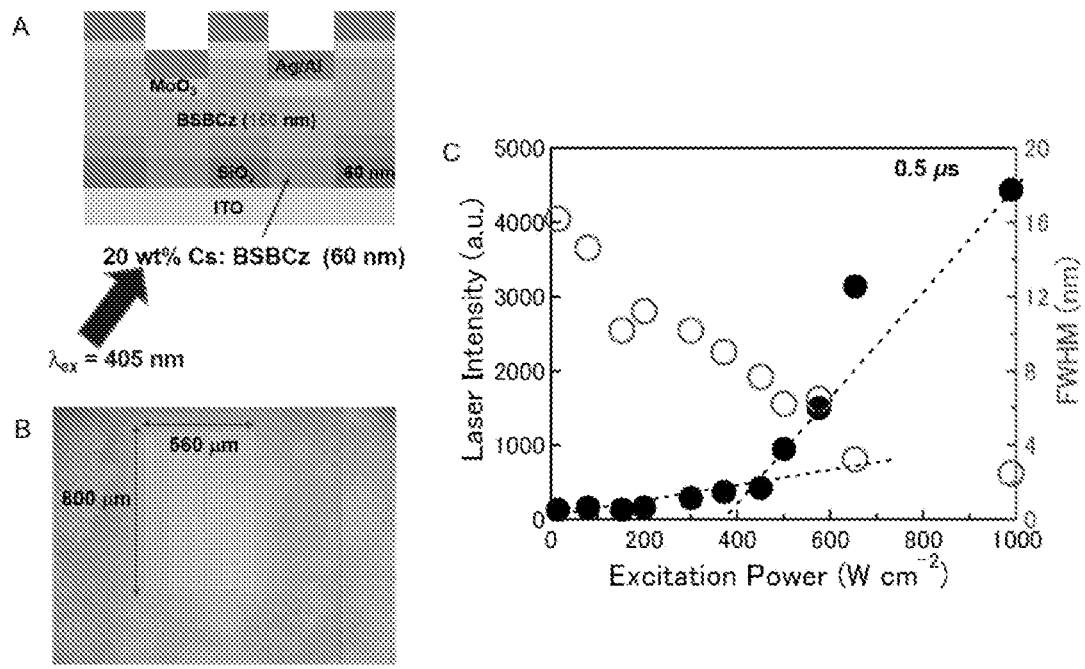
[Fig. 63]
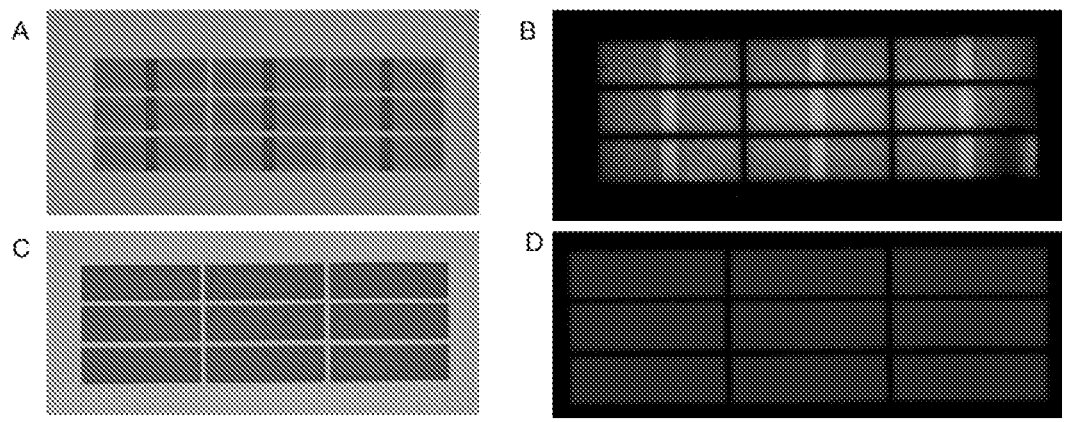

[Fig. 64]
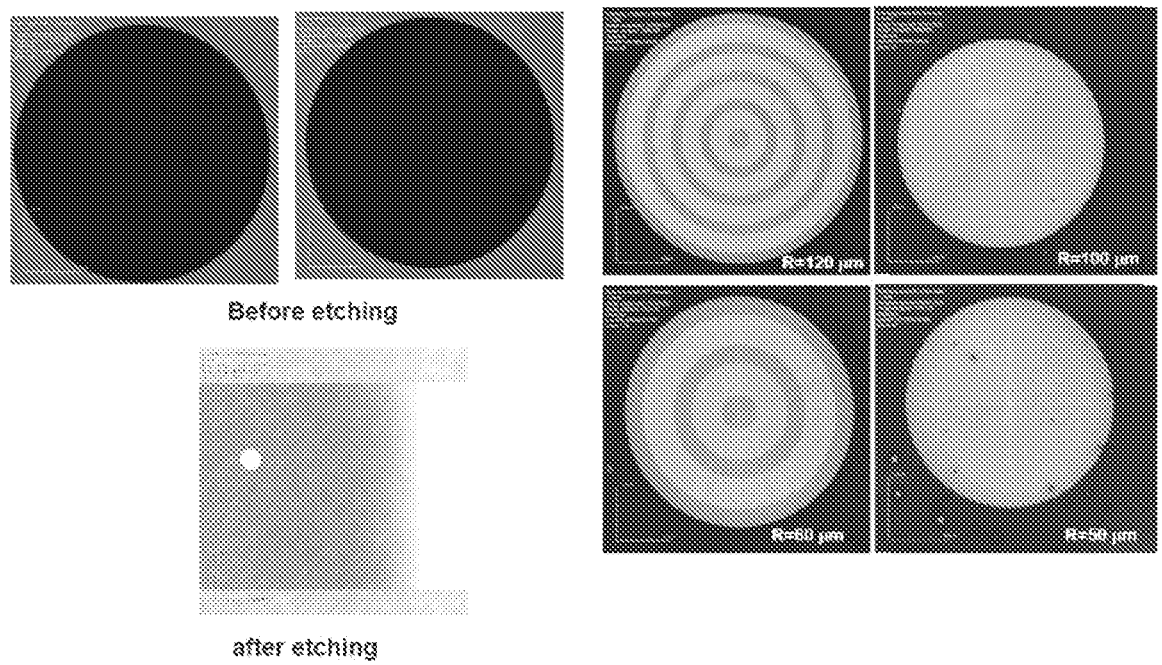
[Fig. 65]
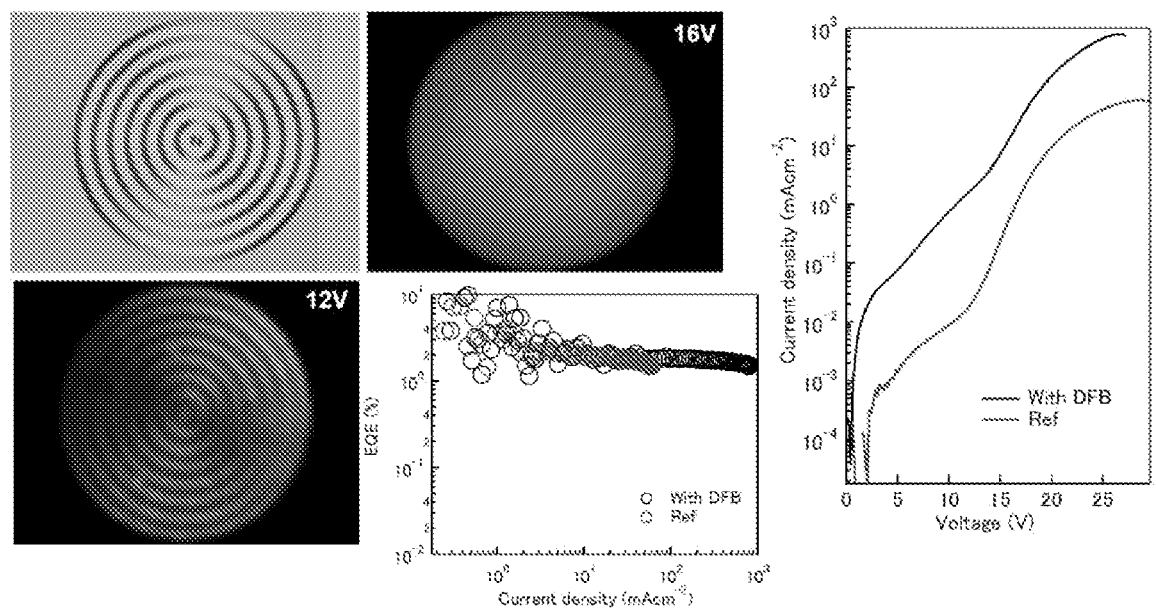

[Fig. 66]
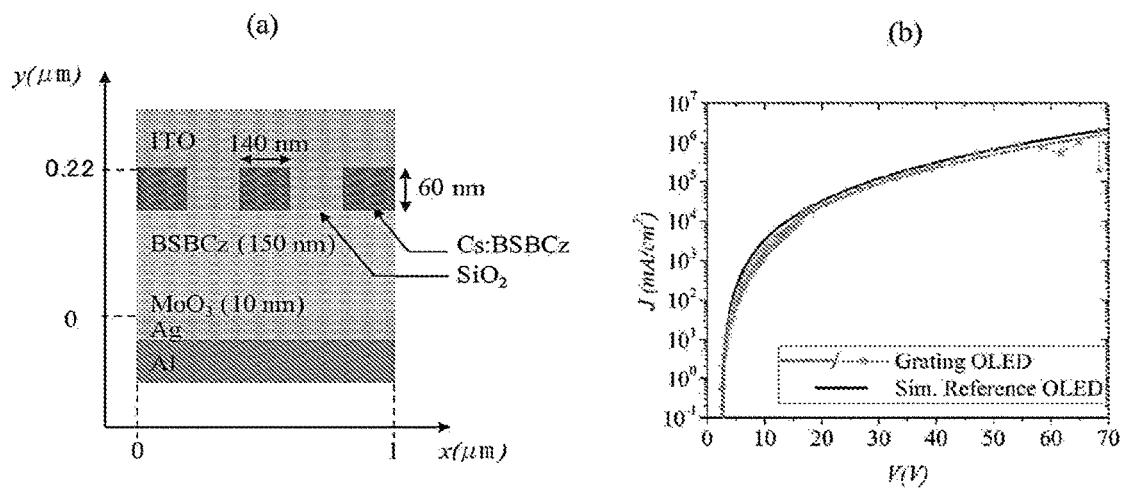
[Fig. 67]
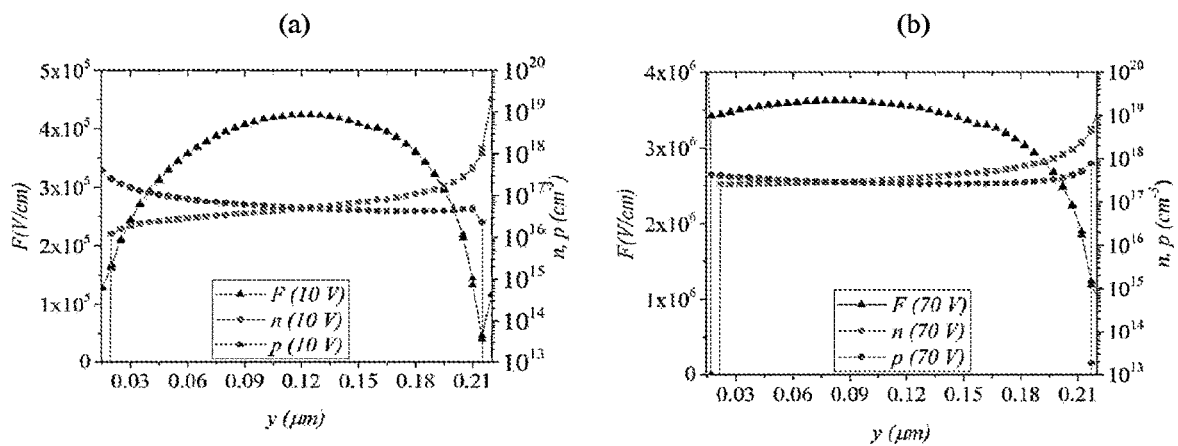

[Fig. 68]
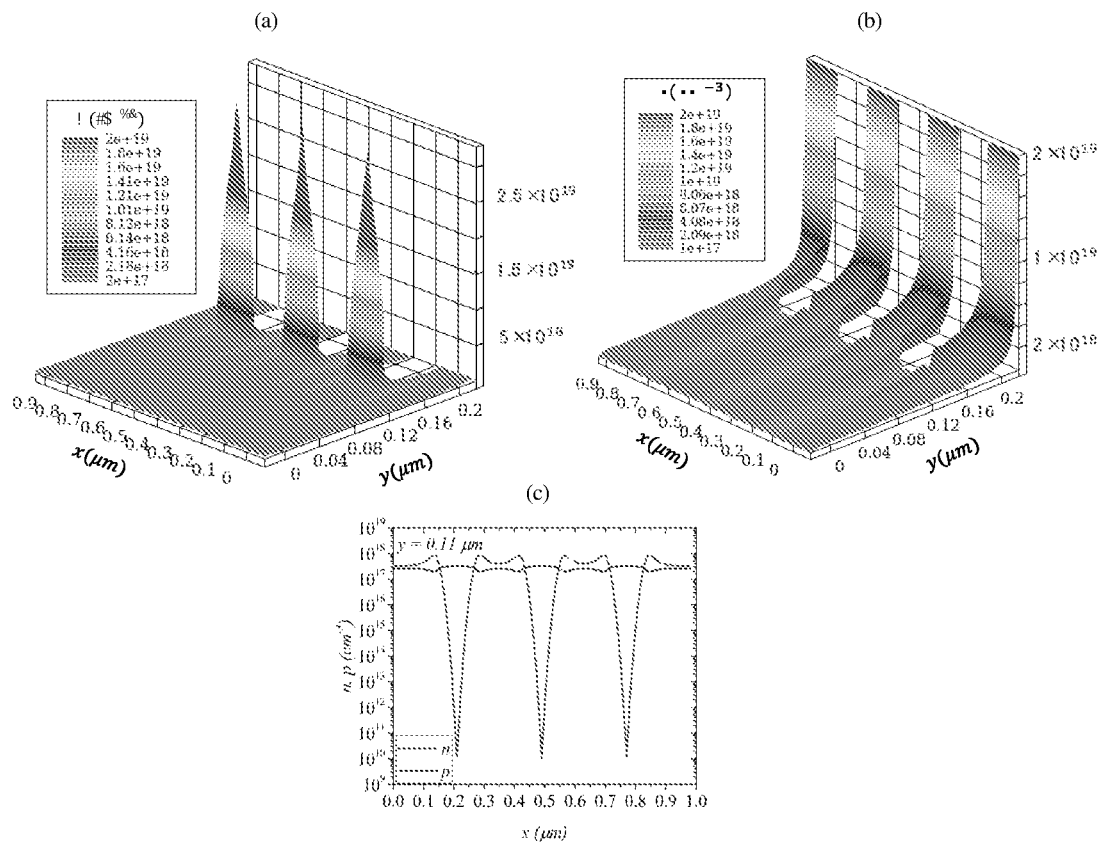
[Fig. 69]
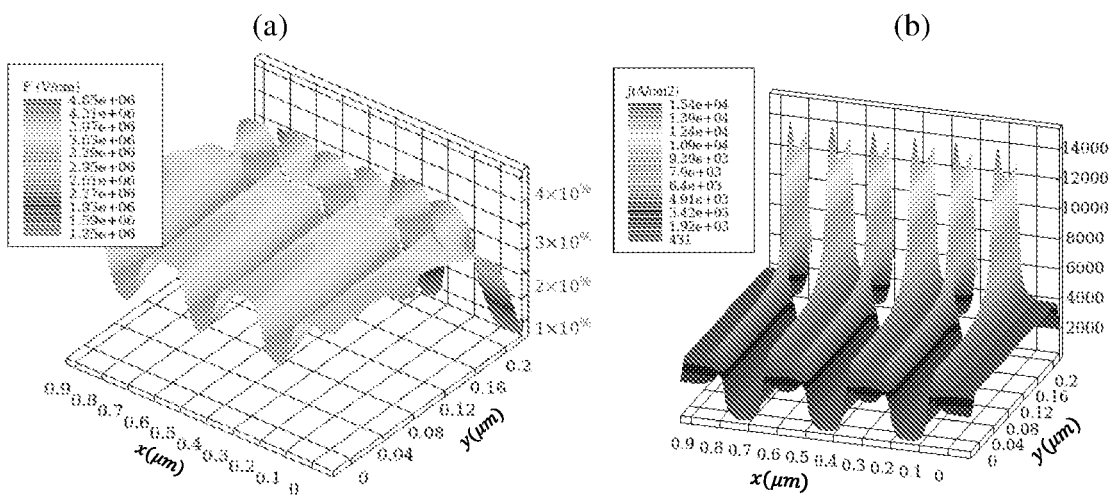

[Fig. 70]
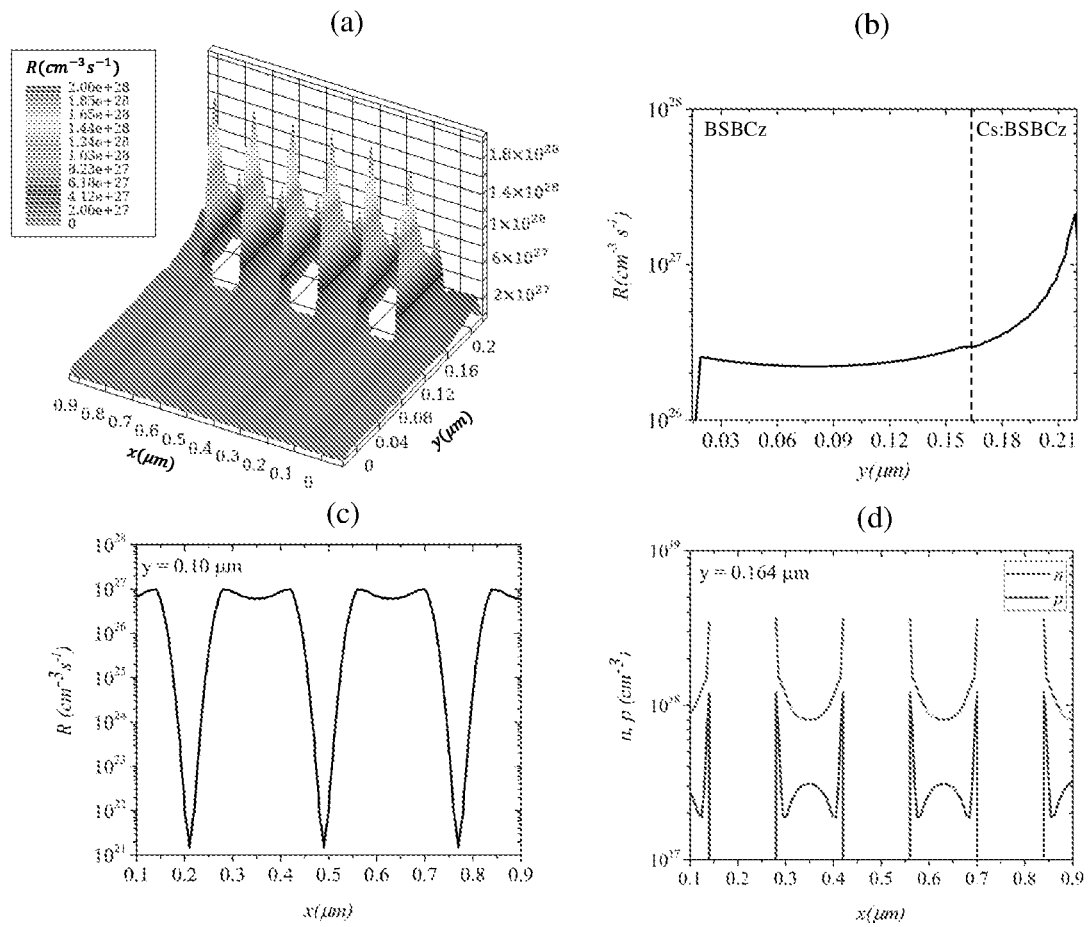
[Fig. 71]
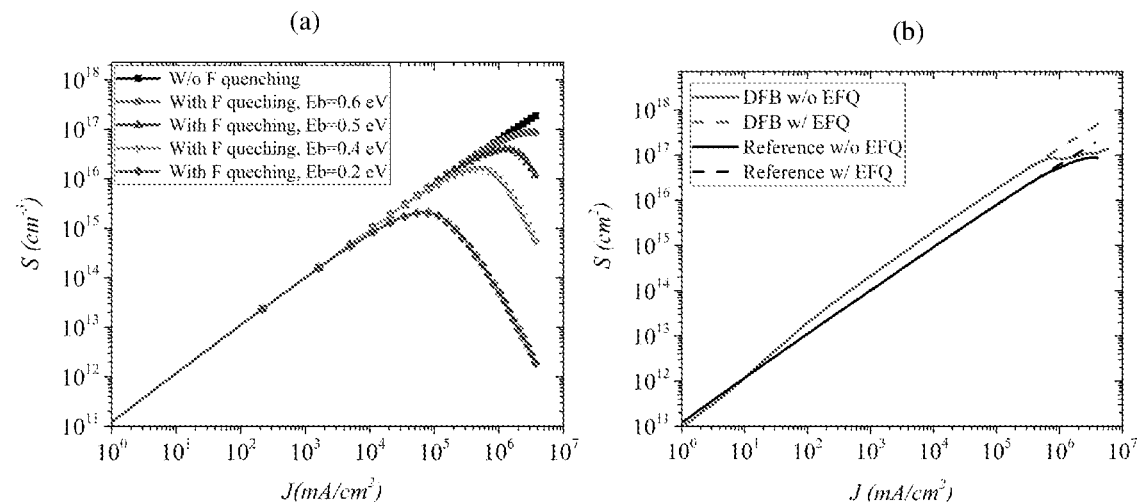

[Fig. 72]
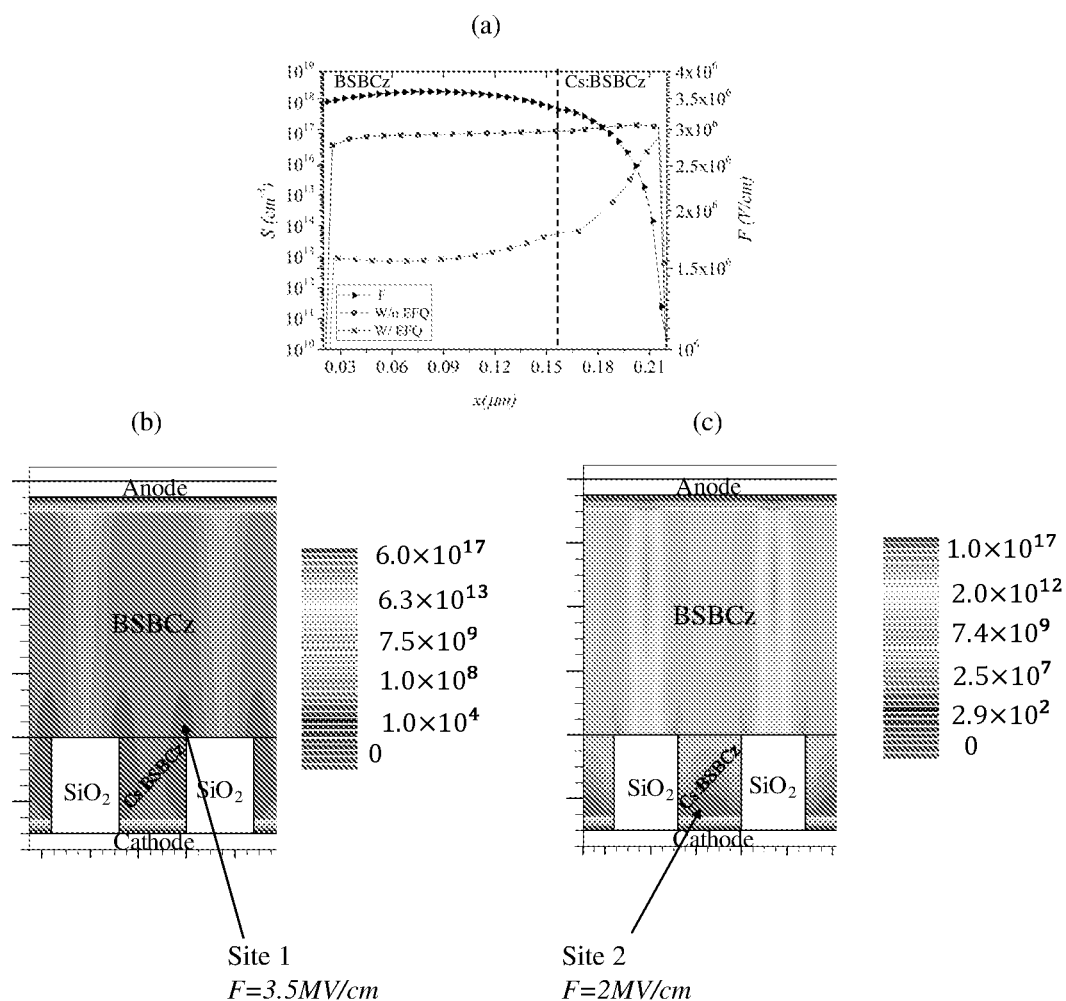

[Fig. 73]
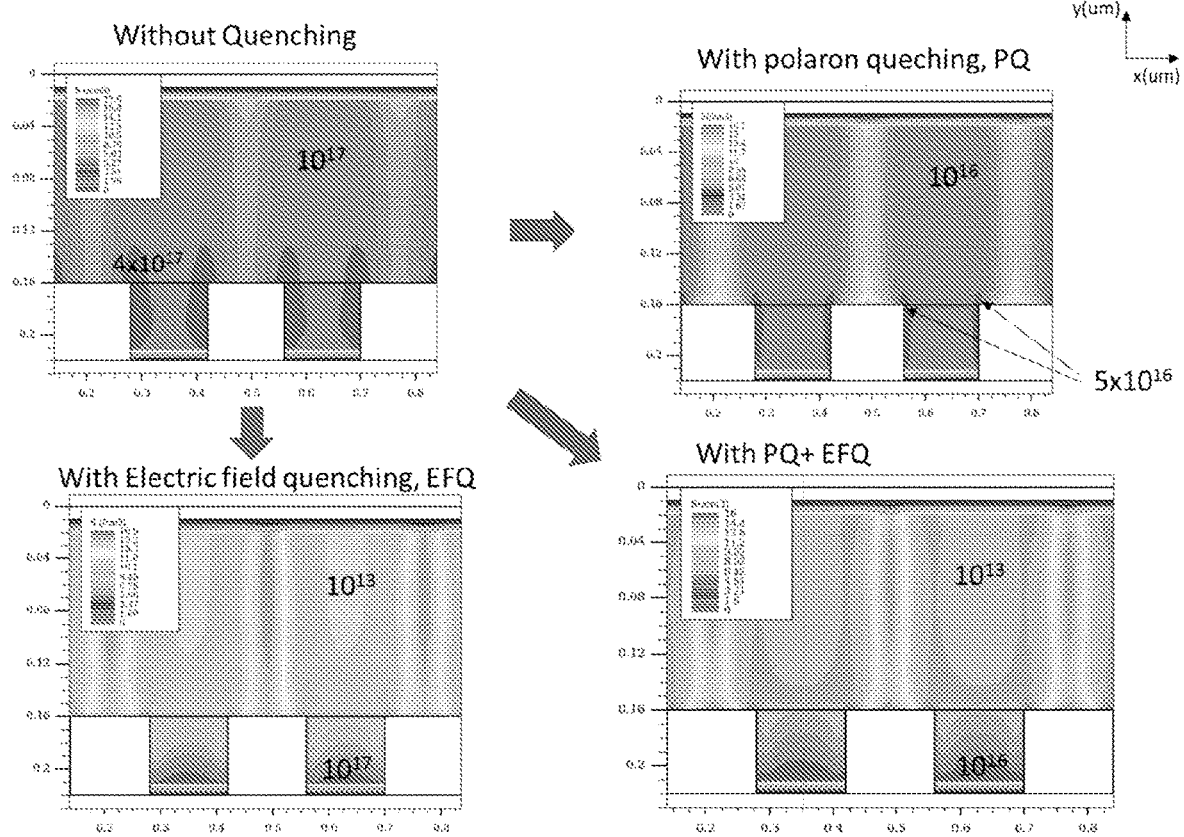
[Fig. 74]
Modal intensity profile $I(x,y)$     Mixed-order DFB
$d_t = 150$ nm $+ h_g$
Air/BSBCZ/SiO$_2$
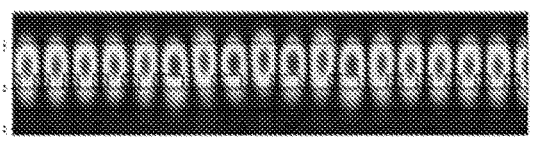
Q=1112, λ=481 nm, Γ=0.77
Air/BSBCZ/SiO$_2$/ITO
Q=714, λ=487 nm, Γ=0.48
Al/Ag/MoO$_x$/BSBCZ/SiO$_2$/ITO
Q=239, λ=483 nm, Γ=0.38

[Fig. 75]
(a)
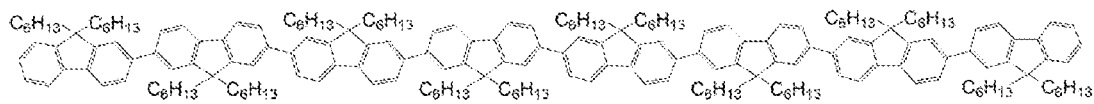
(b)
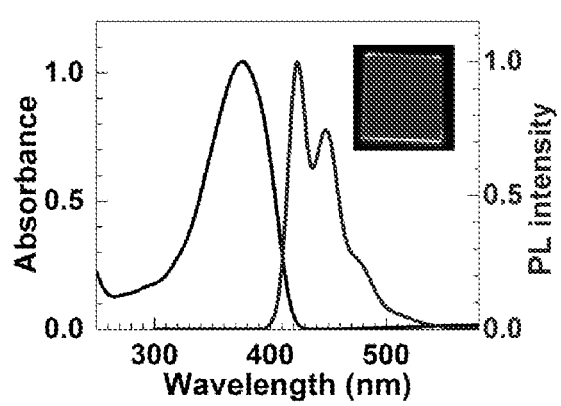
(c)
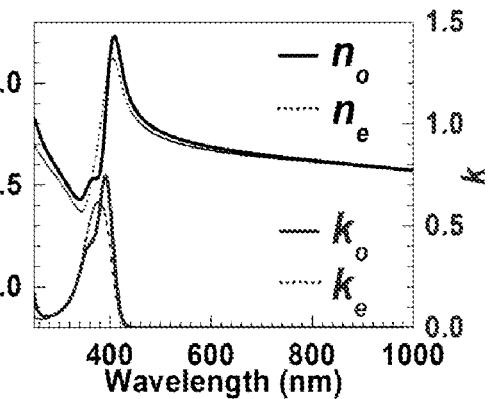
[Fig. 76]
(a)
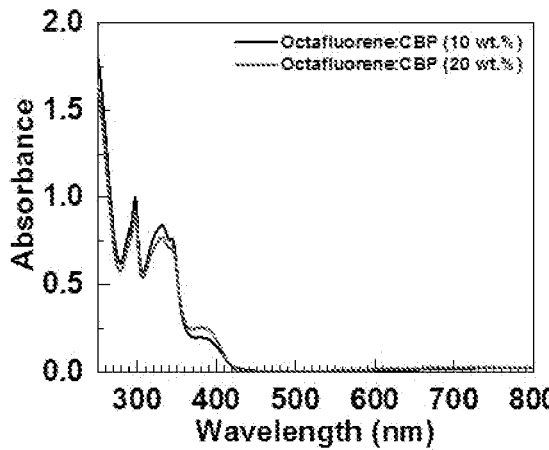
(b)
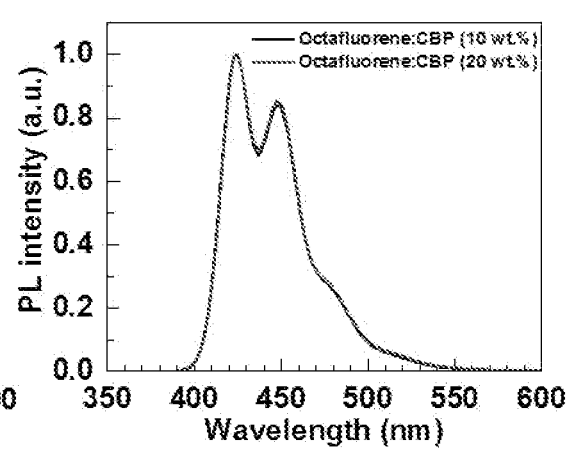

[Fig. 77]
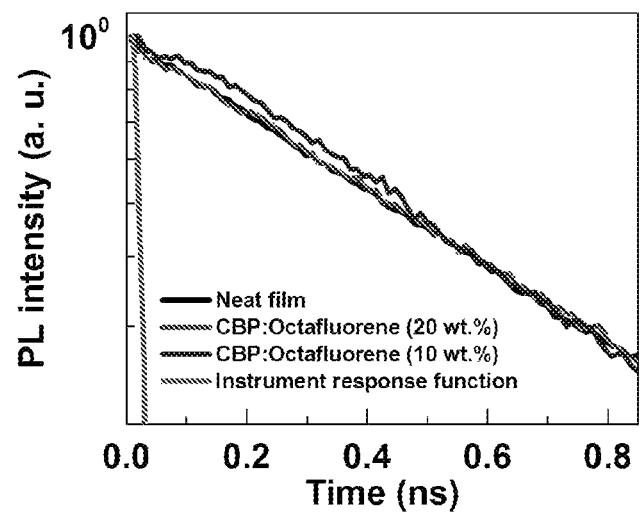
[Fig. 78]
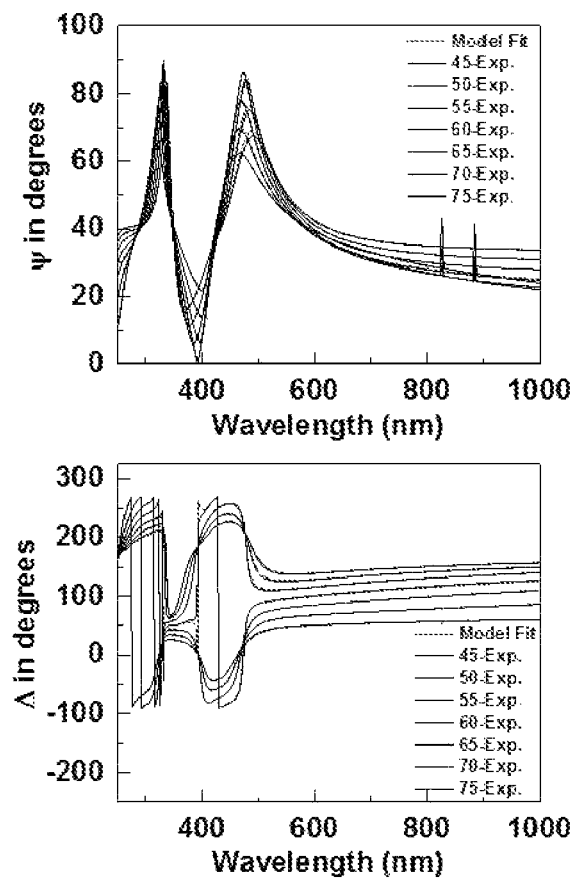

[Fig. 79]
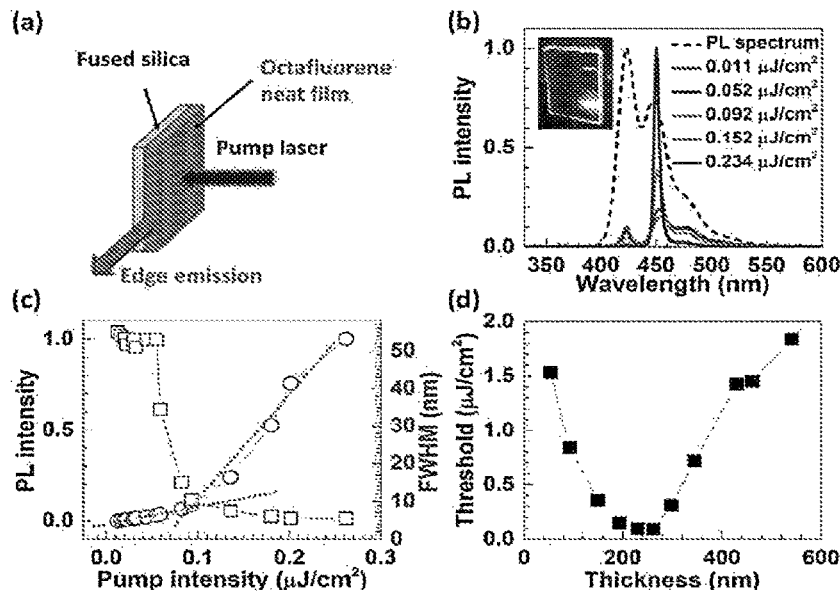
[Fig. 80]
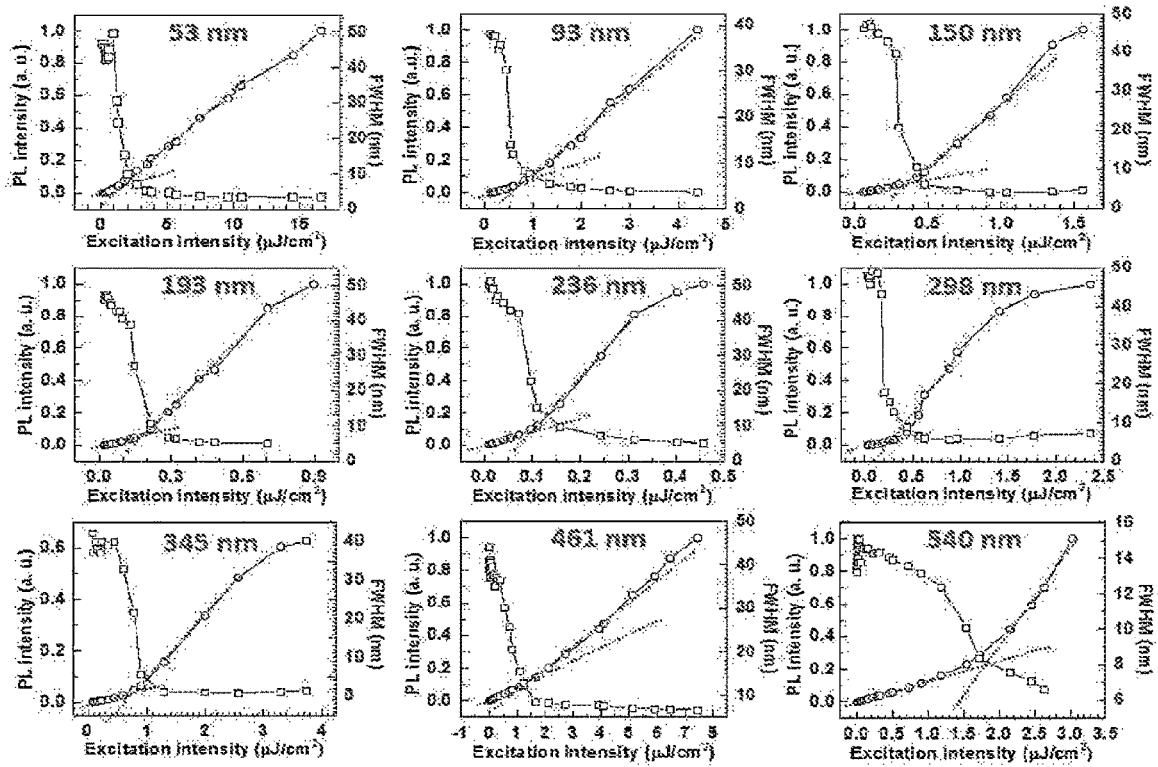

[Fig. 81]
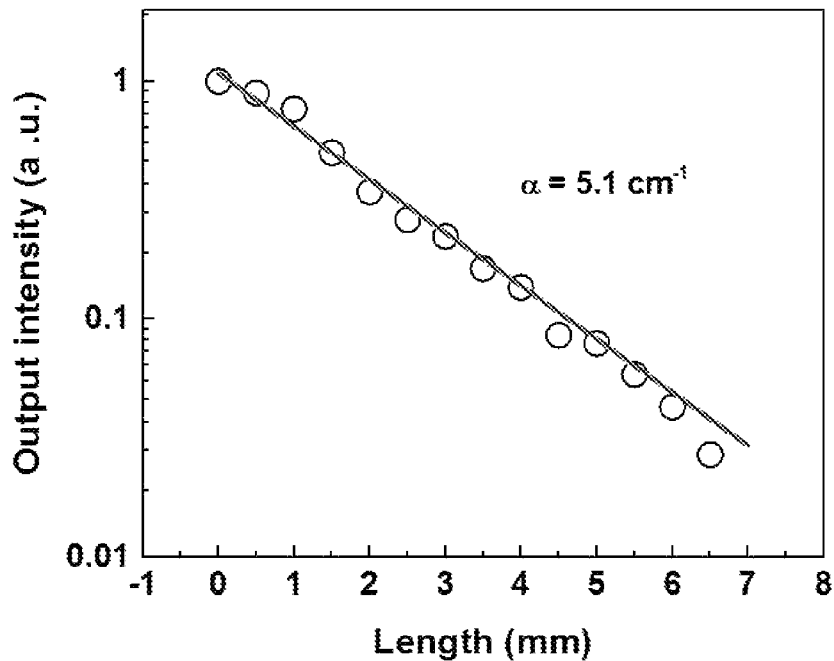
[Fig. 82]
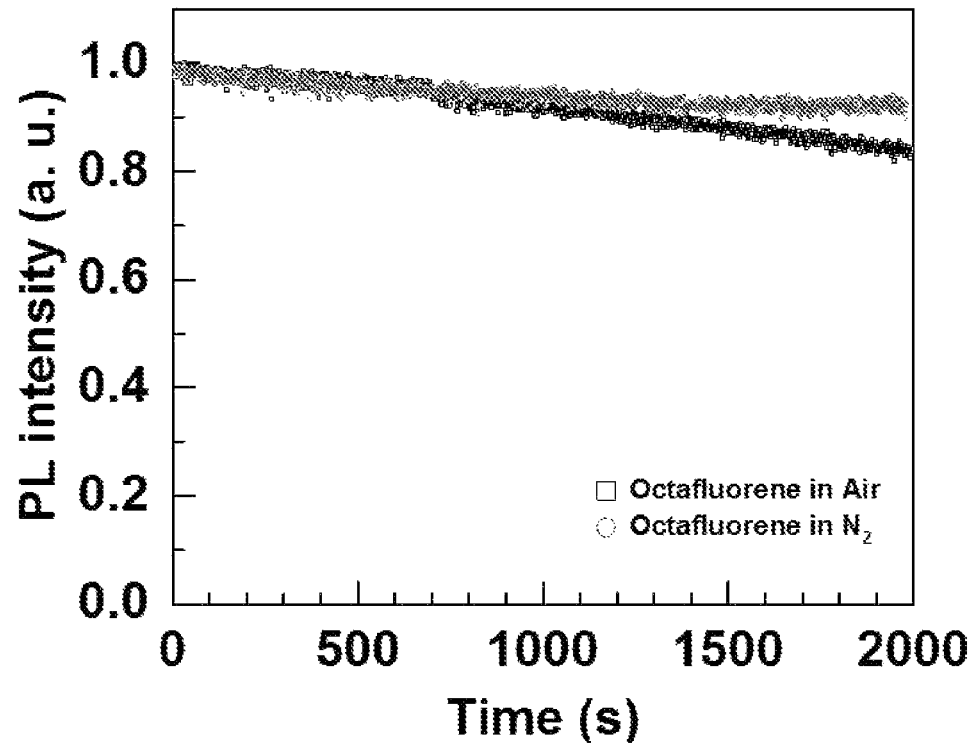

[Fig. 83]
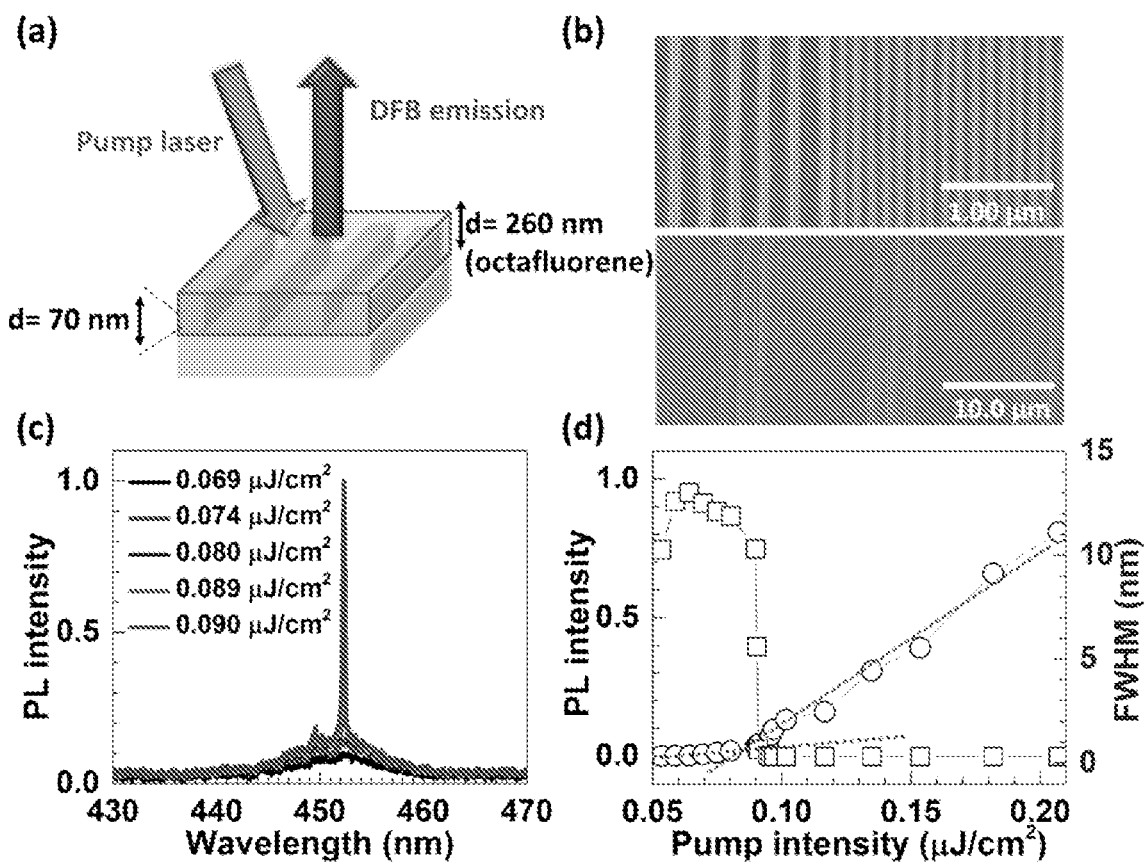

[Fig. 84]
(a)
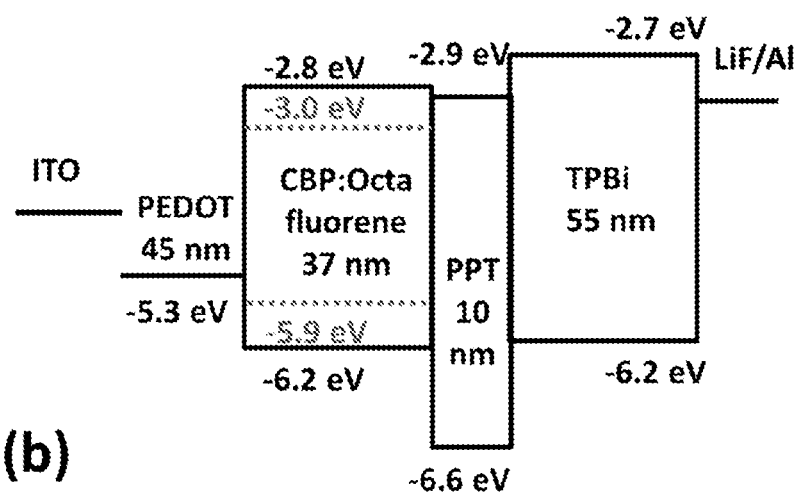
(b)
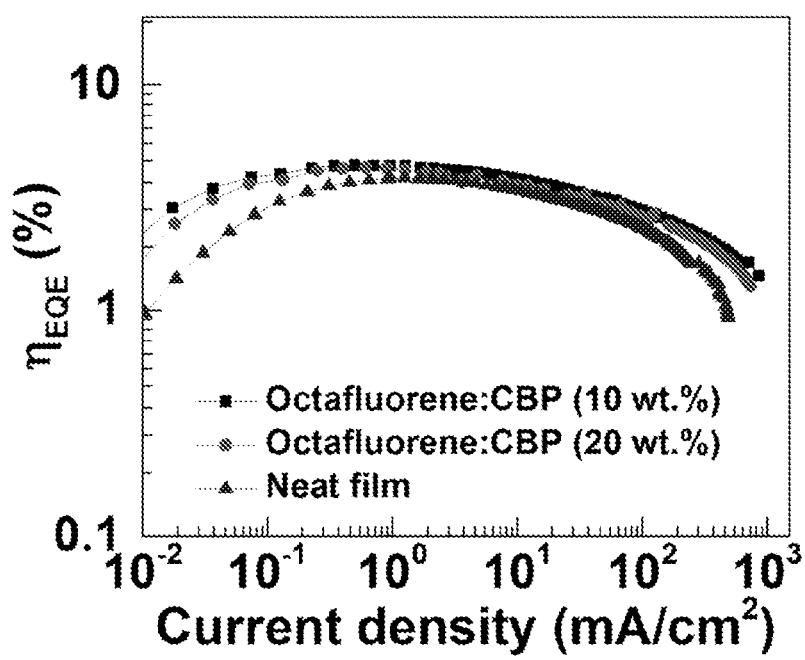

[Fig. 85]
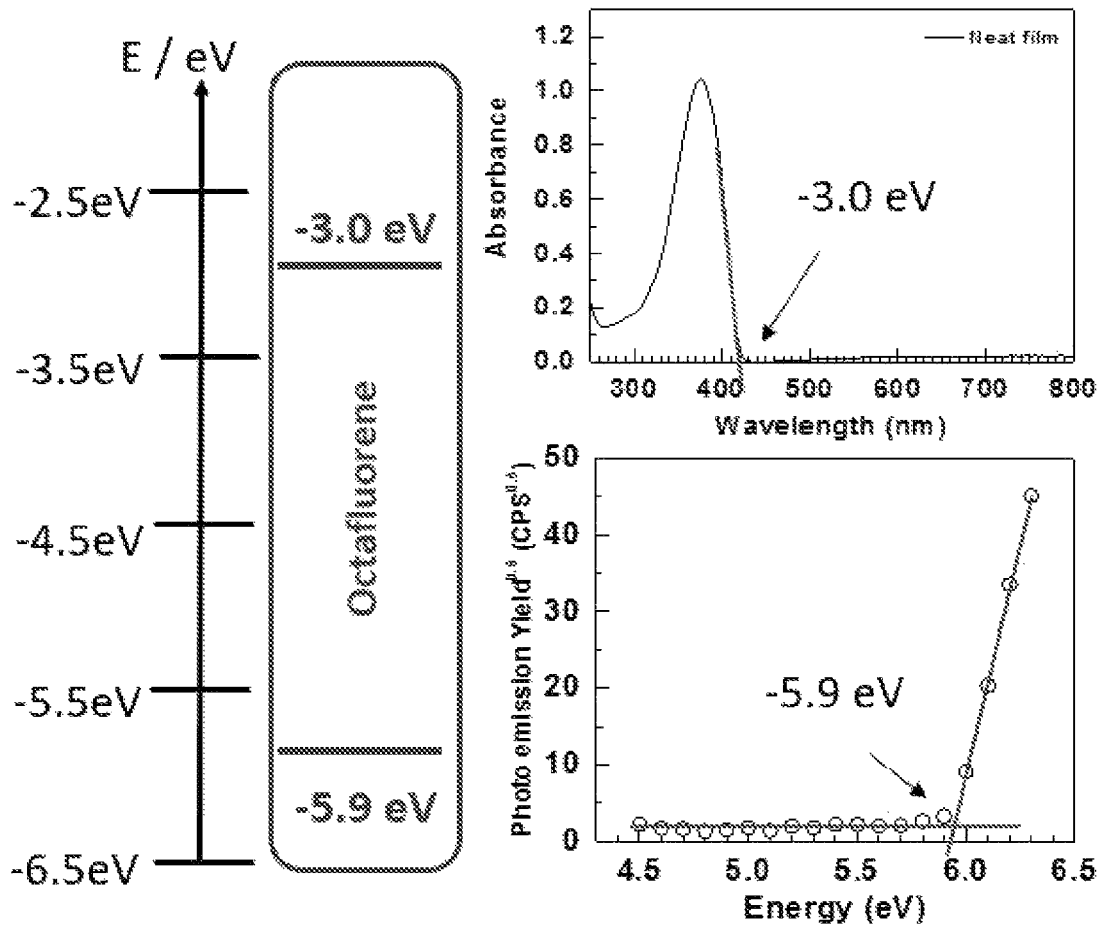
[Fig. 86]
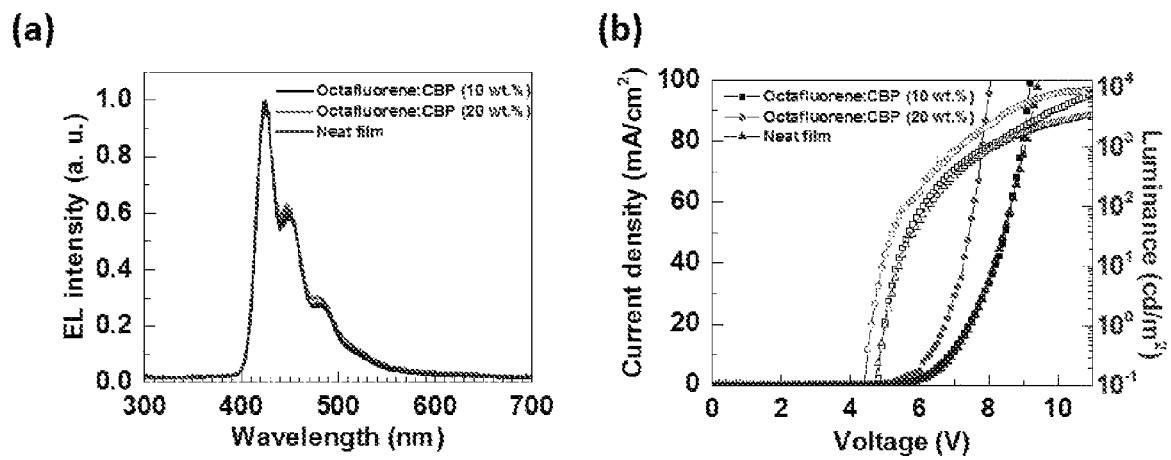

[Fig. 87]
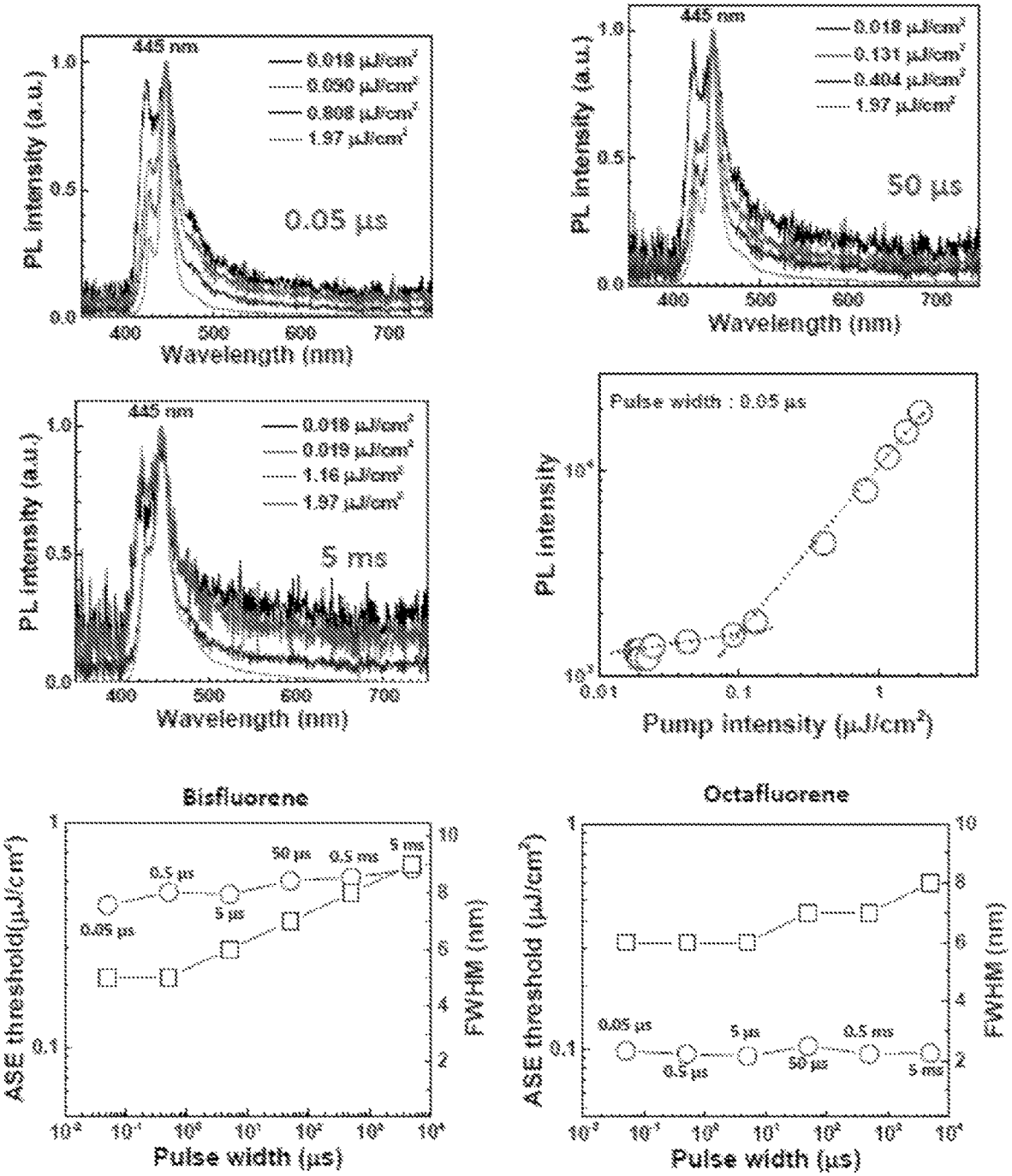

[Fig. 88]
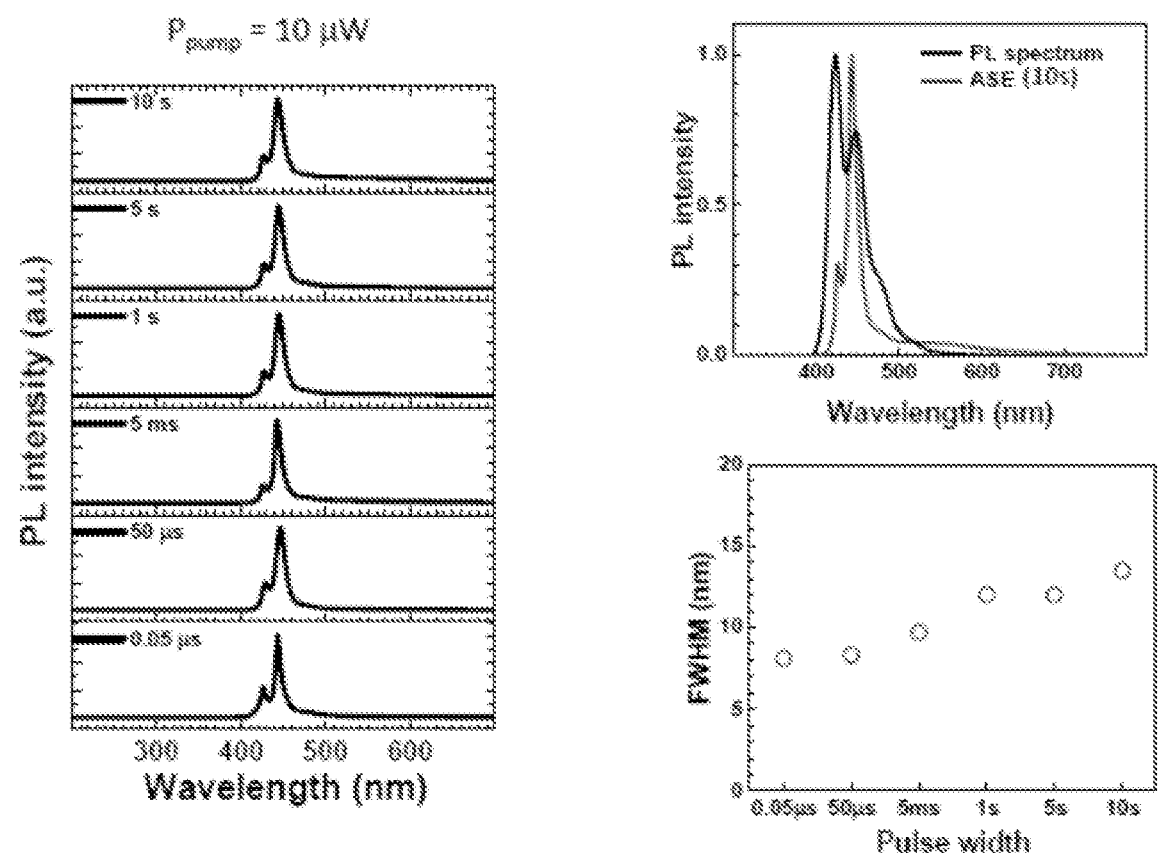

[Fig. 89]
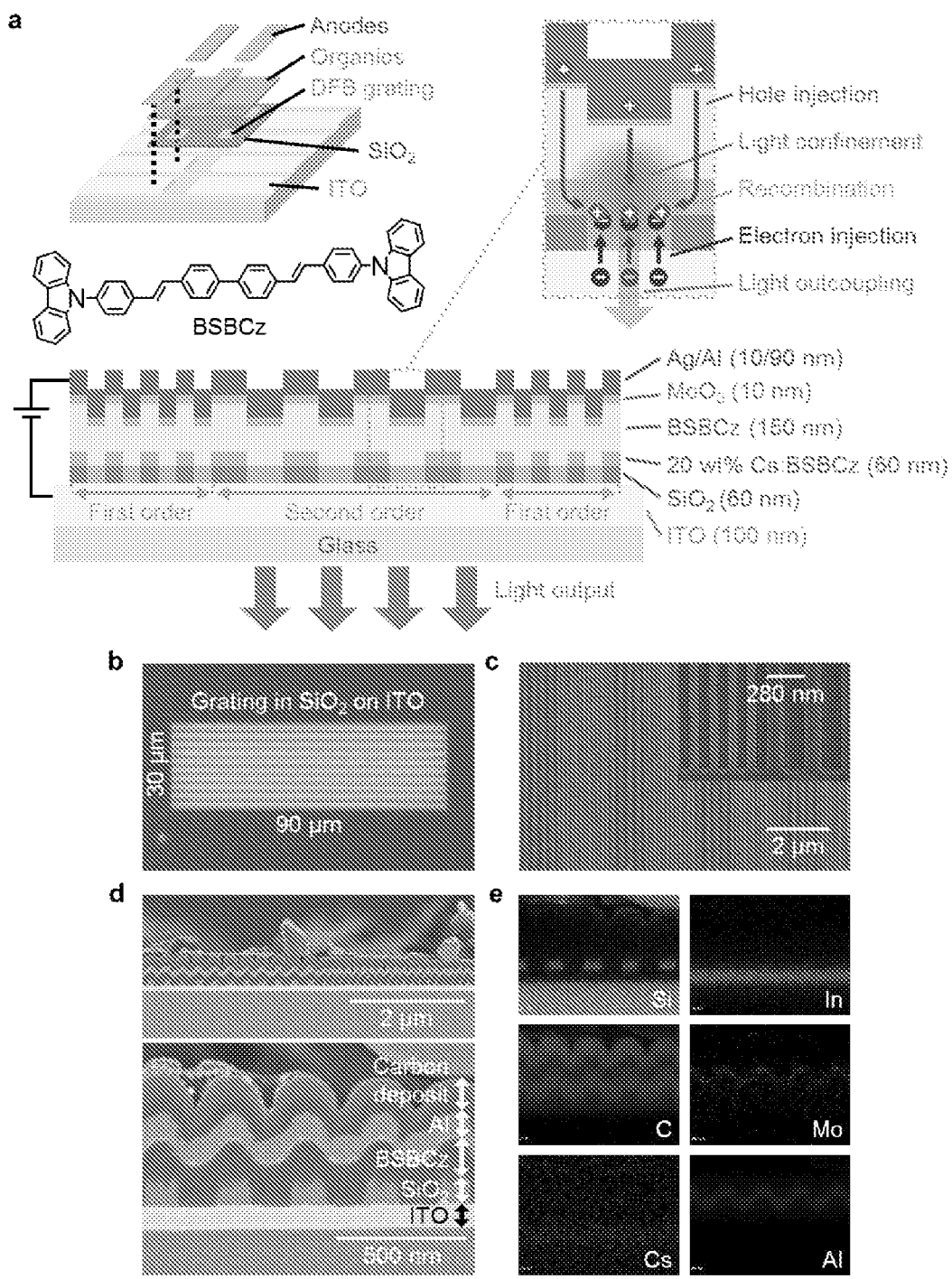

[Fig. 90]
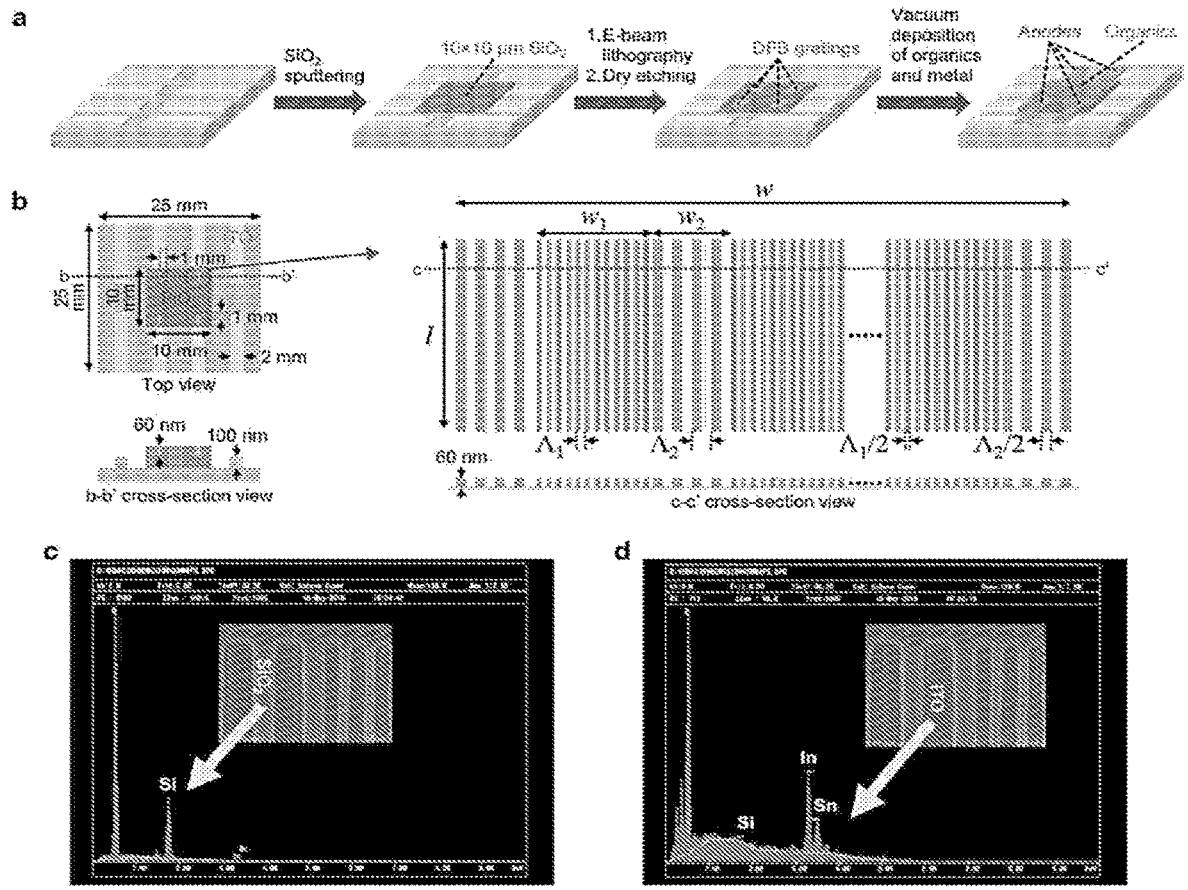
[Fig. 91]
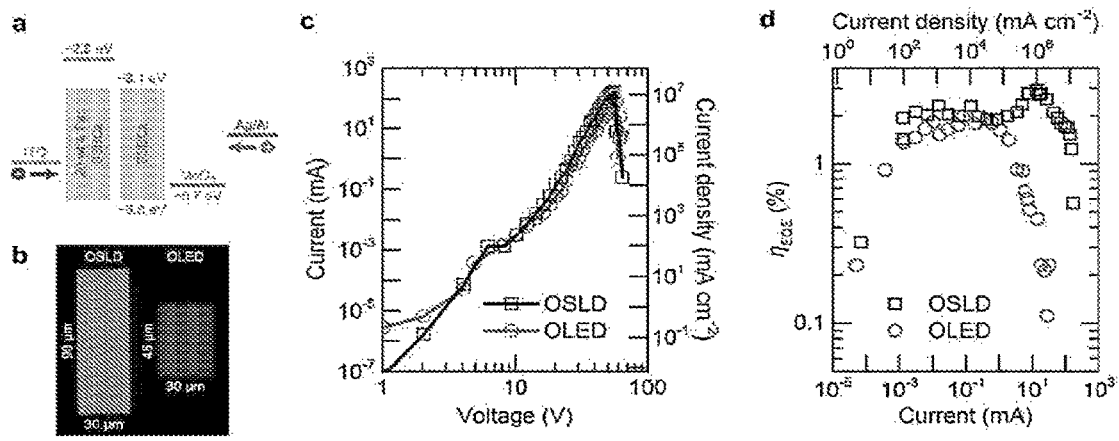

[Fig. 92]
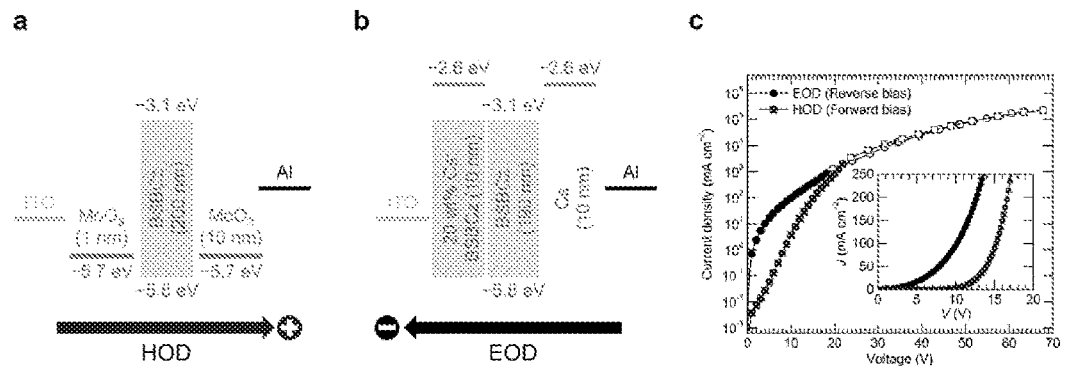
[Fig. 93]
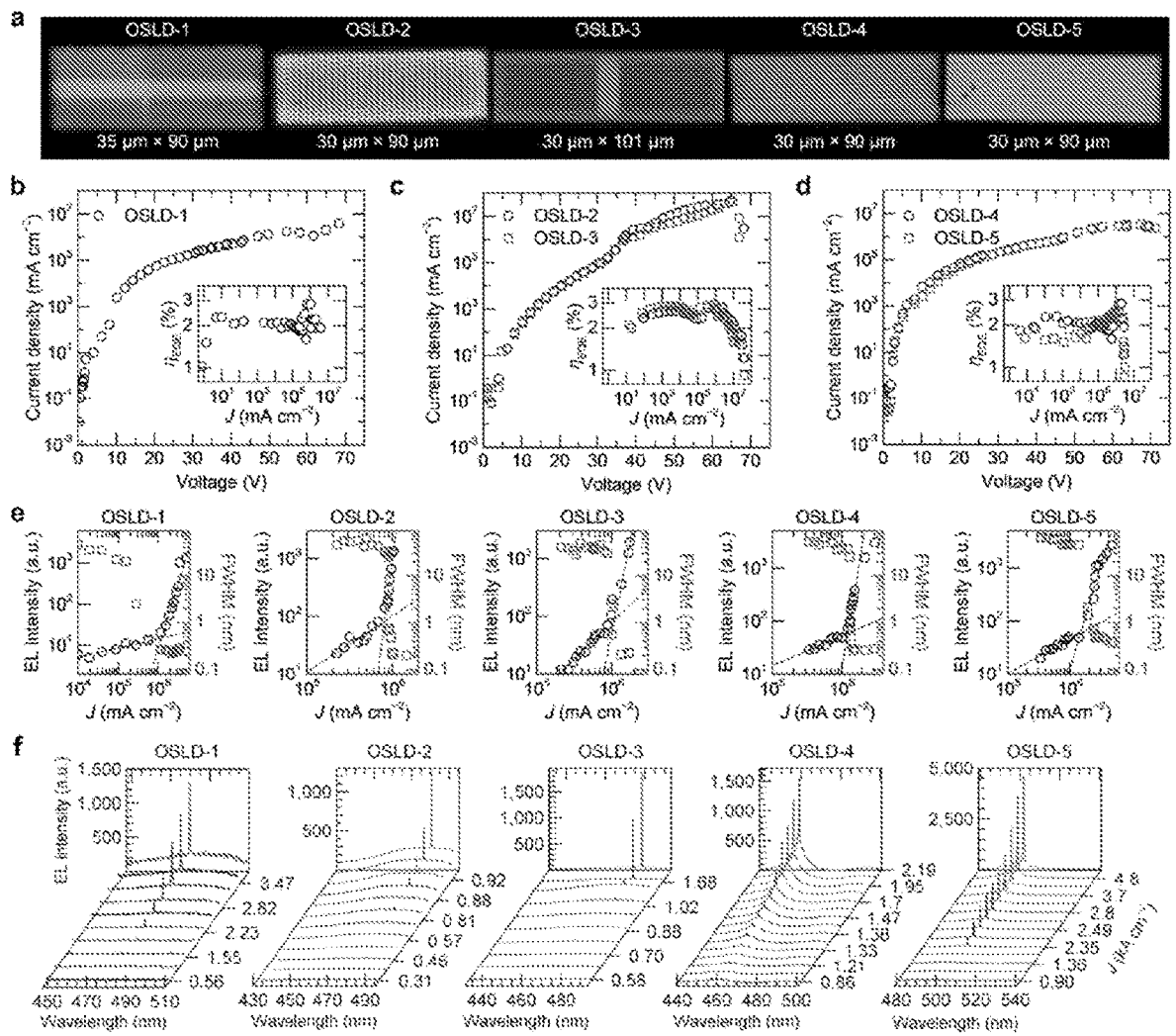

[Fig. 94]
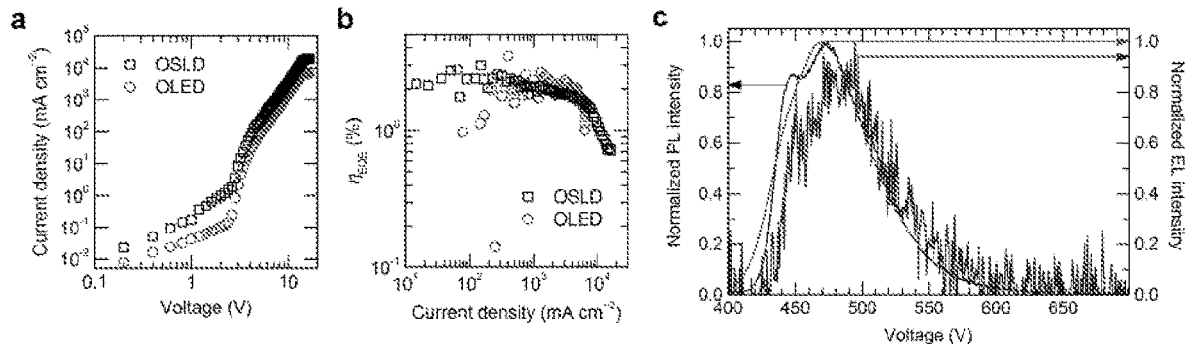
[Fig. 95]
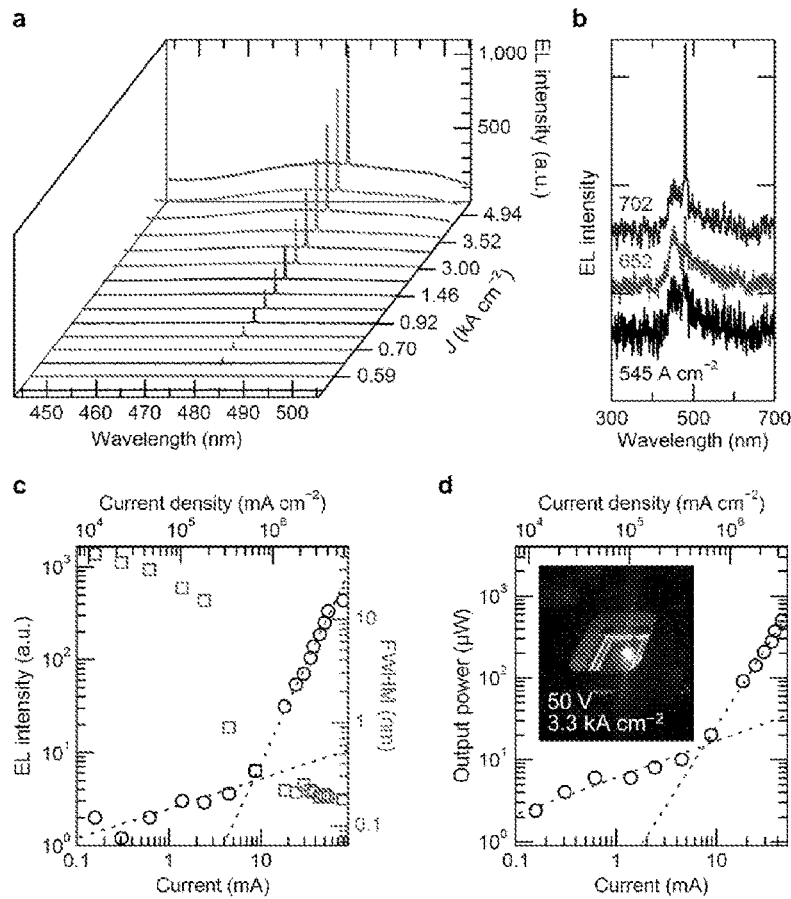

[Fig. 96]
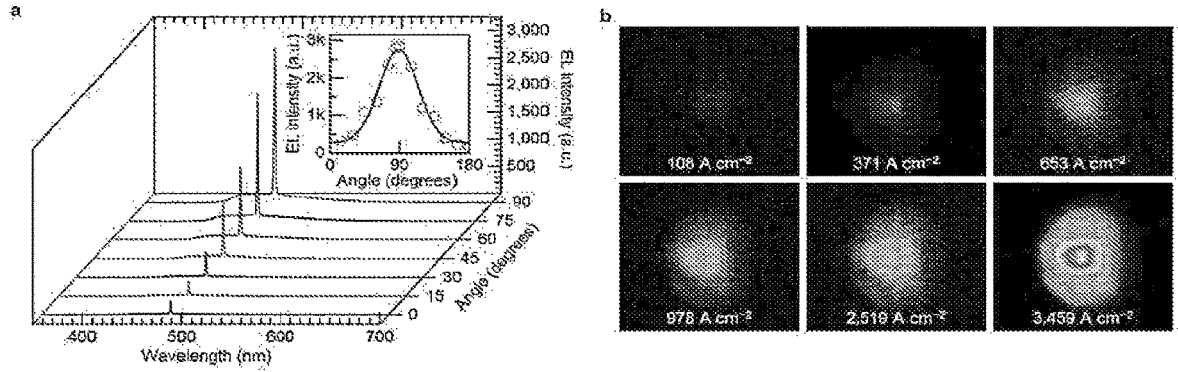
[Fig. 97]
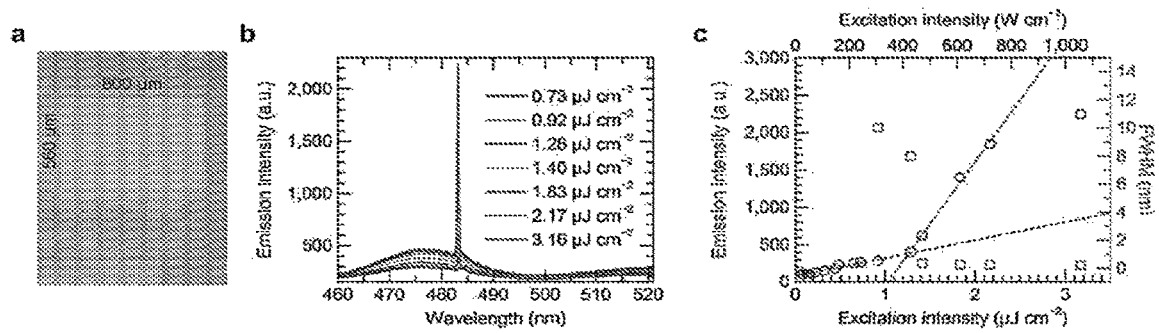
[Fig. 98]
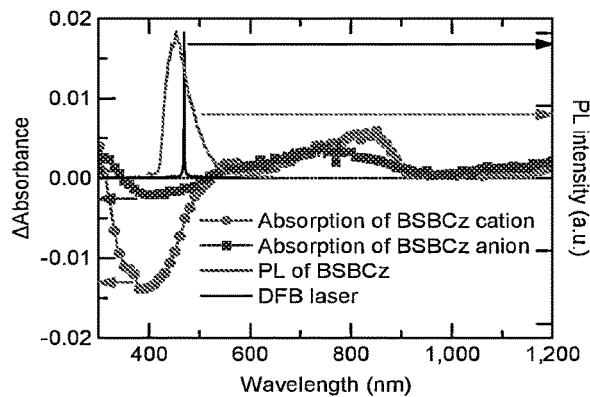

[Fig. 99]
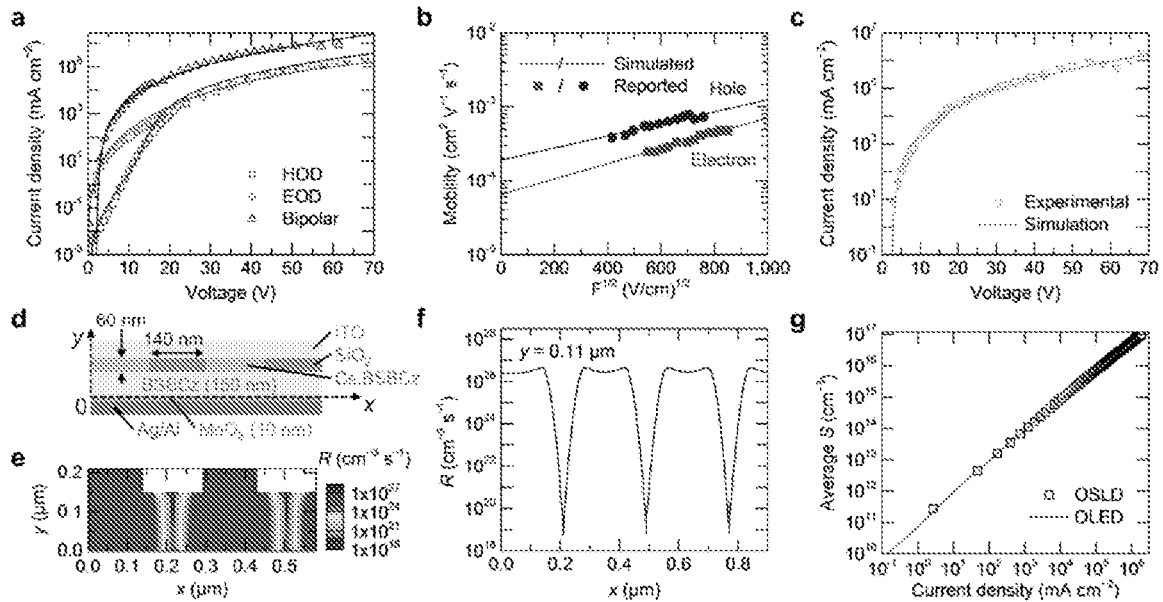
[Fig. 100]
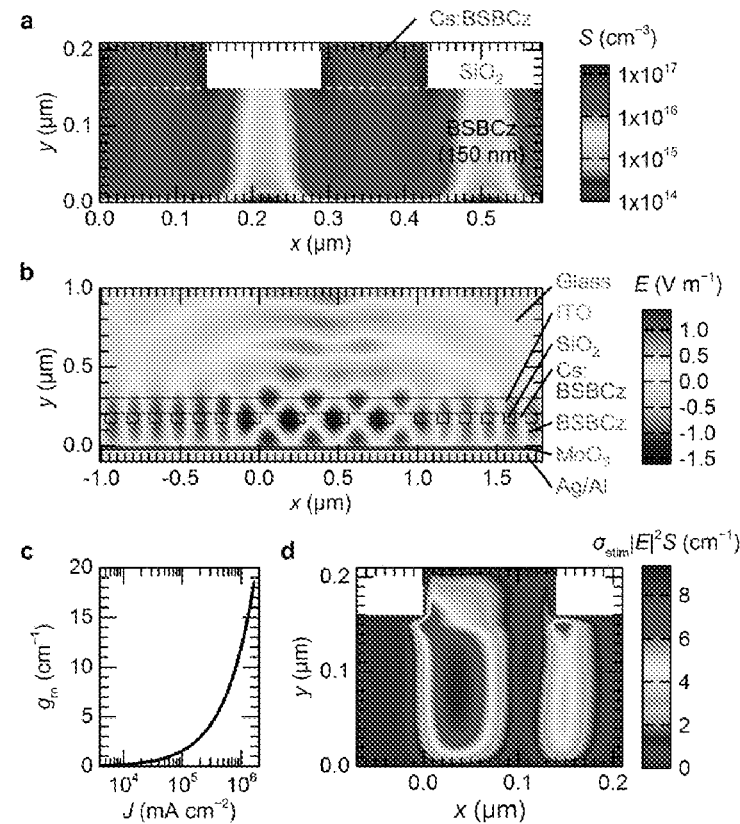

CONTINUOUS-WAVE ORGANIC THIN-FILM DISTRIBUTED FEEDBACK LASER AND ELECTRICALLY DRIVEN ORGANIC SEMICONDUCTOR LASER DIODE

TECHNICAL FIELD

The present invention relates to continuous-wave organic thin-film distributed feedback laser and electrically driven organic semiconductor laser diode

SUMMARY OF INVENTION

The present application discloses the following inventions:
1. A current excitation type organic semiconductor laser containing two electrodes, an organic optical gain layer and an optical resonator structure. In the specification, the current excitation type organic semiconductor laser may be referred to as a current-injection organic semiconductor laser or an electrically driven organic semiconductor laser.
2. The laser according to Item 1, wherein the organic optical gain layer is composed of at least one charge transport layer and at least one light amplification layer by stimulated emission.
3. The laser according to Item 1 or 2, wherein at least one of the two electrodes is transparent.
4. The laser according to any one of Items 1 to 3, wherein the optical resonator structure is composed of a distributed feedback (DFB) structure.
5. The laser according to any one of Items 1 to 4, wherein the optical resonator structure is a one dimensional resonator structure.
6. The laser according to Item 5, wherein the optical resonator structure is composed of a second-order Bragg scattering region surrounded by the first-order Bragg scattering region.
7. The laser according to any one of Items 1 to 4, wherein the optical resonator structure is a two dimensional resonator structure.
8. The laser according to Item 7, wherein the optical resonator structure is a circular resonator structure.
9. The laser according to any one of Items 1 to 3, 7 and 8, wherein the optical resonator structure is composed of a distributed Bragg reflector (DBR) structure.
10. The laser according to any one of Items 1 to 9, containing at least one hole transporting or injection region and at least one electron transporting or injection region. The hole transporting region may exist in an organic optical gain layer or may be a layer formed on an organic optical gain layer. The layer may contain no an organic gain medium and may consist of the dopant only. The region existing in an organic optical gain layer may contain the dopant and an organic gain medium. The hole transporting region in an organic optical gain layer may be formed by doping a dopant in the organic optical gain layer. The doping can be carried out by doping the dopant from one surface of the organic optical gain layer. The electron transporting region may exist in an organic optical gain layer or may be a layer formed on an organic optical gain layer. The layer may contain no an organic gain medium and may consist of the dopant only. The region existing in an organic optical gain layer may contain the dopant and an organic gain medium. The electron transporting region in an organic optical gain layer may be formed by doping a dopant in the organic optical gain layer. The doping can be carried out by doping the dopant from one surface of the organic optical gain layer.
11. The laser according to Item 10, wherein the hole transporting or injection region contains an acceptor.
12. The laser according to Item 10, wherein the hole transporting or injection region is doped with an acceptor.
13. The laser according to any one of Items 10 to 12, wherein the acceptor is a metal oxide. The metal oxide may be $MoO_3$.
14. The laser according to any one of Items 10 to 13, further containing an accepting layer between the hole transporting or injection region and an anode. The anode is one of the two electrodes.
15. The laser according to any one of Items 10 to 14, wherein the electron transporting or injection region contains a donor. The donor may be an alkaline metal such as Cs.
16. The laser according to Item 15, wherein the electron transporting or injection region is doped with a donor.
17. The laser according to any one of Items 10 to 16, further containing a donor layer between the electron transporting or injection region and a cathode. The cathode is one of the two electrodes.
18. The laser according to any one of Items 1 to 17, having no organic layer other than the organic optical gain layer.
19. The laser according to any one of Items 1 to 18, wherein the optical resonator structure is an external optical resonator structure.
20. The laser according to any one of Items 1 to 18, wherein the optical resonator structure is between the two electrodes.
21. The laser according to any one of Items 1 to 20, further containing a current confinement structure between the two electrodes
22. The laser according to any one of Items 1 to 21, wherein the optical resonator structure is a whispering gallery type optical resonator structure.
23. The laser according to any one of Items 1 to 22, wherein an exciton is generated by the current excitation and overlaps with the optical resonant mode of the optical resonator structure.
24. The laser according to any one of Items 1 to 23, showing no substantial exciton annihilation at a lasing wavelength. The loss by the exciton annihilation is preferably less than 10%, more preferably less than 5%, further more preferably less than 1%, still further more preferably less than 0.1%, still further more preferably less than 0.01%, the most preferably 0%.
25. The laser according to Item 24, showing no substantial singlet-singlet and triplet-triplet annihilation.
26. The laser according to any one of Items 1 to 25, showing no substantial polaron absorption loss at a lasing wavelength. There is no substantial overlap between the polaron absorption spectrum and the emission spectrum of the organic semiconductor laser. The loss by the polaron absorption is preferably less than 10%, more preferably less than 5%, further more preferably less than 1%, still further more preferably less than 0.1%, still further more preferably less than 0.01%, the most preferably 0%.

27. The laser according to any one of Items 1 to 26, wherein the ratio of an electron mobility to a hole mobility in the organic optical gain layer is within the rrange of from 1/10 to 10/1. The ratio is preferably from 1/5 to 5/1, more preferably from 1/3 to 3/1, still more preferably from 1/2 to 2/1.
28. A laser having an organic layer on a DFB grating structure, wherein the organic layer contains an organic gain medium.
29. The laser according to Item 28, wherein the DFB grating structure is a mixed-order DFB grating structure in which a second-order Bragg scattering region is surrounded by a first-order scattering region.
30. The laser according to Item 28, wherein the DFB grating structure is a mixed-order DFB grating structure in which a second-order Bragg scattering region and a first-order scattering region are formed.
31. The laser according to Item 28, wherein the second-order Bragg scattering region and the first-order scattering region are formed alternately.
32. The laser according to any one of Items 28 to 31, wherein the DFB grating structure has a circular structure.
33. The laser according to any one of Items 28 to 32, wherein no substantial spectral overlap exists between excited-state absorption and lasing emission.
34. The laser according to any one of Items 28 to 33, wherein stimulated emission cross section $\sigma_{em}$ is larger than triplet excited state cross sections $\sigma_{TT}$ by 100 times or more, preferably 400 times or more, further preferably 700 times or more.
35. The laser according to any one of Items 28 to 34, wherein the organic layer contains a host material and at least one dopant.
36. The laser according to any one of Items 28 to 35, wherein the organic layer is directly or indirectly covered with sapphire.
37. The laser according to any one of Items 28 to 36, wherein the organic layer is directly or indirectly covered with a fluoropolymer.
38. The laser according to Item 37, wherein the fluoropolymer has a thickness of less than 3 m.
39. The laser according to Item 38, wherein the organic layer covered with a fluoropolymer is further covered with sapphire.
40. The laser according to any one of Items 29 to 39, which is a continuous-wave laser.
41. The laser according to any one of Items 29 to 39, which is a quasi-continuous-wave laser.
42. The laser according to any one of Items 1 to 41, wherein the organic layer contains an organic compound having at least one stilbene unit.
43. The laser according to any one of Items 1 to 41, wherein the organic layer contains 4,4'-bis[(N-carbazole)styryl]biphenyl (BSBCz).
44. The laser according to Item 43, wherein the organic layer contains 4,4'-bis[(N-carbazole)styryl]biphenyl (BSBCz) and 4,4'-bis(N-carbazolyl)-1,1'-biphenyl (CBP).
45. The laser according to any one of Items 1 to 41, wherein the organic layer contains a compound having at least one fluorene unit. The compound having a fluorene unit may be a compound having at least two fluorene structures such as heptafluorene, octafluorene and bisfluorene-cored dendrimer.
46. The laser according to any one of Items 1 to 45, wherein the organic layer has a thickness of from 80 to 350 nm, preferably 100 to 300 nm, further preferably 150 to 250 nm.
47. The laser according to any one of Items 1 to 46, wherein the grating structure has a depth of less than 75 nm, preferably from 20 to 70 nm.
48. The laser according to any one of Items 1 to 47, wherein the grating structure is made of $SiO_2$.
49. The laser according to any one of Items 1 to 48, which is free from a triplet quencher.

DETAILED DESCRIPTION OF INVENTION

[1] Continuous-Wave Organic Thin-Film Distributed Feedback Laser

Since the discovery of organic solid-state lasers,[1-6] great efforts have been devoted to the development of continuous-wave (cw) lasing in organic materials, which include small molecules, oligomers, and polymers.[7-10] However, the operation of organic solid-state lasers under optical cw excitation or pulse excitation at a very high repetition rate (quasi-cw excitation) is extremely challenging. When organic films are optically pumped under such conditions, accumulation of long-lived triplet excitons and charge carriers generally occurs,[11-14] resulting in an increased absorption loss by the triplet exciton formation and quenching of singlet excitons by triplet excitons (namely, singlet-triplet annihilation).[11-16] These absorption loss and emission quenching are significant issues that must be solved to achieve cw and quasi-cw operation because they cause the lasing threshold to dramatically increase and, in the worst case, stop the lasing completely.[17-19] To suppress the absorption loss and emission quenching, the incorporation of triplet quenchers, such as oxygen,[15,16] cyclooctatetraene,[20] or an anthracene derivative,[19] in organic films has been proposed. However, as suggested by Schols et al,[20] the requirements of triplet quenchers are a low triplet energy, a short triplet lifetime, and a large difference between the energies of the singlet and triplet states, making it difficult to discover suitable triplet quenchers that satisfy these conditions without impeding lasing. Rabe et al. demonstrated quasi-cw operation at a repetition rate of 5 MHz in a poly(9,9-dioctylfluorene) derivative containing 6,6'-(2,2'-octyloxy-1,1'-binaphthalene)binaphthyl spacer groups of 12% (BN-PFO) without triplet quenchers.[9] This high repetition rate could be obtained because of the small spectral overlap between emission and triplet absorption in BN-PFO.[10] Therefore, the development of organic laser dyes with less spectral overlap between the excited-state absorption and emission is crucial for the realization of cw and quasi-cw lasing with low threshold.

In our group, we have continuously investigated the optical and amplified spontaneous emission (ASE) characteristics of many organic materials with the aim of realizing electrically pumped organic laser diodes.[21-27] Among them, 4,4'-bis[(N-carbazole)styryl]biphenyl (BSBCz) is one of the most promising candidates because a vacuum-deposited film of the host material 4,4'-bis(N-carbazolyl)-1,1'-biphenyl (CBP) blended with 6 wt % BSBCz, the chemical structures of which are shown in FIG. 1a, possesses outstanding optical and ASE characteristics, such as a high photoluminescence quantum yield ($\Phi_{PL}$) of nearly 100% and short PL lifetime ($\tau_{PL}$) of about 1.0 ns, leading to a large radiative decay constant ($k_r$) of about $10^9$ $s^{-1}$ and low ASE threshold energy of about 0.3 µJ $cm^{-2}$.[23,26] In this paper, we report quasi-cw surface-emitting lasing in a distributed feedback (DFB) device based on this BSBCz:CBP blend film. In this laser device, we obtained the highest repetition rate (up to 8 MHz) and the lowest threshold (on the order of 0.25 μJ cm$^{-2}$) ever reported for a quasi-cw laser based on organic thin-film systems. The incorporation of triplet quenchers is not necessary in our blend film because of its high $\Phi_{PL}$ and no significant spectral overlap between the emission and triplet absorption of BSBCz.[24]

In a DFB structure, a laser oscillation takes place when the following Bragg condition is satisfied: $m\lambda_{Bragg}=2n_{eff}\Lambda$, where m is the order of diffraction, $\lambda_{Bragg}$ is the Bragg wavelength, $n_{eff}$ is the effective refractive index of the gain medium, and $\Lambda$ is the period of the grating.[28,29] When considering a second-order mode (m=2), the grating period is calculated to be $\Lambda$=280 nm using the reported $n_{eff}$ and $\lambda_{Bragg}$ for BSBCZ.[21,22] A grating with $\Lambda$=280 nm provides surface-emitting lasing in a direction normal to the substrate plane as shown in FIG. 1b. Although a second-order grating typically leads to a higher lasing threshold compared to a first-order grating, surface-emitting lasing using a second-order grating is suitable for the fabrication of electrically pumped organic laser diodes having an organic light-emitting diode structure showing the same surface emission.[30,31] Using electron beam lithography and reactive ion etching, such gratings were directly engraved onto silicon dioxide surfaces over a 5×5 mm$^2$ area (FIG. 1c). FIGS. 1d and 1e show SEM images of a representative grating fabricated in this study. We obtained $\Lambda$=280±2 nm and a grating depth of d=70±5 nm from the SEM images, which are in perfect accordance with our specifications. A 6 wt % BSBCz:CBP blend film or a BSBCz neat film with a thicknesses of 200 nm was prepared on the gratings by vacuum deposition to fabricate the laser devices.

First, we examined the surface-emitting lasing characteristics of our DFB systems under 0.8 ns-wide pulse excitation at 20 Hz from a nitrogen-gas laser. This excitation light with a wavelength of 337 nm is mainly absorbed by CBP in the blend film. However, the large spectral overlap between CBP emission and BSBCz absorption guarantees efficient Förster-type energy transfer between the two molecules (FIG. 1f).[26] Therefore, we did not observe any emission from CBP even under high excitation. FIGS. 2a and 2b display the emission spectra measured from the laser devices, (a) BSBCz:CBP and (b) neat BSBCz films, at different excitation intensities. Over certain excitation light intensities, both devices showed lasing emission with very narrow peaks. We confirmed that there was no surface-emitting lasing from regions without the grating on the same substrate. $\tau_{PL}$ and full width at half maximum (FWHM) were found to be significantly decreased under high excitation energies over $E_{th}$ in our laser devices (FIGS. 2a and 2b) because of the stimulated emission,[32-35] indicating that our grating works well for outcoupling light from the waveguide film as surface emission. We observed Bragg dips at around 478 nm for the blend film and 474 nm for the neat film in emission spectra measured at the low excitation intensities (the insets of FIGS. 2a and 2b). The Bragg dips are because of an inhibition of the propagation of the waveguided light by the grating and can be envisaged as a photonic stop band for waveguided modes.[36] Lasing occurs at the short-wavelength edges of the Bragg dips (477 nm for the blend film and 473 nm for the neat film). The difference in the Bragg dip positions is probably because of different refractive indices for the blend and neat films. As the excitation intensity was increased, the emission intensity linearly increased and, then, begun to be amplified for lasing with a reduction of FWHM to <0.30 nm for the blend film and <0.40 nm for the neat film (see FIGS. 2c and 2d). The lasing threshold energies ($E_{th}$) measured from the intersection of two straight lines fitted to the emission intensities were $E_{th}$=0.22 μJ cm$^{-2}$ for the blend film and $E_{th}$=0.66 J cm$^{-2}$ for the neat film, which correspond to the power densities of 275 and 825 W cm$^{-2}$. These values are lower than their ASE threshold power densities of 375 and 1625 W cm$^{-2}$ without gratings because of the excellent quality of our gratings.[23,26] The obtained $E_{th}$ values are the lowest ever reported in all quasi-cw organic thin-film lasers. The lower $E_{th}$ in the blend film than in the neat film is attributed to a higher $\Phi_{PL}$ for the blend film (98%) than the neat film (76%) because of suppressed concentration quenching.[36] In general, $E_{th}$ and the laser gain are inversely proportion to $\Phi_{PL}$.[37,38]

Our devices were operated in the quasi-cw mode using optical pulses with a wavelength of 365 nm and a width of 10 ps from a Ti-sapphire laser. FIG. 3 shows the streak camera images of laser oscillations and corresponding temporal changes of laser intensities in the BSBCz:CBP blend film at the lasing wavelength. The excitation light intensity was fixed at about 0.44 μJ cm$^{-2}$, which is about two-fold higher than $E_{th}$. At a repetition rate of 0.01 MHz, lasing oscillations were observed at 100 s intervals. The time interval between the laser oscillations reduced at higher repetition rates. The neighboring laser oscillations appear continuous at 8 MHz over a wide time scale of 500 s (FIGS. 3a and 3b); however, individual laser oscillations at 125 ns intervals could still be identified over a short time scale of 2 s even at 8 MHz (FIG. 3c). We confirmed that similar quasi-cw operation is possible for the BSBCz neat film.

The emission intensities of both the laser devices with the blend and neat films remained almost constant up to 8 MHz as shown in FIG. 3. This maximum repetition rate is the highest ever reported and is ascribed to small absorption loss and emission quenching resulting from the triplet exciton formation. The $\Phi_{PL}$ of BSBCz is very high, minimizing the generation of triplet excitons via intersystem crossing, especially for the blend film. Furthermore, spectral overlap between emission and triplet absorption is negligible, reducing the possibility of collision between singlet and triplet excitons. When the laser devices were operated at 80 MHz (the highest frequency possible with our equipment), emission intensities rapidly decreased, and it was impossible to estimate a clear lasing threshold, probably because of rapid material degradation. Additionally, the FWHM of the observed emission peak at 80 MHz is about twice those of emission peaks at the lower frequencies. At the present stage, we are unsure if this is lasing.

FIG. 4a displays plots of lasing threshold as a function of repetition rate for the blend and neat films. Interestingly, the lasing threshold was nearly independent of the repetition rate for the blend film because of the negligible absorption loss and emission quenching. However, in the case of the neat film, a gradual increase of the threshold was observed as the repetition rate was increased. We do not know an exact reason for the gradual increase of the threshold and, therefore, need further studies to clarify this observation.

We investigated the operational stability of the lasing oscillations when the devices were continuously operated at 8 MHz (FIG. 4b). The emission intensity gradually decreased with time. The change was irreversible, indicating photodegradation of the materials. The lifetime until the emission intensity reduced to 90% of the initial was 900 s for the blend film, which was longer than the 480 s for the neat film. Stronger excitation light was required to achieve lasing in the neat film than the blend film because of the higher threshold. Therefore, the photodegradation might be expected to be faster in the neat film. The lowering of the threshold is crucial for the suppression of the photodegradation.

In summary, DFB laser devices which combine a BSBCz:CBP blend film as a gain medium with a second-order grating were fabricated and evaluated. We obtained superior surface-emitting lasing from the devices under quasi-cw operation, with emission intensity and lasing threshold being independent of repetition rate. For our laser devices, the maximum repetition rate was 8 MHz, which is the highest ever reported, and the lasing threshold was about 0.25 µJ cm$^{-2}$, which is the lowest ever reported. Triplet quenchers, generally used for the fabrication of organic thin-film lasers, were not necessary in our devices because of negligible accumulation of triplet excitons and a small spectral overlap between emission and triplet absorption. Therefore, we believe that BSBCz is the most promising candidate for the first realization of electrically pumped organic laser diodes in terms of optical characteristics. However, electrical characteristics such as charge carrier mobility, charge carrier capture cross section, etc., are also extremely important and will need further investigation and enhancement for realization of electrically pumped organic lasers.

EXPERIMENTAL SECTION

Silicon substrates covered with a thermally grown silicon dioxide layer with a 1 µm thickness were cleaned by ultrasonication using neutral detergent, pure water, acetone, and isopropanol, followed by UV-ozone treatment. The silicon dioxide surfaces were treated with hexamethyldisilazane (HMDS) by spin coating at 4000 rpm for 15 s. An around 70-nm-thick resist layer was spin-coated on the substrates at 4000 rpm for 30 s from a ZEP520A-7 solution (ZEON Co.) and baked at 180° C. for 240 s. Electron beam lithography was performed to draw grating patterns on the resist layer using a JBX-5500SC system (JEOL) with an optimized dose of 0.1 nC cm$^{-2}$. After the electron beam irradiation, the patterns were developed in a developer solution (ZED-N50, ZEON Co.) at room temperature. The patterned resist layer was used as an etching mask while the substrate was plasma etched with CHF$_3$ using an EIS-200ERT etching system (ELIONIX). To completely remove the resist layer from the substrate, the substrate was plasma etched with O$_2$ using a FA-1EA etching system (SAMCO). The gratings formed on the silicon dioxide surfaces were observed with scanning electron microscopy (SU8000, Hitachi). To complete the laser devices, the 200-nm-thick 6 wt % BSBCz:CBP blend films and BSBCz neat films were prepared on the gratings by thermal evaporation under a pressure of 4.0×10$^{-4}$ Pa with a total evaporation rate of 0.1-0.2 nm s$^{-1}$.

For the laser operation, pulsed excitation light from a nitrogen-gas laser (USHO, KEN-2020) was focused on a 6×10$^{-3}$ cm$^2$ area of the devices through a lens and slit. The excitation wavelength was 337 nm, pulse width was 0.8 ns, and repetition rate was 20 Hz. The excitation light was incident upon the devices at around 20° with respect to the normal to the device plane. The emitted light was collected normal to the device surface with an optical fiber connected to a multichannel spectrometer (PMA-50, Hamamatsu Photonics) which was placed 3 cm away from the device. Excitation intensities were controlled using a set of neutral density filters. For the quasi-cw operation, a mode-locked frequency-doubled Ti-sapphire laser (Millennia Prime, Spectra physics) was used to generate excitation light with an excitation wavelength of 365 nm, pulse width of 10 ps, and repetition rates ranging from 0.01 to 8 MHz. The excitation light was focused on a 1.9×10$^{-4}$ cm$^2$ area of the devices through a lens and slit, and the emitted light was collected using a streak scope (C10627, Hamamatsu Photonics) with a time resolution of 15 ps which was connected with a digital camera (C9300, Hamamatsu Photonics). The same irradiation and detection angles were used for this measurement as described earlier. The size of the excitation area was carefully checked by using a beam profiler (WimCamD-LCM, DataRay). All the measurements were performed in nitrogen atmosphere to prevent any degradation resulting from moisture and oxygen.

The solution containing BSBCz in CH$_2$Cl$_2$ at 0.15 mM was prepared and bubbled with argon before use. Third-harmonic-wave laser light with a wavelength of 355 nm and a FWHM of 5 ns from a Nd:YAG laser (Quanta-Ray GCR-130, Spectra-Physics) was used as pump light and pulsed white light from a Xe lamp was used as probe light for the triplet absorption measurement on the solution using a streak camera (C7700, Hamamatsu Photonics).

REFERENCES

1. F. Hide, B. J. Schwartz, M. A. Díaz-García, A. J. Heeger, *Chem. Phys. Lett.* 1996, 256, 424.
2. F. Hide, M. A. Diaz-Garcia, B. J. Schwartz, M. Andersson, Q. Pei, A. J. Heeger, *Science* 1996, 273, 1833.
3. N. Tessler, G. J. Denton, R. H. Friend, *Nature* 1996, 382, 695.
4. M. D. McGehee, A. J. Heeger, *Adv. Mater* 2000, 12, 1655.
5. N. Tessler, *Adv. Mater* 1999, 11, 363.
6. I. D. W. Samuel, G. A. Turnbull, *Chem. Rev.* 2007, 107, 1272.
7. R. Bornemann, U. Lemmer, E. Thiel, *Opt. Lett.* 2006, 31, 1669.
8. R. Bornemann, E. Thiel, P. H. Bolívar, *Opt. Express.* 2011, 19, 26383.
9. T. Rabe, K. Gerlach, T. Riedl, H.-H. Johannes, W. Kowalsky, J. Niederhofer, W. Gries, J. Wang, T. Weimann, P. Hinze, F. Galbrecht, U. Scherf, *Appl. Phys. Lett.* 2006, 89, 081115.
10. M. Lehnhardt, T. Riedl, U. Scherf, T. Rabe, W. Kowalsky, *Org. Electron.* 2011, 12, 1346.
11. N. C. Giebink, S. R. Forrest, *Phys. Rev. B* 2009, 79, 073302.
12. M. A. Baldo, R. J. Holmes, S. R. Forrest, *Phys. Rev. B* 2002, 66, 035321.
13. M. Lehnhardt, T. Riedl, T. Weimann, W. Kowalsky, *Phys. Rev. B* 2010, 81, 165206.
14. M. A. Stevens, C. Silva, D. M. Russell, R. H. Friend, *Phys. Rev. B* 2001, 63, 165213.
15. M. Inoue, T. Matsushima, H. Nakanotani, C. Adachi, *Chem. Phys. Lett.* 2015, 624, 43.
16. L. Zhao, M. Inoue, K. Yoshida, A. S. D. Sandanayaka, J.-H. Kim, J.-C. Ribierre, C. Adachi, *IEEE Quantum Electronics* 2016, 22, 1, 1300209.
17. P. P. Sorokin, J. R. Lankard, E. C. Hammond, V. L. Moruzzi, *IBM J. Res. Dev.* 1967, 11, 130.
18. O. G. Peterson, S. A. Tuccio, B. B. Snavely, *Appl. Phys. Lett.* 1970, 17, 245.
19. Y. Zhang, S. R. Forrest, *Phys. Rev. B* 2011, 84, 241301.
20. S. Schols, A. Kadashchuk, P. Heremans, A. Helfer, U. Scherf, *Chem. Phys. Chem.* 2009, 10, 1071.
21. D. Yokoyama, M. Moriwake, C. Adachi, *J. Appl. Phys.* 2008, 103, 123104.

22. H. Yamamoto, T. Oyamada, H. Sasabe, C. Adachi, *Appl. Phys. Lett.* 2004, 84, 1401.
23. M. Inoue, K. Goushi, K. Endo, H. Nomura, C. Adachi, *J. Lumin.* 2013, 143, 754.
24. H. Nakanotani, C. Adachi, S. Watanabe, R. Katoh, *Appl. Phys. Lett.* 2007, 90, 231109.
25. D. Yokoyama, H. Nakanotani, Y. Setoguchi, M. Moriwake, D. Ohnishi, M. Yahiro, C. Adachi, *Jpn. J. Appl. Phys.* 2007, 46, 826.
26. T. Aimono, Y. Kawamura, K. Goushi, H. Yamamoto, H. Sasabe, C. Adachi, *Appl. Phys. Lett.* 2005, 86, 071110.
27. H. Nakanotani, S. Akiyama, D. Ohnishi, M. Moriwake, M. Yahiro, T. Yoshihara, S. Tobita, C. Adachi, *Adv. Funct. Mater* 2007, 17, 2328.
28. I. D. W. Samuel, G. A. Turnbull, *Chem. Rev.* 2007, 107, 1272.
29. S. Chenais, S. Forget, *Polym. Int.* 2012, 61, 390.
30. A. E. Vasdekis, G. A. Turnbull, I. D. W. Samuel, P. Andrew, W. L. Barnes, *Appl. Phys. Lett.* 2005, 86, 161102.
31. S. Riechel, C. Kallinger, U. Lemmer, J. Feldmann, A. Gombert, V. Wittwer, *Appl. Phys. Lett.* 2000, 77, 2310.
32. Y. Takahashi, H. Hagino, Y. Tanaka, B.-S. Song, T. Asano, S. Noda, *Opt. Express.* 2007, 15, 17206.
33. M. Koschorreck, R. Gehlhaar, V. G. Lyssenko, M. Swoboda, M. Hoffmann, K. Leo *Appl. Phys. Lett.* 2005, 87, 181108.
34. P. A. Morton, V. Mizrahi, S. G. Kosinski, L. F. Mollenauer, T. Tanbuu-Ek, R. A. Logan, D. L. Coblentz, A. M. Sergent, K. W. Wecht, *Electron. Lett.* 1992, 28, 561.
35. P. A. Morton, V. Mizrahi, T. Tanbun-Ek, R. A. Logan, P. J. Lemaire, H. M. Presby, T. Erdogan, S. L. Woodward, J. E. Sipe, M. R. Phillips, A. M. Sergent, K. W. Wecht, *Appl. Phys. Lett.* 1994, 64, 2634.
36. G. A. Turnbull, P. Andrew, M. J. Jory, W. L. Barnes, I. D. W. Samuel, *Phys. Rev. B* 2001, 64, 125122.
37. B. Zhen, S.-L. Chua, J. Lee, A. W. Rodriguez, X. Liang, S. G. Johnson, J. D. Joannopoulos, M. Soljacic, O. Shapira, *Proc. Natl. Acad. Sci. USA* 2013, 110, 13711.
38. J. C. Ribierre, G. Tsiminis, S. Richardson, G. A. Turnbull, H. S. Barcena, P. L. Burn, I. D. W. Samuel, *Appl. Phys. Lett.* 2007, 91, 081108.

[2] Improvement of the Quasi-Continuous-Wave Lasing Properties in Organic Semiconductor Lasers Using Oxygen as Triplet Quencher We demonstrate quasi-continuous-wave lasing in solvent-free liquid organic semiconductor distributed feedback lasers based on a blend containing a liquid 9-(2-ethylhexyl) carbazole host doped with a blue-emitting heptafluorene derivative. The liquid gain medium is bubbled either with oxygen or nitrogen in order to investigate the role of a triplet quencher such as molecular oxygen on the quasi-continuous-wave lasing properties of organic semiconductor lasers. The oxygenated laser device exhibits a low threshold of 2 µJ cm$^{-2}$, which is lower than that measured in the nitrogenated device and is independent of the repetition rate in a range between 0.01 and 4 MHz.

Since the demonstration of the first optically-pumped organic solid-state semiconductor laser in 1996,[1,2] organic lasers have been the subject of intensive studies mainly due to several attractive features of organic semiconducting materials such as their broad absorption and emission spectra and their high optical gain coefficients.[3,4] The performance of organic solid-state lasers has dramatically improved during the two last decades and applications are currently emerging, which include the development of integrated light sources for spectroscopy and vapor chemical sensors.[5] While pulsed inorganic light-emitting diodes can now be used to optically pump organic solid-state lasers,[6] further breakthroughs are still required to demonstrate optically-pumped organic semiconductor lasers operating in the continuous-wave (cw) regime and ultimately to realize an electrically-pumped organic laser diode.

It is well established that the generation of long-lived triplet excitons via intersystem crossing can result in high photon and singlet losses that prevent lasing in the cw optical pumping regime.[7-12] In order to sort out this critical issue, the incorporation of a triplet quencher into the organic semiconductor gain medium has been proposed. Zhang et al. used an anthracene derivative as triplet quencher in 4-(dicyanomethylene)-2-methyl-6-julolidyl-9-enyl-4H-pyran (DCM2)-doped tris(8-hydrixyquinoiline) aluminum (Alq$_3$) and could extend the laser duration of their distributed feedback (DFB) organic devices to nearly 100 s. In parallel, a few other studies demonstrated that the triplet losses in optically-pumped organic semiconductor lasers could be reduced by using oxygen or cyclooctatetraene (COT) as triplet quencher.[9-11] While the use of triplet quencher is extremely promising for the development of a true cw organic solid-state laser technology, it should be mentioned that other approaches have been suggested to reach this objective. Recently, quasi-cw lasing with a repetition rate as high as 8 MHz was demonstrated in organic DFB lasers based on a 4,4'-bis(N-carbazolyl)-1,1'-biphenyl (CBP) host doped with 4,4'-bis[(N-carbazole)styryl]biphenyl (BSBCz).[13] This achievement was explained by the negligible overlap between the lasing emission and the triplet absorption spectra of BSBCz as well as the photoluminescence quantum yield of the material approaching 100%, resulting in an extremely weak production of triplets under optical pumping. Another way used to realize a high power cw organic solid-state dye laser was based on the very rapid rotation of the device during its operation, but the long-time power output stability of these devices seems to be too limited for practical applications.[14]

In this study, we report on the fabrication of organic semiconductor DFB lasers operating in the quasi-cw regime using a solvent-free liquid organic semiconductor material as the laser gain medium.[15-23] This lasing material is composed of a 9-(2-ethylhexyl)carbazole (EHCz) host[17] doped with an heptafluorene derivative.[24] The chemical structures of these molecules are shown in FIG. 5a. The choice of this blend was motivated by its photoluminescence quantum yield (PLQY) of 85% and its low amplified spontaneous emission (ASE) threshold of 0.4 µJ cm$^{-2}$ under pulsed optical pumping.[22] In that context, we examine here the influence of the oxygenation on the quasi-cw DFB lasing properties of the EHCz:heptafluorene blend. The results provide clear evidence that the use of a triplet quencher such as molecular oxygen is extremely promising for the future realization of optically-pumped cw organic semiconductor lasers.

The heptafluorene derivative was synthesized following a method previously published in the literature[25] while the liquid carbazole, EHCz, was purchased (Sigma-Aldrich) and used without further purification. EHCz, which is liquid at room temperature and shows a glass transition temperature well below 0° C.,[17] was mixed with the heptafluorene in a chloroform solution. The EHCz:heptafluorene (90:10 wt. %) blend solution was then bubbled either by oxygen or nitrogen for about 20 minutes. The gas was incorporated into the solutions by using a needle with an inner diameter of 0.7 mm and with a pressure around 0.02 MPa. The blends were then used as the gain medium in the laser devices after full evaporation of the solvent. The device structure of the liquid DFB lasers is schematically represented in FIG. 5b. To fabricate these devices, a ultraviolet (UV) curable polyurethaneacrylate (PUA) mixture was synthesized following a previously reported method.[26] Corrugated polymeric DFB pattern was easily fabricated on a polyethylene terephthalate (PET) substrate by replicating a grating master mold of silicon with the PUA mixture.[27] The grating period Λ for the desired lasing wavelength λ must satisfy the Bragg condition $\Lambda = m\lambda/(2n_{eff})$, where m is the order number and $n_{eff}$ is the effective refractive index of the guided mode. In order to achieve low threshold laser operation, first-order feedback, corresponding to m=1, was chosen, which leads to a laser emission from the edge of the device. It is worth noting that the refractive indexes of the PUA film and the EHCz blends are around 1.54 and 1.7, respectively, implying a refractive index contrast of 0.16.[22] As shown in FIG. 5c, the corrugated structure patterned on the PUA layer consisted of a 1D grating with a period of 140 nm and a height of 100 nm. This grating period was selected for a first order DFB laser operation with an emission wavelength around 450 nm, based on the Bragg formula and the emission spectrum of the blue-emitting heptafluorene derivative. The corrugated PUA layer was then covered with a fused silica substrate, and a gap distance between the PUA replica and the cover was fixed using silica microspheres with a diameter of 1 μm. The empty gap space was then filled with the liquid gain medium via capillarity. In order to investigate their quasi-cw laser properties, the nitrogenated and oxygenated EHCz: heptafluorene DFB lasers were optically-pumped using a Ti-sapphire laser system (Millennia Prime, Spectra Physics) delivering optical pulses at 365 nm with a pulse width of 10 ps. The repetition rate of the photo-excitation was varied from 0.01 to 4 MHz. The spot area of the laser pump beam focused onto the devices was $1.9 \times 10^{-4}$ cm$^2$. The emission was detected from the edges of the devices using a Hamamatsu streak scope (C10627) connected with a Hamamatsu digital camera (C9300).

The heptafluorene derivative was previously used in solution-processed fluorescent organic light-emitting diodes (OLEDs) with external quantum efficiency as high as 5.3%.[28] Such a good electroluminescence performance could be achieved due to the horizontal orientation of the heptafluorene emitters in a 4,4'-bis(N-carbazolyl)-1,1'-biphenyl (CBP) host. In another study, the heptafluorene molecule was also blended into a EHCz host in order to demonstrate solvent-free liquid organic second-order DFB lasers operating in the blue region of the visible spectrum.[22] For this purpose, the devices were optically-pumped using a pulsed nitrogen laser (λ=337 nm, pulse duration of 800 ps and repetition rate of 8 Hz) and the laser output emission was detected in the direction normal to the surface. Here, we used the same liquid composite material to fabricate edge-emitting first-order DFB lasers. As displayed in FIGS. 5d and 5e, the blue laser emission detected from the edge of the nitrogenated and oxygenated liquid DFB lasers has a peak wavelength of 450 and 449 nm, respectively. The very small difference between the lasing wavelengths of the two devices is presumably due to a tiny variation of the thickness of the organic liquid layer.[29]

FIGS. 6a and 6b display the streak camera images of the laser emission for both nitrogenated and oxygenated solvent-free liquid organic DFB lasers at several repetition rates. For these measurements, the excitation intensity was kept constant at a value of 2.5 μJ cm$^{-2}$. While the laser pulses emitted from the DFB lasers can be clearly observed in a 100 s time scale window, the time interval between pulses gradually decreases as the repetition rate is increased. For the highest repetition rates of 1 and 4 MHz, the DFB laser output emission in FIGS. 6c and 6d seems to emit continuously within this time range, providing evidence that both the nitrogenated and oxygenated devices operate properly in the quasi-cw regime. It is however worth noticing that the output intensity of the oxygenated devices in the quasi-cw regime, and especially at 4 MHz, was always found to be significantly higher than that of the nitrogenated devices.[30]

The laser output intensity and the full-width-at-half-maximum (FWHM) of the emission spectra were plotted against the excitation intensities at different repetition rates in the nitrogenated and oxygenated solvent-free liquid organic DFB lasers, respectively (FIGS. 7 and 8).[30] The FWHM of the emission peak in both samples is found to lower down to 1.8 nm at high excitation densities, due to the amplification by stimulated emission. This linewidth is higher than the resolution of 0.7 nm of the spectrometer. Looking at the curves showing the output intensity versus the excitation intensity, the abrupt variation in the slope efficiency is directly related to the lasing threshold.[29,31-34] Using these data, the lasing thresholds were then determined as a function of the repetition rate in both devices. The results in FIG. 9a demonstrate that the lasing threshold is lower and nearly independent of the repetition rate in the oxygenated sample with a value of 2 μJ cm$^{-2}$. Interestingly, the lasing threshold in the nitrogenated sample is found to gradually increase from 2.8 to 4.4 μJ cm$^{-2}$ as the repetition rate of the optical picosecond pulse excitation is increased from 0.01 to 4 MHz.

A non-negligible overlap is observed between the triplet-triplet absorption spectrum of the heptafluorene molecule in chloroform solution and a representative laser spectrum of the gain material (FIG. 10).[30] In fact, a previous work reported that the stimulated emission cross section in heptafluorene is seven times larger than the triplet absorption cross section at the ASE/lasing wavelength.[10] Noticeably, the triplet-triplet absorption completely vanishes in the oxygenated solution due to the presence of molecular oxygen acting as triplet quencher. To provide additional evidence that molecular oxygen can quench the triplets efficiently in the heptafluorene-based laser gain medium, we then examined the quenching of the singlet excitons by singlet-triplet exciton annihilation (STA) in the liquid blend material bubbled with either oxygen or nitrogen. For this purpose, the nitrogenated and oxygenated gain materials were sandwiched between two flat fused silica substrates. The samples were irradiated by 325 nm light pulses (with a pulse duration varying from 50 to 800 s) at an excitation density of 0.5 kW cm$^{-2}$ and we monitored the temporal evolution of the photoluminescence intensity.[8-10] The transient curves in the nitrogenated samples show that, following the onset of the optical pump, the emission intensity significantly decreases by nearly 60% after 300 s before reaching its steady-state (FIG. 11).[30] These data demonstrate that singlet excitons are quenched by STA in the nitrogenated liquid material.[8-10] In contrast, the oxygenated liquid gain medium does not show such a quenching and, in addition, does not present any sign of degradation under high intensity cw irradiation for 800 s. This is in agreement with results reported in a previous study[10] and provides clear evidence that molecular oxygen can be used indeed to quench the triplets without affecting the singlets in heptafluorene-based materials. The suppression of the singlet quenching by STA in the oxygenated sample is also consistent with the fact that the intensity of the DFB laser emission seems to be stronger in the oxygenated than in the nitrogenated devices.

From these considerations, the highest threshold values and the repetition rate dependence of this threshold in the nitrogenated DFB laser device can be attributed to the generation and accumulation of long-lived triplet excitons in the gain medium, which leads to additional losses associated with triplet absorption and singlet-triplet exciton annihilation. It should be highlighted that the liquid blend shows a high PLQY of 85% and low ASE/lasing threshold. In addition, the intersystem crossing yield is usually small (around 3%) in oligofluorene and polyfluorene derivatives.[35] In that context, it is very plausible that the concentration of triplets produced via intersystem crossing under optical pumping remains sufficiently low in nitrogenated heptafluorene-based gain material to observe lasing in the quasi-cw regime for a repetition rate up to 4 MHz. Importantly, the fact that the lasing threshold becomes lower and independent of the repetition rate in the oxygenated DFB device can be straightforwardly explained by the presence of molecular oxygen acting as triplet quencher.

The photostability of the quasi-cw lasing emission was also evaluated by monitoring the time evolution of the output intensity from the edges of the liquid layers above the lasing thresholds in both nitrogenated and oxygenated DFB lasers at a repetition rate of 1 MHz. The characteristic photostability time constant was estimated by measuring the time duration associated with a reduction of 10% from the initial value of the output intensity. As shown in FIG. 9b, the time constants for the nitrogenated and oxygenated devices were found to be 4 and 5 minutes, respectively. This decrease in the output lasing intensity with time is presumably due to a bleaching of the heptafluorene molecules. This photodegradation issue can certainly be solved by the use of microfluidic circuits for achieving a true quasi-cw solvent-free liquid organic semiconductor laser technology.[22] Interestingly, the presence of oxygen does not lead to a faster photodegradation of the liquid devices, despite the formation of highly chemically reactive oxygen singlets after the quenching of the triplet excitons.[36] This is well supported by the results showing that the photoluminescence intensity from the oxygenated sample remains nearly constant after 800 s under cw optical pumping at a high excitation density of 0.5 kW cm$^{-2}$.[30]

In summary, we demonstrate that the use of oxygen as triplet quencher is a promising pathway to develop a continuous-wave organic semiconductor laser technology. The gain medium used in our first-order organic DFB lasers was based on a solvent-free liquid carbazole host doped with a blue fluorescent heptafluorene derivative. By bubbling this liquid molecular semiconductor blend with molecular oxygen, the DFB laser threshold in the quasi-cw regime was decreased and found to be nearly independent of the repetition rate. The oxygenated DFB device showed indeed a lasing threshold of 2 μJ cm$^{-2}$, even for a repetition rate as high as 4 MHz. This improvement of the quasi-cw lasing performance is attributed to the selective quenching of the triplets in the gain medium by molecular oxygen.

REFERENCES

1. F. Hide, M. A. Diaz-Garcia, B. J. Schwartz, M. Andersson, Q. Pei, A. J. Heeger, Science 273, 1833 (1996).
2. N. Tessler, G. J. Denton, R. H. Friend, Nature 382, 695 (1996).
3. I. D. W. Samuel, G. Turnbull, Chem. Rev. 107, 1272 (2007).
4. S. Chénais, S. Forget, Polym. Int. 61, 390 (2012).
5. A. Rose, Z. G. Zhu, C. F. Madigan, T. M. Swager, V. Bulovic, Nature 434, 876 (2005).
6. Y. Yang, G. Turnbull, I. D. W. Samuel, Appl. Phys. Lett. 92, 163306 (2008).
7. O. G. Peterson, S. A. Tuccio, B. B. Snavely, Appl. Phys. Lett. 17, 245 (1970).
8. Y. Zhang, S. R. Forrest, Phys. Rev. B 84, 241301 (2011).
9. M. Inoue, T. Matsushima, H. Nakanotani, C. Adachi, Chem. Phys. Lett. 624, 43 (2015).
10. L. Zhao, M. Inoue, K. Yoshida, A. S. D. Sandanayaka, J. H. Kim, J. C. Ribierre, C. Adachi, IEEE J. Select. Top. Quant. Electr. 22, 1300209 (2016).
11. S. Schols, A. Kadashchuk, P. Heremans, A. Helfer, U. Scherf, Chem. Phys. Chem. 10, 1071 (2009).
12. T. Rabe, K. Gerlach, T. Riedl, H. H. Johannes, W. Kowalsky, J. Niederhofer, W. Gries, J. Wang, T. Weimann, P. Hinze, F. Galbrecht, U. Scherf, Appl. Phys. Lett. 89, 081115 (2006).
13. A. S. D. Sandanayaka, K. Yoshida, M. Inoue, C. Qin, K. Goushi, J. C. Ribierre, T. Matsushima, C. Adachi, Adv. Opt. Mater. 2016, DOI: 10.1002/adom.201600006
14. R. Bornemann, E. Thiel, P. H. Bolivar, Opt. Expr., 19, 26382 (2011).
15. S. S. Babu, T. Nakanishi, Chem. Comm. 49, 9373 (2013).
16. B. A. Kamino, T. P. Bender, R. A. Klenker, J. Phys. Chem. Lett., 3, 1002 (2012).
17. J. C. Ribierre, T. Aoyama, T. Muto, Y. Imase, T. Wada, Org. Electron. 9, 396 (2008).
18. J. C. Ribierre, T. Aoyama, T. Kobayashi, T. Sassa, T. Muto, T. Wada, J. App. Phys. 102, 033106 (2007).
19. J. C. Ribierre, T. Aoyama, T. Muto, P. Andre, Org. Electron. 12, 1800 (2011).
20. D. Xu, C. Adachi, Appl. Phys. Lett. 95, 053304 (2009).
21. E. Y. Choi, L. Mager, T. T. Cham, K. D. Dorkenoo, A. Fort, J. W. Wu, A. Barsella, J. C. Ribierre, Opt. Expr. 21, 11368 (2013).
22. J. H. Kim, M. Inoue, L. Zhao, T. Komino, S. M. Seo, J. C. Ribierre, C. Adachi, Appl. Phys. Lett. 106, 053302 (2015).
23. J. C. Ribierre, L. Zhao, M. Inoue, P. O. Schwartz, J. H. Kim, K. Yoshida, A. S. D. Sandanayaka, H. Nakanotani, L. Mager, S. Méry, C. Adachi, Chem. Comm. 52, 3103 (2016).
24. E. Y. Choi, L. Mazur, L. Mager, M. Gwon, D. Pitrat, J. C. Mulatier, C. Monnereau, A. Fort, A. J. Attias, K. Dorkenoo, J. E. Kwon, Y. Xiao, K. Matczyszyn, M. Samoc, D. W. Kim, A. Nakao, B. Heinrich, D. Hashizume, M. Uchiyama, S. Y. Park, F. Mathevet, T. Aoyama, C. Andraud, J. W. Wu, A. Barsella, J. C. Ribierre, J. C. Phys. Chem. Chem. Phys. 16, 16941 (2014).
25. R. Anemian, J. C. Mulatier, C. Andraud, O. Stephan, J. C. Vial, Chem. Comm. 1608 (2002).
26. S. J. Choi, P. J. Yoo, S. J. Baek, T. W. Kim, H, H, Lee, J. Am. Chem. Soc. 126, 7744 (2004).
27. J. H. Kim, M. J. Han, S. Seo, J. Polym. Sci. Part B 53, 453 (2015).
28. L. Zhao, T. Komino, M. Inoue, J. H. Kim, J. C. Ribierre, C. Adachi, Appl. Phys. Lett. 106, 063301 (2015).
29. J. C. Ribierre, G. Tsiminis, S. Richardson, G. A. Turnbull, I. D. W. Samuel, H. S. Barcena, P. L. Burn, Appl. Phys. Lett. 91, 081108 (2007).
30. Material for a characterization of the triplet losses and the determination of the threshold in the quasi-cw regime 31. C. Kamutsch, C. Gyrtner, V. Haug, U. Lemmer, T. Farrell, B. S. Nehls, U. Scherf, J. Wang, T. Weimann, G. Heliotis, C. Pflumm, J. C. deMello, D. D. C. Bradley, Appl. Phys. Lett. 89, 201108. (2006).
32. G. Tsiminis, J. C. Ribierre, A. Ruseckas, H. S. Barcena, G. J. Richards, G. A. Turnbull, P. L. Burn, I. D. W. Samuel, Adv. Mater. 20, 1940 (2008).
33. G. Tsiminis, Y. Wang, P. E. Shaw, A. L. Kanibolotsky, I. F. Perepichka, M. D. Dawson, P. J. Skabara, G. A. Turnbull, I. D. W. Samuel, Appl. Phys. Lett. 94, 243304 (2009).
34. A. E. Vasdekis, G. Tsiminis, J. C. Ribierre, L. O'Faolain, T. F. Krauss, G. A. Turnbull, I. D. W. Samuel, Opt. Expr. 14, 9211 (2006).
35. H. L. Chen, Y. F. Huang, C. P. Hsu, T. S. Lim, L. C. Kuo, M. K. Leung, T. C. Chao, K. T. Wong, S. A. Chen, W. Fann, J. Phys. Chem. A, 111, 9424 (2007)
36. T. Gallavardin, C. Armagnat, O. Maury, P. L. Baldeck, M. Lindgren, C. Monnereau, C. Andraud, Chem. Comm. 48, 1689 (2012).

[3] Continuous-Wave Operation of Organic Semiconductor Lasers

Summary

The demonstration of continuous-wave lasing from organic semiconductor films is highly desirable for practical applications in the areas of spectroscopy, data communication and sensing but still remains a challenging objective. Here, we report low-threshold surface-emitting organic distributed feedback lasers operating in the quasi-continuous-wave regime at 80 MHz as well as under continuous-wave photoexcitation of 30 ms. This outstanding performance was achieved using an organic semiconductor thin film with high optical gain, high photoluminescence quantum yield and no triplet absorption losses at the lasing wavelength combined with a mixed-order distributed feedback grating to achieve low lasing threshold. A simple encapsulation technique greatly reduced the laser-induced thermal degradation and suppressed the ablation of the gain medium taking place otherwise under intense continuous-wave photo-excitation. Overall, this study provides evidence that the development of a true continuous-wave organic semiconductor laser technology is possible via the engineering of the gain medium and the device architecture.

Introduction

Organic semiconducting materials are generally considered as well-suited for applications in photonics due to their ability to emit, modulate and detect light (1). In particular, considerable research efforts have been undertaken during the last two decades to use them in optically-pumped solid-state laser sources because of their outstanding features in terms of low-cost fabrication, easy processability, chemical versatility, mechanical flexibility and wavelength tunability across the whole visible range (2-6). Since the first demonstration of an optically-pumped organic semiconductor laser (OSL) (2), their performance has dramatically improved due to significant progress in both high gain organic semiconducting materials and device design (7-15). Owing to recent advances in low-threshold distributed feedback (DFB) OSLs, direct optical pumping by electrically-driven nanosecond-pulsed inorganic light-emitting diodes was demonstrated, providing a route towards a new compact and low-cost visible laser technology (12,13). Applications based on these OSLs are currently emerging, which include the development of spectroscopic tools, data communication devices, medical diagnostics and chemical sensors (16, 20). Nevertheless, OSLs are still optically pumped by pulsed photo-excitation (with a pulse width typically varying from 100 fs to 10 ns) and driven at repetition rates (f) ranging from 10 Hz to 10 kHz. In this context, further breakthroughs are still required to demonstrate optically-pumped OSLs operating in the continuous-wave (CW) regime and ultimately to realize an electrically-pumped organic laser diode (21, 22). Operation of OSLs in the CW regime has proven to be challenging (23, 24). Thermal degradation of the organic gain medium under intense long pulse optical pumping represents a severe issue for long-term laser operation (25). The other important problem that needs to be overcome is related to the losses caused by the generation of long-lived triplet excitons via intersystem crossing (26-29). When organic films are optically pumped in the long pulse regime, the accumulation of triplet excitons generally occurs, resulting in an increased absorption at the lasing wavelength due to triplet absorption (TA) and a quenching of singlet excitons due to singlet-triplet exciton annihilation (STA). To overcome these obstacles, the incorporation of triplet quenchers, such as oxygen (30, 31), cyclooctatetraene (32) and an anthracene derivative (33), in organic films has been proposed. Another way to considerably reduce the triplet losses is based on the use of emitters showing a high photoluminescence quantum yield (PLQY) and no spectral overlap between the absorption band of the triplet excited states and the emission band of the singlet excited states (34-36). Both methods to suppress triplet losses in OSLs have been successfully used to improve device performance in the quasi-CW (qCW) regime (31, 35). In parallel, a CW lasing duration of nearly 100 s could be achieved in an OSL containing an anthracene derivative as triplet quencher (33). Herein, we propose an improved DFB OSL architecture that enables quasi-CW (qCW) lasing (at the very high repetition rate of 80 MHz) and CW surface-emitting lasing with outstanding and unprecedented performance. These results represent a major advance in the field of organic photonics and open new prospects towards the development of a reliable and cost-effective organic-based CW solid-state laser technology.

Results

The surface-emitting OSLs fabricated in the present study used 4,4'-bis[(N-carbazole)styryl]biphenyl (BSBCz) in FIG. 12 as emitter (34). The incorporation of triplet quenchers into BSBCz films is not necessary due to extremely weak production of triplets via intersystem crossing and negligible triplet absorption at the lasing wavelength in this material (35). The fabrication method and the structure of the organic semiconductor DFB lasers fabricated in this study are schematically represented in FIGS. 12 and 13A, respectively. To achieve a low lasing threshold with lasing emission in the direction normal to the substrate plane, we designed a mixed-order DFB grating architecture with second-order Bragg scattering regions surrounded by first-order scattering regions that give rise to a strong feedback, providing an efficient vertical outcoupling of the laser radiation (8). In a DFB structure, laser oscillation takes place when the Bragg condition $m\lambda_{Bragg}=2n_{eff}\Lambda$ is satisfied (5), where m is the order of diffraction, $\lambda_{Bragg}$ is the Bragg wavelength, $n_{eff}$ is the effective refractive index of the gain medium, and $\Lambda$ is the period of the grating. Using the reported $n_{eff}$ and $\lambda_{Bragg}$ values for BSBCz (37-39), the grating periods for a mixed-order (m=1, 2) DFB laser device are calculated to be 140 and 280 nm, respectively. Such gratings were directly engraved using electron beam lithography and reactive ion etching onto silicon dioxide surfaces over a 5×5 mm² area. Note that optical simulations and experimental data (see section A, Supplementary Materials) reported in FIGS. 16-17 and Tables S1-S3 were taken into account to choose the parameters used in the resonator design.

As shown by the scanning electron microscopy (SEM) images in FIGS. 13B-C, the DFB gratings fabricated in this work had grating periods of 140±5 and 280±5 nm with a grating depth of about 65±5 nm, which is in accordance with our specifications. The length of each first- and second-order DFB grating was about 15.12 and 10.08 µm, respectively. BSBCz neat films and BSBCz:CBP (6:94 wt. % and 20:80 wt. %) blend films with a thickness of 200 nm were prepared on top of the gratings by vacuum-deposition. As shown in FIGS. 13D-E, the surface morphology of the organic layers presents a grating structure with a surface modulation depth of 20-30 nm. To greatly improve the efficiency and the stability of the DFB lasers operating in the qCW and long pulse regimes, the devices were then encapsulated in a nitrogen-filled glove box (40). For this purpose, 0.05 ml of CYTOP (a chemically robust, optically transparent, fluoropolymer with a refractive index of about 1.35) was directly spin-coated on top of the organic layer, and the polymer film was then covered by a transparent sapphire lid, which was chosen because of its good thermal conductivity (TC~25 W $m^{-1}$ $K^{-1}$ at 300 K) and good transparency at the BSBCz lasing wavelength, to seal the organic laser devices. The CYTOP film typically had a thickness of around 2 µm and was found to not affect the photophysical properties of the BSBCz films (FIG. 18).

The lasing properties of encapsulated mixed-order DFB devices using either a BSBCz neat film or a BSBCz:CBP (6:94 wt. %) blend film as the gain medium were first examined under pulsed optical pumping using a nitrogen-gas laser delivering 800 ps pulses at a repetition rate of 20 Hz and a wavelength of 337 nm (see section B and FIG. 19, Supplementary Materials). In the case of the CBP blend films, the excitation light was mainly absorbed by the CBP host, but the large spectral overlap between CBP emission and BSBCz absorption guaranteed an efficient Förster-type energy transfer from the host to the guest molecules (39). This was confirmed by the absence of CBP emission under 337 nm photo-excitation. Based on the results shown in FIG. 19, the neat and blend film devices were found to exhibit low lasing thresholds of 0.22 and 0.09 µJ $cm^{-2}$, respectively, in the 800 ps pulse regime. In both cases, these values are lower than the previously reported thresholds for amplified spontaneous emission (ASE) (0.30 µJ $cm^{-2}$) (39) and the second-order DFB lasers (0.22 µJ $cm^{-2}$) (35) in BSBCz:CBP blends, (35-39) supporting the potential of mixed-order gratings for high-performance organic solid-state lasers (8). Importantly, the device encapsulation in this pulsed optical pumping regime was found to not modify the threshold and the lasing wavelength of the mixed-order DFB lasers.

Quasi-CW Lasing in Organic Semiconductor DFB Lasers

The lasing properties of various BSBCz and BSBCz:CBP (6:94 wt. %) DFB devices with different resonator structures were investigated in the qCW regime using, for the optical pumping, optical pulses with a wavelength of 365 nm and a width of 10 ps from a Ti-sapphire laser. FIGS. 14A-C show streak camera images of the laser oscillations above threshold and the corresponding changes in emission intensities at different repetition rates in a representative encapsulated blend mixed-order DFB device. The excitation light intensity was fixed at about 0.5 µJ $cm^{-2}$. When increasing the repetition rate of the photoexcitation from 10 kHz to 80 MHz, the time interval between laser oscillations gradually decreased from 100 ps to 12.5 ns. For the highest repetition rates (>1 MHz), the DFB laser output emission looks continuous in the 500 ps window, indicating that the device properly worked in the qCW regime even at the highest repetition rate of 80 MHz. The possibility to operate the DFB device at such high repetition rates is clearly related to the small TA loss and STA quenching resulting from the negligible triplet exciton formation in the BSBCz:CBP blend (35). Similar experiments were performed with non-encapsulated mixed-order and second-order DFB devices based on either BSBCz neat or blend films. For each device, the laser output intensity obtained at several repetition rates was measured as a function of the excitation intensity to determine the lasing thresholds, and results for a representative encapsulated blend mixed-order DFB device at repetition rates of 10 kHz and 80 MHz are displayed in FIG. 20. The repetition rate dependences of the lasing threshold in the different devices are summarized in FIG. 14D. The lasing threshold ($E_{th}$) was always lower in the 6 wt. % blend DFB lasers essentially due to the PLQY of nearly 100% and the suppression of the concentration quenching in this gain medium (as compared with the PLQY of 76% in a BSBCz neat film) (36). The results also show that the lowest thresholds were obtained with the mixed-order DFB resonator structures. Noticeably, the lasing threshold for all devices only increased very slightly when the repetition rate was increased from 10 kHz to 8 MHz. Due to the absence of significant triplet accumulation in the BSBCz system (35), we attribute the small increase of the threshold with the repetition rate to minor degradation of the devices under high-intensity qCW irradiation (see FIG. 21). Interestingly, the encapsulated blend mixed-order DFB laser exhibited the lowest threshold (varying from 0.06 µJ $cm^2$ at 10 kHz to 0.25 µJ $cm^2$ at 80 MHz) and was the only device operating properly at 80 MHz. When other devices were optically-pumped at 80 MHz, the emission intensities very rapidly decreased and the FWHM values of the emission spectra detected with the streak camera before the fast degradation of the organic films were typically larger around 7-8 nm (FIG. 22). This indicates that the encapsulation of the DFB devices is necessary to significantly reduce the degradation, and presumably the laser ablation of the organic thin film taking place under high intensity 80 MHz photo-excitation. This reduction of the device degradation due to the encapsulation is presumably responsible for the lowering of the lasing thresholds observed in FIG. 14D.

The operational stability of the different blend DFB devices was investigated under qCW optical pumping at 8 MHz. Similar experiments were also performed with the encapsulated mixed-order DFB laser at a repetition rate of 80 MHz. The temporal evolution of the different DFB laser output intensities was monitored for 20 minutes using a pumping intensity 1.5 times larger than the lasing threshold for each device (FIG. 23). These results show that the operational stability was improved when the lasing threshold was decreased via the choice of the grating structure and the encapsulation. Higher pumping intensities were required to achieve lasing in the devices with higher threshold, which led to faster laser-induced thermal degradation. More importantly, while none of the non-encapsulated DFB devices operated well under qCW optical pumping at 80 MHz, the emission output intensity from the encapsulated organic laser after 20 minutes decreased to only 96% of its initial value. Such an outstanding operational stability highlights the key-role played by the encapsulation on the performance of organic semiconductor DFB lasers operating in the qCW regime.

True CW Lasing in Organic Semiconductor DFB Lasers

The amplified spontaneous emission (ASE) properties of a 200-nm-thick BSBCz:CBP (20:80 wt. %) film were investigated using the variable stripe length method to gain insights into the optical gain and loss coefficient under long pulse photo-irradiation. As shown in FIG. 24 (see Table S4 and section C in the Supplementary Materials), the film optically pumped at 405 nm with 50 s long pulses exhibits a high net gain coefficient of 40 cm$^{-1}$ and a loss coefficient of 3 cm$^{-1}$ for a pumping intensity of 1.5 kW cm$^{-2}$. This clearly supports our idea that BSBCz is an outstanding candidate for organic semiconductor lasers operating under long pulse photo-excitation. The lasing characteristics of the DFB devices in the CW mode were then investigated using an inorganic laser diode emitting at 405 nm. Because the absorption of CBP is negligible at this excitation wavelength (30), the concentration of BSBCz in the blend was increased to 20 wt. % to improve the harvesting of the laser diode pumping emission. The PLQY of this 20 wt. % blend was measured to be around 86%. FIG. 15A shows the streak camera images integrated over 100 pulses of the encapsulated 20 wt. % blend mixed-order DFB laser emission measured at a pumping intensity of 200 W cm$^{-2}$ and 2.0 kW cm$^{-2}$ for CW excitation pulse widths of 800 ps and 30 ms, respectively. The corresponding emission spectra in FIG. 25 provide additional evidence with the picture in FIG. 15B that the encapsulated DFB laser operates properly in the long-pulse regime with a lasing duration which can be clearly extended to more than 30 ms. Other data in FIG. 26 provide further evidence of lasing under 30 ms long pulse photo-excitation. As shown in FIG. 27, the DFB laser emission output intensity decreased when increasing the number of successive 30 ms long excitation pulses from 10 to 500, which is presumably due to thermal degradation of the gain medium under such intense irradiation. While the encapsulation of the device between high-thermal-conductivity silicon and sapphire clearly improved the performance and the stability of the OSLs to an unprecedented level, this suggests that the heat dissipation will still need to be improved in the future for the development of a real CW organic laser technology. FIG. 27 also shows that no quenching of singlet excitons by TA or STA occurs in BSBCz (see section D, Supplementary Materials). The results confirm the negligible overlap between the emission and the triplet absorption of BSBCz and the absence of detrimental triplet losses in the gain medium even under intense CW photo-excitation (35). To authenticate the claim of CW lasing, the divergence of the emitted beam below and above threshold as well as its polarization were examined. The results displayed in FIGS. 28-29 confirm that a proper lasing operation takes place in BSBCz DFB devices under long pulse photo-irradiation.

The organic DFB laser output intensity and emission spectra were measured as a function of the excitation intensity in the devices with different structures and various long pulse durations ranging from 0.1 to 1000 µs. An example of data obtained from a representative encapsulated blend mixed-order device is displayed in FIG. 30. The abrupt change in the slope efficiency of the laser output intensity was used again to determine the lasing threshold. FIG. 15C summarizes the pulse duration dependence of the laser thresholds measured in the different devices. Similarly to the trends observed in the qCW regime, blending BSBCz into a CBP host, using a mixed-order DFB resonator structure and encapsulating the device led to a substantial lowering of the lasing threshold. While the BSBCz-neat-film-based encapsulated mixed-order DFB device could operate properly in the long pulse regime for durations longer than 100 µs, the encapsulated blend mixed-order organic DFB laser showed the lowest lasing thresholds (in the range 5-75 W cm$^{-2}$) and was the only device that could produce lasing effectively for durations longer than 800 µs. To provide additional evidence of the key-role played by the choice of high TC sapphire as encapsulation lid on the performances of the organic semiconductor lasers in the long pulse regime, we compared the excitation duration dependence of the lasing thresholds obtained in the mixed-order blend DFB devices encapsulated either with a sapphire or glass lid. FIG. 31 clearly demonstrates that the use of a high TC lid made of sapphire leads to a lower threshold and improved operational stability.

Operational stability of the mixed-order DFB lasers with and without encapsulation was characterized in the long pulse regime by monitoring the laser emission output intensity of these devices above the lasing threshold as a function of the number of 100 µs excitation pulses with a pump intensity of 200 W cm$^{-2}$. As shown in FIG. 15D, the emission intensity gradually decreased with time in all devices, and these decreases were irreversible, indicating a laser-induced thermal degradation of the organic gain media. Noticeably, the operational stability was greatly improved by the encapsulation and was clearly the best for the encapsulated blend device. In that latter case, the laser output intensity only decreased by 3% after 500 pulses. FIG. 32 shows laser microscope images of a non-encapsulated blend mixed-order DFB laser before and after irradiation by 100 incident pulses with a width of 1 ms and an excitation intensity of 200 W cm$^{-2}$. While no sign of any laser-induced thermal degradation could be observed in the encapsulated device, laser ablation took place in the non-encapsulated device with an ablated depth of about 125 nm. The possibility to greatly reduce laser ablation by the proposed encapsulation technique is evidently critical for the future development of CW organic semiconductor laser technologies. To derive conclusions how the present devices are limited on the way towards real CW-operation, thermal simulation of the heat dissipation in the devices was carried out and is reported in FIGS. 38-42 (see Table S4 and section E, Supplementary Materials). These results show the influence of the pump pulse width and the role of the encapsulation on the thermal properties of the devices. In particular, while the encapsulation has been found to be a critical element in this study, the simulation suggests that CYTOP should be replaced in further studies by another material with a better thermal conductivity.

DISCUSSION

The first demonstration of an inorganic CW solid-state laser was reported about 4 decades ago (41), and the development has since been proven to be very successful, especially at wavelengths in the near infrared and the ultraviolet/blue regions of the electromagnetic spectrum (42-45). While such devices generally require sophisticated microfabrication techniques with high vacuum and temperature conditions, it was recently demonstrated that CW lasing could also be achieved using solution-processed inorganic quantum wells (46). On the other hand, the performance of the organic semiconductor lasers in the qCW and long pulse regimes has, up to now, remained far below that of inorganic semiconductors (33, 35).

Our demonstration of an organic semiconductor laser operating at 80 MHz in the qCW regime and still working in the long pulse regime after 500 successive pulses of 30 ms thus represents a major step towards the development of a real CW organic solid-state laser technology. The present study strongly supports the fact that organic lasing materials with high PLQY, high optical gain and no spectral overlap between lasing emission peak and TA bands are highly desirable for suppressing the triplet losses and, when combined with mixed-order DFB gratings, achieving low threshold CW lasers. The results also demonstrate that the use of silicon and sapphire encapsulating lids with higher thermal conductivities (47) than those of conventional glass and fused silica clearly improved the efficiency and stability of the organic DFB lasers, but laser-induced thermal degradation of the organic gain medium under intense CW optical pumping remains the most severe issue that will need to be overcome in the near future. Further work to greatly enhance the CW organic semiconductor laser operational stability should thus now focus on the development of organic semiconductor gain media with low CW lasing thresholds and enhanced thermal stability as well as on the integration of efficient heat dissipation systems into the devices, taking into account perhaps the previous approaches developed for improving the thermal management in CW inorganic solid-state lasers (48, 49). In addition, aside from finding better and more efficient gain materials, further optimization of the resonator geometry and laser structure should lead to lower lasing thresholds and should still represent an important future direction for the development of a CW organic laser technology and for the realization of an electrically-pumped organic laser diode.

Materials and Methods

Device Fabrication

Silicon substrates covered with a thermally grown silicon dioxide layer with a 1 µm thickness were cleaned by ultrasonication using alkali detergent, pure water, acetone, and isopropanol followed by UV-ozone treatment. The silicon dioxide surfaces were treated with hexamethyldisilazane (HMDS) by spin coating at 4000 rpm for 15 s and annealed at 120° C. for 120 s. A resist layer with a thickness of around 70 nm was spin-coated on the substrates at 4000 rpm for 30 s from a ZEP520A-7 solution (ZEON Co.) and baked at 180° C. for 240 s. Electron beam lithography was performed to draw grating patterns on the resist layer using a JBX-5500SC system (JEOL) with an optimized dose of 0.1 nC $cm^{-2}$. After the electron beam irradiation, the patterns were developed in a developer solution (ZED-N50, ZEON Co.) at room temperature. The patterned resist layer was used as an etching mask while the substrate was plasma etched with $CHF_3$ using an EIS-200ERT etching system (ELIONIX). To completely remove the resist layer from the substrate, the substrate was plasma-etched with $O_2$ using a FA-1EA etching system (SAMCO). The gratings formed on the silicon dioxide surfaces were observed with SEM (SU8000, Hitachi). To complete the laser devices, 200-nm-thick 6 or 20 wt % BSBCz:CBP blend films and BSBCz neat films were prepared on the gratings by thermal evaporation under a pressure of $2.0 \times 10^{-4}$ Pa with a total evaporation rate of 0.1-0.2 nm $s^{-1}$. Finally, 0.05 ml of CYTOP (Asahi Glass Co. Ltd., Japan) was directly spin-coated at 1000 rpm for 30 s onto the DFB laser devices, sandwiched with sapphire lids to seal the top of the laser devices, and dried in a vacuum overnight.

Spectroscopy Measurements

For the characterization of the pulsed organic lasers, pulsed excitation light from a nitrogen-gas laser (USHO, KEN-2020) was focused on a $6 \times 10^{-3}$ $cm^2$ area of the devices through a lens and slit. The excitation wavelength was 337 nm, pulse width was 0.8 ns, and repetition rate was 20 Hz. The excitation light was incident upon the devices at around 20° with respect to the normal to the device plane. The emitted light was collected normal to the device surface with an optical fiber connected to a multichannel spectrometer (PMA-50, Hamamatsu Photonics) and placed 3 cm away from the device. Excitation intensities were controlled using a set of neutral density filters. For qCW operation, a mode-locked frequency-doubled Ti-sapphire laser (Millennia Prime, Spectra physics) was used to generate excitation light with an excitation wavelength of 365 nm, pulse width of 10 ps, and repetition rates ranging from 0.01 to 80 MHz. The excitation light was focused on a $1.9 \times 10^{-4}$ $cm^2$ area of the devices through a lens and slit, and the emitted light was collected using a streak scope (C10627, Hamamatsu Photonics) with a time resolution of 15 ps that was connected with a digital camera (C9300, Hamamatsu Photonics). For the true-CW operation, a CW laser diode (NICHIYA, NDV7375E, maximum power of 1400 mW) was used to generate excitation light with an excitation wavelength of 405 nm. In these measurements, pulses were delivered using an acousto-optic modulator (AOM, Gooch & Housego) which was triggered with a pulse generator (WF 1974, NF Co.). The excitation light was focused on a $4.5 \times 10^{-5}$ $cm^2$ area of the devices through a lens and slit, and the emitted light was collected using a streak scope (C7700, Hamamatsu Photonics) with a time resolution of 100 ps that was connected with a digital camera (C9300, Hamamatsu Photonics). The emission intensity was recorded using a photomultiplier tube (PMT) (C9525-02, Hamamatsu Photonics). Both the PMT response and the driving square wave signal were monitored on a multi-channel oscilloscope (Agilent Technologies, MSO6104A). The same irradiation and detection angles were used for this measurement as described earlier. The size of the excitation area was carefully checked by using a beam profiler (WimCamD-LCM, DataRay). All the measurements were performed in nitrogen atmosphere to prevent any degradation resulting from moisture and oxygen. The solution containing BSBCz in $CH_2Cl_2$ was prepared and bubbled with argon before use. Third-harmonic-wave laser light with a wavelength of 355 nm and a FWHM of 5 ns from a Nd:YAG laser (Quanta-Ray GCR-130, Spectra-Physics) was used as pump light and pulsed white light from a Xe lamp was used as probe light for the triplet absorption measurement on the solution using a streak camera (C7700, Hamamatsu Photonics).

REFERENCES

1. J. Clark, G. Lanzani, Organic photonics for communications. *Nature Photon.* 4, 438-446 (2010).
2. D. Moses, High quantum efficiency luminescence from a conducting polymer in solution: A novel polymer laser dye. *Appl. Phys. Lett.* 60, 3215-3216 (1992).
3. N. Tessler, G. J. Denton, R. H. Friend, Lasing from conjugated-polymer microcavities. *Nature* 382, 695-697 (1996).
4. F. Hide, M. A. Diaz-Garcia, B. J. Schwartz, M. Andersson, Q. Pei, A. J. Heeger, Semiconducting polymers: a new class of solid-state laser materials. *Science* 273, 1833-1836 (1996).
5. I. D. W. Samuel, G. A. Turnbull, Organic semiconductor lasers. *Chem. Rev.* 107, 1272-1295 (2007).
6. S. Chénais, S. Forget, Recent advances in solid-state organic lasers. *Polym. Int.* 61, 390-406 (2012).
7. M. D. Mcgehee, A. J. Heeger, Semiconducting (conjugated) polymers as materials for solid-state lasers. *Adv. Mater* 12, 1655-1668 (2000).
8. C. Karnutsch, C. Pflumm, G. Heliotis, J. C. deMello, D. D. C. Bradley, J. Wang, T. Weimann, V. Haug, C. Gartner, U. Lemmer, Improved organic semiconductor lasers based on a mixed-order distributed feedback resonator design. *Appl. Phys. Lett.* 90 131104 (2007).
9. G. Heliotis, R. Xia, D. D. C. Bradley, G. A Turnbull, I. D. W. Samuel, P. Andrew, W. L. Barnes, Two-dimensional distributed feedback lasers using a broadband, red polyfluorene gain medium. *J. Appl. Phys.* 96, 6959-6965 (2004).
10. A. E. Vasdekis, G. Tsiminis, J. C. Ribierre, L. O'Faolain, T. Krauss, G. A. Turnbull, I. D. W. Samuel, Diode pumped distributed Bragg reflector lasers based on a dye-to-polymer energy transfer blend. *Opt. Expr* 14, 9211-9216 (2006).
11. J. C. Ribierre, G. Tsiminis, S. Richardson, G. A. Turnbull, I. D. W. Samuel, H. S. Barcena, P. L. Burn, Amplified spontaneous emission and lasing properties of bisfluorene-cored dendrimers. *Appl. Phys. Lett.* 91, 081108 (2007).
12. Y. Yang, G. A. Turnbull, I. D. W. Samuel, Hybrid optoelectronics: Apolymer laser pumped by a nitride light-emitting diode. *Appl. Phys. Lett.* 92, 163306 (2008).
13. G. Tsiminis, Y. Wang, A. L. Kanibolotsky, A. R. Inigo, P. J. Skabara, I. D. W. Samuel, G. A. Turnbull, Nanoimprinted organic semiconductor lasers pumped by a light-emitting diode. *Adv. Mater.* 25, 2826-2830 (2013).
14. E. R. Martins, Y. Wang, A. L. Kanibolotsky, P. J. Skabara, G. A. Turnbull, I. D. W. Samuel, Low-threshold nanoimprinted lasers using substructured gratings for control of distributed feedback. *Adv. Opt. Mater* 1, 563-566 (2013).
15. J. Herrnsdorf, Y. Wang, J. J. D. McKendry, Z. Gong, D. Massoubre, B. Guilhabert, G. Tsiminis, G. A. Tunrbull, I. D. W. Samuel, N. Laurand, E. Gu, M. D. Dawson, Micro-LED pumped polymer laser: A discussion of future pump sources for organic lasers. *Laser & Photon. Laser & Photon. Rev.* 7, 1065-1078 (2013).
16. C. Grivas, M. Pollnau, Organic solid-state integrated amplifiers and lasers. *Laser & Photon. Rev.* 6, 419-462 (2012).
17. C. Vannahme, S. Klinkhammer, U. Lemmer, T. Mappes, Plastic lab-on-a-chip for fluorescence excitation with integrated organic semiconductor lasers. *Opt. Expr* 19, 8179-8186 (2011).
18. W. Zheng, L. He, Label-free, real-time multiplexed DNA detection using fluorescent conjugated polymers. *J. Am. Chem. Soc.* 131, 3432-3433 (2009).
19. Y. Wang, P. O. Morawska, A. L. Kanibolotsky, P. J. Skabara, G. A. Turnbull, I. D. W. Samuel, LED pumped polymer laser sensor for explosives. *Laser & Photon. Rev.* 7, L71-L76 (2013).
20. A. Rose, Z. Zhu, C. F. Madigan, T. M. Swager, V. Bulovic, Sensitivity gains in chemosensing by lasing action in organic polymers. *Nature* 434, 876-879 (2005).
21. I. D. W. Samuel, E. B. Namdas, G. A. Turnbull, How to recognize lasing. *Nature Photon.* 3, 546-549 (2009).
22. S. Z. Bisri, T. Takenobu, Y. Iwasa, The pursuit of electrically-driven organic semiconductor lasers. *J. Mater Chem. C* 2, 2827-2836 (2014).
23. E. Bornemann, E. Thiel, P. Haring Bolivar, High-power solid-state cw dye laser. *Opt. Expr.* 19, 26382-26393 (2011).
24. E. Bornemann, U. Lemmer, E. Thiel, Continuous-wave solid-state dye laser. *Opt. Lett.* 31, 1669-1671 (2006).
25. Z. Zhao, O. Mhibik, T. Leang, S. Forget, S. Chenais, Thermal effects in thin-film organic solid-state lasers. *Opt. Expr* 22, 30092-30107 (2014).
26. N. C. Giebink, S. R. Forrest, Temporal response of optically pumped organic semiconductor lasers and its implication for reaching threshold under electrical excitation. *Phys. Rev. B* 79, 073302 (2009).
27. M. A. Baldo, R. J. Holmes, S. R. Forrest, Prospects for electrically pumped organic lasers. *Phys. Rev. B* 66, 035321 (2002).
28. M. Lehnhardt, T. Riedl, T. Weimann, W. Kowalsky, Impact of triplet absorption and triplet-singlet annihilation on the dynamics of optically pumped organic solid-state lasers. *Phys. Rev. B* 81, 165206 (2010).
29. M. A. Stevens, C. Silva, D. M. Russell, R. H. Friend, Exciton dissociation mechanisms in the polymeric semiconductors poly(9,9-dioctylfluorene) and poly(9,9-dioctylfluorene-co-benzothiadiazole). *Phys. Rev. B* 63, 165213 (2001).
30. L. Zhao, M. Inoue, K. Yoshida, A. S. D. Sandanayaka, J. H. Kim, J. C. Ribierre, C. Adachi, Singlet-triplet exciton annihilation nearly suppressed in organic semiconductor laser materials using oxygen as a triplet quencher. *IEEE J. Sel. Top. Quant. Electron.* 22, 1300209 (2016).
31. A. S. D. Sandanayaka, L. Zhao, D. Pitrat, J. C. Mulatier, T. Matsushima, C. Andraud, J. H. Kim, J. C. Ribierre, C. Adachi, Improvement of the quasi-continuous-wave lasing properties in organic semiconductor lasers using oxygen as triplet quencher. *Appl. Phys. Lett.* 108, 223301 (2016).
32. S. Schols, A. Kadashchuk, P. Heremans, A. Helfer, U. Scherf, Triplet excitation scavenging in films of conjugated polymers. *Chem. Phys. Chem.* 10, 1071-1076 (2009).
33. Y F. Zhang, S. R. Forrest, Existence of continuous-wave threshold for organic semiconductor lasers. *Phys. Rev. B* 84, 241301 (2011).
34. T. Rabe, K. Gerlach, T. Riedl, H. H. Johannes, W. Kowalsky, J. Niederhofer, W. Gries, J. Wang, T. Weimann, P. Hinze, F. Galbrecht, U. Scherf, Quasi-continuous-wave operation of an organic thin-film distributed feedback laser. *Appl. Phys. Lett.* 89, 081115 (2006).
35. A. S. D. Sandanayaka, K. Yoshida, M. Inoue, K. Goushi, J. C. Ribierre, T. Matsushima, C. Adachi, Quasi-continuous-wave organic thin film distributed feedback laser. *Adv. Opt. Mater* 4, 834-839 (2016).
36. H. Nakanotani, C. Adachi, S. Watanabe, R. Katoh, Spectrally narrow emission from organic films under continuous-wave excitation. *Appl. Phys. Lett.* 90, 231109 (2007).
37. D. Yokoyama, M. Moriwake, C. Adachi, Spectrally narrow emissions at cutoff wavelength from edges of optically and electrically pumped anisotropic organic films. *J. Appl. Phys.* 103, 123104 (2008).
38. H. Yamamoto, T. Oyamada, H. Sasabe, C. Adachi, Amplified spontaneous emission under optical pumping from an organic semiconductor laser structure equipped with transparent carrier injection electrodes. *Appl. Phys. Lett.* 84, 1401 (2004).
39. T. Aimono, Y. Kawamura, K. Goushi, H. Yamamoto, H. Sasabe, C. Adachi, 100% fluorescence efficiency of 4,4'-bis[(N-carbazole)styryl]biphenyl in a solid film and the very low amplified spontaneous emission threshold. *Appl. Phys. Lett.* 86, 071110 (2005).
40. S. Richardson, O. P. M. Gaudin, G. A. Turnbull, I. D. W. Samuel, Improved operational lifetime of semiconducting polymer lasers by encapsulation. *Appl. Phys. Lett.* 91, 261104 (2007).
41. Z. I. Alzerov, V. M. Andreed, D. Z. Garbuzov, Y. V. Zhilyaev, E. P. Morozov, E. L. Portnoi, V. G. Trofim, Investigation of the influence of the AlAs—GaAs heterostructure parameters on the laser threshold current and the realization of continuous emission at room temperature. *Sov. Phys. Semicond.* 4, 1573-1575 (1971).
42. M. Beck, D. Hofstetter, T. Aellen, J. Faist, U. Oesterle, M. Ilegems, E. Gini, H. Melchior, Continuous wave operation of a mid-infrared semiconductor laser at room temperature. *Science* 295, 301-305 (2002).
43. H. Rong, R. Jones, A. Liu, O. Cohen, D. Hak, A. Fang, M. A. Paniccia, A continuous-wave Raman silicon laser. *Nature* 433, 725-728 (2005).
44. T. Someya, Room temperature lasing at blue wavelengths in gallium nitride microcavities. *Science* 285, 1905-1906 (1999).
45. A. C. Tamboli, E. D. Haberer, R. Sharma, K. H. Lee, S. Nakamura, E. L. Hu, Room temperature continuous-wave lasing in GaN/InGaN microdisks. *Nature Photon.* 1, 61-64 (2007).
46. J. Q. Grim, S. Christodoulou, F. Di Stasio, R. Krahne, R. Cingolani, L. Manna, I. Moreels, Continuous-wave biexciton lasing at room temperature using solution-processed quantum wells. *Nature Nanotech.* 9, 891-895 (2014).
47. S. H. Choi, T. I. Lee, H. K. Baik, H. H. Roh, O. Kwon, D. H. Suh, The effect of electrode heat sink in organic-electronic devices. *Appl. Phys. Lett.* 93, 183301 (2008).
48. Y. Bai, S. R. Darvish, S. Slivken, W. Zhang, A. Evans, J. Nguyen, M. Razeghi, Room temperature continuous wave operation of quantum cascade lasers with watt-level optical power. *Appl. Phys. Lett.* 92, 101105 (2008).
49. V. Spagnolo, A. Lops, G. Scamarcio, M. S. Vitiello, C. Di Franco, Improved thermal management of mid-IR quantum cascade lasers. *J. Appl. Phys.* 103, 043103 (2008).

[4] Supplementary Materials

Section A. Optical Simulations

1. Introduction

Recently, organic semiconductor lasers (OSLs) have attracted much attention due to their advantageous properties such as wavelength tuneability in the visible range, low cost, flexibility and large area fabrication [1]. These properties make them good candidates for many applications including sensing, display applications, data storage and xerography. However, only optically pumped organic lasers have been realized thus far. Much effort has been focused on reducing the energy threshold of optically pumped organic lasers by enhancing the gain media properties [2], [3] and optimizing the resonant cavities [4] [5], [6]. In view of achieving electrically pumping organic lasers, which have not been realized yet, more optimizations are needed in order to further reduce the energy threshold.

Concerning the resonant cavities, there are several types compatible with organic gain media including distributed feedback (DFB) resonator [7], [8], distributed Bragg resonator (DBR) [9], microring [10], microdisc [11] and microsphere cavities [12]. The role of the resonator is to provide a positive optical feedback in addition to optical amplification provided by the gain medium.

The laser architecture used in organic lasers state-of-the-art is based on DFB resonators [5], [4], [13]. These resonators do not use conventional cavity mirrors but instead use periodic nanostructures responsible for Bragg diffraction. DFB resonators are compact and can be readily integrated into planar organic thin films. In addition, they can provide a high degree of spectral selection.

The structure of the laser studied in this work is composed of an organic thin film deposited on a $2^{nd}$ order DFB grating. In such a grating, the light generated by the gain medium is waveguided along the high index organic film and then is scattered by the periodic structuration. An optical feedback is produced due to the coupling between forward and backward propagating waves [14]. This coupling is maximum for a certain wavelength which satisfies the Bragg condition:

$$m\lambda_{Bragg}=2n_{eff}\Lambda \quad (1)$$

where m is the order of diffraction, $\lambda_{Bragg}$ is the resonant wavelength in the cavity, $n_{eff}$ is the effective refractive index of the uniform waveguide and $\Lambda$ is the grating period. For the case of the second order grating (m=2), the first order diffracted light is perpendicularly outcoupled from the surface of the film while the in plane feedback is provided by $2^{nd}$ order diffraction. According to the coupled mode theory, the wavelength that fulfills the Bragg condition (1) is not allowed to propagate in the film [15]. This is due to the periodic modulation of the refractive index which leads to the appearance of a photonic stop band centered on the Bragg wavelength. Hence, at $\lambda_{Bragg}$, a dip in emission is observed and the laser oscillations occur on a pair of wavelengths situated on the stopband edges. In a second order grating, laser oscillates only at one edge of the stopband (at the highest wavelength). At this wavelength, the threshold is low due to low radiation losses [16].

The resonant cavity has an influence on the laser performance through two parameters: the confinement factor $\Gamma$ and the quality factor Q. The exciton density at the laser threshold is inversely proportional to both $\Gamma$ and Q [17]. Hence, the optimization of the geometry of DFB resonant cavity is important for reducing the losses which can be quantified by $\Gamma$ and Q.

The goal of this work is to investigate the effect of the organic film thickness on the laser performance including the energy threshold and lasing wavelength. First, the design of the laser is fixed. This is done by calculating the effective index of the waveguide structure in order to deduce the grating period needed to obtain lasing at the ASE wavelength. The thickness of the organic film is changed from 100 nm to 300 nm and the effective index at each thickness is calculated. Second, in order to gain physical insight on the variation of the laser threshold energy with the thickness, optical simulations are performed. The quality factor and the confinement factor of the resonant cavity are calculated as a function of the film thickness and compared to experimental energy threshold of the organic laser device.

2. Device Structure and Simulation Details

The geometry of the grating coupled waveguide constituting the second order DFB organic laser studied in this work is depicted in FIG. 33. The waveguide structure is composed of a gain medium (6% wt BSBCz:CBP), which consists of a high-index layer surrounded by a lower-index SiO$_2$ grating and air. The gain medium is composed of a 6 wt % BSBCz:CBP blend film vacuum deposited on $2^{nd}$ order DFB grating. The grating is made on SiO$_2$ substrate by electron beam lithography. The fabrication of the DFB laser is described elsewhere [4].

The input parameters used for the simulation are the thicknesses and the refractive indices of the layers. The air ($n_a$=1) and the SiO$_2$ substrate ($n_s$=1.46) are considered to be semi-infinite layers. The refractive index of the 6 wt % BSBCz:CBP blend, $n_f$, is considered to be equal to the refractive index of CBP reported in [18] ($n_f$ around 1.8). The thickness of the organic film is changed from 100 to 300 nm. The structure of the laser is designed so that the laser oscillates at the amplified spontaneous emission (ASE) wavelength of the BSB-Cz, around 477 nm [19], [20].

Simulation Software:

The effective index calculation and the fano-fitting are performed using a home made script using python 3.5 software The quality factor and the confinement factors are extracted from the calculation of the eigenvalues of resonant cavity mode using the finite element method in the RF Module of Comsol 5.2a software.

3. Results and Discussions 3.1 Waveguide Characterization (Effective Index Calculation)

In order to calculate the grating period using the Bragg condition (Eq.1), the effective index $n_{eff}$ of the uniform waveguide (without grating) is needed. In this model, the grating is ignored, so the waveguide thickness is that of the organic film. The effective index $n_{eff}$ values are calculated by solving the propagation wave equation [21] at wavelength 477 nm as a function of organic film thickness.

In this calculation, we consider the asymmetric waveguide without grating (FIG. 34(a)). In the case of asymmetric 3-layer slab waveguide, the electric field in each region is given by:

$$E(z, w) = \begin{cases} A\exp(-\delta z) & z \geq 0 \\ A\cos(\kappa z) + B\sin(\kappa z) & -d \leq z \leq 0 \\ [A\cos(\kappa z) + B\sin(\kappa z)]\exp(\gamma(z+d)) & z \leq -d \end{cases} \quad (2)$$

with:

$$\delta = \sqrt{n_{eff}^2 k_0^2 - n_a^2 k_0^2} \quad (3)$$

$$\kappa = \sqrt{n_f^2 k_0^2 - n_{eff}^2 k_0^2} \quad (4)$$

$$\gamma = \sqrt{n_{eff}^2 k_0^2 - n_s^2 k_0^2} \quad (5)$$

Where $k_0$ is the vacuum propagation constant mode ($k_0 = n_{eff} k_0$) and $\beta$ is the propagation constant of the guided mode ($\beta = n_{eff} k_0$). The effective refractive index of the waveguided mode is calculated from the transcendental equation obtained after applying the following boundary conditions:

$$\text{Tan}(\kappa d) = \frac{\kappa(\gamma + \delta)}{\kappa^2 - \gamma \delta} \text{ for TE mode} \quad (6)$$

$$\text{Tan}(\kappa d) = \frac{\kappa(\gamma + \delta)}{\kappa^2 - \gamma \delta} \text{ for TM mode} \quad (7)$$

FIG. 34(b) presents the waveguide dispersion curves, derived from Eq. 6 and 7, showing the variation of the effective refractive index as a function of the organic film thickness at the lasing wavelength 477 nm. From these curves, we can deduce the number of the propagating modes at a given thickness and the cutoff thickness for a certain propagating mode. In this work the thickness is chosen to vary from 100 nm to 300 nm. For thicknesses below 280 nm, only the fundamental mode $TE_0$ is allowed to oscillate. The increase of the thickness above 280 nm lead to the presence to higher order ($TE_1$, $TE_2$).

Once the effective index is calculated, we can deduce the value of the grating period at $\lambda_{ASE}$=477 nm using the Bragg condition (Eq.1) at different film thicknesses. For 200 nm film thickness, the $n_{eff}$=1.7. The value of the grating period $\Lambda$ which satisfy the Bragg condition (Eq.1) is 280 nm. In the following, we fix the grating period at 280 nm and the grating depth at 70 nm thickness. Only the thickness of the organic film is changed from 100 nm to 300 nm.

3.2 DFB Resonant Cavity Optimizations

A resonant cavity is described by its photon lifetime and confinement factor. The photon lifetime $\tau$ expresses the time that photons spend in the cavity (the rate at which photons are lost from the cavity). The photons can be lost by escaping the cavity or by getting absorbed by the material. This photon lifetime $\tau$ is related to the quality factor Q of the cavity as follow:

$$\tau = 2Q/\omega_0 \quad (8)$$

Where $\omega_0$ is the resonant angular frequency.

The Q-factor of the optical cavity is calculated in two different methods.

(1) Eigenmodes Calculations

In the first method, the quality factor is extracted from the calculation of the eigenvalues of resonant cavity mode using the finite element method in the RF Module of Comsol software. The computation domain is limited to one period unit cell of the grating. The Floquet periodic boundary conditions are applied for lateral boundaries and scattering boundary conditions are used for the top and bottom domain [22], [23]. The eigenfrequency solver is used to find the propagating eigenmodes of the resonant cavity. From the real and imaginary parts of the eigenvalue, the Q-factor is derived:

$$Q_{FEM-calc.} = \frac{\omega_0}{2|\alpha|} \quad (9)$$

where $\alpha$ is the damping attenuation ($|\alpha|=1/\tau$). In addition, the confinement factor of the eigenmode is calculated using the following expression:

$$\Gamma = \frac{\int_0^d |E_{norm}|^2 dxdy}{\int_{-\infty}^{+\infty} |E_{norm}|^2 dxdy} \quad (10)$$

where $E_{norm}$ is the normalized electric field intensity distribution of the eigenmode.

(2) Fano Fitting of the Reflection Spectra

The second method used to extract the quality factor consists of calculating the reflection spectrum using the scattering matrix implemented in Comsol software for a normal incident TE-polarized plane wave with its electric field parallel to the gratings [ref]. Then, the Q-factor (Eq.8) is obtained by fitting the resonance linewidth present in the simulated reflection spectrum with the following Fano-resonance equation [24]

$$R = \frac{r^2(\omega - \omega_0)^2 + t^2(1/\tau)^2 \mp 2rt(\omega - \omega_0)(1/\tau)}{(\omega - \omega_0)^2 + (1/\tau)^2} \quad (11)$$

where $\omega_0$ is the central frequency, $\tau$ is the lifetime of the resonance, r and t are the amplitude reflection and transmission coefficient of a uniform slab with the same thickness as the grating and effective refractive index $n_{eff,g}$. In the case of a binary grating, the effective refractive index can be described using the following effective media theory [25]

$$n_{eff,g} = ((1-ff)n_f^2 + ff n_g^2)^{1/2} \quad (12)$$

Where ff is defined as the ratio of the width of the grating w and the period $\Lambda$.

FIG. 35 shows the calculated reflection spectra as a function of wavelength and film thickness and the corresponding fitted Fano-resonance curve using Eq.11. For cavities with film thicknesses of 100, 150, 200, 250 and 300 nm, the reflection peaks are observed at wavelength of 448, 462, 472, 478 and 483 nm, respectively. At these wavelengths, a resonance occurs due to the phase match between diffracted waves by the grating and the leaky waveguide mode [26], [27]. Hence, multiple reflections happen in the waveguide and the wavelength of the incident light is selected by the resonance of the waveguide grating.

As confirmed by the calculation presented in section 3.1 and by previously reported works [28], the increase of $d_f$ causes an increase of the modal $n_{eff}$ (FIG. 34(b)), which leads to a tuning of the lasing wavelength. As we can see in FIG. 36(a), an increase of $d_f$ leads to a spectral red shift of the laser emission. The comparison of the experimental lasing wavelengths and the calculated ones from the Fano model and the model presented in Section 3.1 denoted "model $d_f+h_g$" is presented in FIG. 36(b), where $h_g$ refers to the depth of the grating. Both models provide approximately the same results, approaching the experimental values but the gap between experimental and calculated wavelengths at small $d_f$ (<200 nm) still remains significant ($\Delta\lambda$>10 nm). It was reported that when the ratio $h_g/d_f$ exceeds 0.3 [28], index coupling is the dominant mechanism which is the case for $d_f$ around and bellow 200 nm. When the index coupling is more dominant than gain coupling, the lasing does not occur near the $\lambda_{Bragg}$ as mentioned above. Therefore, the disagreement between experimental lasing wavelengths and calculated ones can be explained by the dominance of index coupling for $d_f$ below 200 nm.

FIG. 37(a) shows the calculated Q-factor and $\Gamma$ values. Both methods used for calculating the Q-factor give the same results. It can be seen that $\Gamma$ increases with $d_f$ showing a good optical confinement. This is due to an increase of $n_{eff}$ of the fundamental mode $TE_0$. However, the Q-factor of the resonant cavity becomes the highest at a $d_f$ value of 200 nm. The measured energies threshold $E_{th}$ for the different $d_f$ are presented in FIG. 37(a)). We can observe that the Q-factor is inversely proportional to $E_{th}$. In addition, when $d_f$ increases from 100 to 200 nm, $E_{th}$ decreases. This is due to the increase of both the Q-factor and $\Gamma$. At a $d_f$ value of 200 nm, $E_{th}$ shows a minimum, and then increases with $d_f$. The higher $E_{th}$ for larger $d_f$ is attributed to the low Q-factor of the resonant cavity.

Finally, the full width at half maximum (FWHM) of the peak reflection extracted from the calculations and Fano fitting is compared with the FWHM of the experimental laser emission [FIG. 37(b)]. Both the experimental and calculated FWHM values show the same trend with the smallest value obtained for $d_f$ equal to 200 nm.

3.3 DFB Laser Optimization with Encapsulation

In this section, the $\Gamma$ and the Q-factor are calculated for the DFB laser with encapsulation using CYTOP. The input parameters used for the optical simulation are the organic film thickness and the refractive indices of the layers. The CYTOP ($n_{CYTOP}$=1.35) and the SiO$_2$ substrate ($n_{SiO2}$=1.46) are considered to be semi-infinite layers. The refractive index of the 6 wt % BSBCz:CBP film, $n_f$, is considered to be equal to the reported refractive index of CBP ($n_f$=1.85) (1). The thickness $d_0$ of the BSBCz:CBP film is changed from 100 to 300 nm. Due to the top surface structuration, a thin grating is added with a depth $h_{g(top)}$=5 nm on a thin layer of thickness ($h_g-h_{g(Top)}$)/2=30 nm.

3.3.1 Film Thickness Variation

First, we investigate the effect of variation of the film thickness $d_0$ while keeping the grating depth $h_g$ constant ($h_g$=65 nm) by calculating the $\Gamma$ and the Q-factor. Table S1 shows the calculation results.

TABLE S1

Film thickness, resonant wavelength, quality factor and confinement factor.

| $d_0$ (nm) | $\lambda_0$ (nm) | Q-factor | $\Gamma$ |
|---|---|---|---|
| 100 | 465 | 717 | 0.34 |
| 200 | 481 | 5050 | 0.78 |
| 300 | 494 | 6674 | 0.88 |

When the thickness increases, the $\Gamma$ and the Q-factor increase but, due to the shift of the resonant wavelength $\lambda_0$ from the ASE wavelength of the gain material, a $d_0$ of 200 nm remains an optimal thickness for the device operation.

3.3.2 Grating Depth Variation

Second, we investigate the effect of $h_g$ variation while keeping $d_0$ constant (d=200 nm) by calculating the $\Gamma$ and the Q-factor. Table S2 below shows the calculation results.

TABLE S2

Grating depth, resonant wavelength, quality factor and confinement factor.

| $h_g$ (nm) | $\lambda_0$ (nm) | Q-factor | $\Gamma$ |
|---|---|---|---|
| 30 | 481 | 8026 | 0.79 |
| 65 | 481 | 5050 | 0.78 |
| 80 | 483 | 1915 | 0.74 |

By reducing the grating depth, the Q-factor increases while $\Gamma$ remains almost the same. However, fabrication of shallow grating is challenging since a small variation of the depth would dramatically affect the optical response of the grating. While this aspect can certainly be improved in future works, the choice of the 65 nm depth in this study seems to be the most appropriate.

3.3.3 Comparison Between Devices with and without Encapsulation

The calculation is done using the same geometry. With encapsulation, the top layer is the CYTOP with a refractive index of 1.35. Without encapsulation, the CYTOP is replaced by air (n=1). In this case the Q-factor and $\Gamma$ increase and the resonant wavelength is slightly blue shifted, as shown in Table S3.

TABLE S3

Comparison between devices with and without encapsulation, the resonant wavelength, quality factor and confinement factor.

| | $\lambda_0$ (nm) | Q-factor | $\Gamma$ |
|---|---|---|---|
| With encapsulation | 481.2 | 5050 | 0.78 |
| Without encapsulation | 479 | 6455 | 0.82 |

However, based on the experimental results, the device with encapsulation showed better performance (FWHM) than the one without encapsulation. This can be due to changes of top surface when we encapsulated the device or due to the protection from moisture.

3.3.4 Influence of the Dimension of the $2^{nd}$ Order Grating Regions

The lasing thresholds of BSBCz:CBP (6:94 wt. %) blend mixed-order DFB lasers were determined experimentally using different dimensions for the 2$^{nd}$ order regions. The results are displayed in FIG. 17. It can be seen that the DFB architecture used in this study (which corresponds to a number of periods equal to 36) is not fully optimized, suggesting that further improvements of the device performances should be possible by simply playing on the resonator structure.

REFERENCES

1. C. Ge, M. Lu, X. Jian, Y. Tan, and B. T. Cunningham, "Large-area organic distributed feedback laser fabricated by nanoreplica molding and horizontal dipping," vol. 18, no. 12, pp. 12980-12991, 2010.
2. H. Nakanotani, S. Akiyama, D. Ohnishi, M. Moriwake, M. Yahiro, T. Yoshihara, S. Tobita, and C. Adachi, "Extremely low-threshold amplified spontaneous emission of 9,9-disubstituted-spirobifluorene derivatives and electroluminescence from field-effect transistor structure," *Adv. Funct. Mater*, vol. 17, no. 14, pp. 2328-2335, 2007.
3. G. Tsiminis, Y. Wang, P. E. Shaw, A. L. Kanibolotsky, I. F. Perepichka, M. D. Dawson, P. J. Skabara, G. A. Turnbull, and I. D. W. Samuel, "Low-threshold organic laser based on an oligofluorene truxene with low optical losses," pp. 3-5, 2009.
4. A. S. D. Sandanayaka, K. Yoshida, M. Inoue, C. Qin, K. Goushi, J.-C. Ribierre, T. Matsushima, and C. Adachi, "Quasi-Continuous-Wave Organic Thin-Film Distributed Feedback Laser," *Adv. Opt. Mater*, vol. 4, no. 6, pp. 834-839, June 2016.
5. E. R. Martins, Y. Wang, A. L. Kanibolotsky, P. J. Skabara, G. A. Turnbull, and I. D. W. Samuel, "Low-Threshold Nanoimprinted Lasers Using Substructured Gratings for Control of Distributed Feedback," *Adv. Opt. Mater.*, vol. 1, no. 8, pp. 563-566, 2013.
6. V. Qaradaghi, V. Ahmadi, and G. Abaeiani, "Design of organic vertical-cavity surface-emitting laser for electrical pumping," *IEEE Electron Device Lett.*, vol. 33, no. 11, pp. 1616-1618, 2012.
7. M. D. McGehee, M. A. Díaz-García, F. Hide, R. Gupta, E. K. Miller, D. Moses, and A. J. Heeger, "Semiconducting polymer distributed feedback lasers," *Appl. Phys. Lett.*, vol. 72, no. 13, pp. 1536-1538, 1998.
8. G. Heliotis, R. Xia, D. D. C. Bradley, G. A. Turnbull, I. D. W. Samuel, P. Andrew, and W. L. Barnes, "Blue, surface-emitting, distributed feedback polyfluorene lasers," *Appl. Phys. Lett.*, vol. 83, no. 11, pp. 2118-2120, 2003.
9. A. E. Vasdekis, G. Tsiminis, J.-C. Ribierre, L. O' Faolain, T. F. Krauss, G. A. Turnbull, and I. D. W. Samuel, "Diode pumped distributed Bragg reflector lasers based on a dye-to-polymer energy transfer blend.," *Opt. Express*, vol. 14, no. 20, pp. 9211-9216, 2006.
10. R. Osterbacka, M. Wohlgenannt, M. Shkunov, D. Chinn, and Z. V. Vardeny, "Excitons, polarons, and laser action in poly(p-phenylene vinylene) films," *J. Chem. Phys.*, vol. 118, no. 19, pp. 8905-8916, 2003.
11. C. X. Sheng, R. C. Polson, Z. V. Vardeny, and D. A. Chinn, "Studies of pi-conjugated polymer coupled microlasers," *Synth. Met.*, vol. 135-136, no. April, pp. 147-149, 2003.
12. M. Berggren, A. Dodabalapur, Z. N. Bao, and R. E. Slusher, "Solid-state droplet laser made from an organic blend with a conjugated polymer emitter," *Adv. Mater*, vol. 9, no. 12, pp. 968-971, 1997.
13. G. Tsiminis, Y. Wang, A. L. Kanibolotsky, A. R. Inigo, P. J. Skabara, I. D. W. Samuel, and G. A. Turnbull, "Nanoimprinted organic semiconductor laser pumped by a light-emitting diode," *Adv. Mater*, vol. 25, no. 20, pp. 2826-2830, 2013.
14. I. D. W. Samuel and G. a Turnbull, "Organic semiconductor lasers.," *Chem. Rev.*, vol. 107, no. 4, pp. 1272-1295, 2007.
15. H. Kogelnik and C. V. Shank, "Coupled-wave theory of distributed feedback lasers," *J. Appl. Phys.*, vol. 43, no. 5, pp. 2327-2335, 1972.
16. R. F. Kazarinov and C. H. Henry, "Second-Order Distributed Feedback Lasers with Mode Selection Provided by First-Order Radiation Losses," *IEEE J. Quantum Electron.*, vol. 21, no. 2, pp. 144-150, 1985.
17. S. Schols, *Device Architecture and Materials for Organic Light-Emitting Devices*. Springer, 2011.
18. D. Yokoyama, A. Sakaguchi, M. Suzuki, and C. Adachi, "Horizontal orientation of linear-shaped organic molecules having bulky substituents in neat and doped vacuum-deposited amorphous films," *Org. Electron.*, vol. 10, no. 1, pp. 127-137, 2009.
19. J. Chang, Y. Huang, P. Chen, R. Kao, X. Lai, C. Chen, and C. Lee, "Reduced threshold of optically pumped amplified spontaneous emission and narrow linewidth electroluminescence at cutoff wavelength from bilayer organic waveguide devices," vol. 23, no. 11, pp. 67-74, 2015.
20. M. Inoue, T. Matsushima, and C. Adachi, "Low amplified spontaneous emission threshold and suppression of electroluminescence efficiency roll-off in layers doped with ter(9,9'-spirobifluorene)," *Appl. Phys. Lett.*, vol. 108, no. 13, 2016.
21. A. K. Sheridan, G. A. Turnbull, A. N. Safonov, and I. D. W. Samuel, "Tuneability of amplified spontaneous emission through control of the waveguide-mode structure in conjugated polymer films," vol. 62, no. 18, pp. 929-932, 2000.
22. J.-H. Hu, Y.-Q. Huang, X.-M. Ren, X.-F. Duan, Y.-H. Li, Q. Wang, X. Zhang, and J. Wang, "Modeling of Fano Resonance in High-Contrast Resonant Grating Structures," *Chinese Phys. Lett.*, vol. 31, no. 6, p. 64205, June 2014.
23. T. Zhai, X. Zhang, and Z. Pang, "Polymer laser based on active waveguide grating structures.," *Opt. Express*, vol. 19, no. 7, pp. 6487-6492, 2011.
24. A. E. Miroshnichenko and Y. S. Kivshar, "Fano resonances in nanoscale structures," vol. 82, no. September, pp. 2257-2298, 2010.
25. M. Foldyna, R. Ossikovski, A. De Martino, B. Drevillon, E. Polytechnique, and P. Cedex, "Effective medium approximation of anisotropic lamellar nanogratings based on Fourier factorization," vol. 14, no. 8, pp. 3055-3067, 2006.
26. S. S. Wang and R. Magnusson, "Theory and applications of guided-mode resonance filters.," *Appl. Opt.*, vol. 32, no. 14, pp. 2606-2613, 1993.
27. T. Khaleque and R. Magnusson, "Light management through guided-mode resonances in thin-film silicon solar cells," *J. Nanophotonics*, vol. 8, no. 1, p. 83995, 2014.
28. V. Navarro-Fuster, I. Vragovic, E. M. Calzado, P. G. Boj, J. A. Quintana, J. M. Villalvilla, A. Retolaza, A. Juarros, D. Otaduy, S. Merino and M. A. Díaz-García, "Film thickness and grating depth variation in organic second-order distributed feedback lasers," *J. Appl. Phys.* Vol. 112, no. 4, pp. 43104, 2012.

Section B. Lasing Properties of Mixed-Order DFB Devices

The lasing properties of encapsulated mixed-order DFB devices using either a BSBCz neat film or a BSBCz:CBP (6:94 wt. %) blend film as the gain medium were examined under pulsed optical pumping using a nitrogen laser delivering 800 ps pulses at a repetition rate of 20 Hz and at a wavelength of 337 nm. In case of the CBP blend films, the excitation light was mainly absorbed by the CBP host. However, the large spectral overlap between CBP emission and BSBCz absorption guaranteed an efficient Förster-type energy transfer from the host to the guest molecules (2-6). This was confirmed by the absence of CBP emission under 337 nm photo-excitation. FIGS. 19A-E display the emission spectra collected normal to the surface of the BSBCz and BSBCz:CBP (6:94 wt. %) films at different excitation intensities below and above the threshold. At low excitation intensities, Bragg dips corresponding to the optical stopband of the DFB grating (2) were observed at 480 and 483 nm for the neat and blend films, respectively. The tiny variation in the Bragg dip position is presumably due to the slightly different refractive indices of the blend and neat films (2-6). As the pumping intensity was increased above a critical threshold, a narrow emission peak appeared in both neat and blend devices, indicating the onset of lasing. It can also be seen that the laser peaks increased in intensity faster than the photoluminescence backgrounds providing evidence of the non-linearity associated with stimulated emission. The lasing wavelength was found to be 484 nm for the blend film and 481 nm for the neat film. FIGS. 19C-D show the output emission intensity and the full-width-at-half-maximum (FWHM) as a function of the pumping intensity for both DFB devices. The FWHM was found to become lower than 0.2 nm at high excitation intensities. The lasing thresholds of the DFB lasers were determined from the abrupt changes in the output intensities. The devices based on neat and blend films were found to exhibit lasing thresholds of 0.22 and 0.09 µJ cm$^{-2}$, respectively. In both cases, these values are lower than the previously reported thresholds for amplified spontaneous emission (ASE) and the second-order DFB lasers in BSBCz:CBP blends (2-6), supporting the potential of mixed-order gratings for high performance organic solid-state lasers.

Section C. Optical Gain

From these experimental ASE data, the net gain and loss coefficients could be determined and their values are listed in Table S4.

TABLE S4

Pulse width, excitation power, net gains and loss coefficient.

| Pulse width (□ul) | Power (k W cm$^{-2}$) | Net gains (cm$^{-1}$) | Loss coefficient (cm$^{-1}$) |
|---|---|---|---|
| 0.1 | 0.5 | 8.1 | 1.5 |
|  | 1.0 | 11.3 |  |
|  | 1.5 | 19.8 |  |
| 10.0 | 0.5 | 13.9 | 2.2 |
|  | 1.0 | 17.0 |  |
|  | 1.5 | 32.6 |  |
| 50.0 | 0.5 | 25.1 | 3.4 |
|  | 1.0 | 30.8 |  |
|  | 1.5 | 40.1 |  |

These ASE results provide clear evidence that a large net optical gain can be achieved in BSBCz based films in the CW regime. Therefore, this clearly supports our statement that BSBCz is one of the best candidates for CW and quasi-CW lasing.

Section D. Transient Absorption

The results in FIG. 27A indicate that the PL intensity remains constant after a few µs irradiation. This implies that there is no quenching of the singlet excitons by STA in the devices. FIG. 27C also shows that there is no significant spectral overlap between the lasing and the triplet absorption spectra. Those results provide clear evidence that there are no detrimental triplet losses in the gain medium used in this study.

From these data, we also estimated the stimulated emission cross section $\sigma_{em}$ and the triplet excited state cross sections $\sigma_{TT}$ as previously report (3, 9). The $\sigma_{em}$ at 480 nm is 2.2×10$^{-16}$ cm$^2$, which is significantly larger than a $\sigma_{TT}$ of 3.0×10$^{-19}$ cm$^2$, indicating that the triplet absorption has almost no influence on the long pulse regime.

We estimated triplet lifetime ($\tau_{TT}$), triplet absorption cross section ($\sigma_{TT}$), and intersystem crossing yield ($\varphi_{ISC}$) $\tau_{TT}$=5.7×10$^3$ s$^{-1}$, $\sigma_{TT}$=3.89×10$^{-17}$ cm$^2$ (at 630 nm, FIG. 27D) and $\varphi_{ISC}$=0.04, respectively, in a solution. The $\varphi_{ISC}$ was estimated by excitation power dependence of transient absorption (FIG. 27E) comparing with benzophenone as a reference (9). However, it should be highlighted that we could not observe any triplet contribution in thin films using our transient absorption measurement system. For instance, the intersystem crossing in the blend films is negligible due to the $\varphi_{PL}$ value of nearly 100%.

Overall, the emission spectrum measured above E$_{th}$ does not largely overlap with the triplet absorption spectrum, leading to a large net gain for light amplification in the long pulse regime. Therefore, we are convinced that BSBCz is one of the best candidates for CW and quasi-CW lasing.

Section E. Thermal Simulations

Transient 2D heat transfer simulation is performed using COMSOL 5.2a in order to probe the temperature distribution within the device. FIG. 38 shows a schematic of the geometry of the laser device. Note that we neglected the grating in this simulation.

The governing partial differential equation for temperature distribution is expressed as:

$$\rho C_p \frac{\partial T}{\partial t} - k \left[ \frac{\partial^2 T}{\partial r^2} + \frac{1}{r}\frac{\partial T}{\partial r} + \frac{\partial^2 T}{\partial z^2} \right] = Q \quad (1)$$

where $\rho$ is the material density, $C_p$ is the specific heat capacity, T in the temperature, t is the time, k is the thermal conductivity and Q is the laser heat source term. The laser pump beam has a Gaussian shape. Because of the circular symmetry of the laser beam, the heat transfer equation is solved in cylindrical coordinate. For a pulsed Gaussian laser beam, the heat source is written as follow (10):

$$Q(r, z, t) = \alpha(1 - R)\eta_g \exp(-\alpha(z_g - z)) \frac{2P}{\pi r_0^2} \exp\left(-\frac{2r^2}{r_0^2}\right) H(t) \quad (2)$$

where $\alpha$ is the absorption coefficient, R is the reflection of the pump beam at bottom facet of the device, P is the incident pump power reaching the gain region, r and z are the spatial coordinate, $r_0$ is the 1/e$^2$ radius of the pump laser beam, r=0 is center of the laser beam, $z_g$ is z-coordinate of the interface between the gain region and the top layers (see FIG. 38), H(t) is the rectangular pulse function with a pulse width $\tau_p$, $\eta_g$ is the fraction of the pump power absorbed in the gain region converted to heat in the absence of laser field (11) given by:

$$\eta_g = 1 - \phi_{PL}\lambda_{pump}/\lambda_{laser} \qquad (3)$$

where $\phi_{PL}$ is the fluorescence quantum yield ($\phi_{PL}$(BSBCz:CBP)=86%), $\lambda_{pump}$ is the pump laser wavelength and $\lambda_{laser}$ is the extracted laser wavelength. Concerning the boundary conditions, in the radial direction, symmetry boundary conditions are used at the axis of rotation. Thermal insulation boundary conditions are applied at the bottom, top and edge surfaces (air convection is neglected). The radius of the device is set to 2.5 mm. The power density is 2 kW/cm². Table S5 presents the thermo-physical and geometrical parameters used in the simulations taken from COMSOL database. For the BSBCz:CBP layer, we chose the same thermal parameters for organic material as in Ref (11).

TABLE S5

Thermo-physical and geometrical parameters of the materials.

| Layer name | k (W K⁻¹ m⁻¹) | $C_p$ (J kg⁻¹ K⁻¹) | ρ (kg m⁻³) | α (m⁻¹) at 405 nm | D (μm) |
|---|---|---|---|---|---|
| Glass | 1.4 | 730 | 2210 | 0 | 717 |
| Sapphire | 27 | 900 | 3900 | 0 | 759 |
| CYTOP | 0.12 | 861 | 2200 | 0 | 2 |
| BSBCZ:CBP | 0.2 | 1400 | 1200 | $1.55 \times 10^6$ | 0.2 |
| SiO₂ | 1.38 | 703 | 2203 | 0 | 100 |
| Si | 130 | 700 | 2329 | $8.00 \times 10^6$ | 333 |

After absorption of the pump laser energy, the BSBCz layer acts as a heat source. The generated heat is transferred by conduction towards the top and bottom layers.

1.1 Pulse Width Variation

FIGS. 39 and 40 show the maximum temperature rise and the temperature rise at the interface of BSBCz/CYTOP layers after each pump with pulse width $\tau_p$ of 10, 30 and 40 ms, respectively.

These simulation results demonstrate that the temperature rise caused by the long pulse pumping irradiation increases with the pulse duration but this effect tends to saturate for pulses longer than 30 ms. It can also be seen from these calculations that the temperature rise is not expected to significantly increase with the number of incident pulses.

1.2 Influence of the Encapsulation in the Case of a 10 ms Pulse Width

The simulation results in FIG. 41 provide clear evidence of the importance of the encapsulation used in our devices to improve the thermal management in the device operating under long pulse photo-irradiation.

1.3 CYTOP Thickness Variation

As shown in FIG. 42, increasing the CYTOP thickness leads to an increase of temperature in the gain region due to the low thermal conductivity of the CYTOP. While the encapsulation of the DFB laser by CYTOP is found to be critical for improving the performance of the device under long pulse photo-excitation, the poor thermal conduction of CYTOP is clearly a limiting factor and this aspect should be solved in future studies via the selection of a more appropriate encapsulation material in order to demonstrate a real CW organic semiconductor technology.

REFERENCES

1. D. Yokoyama, A. Sakaguchi, M. Suzuki, C. Adachi, Horizontal orientation of linear-shaped organic molecules having bulky substituents in neat and doped vacuum-deposited amorphous films. Org. Electron. 10(1), 127-137 (2009).
2. A. S. D. Sandanayaka, K. Yoshida, M. Inoue, K. Goushi, J. C. Ribierre, T. Matsushima, C. Adachi, Quasi-continuous-wave organic thin film distributed feedback laser. Adv. Opt. Mater 4, 834-839 (2016).
3. H. Nakanotani, C. Adachi, S. Watanabe, R. Katoh, Spectrally narrow emission from organic films under continuous-wave excitation. Appl. Phys. Lett. 90, 231109 (2007).
4. D. Yokoyama, M. Moriwake, C. Adachi, Spectrally narrow emissions at cutoff wavelength from edges of optically and electrically pumped anisotropic organic films. J. Appl. Phys. 103, 123104 (2008).
5. H. Yamamoto, T. Oyamada, H. Sasabe, C. Adachi, Amplified spontaneous emission under optical pumping from an organic semiconductor laser structure equipped with transparent carrier injection electrodes. Appl. Phys. Lett. 84, 1401 (2004).
6. T. Aimono, Y. Kawamura, K. Goushi, H. Yamamoto, H. Sasabe, C. Adachi, 100% fluorescence efficiency of 4,4'-bis[(N-carbazole)styryl]biphenyl in a solid film and the very low amplified spontaneous emission threshold. Appl. Phys. Lett. 86, 071110 (2005).
7. M. D. Mcgehee, A. J. Heeger, Semiconducting (conjugated) polymers as materials for solid-state lasers. Adv. Mater 12, 1655-1668 (2000).
8. J. C. Ribierre, G. Tsiminis, S. Richardson, G. A. Turnbull, I. D. W. Samuel, H. S. Barcena, P. L. Burn, Amplified spontaneous emission and lasing properties of bisfluorene-cored dendrimers. Appl. Phys. Lett. 91, 081108 (2007).
9. S. Hirata, K Totani, T. Yamashita, C. Adachi, M. Vacha, Large reverse saturable absorption under weak continuous incoherent light. Nature Materials. 13, 938-946 (2014).
10. Z. Zhao, O. Mhibik, T. Leang, S. Forget, S. Chénais, Thermal effects in thin-film organic solid-state lasers. Opt. Express. 22, 30092-30107 (2014).
11. S. Chenais, F. Druon, S. Forget, F. Balembois, P. Georges, On thermal effects in solid-state lasers: The case of ytterbium doped materials, Prog. Quantum Electron. 30(4), 89-153 (2006).

[5] Electrically Driven Organic Semiconductor Laser Diode

Summary

Despite major advances in the performance of optically pumped organic semiconductor lasers and their applications, electrically driven organic laser diodes have not been realized yet. Here, we report the first demonstration of an organic semiconductor laser diode. The reported device incorporates a mixed-order distributed feedback SiO₂ grating into an organic light-emitting diode structure. A current density as high as 3.30 kA cm⁻² could be injected into the devices and blue lasing was observed above a threshold around 0.54 kA cm⁻². The realization of an organic semiconductor laser diode is mainly due to the selection of a high gain organic semiconductor showing no triplet absorption losses at the lasing wavelength and the suppression of the electroluminescence efficiency roll-off at high current density. This represents a major advance in the field of organic electronics and the first step towards a novel cost-effective organic laser diode technology enabling full integration of organic optoelectronic circuits.

DETAILED DESCRIPTION

The properties of optically pumped organic semiconductor lasers (OSLs) have dramatically improved in the last two decades as a result of major advances in both the development of high gain organic semiconductor materials and the design of high quality factor resonator structures[1-5]. The advantages of organic semiconductors as gain media for lasers include their high photoluminescence quantum yield (PLQY) and large stimulated emission cross section, their chemical tunability, their broad emission spectra across the visible region and their ease of fabrication. Owing to recent advances in low-threshold distributed feedback (DFB) OSLs, optical pumping by electrically driven nanosecond-pulsed inorganic light-emitting diodes was demonstrated, providing a route towards a new compact and low-cost visible laser technology[6]. This type of miniaturized organic laser is particularly promising for lab-on-chip applications, chemical sensing and bioanalytics. However, to achieve full integration of organic photonic and optoelectronic circuits, electrically driven organic semiconductor laser diodes (OSLDs) are required, which have remained an unrealized scientific challenge so far. The problems that have prevented lasing from direct electrical pumping of organic semiconductor devices are mainly due to the optical losses from the electrical contacts and the additional triplet and polaron losses taking place at high current densities[4-5,7-9]. Different approaches have already been proposed to sort out these issues, which involve for instance the use of triplet quenchers[10-12] to suppress triplet absorption losses and singlet quenching by singlet-triplet exciton annihilation as well as the reduction of the device active area[13] to spatially separate exciton formation from exciton radiative decay areas and minimize the polaron quenching processes. Considering the current state-of-the-art performance of optically pumped organic semiconducting DFB lasers[5], a careful combination of these approaches accompanied with an optimization of the device structure might lead to electrically driven lasing emission from an organic thin film. Previous studies have suggested that current densities over a few kA/cm² would be required to achieve lasing from an OSLD if the additional losses associated with the electrical pumping were completely suppressed[14]. Among the different organic semiconductor thin films showing an amplified spontaneous emission (ASE) threshold lower than 0.5 □J/cm²,[5] one of the most promising molecules to observe lasing emission under electrical pumping is 4,4'-bis[(N-carbazole)styryl]biphenyl (BSBCz) (see the chemical structure in FIG. 43)[15]. The ASE threshold of BSBCz-based thin films was reported to be as low as 0.30 □J cm⁻² under 800 ps pulse photoexcitation[16]. In parallel, another work showed that current densities as high as 2.8 kA cm⁻² could be injected in BSBCz based organic light-emitting diodes (OLEDs) under pulse operation with a pulse width of 5 □s[13]. These devices showed maximum electroluminescence external quantum efficiency (EQE) values over 2%. In addition, efficiency roll-off at high current densities due to singlet-heat and singlet-polaron annihilation was substantially reduced by narrowing one of the dimensions of the current injection/transport area down to 50 nm. More recently, quasi-continuous-wave lasing at 80 MHz and true continuous-wave lasing lasting at least 30 ms were demonstrated in optically pumped BSBCz-based organic DFB lasers[17]. Such an unprecedented performance could be achieved because of the PLQY of BSBCz approaching 100% in a 4,4'-bis(N-carbazolyl)-1,1'-biphenyl (CBP) blend and the fact that there are no significant triplet absorption losses at the lasing wavelength of BSBCz films. Here, we demonstrate electrically driven lasing emission from a BSBCz thin film by combining an inverted OLED structure with a mixed-order DFB SiO₂ grating integrated into the active area of the device, providing thus the first clear evidence of electrically driven lasing emission from an organic semiconductor.

The fabrication method and the architecture of the OSLDs developed in this study are schematically represented in FIGS. 43-45 (see the Materials and Methods Section for a detailed description of the experimental procedures). A 100 nm thick dielectric SiO₂ layer was first sputtered onto precleaned patterned indium tin oxide (ITO) glass substrates. We then designed a mixed-order DFB grating with first-order Bragg scattering regions surrounded by second-order Bragg scattering regions that give rise to a strong optical feedback and provide an efficient vertical outcoupling of the laser emission, respectively[17,18]. In a DFB laser, it is well-known that laser oscillation occurs when the Bragg condition[4-19] $m\lambda_{Bragg}=2n_{eff}\Lambda$ is satisfied, where m is the order of diffraction, $\lambda_{Bragg}$ is the Bragg wavelength, $n_{eff}$ is the effective refractive index of the gain medium, and $\Lambda$ is the period of the grating. Using the reported $n_{eff}$ and $\lambda_{Bragg}$ values for BSBCz[20,21], the grating periods for a mixed-order (m=1, 2) DFB laser device are calculated to be 140 and 280 nm, respectively. Electron beam lithography and reactive ion etching were used to engrave these mixed-order DFB gratings in the SiO₂ layer over a 140×200 □ m area (FIG. 46A). As shown by the scanning electron microscopy (SEM) image in FIG. 46B, the DFB gratings fabricated in this work had periods of 140±5 and 280±5 nm with a grating depth of about 65±5 nm, which is in perfect accordance with our specifications provided above. The length of each 1$^{st}$ and 2$^{nd}$ order DFB grating was about 10 and 15.1 μm, respectively. Energy dispersive X-ray spectroscopy (EDX) analysis was then performed to make sure that the ITO layer was not damaged during the grating fabrication and that the SiO₂ layer was completely removed in the etched regions. The EDX results shown in FIG. 46C and FIG. 46D provide evidence that charge injection from ITO to an organic semiconductor layer deposited on top of the DFB gratings can take place in the etched regions where ITO contacts are located. Further, we propose that the DFB resonator can also be prepared using a simple nanoimprint lithography process with low cost (FIG. 45). As shown by the schematic representation displayed in FIG. 47A, the OSLDs fabricated in this work have the following simple inverted OLED structure vapor-deposited on top of the DFB gratings: ITO (100 nm)/20 wt. % Cs:BSBCz (60 nm)/BSBCz (150 nm)/MoO₃ (10 nm)/Ag (10 nm)/Al (90 nm). In such an inverted device structure, doping the BSBCz film by Cs in the region close to the ITO contact improves the electron injection into the organic layer while MoO₃ is used as hole injection layer (FIG. 48-49). As shown in FIG. 50, the surface morphology of the all layers presents a grating structure with a surface modulation depth of 20-30 nm. While the most efficient OLEDs generally use multilayer architectures to optimize charge balance[22,23], charge accumulation can take place at organic hetero-interfaces at high current densities, which can be detrimental for device performance and stability[24]. The OSLDs fabricated in this work contained only BSBCz as organic semiconductor and were specifically designed to minimize the number of organic hetero-interfaces. Note that devices without SiO₂ DFB grating were also fabricated and used as reference to gain further information about the influence of the gratings on the electroluminescence properties. Furthermore, we are keen to make the organic semiconductor laser diode with different one-dimensional DFB resonator structures in SiO₂, ITO, and polymers or on top of the active layer (FIG. 51A-D). As shown in FIG. 52, an organic semiconductor laser diode with a two-dimensional DFB resonator structure is also promising for low threshold 2D-DFB laser.

FIG. 47B and FIG. 53A-D show optical microscope images of an OSLD, and FIG. 47C those of a reference OLED without grating, both under direct current (DC) operation at 4.0 V. The electroluminescence is emitted homogeneously from the active area of the reference OLED. In the case of the OSLD, more intense emission can be seen from the $2^{nd}$ order DFB grating regions of the OSLD, which were specifically designed to promote vertical light outcoupling. The current-voltage (J-V) and EQE-J curves measured in representative devices with and without DFB gratings are shown in FIG. 47D-E. The devices were characterized under both DC and pulsed (with a voltage pulse width of 500 ns and a repetition rate of 100 Hz) conditions. The active area of the OSLD was evaluated from SEM and laser microscope images, which was needed to calculate the current density injected into the device. The reference device under DC and pulse operation showed maximum current densities before device breakdown ($J_{max}$) of 70 and 850 A cm$^{-2}$, respectively. Due to a reduction of the Joule heating with the smaller active device area[13,25], the OSLD exhibited significantly higher $J_{max}$ of 80 and 3220 A cm$^{-2}$ under DC and pulse operation, respectively. All the BSBCz devices were found to exhibit a maximum EQE value higher than 2% at low current densities. However, significant efficiency roll-off was observed in the OSLD and reference devices at current densities higher than 15 A cm$^{-2}$ under DC operation, which can be attributed to a thermal degradation of the organic gain medium. Under pulse operation, the reference device showed efficiency roll-off at current densities higher than 410 A cm$^{-2}$, which is consistent with results in a previous report. More importantly, the efficiency roll-off was suppressed in the OSLD under pulse operation and the EQE was even found to substantially increase above 800 A cm$^{-2}$ to reach a maximum value of 3.3%. When current densities increased above 3200 A cm$^{-2}$, EQE rapidly decreased presumably due to thermal degradation of the organic semiconductor.

As shown in FIG. 54, the electroluminescence spectra of the reference devices are similar to the steady-state PL spectra of a BSBCz neat film and do not change as a function of the current density. FIGS. 53E, 55A, 55C and 56A shows the evolution of the electroluminescence spectra of several OSLDs under pulse operation at different current densities. These spectra were measured in the direction normal to the substrate plane from the ITO side of the OSLDs. It can be clearly seen that a strong spectral line narrowing effect occurs at 456.8 nm when J becomes higher than 800 A cm$^{-2}$. To gain further insights, the output intensity and the full-width-at-half-maximum (FWHM) are plotted in FIGS. 53F, 55B, 55D, and 56B as a function of the current density. While the FWHM of the steady-state PL spectrum of BSBCz neat film is around 35 nm, it decreases to values lower than 0.2 nm at the highest current densities. In parallel, an abrupt change in the slope efficiency of the output intensity is also observed which is consistent with the behavior of the EQE-J curve and can be used to determine a threshold of 960 A cm$^{-2}$. Similarly to what was seen in the EQE-J curve, the output intensity decreases with J when J>3.2 kA cm$^{-2}$, due to thermal degradation leading to the device breakdown. In this regime, it is however important to note that the emission spectrum of the OSLD remains extremely sharp. The observed behavior evidently suggests that light amplification occurs at high current densities and that the OSLD show lasing emission above a laser threshold. The quest toward the first organic semiconductor laser diode has been associated in the past with a few controversial reports, implying that great care should be taken before claiming that the OSLD fabricated in this study provides electrically driven laser emission[9]. First, a few studies[20,26,27] have shown that edge emission of waveguided modes from organic light-emitting devices can lead to very strong line narrowing effects without laser amplification. In contrast to these previous works, the emission from our OSLD is detected in the direction normal to the substrate plane and shows a clear threshold behavior. It should also be highlighted that the ASE linewidth of an organic thin film is typically in the range of a few nm while the FWHM of an organic DFB laser can be well below 1 nm 5. With a FWHM lower than 0.2 nm, the emission spectrum from our OSLD cannot be attributed to ASE only and corresponds to what is typically obtained in optically pumped organic DFB lasers. Second, a previous report has shown a very narrow emission spectrum by inadvertently exciting a transition in ITO.[28] The atomic spectral lines of ITO include those at 410.3, 451.3 and 468.5 nm.[29] The emission peak wavelength of the OSLD in FIG. 55A is 456.8 nm, which cannot be attributed to emission from ITO. It should also be emphasized that the emission of an OSLD should be characteristic of the resonator modes and the output should thus be very sensitive to any modifications of the laser cavity. A simple way to tune the emission wavelength in optically-pumped organic DFB lasers is to change the grating period[4,5,30,31]. FIG. 55C-D displays the emission spectra at different current densities and the output intensity as a function of the current density for an OSLD with grating periods of 300 nm (for the $2^{nd}$ order scattering) and 150 nm (for the $1^{st}$ order scattering), respectively. This device shows a lasing peak at 475.5 nm with a FWHM as low as 0.16 nm and a threshold of 1.07 kA cm$^{-2}$ (FIG. 57).

Further, we present organic DFB lasers based on thin films of the BSBCz employing an improved resonator design (FIG. 58). As the laser radiation coupled out by the second-order grating represents a loss channel, these lasers usually show higher thresholds as compared to their first-order counterparts. To investigate the trade-off between outcoupling and threshold, we fabricated gratings with different widths of the and first and second-order region. Thresholds were deduced from laser input-output curves and are plotted as a function of widths of the second-order region in FIG. 59. It can be seen that the oscillation threshold increases linearly with the size of the second-order region. This can be understood in terms of the laser threshold being proportional to the waveguide losses, which grow linearly with increasing periods. Hence, the threshold of the mixed-order resonators increases as the fraction of outcoupled light increases, but even for strong outcoupling, the threshold remains low. By varying the grating parameters, organic solid-state lasers can thus be tailored with optimized properties (low threshold and high outcoupling).

FIG. 56B displays the emission spectra at different current densities and the output intensity as a function of the current density for an OSLD with grating periods of 300 nm (for the $2^{nd}$ order scattering) and 150 nm (for the $1^{st}$ order scattering) and first and second order periods of 4 and 12, respectively (FIG. 60). This device shows a lasing peak at 500.5 nm with a FWHM as low as 0.18 nm and a threshold of 540 A cm$^{-2}$. This clearly provides evidence that the lasing emission from our OSLD is strongly influenced by the DFB resonator structure, and this can be used to tune the laser wavelength over a range of wavelengths. Laser emission from an OSLD should also follow some criteria in terms of output beam polarization, shape of the output beam and temporal coherence[9]. As shown in FIG. 61, the output beam of the OSLD is strongly linearly polarized along the grating pattern, providing clear evidence of a truly one-dimensional DFB laser action in the electrically-driven device.

Another important issue that needs to be clarified is to see how the lasing threshold of the electrically driven OSLD compares with that obtained by optical pumping. FIG. 62 shows the lasing characteristics of an OSLD optically pumped through the ITO side at the excitation wavelength of 405 nm by a laser diode delivering 500 ns pulses. Lasing emission occurred at 481 nm, which is consistent with the electrically driven lasing wavelength. The lasing threshold under optical pumping was measured to be around 450 W $cm^{-2}$, which is higher than the value of 36 W $cm^{-2}$ that is obtained in an optically pumped BSBCz-based DFB laser without the two electrodes. It should be noted that the thicknesses of the different layers used in the OSLD have been optimized in this work to minimize the optical losses due to the presence of these electrodes. Assuming no additional loss mechanisms in the BSBCz OSLD operating at high current densities, the threshold measured in the optically pumped device suggests that electrically driven lasing emission should be achieved for current densities higher than 1125 A $cm^{-2}$. The similar threshold values for the optical and electrical pumping suggest that the additional losses (including exciton annihilation, triplet and polaron absorption, quenching by the high electric field, Joule heating) generally taking place in organic electroluminescent devices at high current densities[32] have been nearly suppressed. This is fully consistent with the fact that an electroluminescent efficiency roll-off was not observed in the OSLDs under intense pulse electrical excitation. To explain such a result, it should be remembered that BSBCz films do not show significant triplet absorption at the lasing/ASE wavelength and that they exhibit very weak quenching of the singlets by singlet-triplet annihilation. Importantly, a previous work has shown that the reduction of the device active area can be used to separate exciton formation from exciton radiative decays and substantially reduce polaron/heat quenching processes.

We also fabricated devices with nine DFBs on one chip as shown in FIG. 63, and such a device provide efficient output of laser emission. For low threshold organic semiconductor laser diodes, we also successfully fabricated circular-DFB resonator (FIGS. 64-65).

In conclusion, this study demonstrates the first realization of an electrically-driven organic semiconductor laser diode that implements a mixed-order distributed feedback $SiO_2$ resonator into the active area of an organic light-emitting diode structure. In particular, the device showed blue lasing emission with a threshold current density as low as 540 A $cm^{-2}$. The different criteria, in terms of emission linewidth, polarization and thresholds, that can be used to distinguish between lasing emission and other phenomena have been carefully verified and fully support the claim that this is the first observation of electrically driven lasing in organic semiconductors. This report opens up new opportunities and perspectives in organic photonics and should evidently serve as a strong basis for the future development of an organic semiconductor laser diode technology allying the advantages of a simple, cheap and tunable laser source and its suitability for a full and direct integration of organic-based optoelectronic platforms.

Materials and Methods
Device Fabrication and Characterization

Indium tin oxide (ITO)-coated glass substrates (100 nm ITO, Atsugi Micro Co.) were cleaned by ultrasonication using neutral detergent, pure water, acetone, and isopropanol followed by UV-ozone treatment. A 100 nm thick $SiO_2$ was sputtered at room temperature on 100 nm ITO coated glass substrate to engrave DFB on ITO substrate. The argon pressure during the sputtering was 0.2 Pa. The RF power was set at 100 W (FIG. 43 and FIG. 44). Substrates were again cleaned by ultrasonication using isopropanol followed by UV-ozone treatment. The silicon dioxide surfaces were treated with hexamethyldisilazane (HMDS) by spin coating at 4000 rpm for 15 s and annealed at 120° C. for 120 s. A resist layer with a thickness of around 70 nm was spin-coated on the substrates at 4000 rpm for 30 s from a ZEP520A-7 solution (ZEON Co.) and baked at 180° C. for 240 s. Electron beam lithography was performed to draw grating patterns on the resist layer using a JBX-5500SC system (JEOL) with an optimized dose of 0.1 nC $cm^{-2}$. After the electron beam irradiation, the patterns were developed in a developer solution (ZED-N50, ZEON Co.) at room temperature. The patterned resist layer was used as an etching mask while the substrate was plasma etched with $CHF_3$ using an EIS-200ERT etching system (ELIONIX). To completely remove the resist layer from the substrate, the substrate was plasma-etched with $O_2$ using a FA-1EA etching system (SAMCO). The etching condition was optimized to completely remove the $SiO_2$ from pitch-modulate in DFB until ITO contact. The gratings formed on the silicon dioxide surfaces were observed with SEM (SU8000, Hitachi) (FIG. 46B). EDX (at 6.0 kV, SU8000, Hitachi) analysis were performed to confirm complete removal of $SiO_2$ from the ditches in the DFB (FIGS. 46C and D). The DFB substrates were cleaned by conventional ultrasonication. Organic layers and a metal electrode were then vacuum-deposited by thermal evaporation under a pressure of $2.0 \times 10^4$ Pa with a total evaporation rate of 0.1-0.2 nm $s^{-1}$ on the DFB substrates with $SiO_2$ insulators to fabricate i-OLEDs with the structure indium tin oxide (ITO) (100 nm)/20 wt % Cs:BSBCz (60 nm)/BSBCz (150 nm)/$MoO_3$ (10 nm)/Ag (10 nm)/Al (90 nm). The $SiO_2$ layers left on the ITO surfaces acted as insulators. Therefore, the current flow regions of the OLEDs were limited to the DFB regions where BSBCz is in direct contact with ITO. Reference OLEDs with an active area of 140×200 ☐m were also prepared with same current flow region. Current density-voltage-EQE (J-V-EQE) characteristics (DC) of the OLEDs were measured using an integrating sphere system (A10094, Hamamatsu Photonics) at room temperature. The J-V-L characteristics under pulse driving were measured using a pulse generator (NF, WF1945), an amplifier (NF, HSA4101), and a photomultiplier tube (PMT) (C9525-02, Hamamatsu Photonics). Both the PMT response and the driving square wave signal were monitored on a multi-channel oscilloscope (Agilent Technologies, MSO6104A). A rectangular pulse with a pulse width of 500 ns, pulse period of 5 ☐s, and repetition frequency of 100 Hz was applied in devices with changing peak currents.

Spectroscopy Measurements

The emitted laser light was collected normal to the device surface with an optical fiber connected to a multichannel spectrometer (PMA-50, Hamamatsu Photonics) and placed 3 cm away from the device. For the CW operation, a CW laser diode (NICHIYA, NDV7375E, maximum power of 1400 mW) was used to generate excitation light with an excitation wavelength of 405 nm. In these measurements, pulses were delivered using an acousto-optic modulator (AOM, Gooch & Housego) which was triggered with a pulse generator (WF 1974, NF Co.). The excitation light was focused on a 4.5×10$^{-5}$ cm$^2$ area of the devices through a lens and slit, and the emitted light was collected using a streak scope (C7700, Hamamatsu Photonics) with a time resolution of 100 ps that was connected with a digital camera (C9300, Hamamatsu Photonics). The emission intensity was recorded using a photomultiplier tube (PMT) (C9525-02, Hamamatsu Photonics). Both the PMT response and the driving square wave signal were monitored on a multichannel oscilloscope (Agilent Technologies, MSO6104A). The same irradiation and detection angles were used for this measurement as described earlier. All the measurements were performed in nitrogen atmosphere to prevent any degradation resulting from moisture and oxygen.

REFERENCES

1. Tessler, N., Denton, G. J. & Friend, R. H. Lasing from conjugated-polymer microcavities. *Nature* 382, 695-697 (1996).
2. Kozlov, V. G., Bulović, V., Burrows, P. E. & Forrest, S. R. Laser action in organic semiconductor waveguide and double-heterostructure devices. *Nature* 389, 362-364 (1997).
3. Hide, F. et al. Semiconducting polymers: a new class of solid-state laser materials. *Science* 273, 1833 (1996).
4. Samuel, I. D. W. & Turnbull, G. A. Organic semiconductor lasers. *Chem. Rev.* 107, 1272-1295 (2007).
5. Kuehne, A. J. C. & Gather M. C. Organic lasers: recent development on materials, device geometries and fabrication techniques. *Chem. Rev.* in press.
6. Tsiminis, G. et al. Nanoimprinted organic semiconductor lasers pumped by a light-emitting diode. *Adv. Mater.* 25, 2826-2830 (2013).
7. Baldo, M. A., Holmes, R. J. & Forrest, S. R. Prospects for electrically pumped organic lasers. *Phys. Rev. B* 66, 035321 (2002).
8. Bisri, S. Z., Takenobu, T. & Iwasa, Y. The pursuit of electrically-driven organic semiconductor lasers. *J. Mater Chem.* C 2, 2827-2836 (2014).
9. Samuel, I. D. W., Namdas, E. B. & Turnbull, G. A. How to recognize lasing. *Nature Photon.* 3, 546-549 (2009).
10. Sandanayaka, A. S. D. et al. Improvement of the quasi-continuous-wave lasing properties in organic semiconductor lasers using oxygen as triplet quencher. *Appl. Phys. Lett.* 108, 223301 (2016).
11. Zhang, Y. F. & Forrest, S. R. Existence of continuous-wave threshold for organic semiconductor lasers. *Phys. Rev. B* 84, 241301 (2011).
12. Schols, S. et al. Triplet excitation scavenging in films of conjugated polymers. *Chem. Phys. Chem.* 10, 1071-1076 (2009).
13. Hayashi, K. et al. Suppression of roll-off characteristics of organic light-emitting diodes by narrowing current injection/transport area to 50 nm. *Appl. Phys. Lett.* 106, 093301 (2015).
14. Gartner, C. et al. The influence of annihilation processes on the threshold current density of organic laser diodes. *J. Appl. Phys.* 101, 023107 (2007).
15. Sandanayaka, A. S. D. et al. Quasi-continuous-wave organic thin film distributed feedback laser. *Adv. Opt. Mater* 4, 834-839 (2016).
16. Aimono, T. et al. 100% fluorescence efficiency of 4,4'-bis[(N-carbazole)styryl]biphenyl in a solid film and the very low amplified spontaneous emission threshold. *Appl. Phys. Lett.* 86, 71110 (2005).
17. Sandanayaka, A. S. D. et al. Continuous-wave operation of organic semiconductor lasers. *Submitted.*
18. Karnutsch, C. et al. Improved organic semiconductor lasers based on a mixed-order distributed feedback resonator design. *Appl. Phys. Lett.* 90 131104 (2007).
19. Chénais, S. & Forget, S. Recent advances in solid-state organic lasers. *Polym. Int.* 61, 390-406 (2012).
20. Yokoyama, D. et al. Spectrally narrow emissions at cutoff wavelength from edges of optically and electrically pumped anisotropic organic films. *J. Appl. Phys.* 103, 123104 (2008).
21. Yamamoto, H. et al. Amplified spontaneous emission under optical pumping from an organic semiconductor laser structure equipped with transparent carrier injection electrodes. *Appl. Phys. Lett.* 84, 1401 (2004).
22. Kim, S. Y. et al. Organic light-emitting diodes with 30% external quantum efficiency based on horizontally oriented emitter. *Adv. Funct. Mater* 23, 3896-3900 (2013).
23. Uoyama, H. et al. Highly efficient organic light-emitting diodes from delayed fluorescence. *Nature* 492, 234-238 (2012).
24. Matsushima, T. & Adachi, C. Suppression of exciton annihilation at high current densities in organic light-emitting diode resulting from energy-level alignments of carrier transport layers. *Appl. Phys. Lett.* 92, 063306 (2008).
25. Kuwae, H. et al. Suppression of external quantum efficiency roll-off of nanopatterned organic light-emitting diodes at high current densities. *J. Appl. Phys.* 118, 155501 (2015).
26. Bisri, S. Z. et al. High mobility and luminescent efficiency in organic single-crystal light-emitting transistors. *Adv. Funct. Mater* 19, 1728-1735 (2009).
27. Tian, Y. et al. Spectrally narrowed edge emission from organic light-emitting diodes. *Appl. Phys. Lett.* 91, 143504 (2007).
28. El-Nadi, L. et al. Organic thin film materials producing novel blue laser. *Chem. Phys. Lett.* 286, 9-14 (1998).
29. Wang, X., Wolfe, B. & Andrews, L. Emission spectra of group 13 metal atoms and indium hybrids in solid H2 and D$_2$. *J. Phys. Chem. A* 108, 5169-5174 (2004).
30. Ribierre, J. C. et al. Amplified spontaneous emission and lasing properties of bisfluorene-cored dendrimers. *Appl. Phys. Lett.* 91, 081108 (2007).
31. Schneider, D. et al. Ultrawide tuning range in doped organic solid-state lasers. *Appl. Phys. Lett.* 85, 1886 (2004).
32. Murawski, C., Leo, K. & Gather, M. C. Efficiency roll-off in organic light-emitting diodes. *Adv. Mater* 25, 6801-6827 (2013).

Electrical Simulation of Distributed Feedback Electrically Driven Organic Laser

1. Device Model and Parameters

In this study, the charge transport in organic emitting-light diode (OLED) is described using the so called "first generation models". In this model, two-dimensional time-independent drift-diffusion model used by solving self-consistently the electron density, n, the hole density, p and the electrostatic potential $\Psi$. Poisson's equation relates the electrostatic potential $\Psi$ to the space charge density as follow:

$$\nabla(\nabla\Psi) = -\nabla F = -\frac{q}{\varepsilon_r \varepsilon_0}(p + p_t - n - n_t) \qquad (1)$$

where F is the vector electric field, q is the elementary charge, $\varepsilon_r$ are the relative permittivity of the material and $\varepsilon_0$ is the vacuum permittivity, n(p) is the electron (hole) concentration, $n_t(p_t)$ is the concentration of filled electron (hole) trap states. Assuming parabolic density of states (DOS) and Maxwell-Boltzmann statistics, the electron and hole concentrations are expressed as:

$$n = N_{LUMO} \exp\left(\frac{E_{fn} - E_{LUMO}}{k_B T}\right) \quad (2)$$

$$p = N_{HOMO} \exp\left(\frac{E_{HOMO} - E_{fp}}{k_B T}\right) \quad (3)$$

where $N_{LUMO}$ and $N_{HOMO}$ are the densities of states of the carrier in the lowest unoccupied molecular orbital (LUMO) and the highest occupied molecular orbital (HOMO), $E_{LUMO}$ and $E_{HOMO}$ are the energy levels of the LUMO and HOMO, $E_{fn}$ and $E_{fp}$ are the quasi Fermi levels for electron and hole, $k_B$ is the Boltzmann constant and T is the device temperature.

The presence of charge carrier traps in organic semiconductors is due to structural defects and/or impurities. The injected charge has first to fill these traps before establishing a current. This regime is known as Trap-limited Current (TLC).[1,2] Exponential or Gaussian distributions are used to model the trap distribution within an organic semiconductor.[3] In this work, a Gaussian distribution for the hole trap states is used:[4,5]

$$N(E) = \frac{N_{tp}}{\sqrt{2\pi}\,\sigma_{tp}} \exp\left[-\left(\frac{E_{HOMO} - E + E_{tp}}{2\sigma_{tp}}\right)^2\right] \quad (4)$$

where $N_{tp}$ is the total density of trap, $E_{tp}$ is the energy trap depth above the HOMO level and $\sigma_{tp}$ is the width of the distribution. The density of trapped hole is estimated by integrating the Gaussian density of state times the Fermi-Dirac distribution.

The charge transport is governed by drift in the electric field F and diffusion due to the charge density gradient. The steady state continuity equations for electrons and holes in the drift-diffusion approximation are given by:

$$\nabla(qn\mu_n F + D_n \nabla n) = -qR \quad (5)$$

$$\nabla(qp\mu_p F - D_p \nabla p) = qR \quad (6)$$

where $\mu_n$ ($\mu_p$) are the electron (hole) mobility, $D_n(D_p)$ is the electron (hole) diffusion constant and R is the recombination rate. The charge carrier mobilities are assumed to be field dependent and has the Pool-Frenkel form:[6,7]

$$\mu_{n,p} = \mu_{n_0,p_0} \exp\left(\frac{F}{F_{n_0,p_0}}\right) \quad (7)$$

where $\mu_{n_0}$ ($\mu_{p_0}$) is the zero-field mobility and $F_{n_0}$ ($F_{p_0}$) is the characteristic field for electron (hole). In this model the energetic disorder is not taken in to account, so we assume the validity of Einstein's relation to calculate the diffusion constant from the charge mobility. The recombination rate R is given by the Langevin model:[8]

$$R = \frac{q}{\varepsilon_r \varepsilon_0}(\mu_n + \mu_p)np \quad (8)$$

When electrons and holes recombine, they form an exciton. The resulting exciton can migrate with a characteristic diffusion constant $D_s$ before decaying radiatively or non-radiatively. The continuity equation for singlet excitons is given by:

$$\frac{dS(x,y,t)}{dt} = \quad (9)$$
$$gR + D_s \frac{\nabla^2 S(x,y,t)}{dt^2} - (k_r + k_{nr})S(x,y,t) - R_{diss}(F)S(x,y,t)$$

Where S is the exciton density. The first term is the singlet exciton generation rate from the electron-hole recombination, which is 1/4, the second term represents the exciton diffusion, the third term represent the exciton decay with the radiative decay constant $k_r$ and the non-radiative decay constant $k_{nr}$ and the last term represent the dissociation of excitons by the electric field with the field dependent dissociation rate $R_{diss}$ which is given by the Onsager-Braun model:[9,10]

$$R_{diss}(F) = \frac{3q(\mu_n + \mu_p)}{4\pi\varepsilon\varepsilon_0 r_s^3} \exp\left(\frac{-E_b}{k_B T}\right) \frac{J_1(2\sqrt{-2b(F,T)})}{\sqrt{-2b(F,T)}} \quad (10)$$

where $r_s$ is the exciton radius, $E_b = q^2/(4\pi\varepsilon\varepsilon_0 r_s)$ is the exciton binding energy, $J_1$ is the first order Bessel function and $b = q^3 F/(8\pi\varepsilon\varepsilon_0(k_B T)^2)$ is the field dependent parameter. Within this model, the impact of the electric field quenching (EFQ) depend on the exciton binding energy $E_b$.

2. Simulation Results and Comparison with Experiments 2.1. Unipolar and Bipolar Reference Device Before the simulation of the bipolar device, hole-only and electron-only devices were considered in order to test the electrical model, the simulation parameters and the charge carrier mobilities. The electron-only device consists of 190 nm BSBCz layer sandwiched between Cs(10 nm)/Al and 20 wt % Cs:BSBCz(10 nm)/ITO electrodes. The hole-only device is obtained by inserting a 10 nm $MoO_3$ layer between BSBCz (200 nm) and both ITO and Al. The bipolar OLED device comprises the following structure: ITO/20 wt % Cs:BSBCz (10 nm)/BSBCz (190 nm)/$MoO_3$(10 nm)/Al. The work function of the cathode (ITO/20 wt % Cs:BSBCz) is taken to be 2.6 eV and the one of the anode ($MoO_3$/Al) is 5.7 eV. The energy level diagrams of these devices structure are presented in FIG. 48.

The reported charge carrier mobilities for BSBCz (measured by time of flight) were used [11]. FIG. 49a shows the measured reported mobilities for electron and hole for BSBCz and the corresponding fits with Pool-Frenkel field dependent model. The values of the fitted mobility parameters are presented in the following table along with the other values of the input parameters required for the electrical simulation. The hole and electron mobilities of BSBCz are almost same order of magnitude indicating that BSBCz can transport both type of charge carriers.

TABLE

Electrical simulation parameters

| Parameters | BSBCz | Cs:BSBCz | Units |
|---|---|---|---|
| $\varepsilon_r$ | 4 | 4 | — |
| $E_{HOMO}$ | 5.8 | 5.8 | eV |

TABLE-continued

Electrical simulation parameters

| Parameters | BSBCz | Cs:BSBCz | Units |
|---|---|---|---|
| $E_{LUMO}$ | 3.1 | 2.6 | eV |
| $N_{HOMO}$ | $2 \times 10^{-19}$ | $2 \times 10^{-19}$ | $cm^{-3}$ |
| $N_{LUMO}$ | $2 \times 10^{-19}$ | $2 \times 10^{-19}$ | $cm^{-3}$ |
| $N_{tp}$ | $2.8 \times 10^{-17}$ | — | $cm^{-3}$ |
| $E_{tp}$ | 0.375 | — | eV |
| $\sigma_{tp}$ | 0.017 | — | eV |
| $\mu_{n0}$ | $6.55 \times 10^{-5}$ | $6.55 \times 10^{-5}$ | $cm^2V^{-1}s^{-1}$ |
| $\mu_{p0}$ | $1.9 \times 10^{-4}$ | $1.9 \times 10^{-4}$ | $cm^2V^{-1}s^{-1}$ |
| $F_{n0}$ | 175561 | 175561 | V/cm |
| $F_{p0}$ | 283024 | 283024 | V/cm |
| $k_r$ | $10^{+9}$ | $10^{+9}$ | $s^{-1}$ |
| $k_{nr}$ | $0.11 \times 10^{+9}$ | $0.11 \times 10^{+9}$ | $s^{-1}$ |
| $\varphi_{PL}$ | 0.9 | 0.4 | — |
| $L_s$ | $18 \times 10^{-9}$ | $18 \times 10^{-9}$ | m |

The experimental and simulated J(V) curves for unipolar and bipolar devices are presented in FIG. 49b. The experimental J below 18V is measured under direct current (DC) driving and above 18V, under pulse driving. The hole-only device current is strongly limited by traps at V<20V. The values of $N_{tp}$, $E_{tp}$ and $\sigma_{tp}$, obtained by optimization of experimental data to the simulation are given in the above table. The results show good agreement between experiments and simulation for the unipolar devices. For the bipolar device, the small deviation at low current density between measurement and simulation is due to the presence of experimental leakage current. The simulation model predicts similar current density for hole-only device and electron-only device at high voltage showing a good electron and hole transport balance. The bipolar device shows a current density higher by one order of magnitude than the unipolar current density.

2.2. Bipolar DFB Device

The use of a DFB grating resonator affects not only the optical properties of the organic laser by providing a positive optical feedback for light amplification[12-14] but also the electrical properties. The influence of the nanostructured cathode on the electrical properties of the DFB OLED is calculated and compared to the reference OLED (without grating). The structure of the DFB OLED is similar as the bipolar OLED, the difference lies in the nanostructured cathode which is composed of a periodic grating $SiO_2$—Cs:BSBCz deposited on the ITO. The grating period is 280 nm and grating depth is 60 nm as represented in FIG. 66a. In this structure, the thickness of BSBCz is 150 nm. A reference OLED (ITO/20 wt % Cs:BSBCz (60 nm)/BSBCz (150 nm)/$MoO_3$ (10 nm)/Al) is fabricated with the same thicknesses and without grating for comparison. All the parameters and conditions used for the bipolar device have been retained for the DFB and reference OLED with no additional fitting parameters.

The experimental and simulated J(V) curves for the DFB grating and reference OLED are shown in FIG. 66b. The electrical simulation predicts the J(V) curves with good agreement to the experimental results under both DC (V<18 V) and pulsed operation (V≥18 V).

In addition to J(V) curve prediction, the electrical simulation gives access to physical parameters that are difficult to determine experimentally such as the spatial distribution of the charge carrier density, the electric field and the location of the recombination zone.

First, we consider the reference OLED. FIGS. 67a-b show the charge carrier distributions and electric field profile for the reference OLED at 10 and 70 V. Free electrons are injected from the ITO/CS:BSBCz cathode into BSBCZ (at x=0 μm, and free holes from the Al/$MoO_3$ anode (x=0.215 μm). The carrier densities decrease as they leave the contacts due to the carrier recombination. The electric field increases and reach its maximum in the center when n=p. At 10 V, the electric field is screened by the high charge carrier density near the cathode and the anode. At higher voltage (70 V), the electrons penetrate deeper and the electric field still high in the vicinity of the anode.

In the case of the DFB grating OLED, the physical parameters are extracted at 70 V. FIGS. 68a-b show the spatial distribution of charge carrier density, n and p. Since the electrons are not injected uniformly due to the periodic nanostructuration of the cathode, their spatial distribution follows the periodic injection as it can be seen clearly in FIG. 68b, c. The holes are injected from the uniform anode and extend relatively uniformly in the bulk (FIG. 68a, c). When the holes reach the cathode, they decay as for the reference OLED (FIG. 67(b)). However, due to the presence of $SiO_2$ grating, the holes accumulate and show a high density at the interface $SiO_2$/BSBCz (FIG. 68a).

FIG. 69a shows the periodic profile of the electric field which is high in the insulator and slightly modulated in the BSBCz layer maintaining same strength as for the reference OLED (around $3.5 \times 10^6$V/cm). The current density profile presented in FIG. 69b is strongly modulated and shows high value in the vicinity of the $SiO_2$/Cs:BSBCz interface.

To clarify the reason of the high current density value in the vicinity of the $SiO_2$/Cs:BSBCz interface, the recombination rate profile R is represented in FIG. 70a. As we can see the R shows also a periodic variation inside the device. In the region delimited by the cathode/anode, the profile is the same as for the reference OLED while it decreases in the region delimited by the $SiO_2$/anode (see FIG. 70c). At the Cs:BSBCz/$SiO_2$ interface, the R shows the maximum value due to holes and electrons accumulations as demonstrated in FIG. 70d.

The electric field inside the device is of the order of $MV/cm^2$ as represented in the FIG. 69a. Therefore, the exciton dissociation by the electric field is not negligible and influence strongly the device performance. The singlet exciton binding energy of organic semiconductors is in the range of 0.3-1.6 eV 1518 At low electric field, the dominated deactivation processes are the radiative and non-radiative decay. At high electric field, the probability of exciton dissociation is dramatically increased and is dependent on the exciton binding energy. In order to take into account the electric field-induced exciton dissociation, the field dependent dissociation rate given by Eq.10 is included in the singlet exciton continuity, Eq.9. FIG. 71a shows the calculated exciton density S for the reference device including the EFQ with different exciton binding energies $E_b$ (0.2-0.6 eV). When, the $E_b$ decrease, the EFQ becomes a serious loss mechanism. The use of molecule with high exciton binding energy is required to overcome the EFQ. The exciton binding energy of BSBCz is estimated using PL quenching yield experiment and has a lower limit of 0.6 eV.

FIG. 71b shows the S(J) characteristics with and without electric field-induced exciton dissociation for the reference and DFB devices. Without EFQ, the S increases with J and shows a high value in the case of the DFB device of $9 \times 10^{17}$ $cm^{-3}$ against $2 \times 10^{17}$ $cm^{-3}$ for the reference device at j=3 $KA/cm^2$. This difference in S comes from the different device architecture which lead to different R distribution inside the devices as shown in FIG. 70a, b. By taking into account the EFQ model and the $E_b$=0.6 eV of the BSBCz, the S increases for both devices and until J=0.5 $KA/cm^2$ then decreases due to electric field dissociation of excitons. The EFQ in the DFB devices is slightly lower than for the reference one and can explain the experimental low EQE roll-off of the DFB device compared to the reference device presented in FIG. 47E.

In order to gain further physical insight into the reason of the enhancement of the EQE in the DFB device, the one-dimensional exciton distributions inside the reference device is presented in FIG. 72a with and without EFQ. In the case of the DFB device, the two-dimensional exciton distributions are presented in FIG. 72b, c without and with EFQ, respectively.

The comparison of the exciton density distribution (FIG. 73, right bottom) and the optical mode distribution in the device (FIG. 74, bottom) indicates that there is a large overlap between them at the 2nd grating area, contributing for the light amplification. The significant overlap surely contributes for the lower lasing threshold.

In the reference device, in the absence of EFQ, the S is uniformly distributed. In the presence of EFQ, the S is decreased in the bulk due to the high electric field which reaches 3.5 MV/cm in the bulk (see FIG. 79b). Near to the Cs:BSBCz/ITO interface, the electric field is low, which avoids the EFQ of excitons. In the case of the DFB device, the excitons are generated from two recombination sites (site 1 and site 2) as shown in FIG. 71a. The accumulation of charge near to the $SiO_2$ grating create a recombination zone with high exciton density ($S=6\times10^{17}$ $cm^{-3}$), named site 1. Site 2 has the same S as the reference device ($S=1\times10^{17}$ $cm^{-3}$). Without EFQ, the maximum S is provided by the site 1 and explain the high value in DFB device compared to reference device at low electric field (see FIG. 71b). When the EFQ is taken into account, the excitons in site 1 are quenched by the high electric field in this site (F=3.5 MV/cm) and the maximum S is provided by site 2 where the electric field is low near to the interface (F=1.2 MV/cm) and gradually increase in the bulk region as for the reference device. Hence, some excitons near to the interface can survive if they are not quenched by another mechanism (we did not include in this simulation).

REFERENCE

1. G. Malliaras, J. Salem, P. Brock, and C. Scott, "Electrical characteristics and efficiency of single-layer organic light-emitting diodes," *Phys. Rev. B*, vol. 58, no. 20, pp. R13411-R13414, 1998.
2. J. Staudigel, M. Stößel, F. Steuber, and J. Simmerer, "A quantitative numerical model of multilayer vapor-deposited organic light emitting diodes," *J. Appl. Phys.*, vol. 86, no. 7, p. 3895, 1999.
3. V. Kumar, S. C. Jain, A. K. Kapoor, J. Poortmans, and R. Mertens, "Trap density in conducting organic semiconductors determined from temperature dependence of J-V characteristics," *J. Appl. Phys.*, vol. 94, no. 2, pp. 1283-1285, 2003.
4. V. I. Arkhipov, P. Heremans, E. V. Emelianova, G. J. Adriaenssens, and H. Bassler, "Charge carrier mobility in doped disordered organic semiconductors," *J. Non. Cryst. Solids*, vol. 338-340, no. 1 SPEC. ISS., pp. 603-606, 2004.
5. H. T. Nicolai, M. M. Mandoc, and P. W. M. Blom, "Electron traps in semiconducting polymers: Exponential versus Gaussian trap distribution," *Phys. Rev. B—Condens. Matter Mater Phys.*, vol. 83, no. 19, pp. 1-5, 2011.
6. G. A. N. Connell, D. L. Camphausen, and W. Paul, "Theory of Poole-Frenkel conduction in low-mobility semiconductors," *Philos. Mag.*, vol. 26, no. 3, pp. 541-551, 1972.
7. L. Pautmeier, R. Richert, and H. Bassler, "Poole-Frenkel behavior of charge transport in organic solids with off-diagonal disorder studied by Monte Carlo simulation," *Synth. Met.*, vol. 37, no. 1-3, pp. 271-281, 1990.
8. M. POPE and C. E. SWENBERG, *Electronic Processes in Organic Crystals and Polymers*. New York: Oxford Univ. Press, 1999.
9. L. Onsager, "Initial recombination of ions," *Phys. Rev.*, vol. 54, no. 8, pp. 554-557, 1938.
10. C. L. Braun, "Electric Field Assisted Dissociation of Charge Transfer States as a Mechanism of Photocarrier Production," *J. Chem. Phys.*, vol. 80, no. 9, pp. 4157-4161, 1984.
11. Y. Setoguchi and C. Adachi, "Suppression of roll-off characteristics of electroluminescence at high current densities in organic light emitting diodes by introducing reduced carrier injection barriers," *J. Appl. Phys.*, vol. 108, no. 6, p. 64516, 2010.
12. R. F. Kazarinov and C. H. Henry, "Second-Order Distributed Feedback Lasers with Mode Selection Provided by First-Order Radiation Losses," *IEEE J. Quantum Electron.*, vol. 21, no. 2, pp. 144-150, 1985.
13. C. Karnutsch, C. Pflumm, G. Heliotis, J. C. DeMello, D. D. C. Bradley, J. Wang, T. Weimann, V. Haug, C. Gartner, and U. Lemmer, "Improved organic semiconductor lasers based on a mixed-order distributed feedback resonator design," *Appl. Phys. Lett.*, vol. 90, no. 13, pp. 2005-2008, 2007.
14. A. S. D. Sandanayaka, K. Yoshida, M. Inoue, C. Qin, K. Goushi, J.-C. Ribierre, T. Matsushima, and C. Adachi, "Quasi-Continuous-Wave Organic Thin-Film Distributed Feedback Laser," *Adv. Opt. Mater*, vol. 4, no. 6, pp. 834-839, 2016.
15. J. L. Bredas, J. Cornil, A. J. Heeger, and B. J. Briidas, "The exciton binding energy in luminescent conjugated polymers," *Adv. Mater.*, vol. 8, no. 5, p. 447—{&}, 1996.
16. C. Deibel, D. MacK, J. Gorenflot, A. Schöll, S. Krause, F. Reinert, D. Rauh, and V. Dyakonov, "Energetics of excited states in the conjugated polymer poly(3-hexylthiophene)," *Phys. Rev. B—Condens. Matter Mater Phys.*, vol. 81, no. 8, pp. 1-5, 2010.
17. P. K. Nayak, "Exciton binding energy in small organic conjugated molecule," *Synth. Met.*, vol. 174, pp. 42-45, 2013.
18. S. Kraner, R. Scholz, F. Plasser, C. Koerner, and K. Leo, "Exciton size and binding energy limitations in one-dimensional organic materials," *J. Chem. Phys.*, vol. 143, no. 24, pp. 1-8, 2015.

[6] Extremely Low Amplified Spontaneous Emission Threshold and Blue Electroluminescence from a Spin-Coated Octafluorene Neat Film Organic semiconductor lasers have been the subject of intensive studies during the last two decades, leading to great progress in terms of lasing threshold and operational device stability.[1-3] These devices are now being considered for a variety of applications including spectroscopic tools, data communication devices, medical diagnostics and chemical sensors.[1-5] However, there has been no demonstration of an electrically-driven organic laser diode yet and breakthroughs are also still required to develop a true continuous-wave optically-pumped organic semiconductor laser technology.[1-3,6-8] The challenges to realize an electrically-pumped organic laser diode are now well identified and involve (i) the additional absorption losses taking place at the lasing wavelength due to polarons and long-lived triplets, (ii) the quenching of the singlet excitons due to singlet-triplet, singlet-polaron and singlet-heat annihilation, and (iii) the stability of the organic materials in electroluminescent devices operating at high current densities. Note that approaches to reduce the triplet and polaron losses have been already proposed, which include the use of triplet quenchers and the reduction of the organic light-emitting diode (OLED) active area to spatially separate exciton formation and exciton decay regions.[9,10] While these issues need to be fully overcome and still require further studies, it is also critical in parallel to substantially reduce the threshold for amplified spontaneous emission (ASE) and lasing in organic semiconductor thin films.[3] For this purpose, the development of novel high laser gain organic materials as well as improved resonator structures that can be incorporated into electrically-pumped organic light-emitting devices are needed.

The radiative decay rate ($k_R$) is directly related to the Einstein's B coefficient as expressed by the equation: $B \propto (c/8\pi h v_0^3) k_R$, where $v_0$ is the frequency of light, h is the Planck's constant and c the velocity of light. The ASE threshold is inversely proportional to the B coefficient, implying that a large $k_R$ is generally preferred to achieve low ASE threshold.[11,12] As summarized in a recent review article about organic lasers,[3] the lowest ASE threshold reported in small-molecule-based organic thin films is 110 nJ/cm$^2$ and was obtained using a 9,9'-spirofluorene derivative.[13] Two other excellent organic semiconductor laser materials showing low ASE thresholds in thin films of around 300-400 nJ/cm$^2$ are 4,4'-bis[(N-carbazole)styryl]biphenyl (BSBCz) and a heptafluorene derivative.[12,14] While the ASE threshold generally depends on the characteristics of the light source used for the optical pumping, it is important to note that the ASE threshold values mentioned above were determined using a similar nitrogen laser for the photo-excitation. Fluorene derivatives have been found to be extremely promising for achieving low ASE threshold and some of them show a radiative decay rate higher than $1 \times 10^9$ s$^{-1}$.[13-19] Noticeably, a previous work has investigated in details the photophysical properties of terfluorene, pentafluorene and heptafluorene derivatives functionalized with hexyl side chains.[18] The results demonstrated that the radiative decay rate increased while the ASE threshold decreased when increasing the length of the oligofluorene molecules. In this context, it was important to verify if the ASE/lasing properties could be still further improved by increasing the oligomer length.

Here, we report on an octafluorene derivative showing no concentration quenching in a spin-coated neat film with a PLQY of 87% and a fluorescence lifetime of about 600 ps. The chemical structure of this molecule is displayed in FIG. 75a. The large PLQY value and the short PL lifetime of the octafluorene neat film are accompanied by an ASE threshold of around 90 nJ/cm$^2$, reaching an unprecedented level of ASE performance in an organic non-polymeric gain medium.[3] The performance of organic distributed feedback (DFB) lasers and OLEDs based on octafluorene neat films provides further evidence that this fluorene derivative is extremely promising for further works devoted to organic semiconductor lasing devices and their applications. The experimental procedures used in this work are described in the supplementary material.[19] The absorption and steady-state PL spectra of an octafluorene neat film spin-coated on a fused silica substrate are shown in FIG. 75b. The film is nearly transparent in the visible range of wavelengths and exhibits one main absorption band in the ultraviolet region with a maximum absorption peak wavelength of 375 nm. This absorption peak has been previously attributed to excitonic coupling between fluorene monomers.[18] The optical energy gap was calculated to be around 2.9 eV from the long-wavelength absorption edge. The PL spectrum and the picture shown in the inset of FIG. 75b indicate that the octafluorene neat film emits blue fluorescence. The spectrum shows a clear vibronic structure with two peaks that can be assigned to the (0,0) and (0,1) transitions and a shoulder at longer wavelengths associated to the (0,2) transition. The maximum PL peak wavelength is found to be around 423 nm. The absorption and steady-state PL spectra measured in spin-coated blends containing 10 and 20 wt. % of octafluorene dispersed into a 4,4'-bis(N-carbazolyl)-1,10-biphenyl (CBP) host are displayed in FIG. 76 (see the supplementary material). The CBP host was selected in this work because an efficient Förster-type energy transfer is known to take place from CBP to most of oligofluorene derivatives.[14] While the absorption spectra of the blends are dominated by the CBP absorption, it can be seen that their PL spectra do not markedly differ from that of the octafluorene neat film. PLQY and PL lifetime were then measured in a neat film and in CBP blends. The 10 wt. % and 20 wt. % blends show PLQY values of 88% and 87%, respectively, which are close to the value found in neat film. The neat film and the 10 wt. % and 20 wt. % blends also exhibit similar single exponential fluorescence decays with characteristic PL lifetimes of 609, 570 and 611 ps, respectively (see FIG. 77 in the supplementary material). This provides evidence that the octafluorene neat film does not show any PL concentration quenching, unlike what has been already reported in similar terfluorene, pentafluorene and heptafluorene derivatives.[18] Considering the large radiative decay rate of about $1.7 \times 10^9$ s$^{-1}$ measured in an octafluorene neat film, this oligofluorene derivative can be expected to show excellent ASE properties.[11,12] The optical constants of the octafluorene neat film were measured using variable angle spectroscopic ellipsometry and are shown in FIG. 75c (the ellipsometry data from which the optical constants are calculated can be found in FIG. 78 in the supplemental material). The small optical anisotropy of the neat film indicates that the octafluorene molecules are nearly randomly oriented, which is consistent with previously reported ellipsometry results in a heptafluorene neat film.[20]

As schematically represented in FIG. 79a, the ASE properties of the octafluorene neat films were characterized by optically-pumping the samples at 337 nm with a nitrogen laser delivering 800-ps pulses at a repetition rate of 10 Hz. The excitation beam was focused into a stripe with the dimensions 0.5 cm×0.08 cm, and the PL was collected from the edge of the organic thin film. FIG. 79b shows the PL spectra measured from the edge of a 260-nm-thick octafluorene neat film at various pumping intensities. A spectral line narrowing effect can be clearly seen at high excitation densities with the full-width-at-half-maximum (FWHM) dropping down to 5 nm, providing evidence that ASE occurs in this sample. Light amplification takes place at about 450 nm, due to spontaneously emitted photons that are waveguided in the organic film and amplified by stimulated emission.[21] The ASE threshold was then determined from the plot of the output intensity emitted from the edge of the film against the excitation intensity. The abrupt change in slope efficiency that can be seen in FIG. 79c leads to an ASE threshold of around 90 nJ/cm$^2$. It should be noted that the ASE properties were measured in octafluorene neat films with different film thicknesses in the range between 53 and 540 nm. The data shown in FIG. 79d and FIG. 80 (see the supplementary information) indicate that the ASE threshold is the lowest for the film with a thickness of 260 nm. Similar thickness dependence of the ASE threshold has been already reported in poly(9,9-dioctylfluorene) films.[22] This behavior was ascribed to the interplay between an increase of the mode confinement and a decrease of the pump-mode overlap when increasing thickness. Noticeably, the ASE threshold measured in the 260-nm-thick octafluorene neat film is lower than the lowest value ever reported in small-molecule-based organic thin films.[3] Such a good performance should also imply that the octafluorene thin films exhibit very low loss coefficient values. For this purpose, the ASE intensity was measured as a function of the distance between the edge of the octafluorene film and the pump stripe. The results shown in FIG. 81 (see the supplementary information) lead to a loss coefficient of 5.1 cm$^{-1}$, for the 260-nm-thick octafluorene neat film. Such a low value is close to that reported in poly(9,9-dioctylfluorene) thin films[23] and provides evidence of the excellent optical waveguiding properties of the octafluorene thin films. It should be highlighted that, unlike most polyfluorene systems, the octafluorene as well as most of the fluorene-based small molecules[24-26] do not show any significant deterioration of their photophysical properties under intense light irradiation in air, due to the formation of fluorenone. In addition, the results displayed in FIG. 82 (see the supplementary information) demonstrate that the octafluorene neat film exhibits an excellent photostability at high pumping intensities above the ASE threshold in both ambient and nitrogen atmospheres. This might be related to the high radiative decay rate of the film, which presumably leads to a reduction of the photo-bleaching of the material under high intensity irradiation. Compared to the ASE thresholds measured in shorter oligofluorenes,[14,18] the results suggest that increasing the oligomer length leads to an improvement of the ASE performances. However, it should be noted that preliminary experiments carried out in decafluorene films show higher ASE thresholds than those obtained in octafluorene films, indicating that the octafluorene derivative is certainly, in this series of oligomers, the most promising candidate for organic semiconductor lasers.

We then designed and fabricated a mixed-order DFB grating structure composed of second-order Bragg scattering regions surrounded by first-order scattering regions.[17] Such a grating architecture was selected to obtain low lasing threshold together with a lasing emission in the direction normal to the substrate. In DFB lasers, laser emission takes place near the Bragg wavelength ($\lambda_{Bragg}$) defined as: $m\lambda_{Bragg}=2n_{eff}\Lambda$, where $n_{eff}$ is the effective refractive index of the laser gain medium, m is the Bragg order and $\Lambda$ is the grating period.[1-3] Using the refractive index of an octafluorene neat film determined by ellipsometry (FIG. 75c) and the ASE wavelength measured in this study, the grating periods for m=1,2 were chosen to be 260 and 130 nm, respectively. FIGS. 83a and 83b show a schematic representation and a scanning electron microscope (SEM) image of such a DFB SiO$_2$ grating, which was fabricated using electron beam lithography and reactive ion etching techniques. Note that the depth of the DFB gratings is around 70 nm. To complete the laser device, a 260-nm-thick octafluorene neat film was spin-coated on top of the DFB structure. FIG. 83c shows the emission spectra detected normal to the substrate plane at several excitation densities below and above the lasing threshold. Below threshold, Bragg dips attributed to the optical stopband of the DFB grating can be observed. Above the lasing threshold, a sharp laser emission peak is clearly seen at the lasing wavelength of about 452 nm. The output emission intensity and the FWHM of this DFB laser are plotted as a function of the excitation intensity in FIG. 81d. The FWHM of the laser emission peak is found to be lower than 0.3 nm at high excitation densities. In parallel, the lasing threshold determined from the changes in slope of the output intensity curve is found to be around 84 nJ/cm$^2$, which is slightly lower than the ASE threshold reported earlier. Overall, the extremely low ASE and lasing thresholds measured in this work together with the excellent photostability of the films under high photo-excitation intensity demonstrate that this octafluorene derivative is a very promising gain medium material for organic semiconductor laser applications.

To fully evaluate the potential of this octafluorene derivative for organic laser diodes, it is also crucial to investigate the electroluminescence (EL) properties of this compound in neat films and in CBP blends using a standard OLED structure. A schematic representation of the OLED fabricated in this study is provided in FIG. 82a. The architecture of the devices is as follows: indium tin oxide (ITO) (100 nm)/poly(3,4-ethylenedioxythiophene):poly(styrene-sulfonate) (PEDOT:PSS) (45 nm)/EML (~40 nm)/2,8-bis (diphenylphosphoryl)dibenzo[b,d]thiophene (PPT) (10 nm)/ 2,2',2''-(1,3,5-benzinetriyl)-tris(1-phenyl-1-H-benzimidazole) (TPBi) (55 nm)/LiF (1 nm)/Al (100 nm), where the emitting layer (EML) corresponds either to an octafluorene neat film or an octafluorene:CBP blend. In these devices, PEDOT:PSS plays the role of a hole injection layer while PPT and TPBi are used as hole blocking and electron transport layers, respectively. The highest occupied molecular orbital (HOMO) and lowest unoccupied molecular orbital (LUMO) energy values of PEDOT:PSS, PPT and TPBi in FIG. 84a are taken from the literature.[20] The ionization potential of the octafluorene neat film was measured to be 5.9 eV by photoelectron spectroscopy in air (see FIG. 85 in the supplementary material). Using the optical bandgap value of 2.9 eV determined from the absorption spectrum of the neat film, the electron affinity of the octafluorene can be approximated to be around 3 eV. As shown in FIG. 86a (see the supplementary information), the EL spectra measured at 10 mA/cm$^2$ in these OLEDs are similar to the PL spectra measured in the octafluorene neat film and in the CBP blends, indicating that the blue EL emitted from these devices comes only from the octafluorene chromophores. The current-density-voltage-luminance (J-V-L) curves of the devices are displayed in FIG. 86b (see the supplementary information). The OLEDs based on a neat octafluorene film, 10 wt. % CBP blend and 20 wt. % CBP blend exhibit driving voltages of 5.0, 4.9 and 4.5 V, respectively, at 1 cd/m$^2$. The highest luminance values obtained in these OLEDs were 4580 cd/m$^2$ (at 12.6 V) for the neat film, 8520 cd/m2 (at 10.4 V) for the 20 wt. % blend and 8370 cd/m$^2$ (at 11.2 V) for the 10 wt. % blend. The external quantum efficiencies ($\eta_{ext}$) of the devices are plotted as a function of the current density in FIG. 84b. Their maximum values were found to be 3.9% for the neat film, 4.3% for the 20 wt. % blend and 4.4% for the 10 wt. % blend. The differences in efficiency cannot be explained by the PLQY values of the three films, which are nearly identical. In fact, a recent study devoted to the molecular orientation of oligofluorene molecules in spin-coated thin films demonstrated that, while the octafluorene molecules are randomly oriented in neat films, the 20 wt. % and 10 wt. % octafluorene:CBP blends show a relatively good horizontal orientation of the octafluorene molecules.[26] Such horizontal molecular orientation of the emitting dipoles should lead to an improvement of the light outcoupling efficiency and thus can explain the slightly higher $\eta_{ext}$ values measured in OLEDs based on the CBP blends.[20,26] In the context of organic laser diodes, the maximum next values obtained in these OLEDs are evidently promising. However, much higher current densities should be injected into the devices and the efficiency roll-off occurring at current densities higher than 100 mA/cm² would need to be suppressed in further work via an improvement of the device architecture before seriously considering this octafluorene derivative as a candidate for electrically-driven organic lasing devices. In summary, this study demonstrates an unprecedentedly low ASE threshold of 90 nJ/cm² in a non-polymeric organic thin film. This achievement was realized using an octafluorene derivative that shows a PLQY of 87% and a large radiative decay rate of $1.7 \times 10^9$ s$^{-1}$ in spin-coated neat film. This blue light-emitting material was then used in low threshold organic semiconductor DFB lasers and in fluorescent OLEDs with an external quantum efficiency as high as 4.4% and a maximum brightness value approaching 10,000 cd/m². Overall, this study provides evidence that this octafluorene derivative is an excellent organic material for organic semiconductor lasers.

See supplementary material at [URL will be inserted by AIP] for all of the experimental procedures used in this study, absorption and fluorescence spectra of the CBP blends, ellipsometry data, additional ASE characterization results and the determination of the HOMO and LUMO in octafluorene film.

REFERENCES

1. I. D. W. Samuel and G. A. Turnbull, Chem. Rev. 107, 1272 (2007).
2. S. Chénais and S. Forget, Polym. Int. 61, 390 (2012).
3. A. J. C. Kuehne and M. C. Gather, Chem. Rev. in press, DOI: 10.1021/acs.chemrev.6b00172.
4. Y. Wang, P. O. Morawska, A. L. Kanibolotsky, P. J. Skabara, G. A. Turnbull and I. D. W. Samuel, Laser & Photon. Rev. 7, L71-L76 (2013).
5. A. Rose, Z. G. Zhu, C. F. Madigan, T. M. Swager and V. Bulovic, Nature 434, 876 (2005).
6. I. D. W. Samuel, E. B. Namdas and G. A. Turnbull, Nature Photon. 3, 546 (2009).
7. S. Z. Bisri, T. Takenobu and Y. Iwasa, J. Mater. Chem. C 2, 2827 (2014).
8. A. S. D. Sandanayaka, T. Matsushima, K. Yoshida, M. Inoue, T. Fujihara, K. Goushi, J. C. Ribierre and C. Adachi, Adv. Opt. Mater. 4, 834 (2016).
9. A. S. D. Sandanayaka, L. Zhao, D. Pitrat, J. C. Mulatier, T. Matsushima, J. H. Kim, J. C. Ribierre and C. Adachi, Appl. Phys. Lett. 108, 223301 (2016).
10. K. Hayashi, H. Nakanotani, M. Inoue, K. Yoshida, O. Mikhnenko, T. Q. Nguyen and C. Adachi, Appl. Phys. Lett. 106, 093301 (2015).
11. F.-H. Kan and F. Gan, *Laser Materials* (World Scientific, Singapore, 1995).
12. T. Aimono, Y. Kawamura, K. Goushi, H. Yamamoto, H. Sasabe and C. Adachi, Appl. Phys. Lett. 86, 071110 (2005).
13. H. Nakanotani, S. Akiyama, D. Ohnishi, M. Moriwake, M. Yahiro, T. Yoshihara, S. Tobita and C. Adachi, Adv. Funct. Mater. 17, 2328 (2007).
14. L. Zhao, M. Inoue, K. Yoshida, A. S. D. Sandanayaka, J. H. Kim, J. C. Ribierre and C. Adachi, IEEE J. Sel. Top. Quant. Electron. 22, 1300209 (2016).
15. J. C. Ribierre, G. Tsiminis, S. Richardson, G. A. Turnbull, I. D. W. Samuel, H. S. Barcena and P. L. Burn, Appl. Phys. Lett. 91, 081108 (2007).
16. T. W. Lee, O. O. Park, D. H. Choi, H. N. Cho and Y. C. Kim, Appl. Phys. Lett. 81, 424 (2002).
17. C. Karnutsch, C. Pflumm, G. Heliotis, J. C. DeMello, D. D. C. Bradley, J. Wang, T. Weimann, V. Haug, C. Gartner and U. Lemmer, Appl. Phys. Lett. 90, 131104 (2007).
18. E. Y. Choi, L. Mazur, L. Mager, M. Gwon, D. Pitrat, J. C. Mulatier, C. Monnereau, A. Fort, A. J. Attias, K. Dorkenoo, J. E. Kwon, Y. Xiao, K. Matczyszyn, M. Samoc, D.-W. Kim, A. Nakao, B. Heinrich, D. Hashizume, M. Uchiyama, S. Y. Park, F. Mathevet, T. Aoyama, C. Andraud, J. W. Wu, A. Barsella and J. C. Ribierre, Phys. Chem. Chem. Phys. 16, 16941 (2014).
19. J.-H. Kim, M. Inoue, L. Zhao, T. Komino, S. Seo, J. C. Ribierre and C. Adachi, Appl. Phys. Lett. 106, 053302 (2015).
20. L. Zhao, T. Komino, M. Inoue, J. H. Kim, J. C. Ribierre and C. Adachi, Appl. Phys. Lett. 106, 063301 (2015).
21. M. D. McGehee and A. J. Heeger, Adv. Mater. 12, 1655 (2000).
22. M. Anni, A. Perulli and G. Monti, J. Appl. Phys. 111, 093109 (2012).
23. G. Heliotis, D. D. C. Bradley, G. A. Turnbull, and I. D. W. Samuel, Appl. Phys. Lett. 81, 415 (2002); J. C. Ribierre, A. Ruseckas, I. D. W. Samuel, H. S. Barcena and P. L. Burn, J. Chem. Phys. 128, 204703 (2008).
24. J. C. Ribierre, L. Zhao, M. Inoue, P. O. Schwartz, J. H. Kim, K. Yoshida, A. S. D. Sandayanaka, H. Nakanotani, L. Mager, S. Mery and C. Adachi, Chem. Comm. 52, 3103 (2016).
25. J. C. Ribierre, A. Ruseckas, O. Gaudin, I. D. W. Samuel, H. S. Barcena, S. V. Staton and P. L. Burn, Org. Electron. 10, 803 (2009).
26. L. Zhao, T. Komino, D. H. Kim, M. H. Sazzad, D. Pitrat, J. C. Mulatier, C. Andraud, J. C. Ribierre and C. Adachi, J. Mater. Chem. C 4, 11557 (2016).

Experimental Procedures

Photophysical and ASE Measurements

The octafluorene derivative was synthesized following a method previously published in the literature.[1] Fused silica substrates were cleaned with ultrasonication in detergent, pure water, acetone and isopropanol, followed by an ultraviolet-ozone treatment. Octafluorene neat films and CBP: octafluorene blend films were deposited on the fused silica susbtrates by spin-coating from a chloroform solution in a nitrogen-filled glove box. Note that the concentration of the solution and the spin-speed were varied to control the thickness of the octafluorene neat films. Absorption and steady-state emission spectra were measured using an UV-vis spectrophotometer (Perkin-Elmer Lambda 950-PKA) and a spectrofluorometer (Jasco FP-6500), respectively. The PLQY in films were measured using a xenon lamp with an excitation wavelength of 340 nm and an integrating sphere (C11347-11 Quantaurus QY, Hamamatsu Photonics). The PL decays were measured using a streak camera and a Ti-sapphire laser system (Millenia Prime, Spectra Physics) delivering optical pulses with a width of 10 ps and a wavelength of 365 nm.

Variable angle spectroscopic ellipsometry (VASE) (J.A. Wollam, M-2000U) measurements were carried out at different angles from 45° to 75° by steps of 5° in a 75 nm thick octafluorene neat film. The ellipsometry data were then analyzed using an analytical software (J.A. Woollam, WVASE32) to determine the anisotropic extinction coefficients and refractive indices of the films.

For the characterization of the ASE properties, the samples were optically pumped by a pulsed nitrogen laser (KEN2020, Usho) emitting at 337 nm. This laser delivers pulses with a pulse duration of 800 ps at a repetition rate of 10 Hz. The pump beam intensity was varied using a set of neutral density filters. The pump beam was focused into a 0.5 cm×0.08 cm stripe. The emission spectra from the edge of the organic thin films were collected using an optical fiber connected to a charge coupled device spectrometer (PMA-11, Hamamatsu Photonics).

Fabrication and Characterization of the Organic DFB Lasers

Silicon substrates with a thermally grown 1-□m-thick $SiO_2$ layer were cleaned following the same cleaning procedure as above. Hexamethyldisilazane (HMDS) was then spin-coated on top of the $SiO_2$ surfaces and the samples were annealed at 120° C. for 2 minutes. After that, a 70-nm-thick resist layer was spin-coated on the substrates from a ZEP520A-7 solution (ZEON Co.) and annealed at 180° C. for 4 minutes. Electron beam lithography was then used to pattern the DFB gratings on the resist layer using a JBX-5500SC system (JEOL). Following the electron beam irradiation, the patterns were developed in a developer solution (ZED-N50, ZEON Co.). In the following step, the patterned resist layer plays the role of etching mask. The substrates were plasma-etched with $CHF_3$ using an EIS-200ERT etching system (ELIONIX). Finally, the substrates were plasma-etched with $O_2$ using a FA-1EA etching system (SAMCO) to fully remove the resist layer. A SEM (SU8000, Hitachi) was used to check the quality of the DFB gratings. The 260-nm-thick octafluorene neat film was finally spin-coated from chloroform solution on top of the DFB gratings in order to complete the organic laser devices.

For the laser operation, pulsed excitation light from a nitrogen-gas laser (SRS, NL-100) was focused on a $6\times10^{-3}$ $cm^2$ area of the devices through a lens and slit. The excitation wavelength was 337 nm, the pulse width was 3.5 ns, and the repetition rate was 20 Hz. The excitation light was incident upon the devices at around 20° with respect to the normal to the device plane. The emitted light was collected normal to the device surface with an optical fiber, which was placed 6 cm away from the device, connected to a multichannel spectrometer (PMA-50, Hamamatsu Photonics). Excitation intensities were controlled using a set of neutral density filters.

Fabrication and Characterization of the OLEDs

The OLEDs were fabricated by depositing the organic layers and the cathodes on precleaned ITO glass substrates. The structure of the OLEDs fabricated in this study is the following: ITO (100 nm)/PEDOT:PSS (45 nm)/EML (~40 nm)/PPT (10 nm)/TPBi (55 nm)/LiF (1 nm)/Al (100 nm), where the emitting layer (EML) corresponds either to an octafluorene neat film or an octafluorene:CBP blend. The PEDOT:PSS layer was spin-coated on ITO and annealed at 130° C. for 30 minutes. The octafluorene neat and blend films were spin-coated from chloroform solutions on top of the PEDOT:PSS layer in a glove box environment. The thickness of the EML layer was typically around 40 nm. Then, the 10-nm-thick PPT layer and the 40-nm-thick TPBi layer were deposited by thermal evaporation. Finally, the cathode made of a thin LiF layer and a 100-nm-thick Al layer was prepared by thermal evaporation through a shadow mask. The active area of the devices was 4 $mm^2$. Before characterization, the devices were encapsulated in nitrogen atmosphere to prevent any degradation effects related to oxygen and moisture.

The current-density-voltage-luminance (J-V-L) characteristics under direct current driving were measured using a source meter (Keithley 2400, Keithley Instruments Inc.) and an absolute external quantum efficiency measurement system (C9920-12, Hamamatsu Photonics). The EL spectra were measured using an optical fiber connected to a spectrometer (PMA-12, Hamamatsu Photonics).

REFERENCE

1. R. Anemian, J. C. Mulatier, C. Andraud, O. Stephan, J. C. Vial, Chem. Comm. 1608 (2002).

[7] CW Amplified Spontaneous Emission (ASE) Experiments

CW amplified spontaneous emission (ASE) experiments were carried out in bisfluorene-cored dendrimer and octafluorene spin-coated neat films. The films were deposited onto pre-cleaned planar fused silica substrates and were not encapsulated. Film thicknesses were around 250 nm.

To study the CW ASE properties, the films were optically pumped at 355 nm with a CW laser diode. Pulses with different widths were delivered using an acousto-optic modulator (AOM, Gooch & Housego) which was triggered with a pulse generator (WF 1974, NF Co.). The emitted light was collected from the edge of the films using a streak scope (C7700, Hamamatsu Photonics) with a time resolution of 100 ps that was connected with a digital camera (C9300, Hamamatsu Photonics). The emission intensity was recorded using a photomultiplier tube (PMT) (C9525-02, Hamamatsu Photonics). Both the PMT response and the driving square wave signal were monitored on a multichannel oscilloscope (Agilent Technologies, MSO6104A).

In both materials, the streak camera images and the emission spectra at various pumping intensities show a clear line narrowing effect above a threshold, which is due to stimulated emission and can be assigned to ASE. The ASE thresholds were measured from the output intensity versus excitation intensity curves for different pulse widths. The results show that the ASE thresholds remain nearly unchanged for pulse widths varying from 100 □s to 5 ms. In addition, it can be noted that these ASE threshold values are consistent with those measured in these materials using a pulsed nitrogen laser (pulse width of 800 ps and repetition rate of 10 Hz). The possibility to achieve CW lasing in both octafluorene and bisfluorene-cored dendrimer implies negligible triplet losses. This is consistent with the fact that both materials exhibit a very high photoluminescence quantum yield (PLQY) (PLQY of 92% in bisfluorene-cored dendrimer and PLQY of 82% in octafluorene neat film). In addition, transient absorption measurements were carried out in octafluorene and bisfluorene-cored dendrimer solutions to examine the triplet-triplet absorption spectra. It can be seen that there is no overlap between the ASE and the triplet absorption spectra, which provide clear evidence that triplet absorption does not play any detrimental role for CW lasing in both materials.

[8] A Current-Injection Organic Semiconductor Laser Diode

Summary

Present laser diodes are primarily based on inorganic semiconductors, but organics can also be excellent gain media with unique fabrication routes. However, electrically driven organic semiconductor laser diodes have not yet been realized despite advances in optically pumped organic semiconductor lasers. Here, we report the first demonstration of organic semiconductor laser diodes. The devices incorporate a mixed-order distributed feedback $SiO_2$ grating in an organic light-emitting diode structure and emit blue lasing. These results prove that lasing by direct injection of current into an organic thin film can be achieved through selection of a high-gain organic semiconductor showing no triplet and polaron absorption losses at the lasing wavelength and design of a proper feedback structure to suppress losses at high current densities. This represents the first step toward simple organic-based laser diodes that can cover the visible and near infrared spectra and a major advance toward future organic optoelectronic integrated circuits.

DETAILED DESCRIPTION

The properties of optically pumped organic semiconductor lasers (OSLs) have dramatically improved in the last two decades as a result of major advances in both the development of high-gain organic semiconductor materials and the design of high-quality-factor resonator structures[1-5]. The advantages of organic semiconductors as gain media for lasers include their high photoluminescence (PL) quantum yields, large stimulated emission cross sections, and broad emission spectra across the visible region along with their chemical tunability and ease of processing. Owing to recent advances in low-threshold distributed feedback (DFB) OSLs, optical pumping by electrically driven nanosecond-pulsed inorganic light-emitting diodes was demonstrated, providing a route toward a new compact and low-cost visible laser technology[6]. This type of miniaturized organic laser is particularly promising for lab-on-chip applications. However, the ultimate goal is electrically driven organic semiconductor laser diodes (OSLDs). In addition to enabling the full integration of organic photonic and optoelectronic circuits, the realization of OSLDs will open novel applications in high-performance displays, medical sensing, and bio-compatible devices.

The problems that have prevented the realization of lasing by the direct electrical pumping of organic semiconductors are mainly due to the optical losses from the electrical contacts and the triplet and polaron losses taking place at high current densities[4,5,7-9]. Approaches that have been proposed to solve these fundamental loss issues include the use of triplet quenchers[10-12] to suppress triplet absorption losses and singlet quenching by singlet-triplet exciton annihilation as well as the reduction of the device active area[13] to spatially separate where exciton formation and exciton radiative decay occur and minimize the polaron quenching processes. However, even with the advances that have been made in organic light-emitting diodes (OLEDs) and optically pumped organic semiconducting DFB lasers[5], a current-injection OSLD has still not been conclusively demonstrated.

Previous studies have suggested that current densities over a few kA/cm$^2$ would be required to achieve lasing from an OSLD if additional losses associated with the electrical pumping were completely suppressed[14]. One of the most promising molecules for the realization of an OSLD is 4,4'-bis[(N-carbazole)styryl]biphenyl (BSBCz) (chemical structure in FIG. 89a)[15] because of its excellent combination of optical and electrical properties such as a low amplified spontaneous emission (ASE) threshold in thin films (0.30 μJ cm$^{-2}$ under 800-ps pulse photoexcitation)[16] and the ability to withstand the injection of current densities as high as 2.8 kA cm$^{-2}$ under 5-μμs pulse operation in OLEDs with maximum electroluminescence (EL) external quantum efficiencies ($\eta_{EQE}$) of over 2%[13]. Furthermore, lasing at a high repetition rate of 80 MHz and under long pulse photoexcitation of 30 ms were recently demonstrated in optically pumped BSBCz-based DFB lasers[17] and were largely possible because of the extremely small triplet absorption losses at the lasing wavelength of BSBCz films. Here, we undoubtedly demonstrate the first examples of lasing from an organic semiconductor film directly excited by electricity through the development and complete characterization of OSLDs based on a BSBCz thin film in an inverted OLED structure with a mixed-order DFB SiO$_2$ grating integrated into the active area of the device.

The architecture and fabrication of the OSLDs developed in this study are schematically represented in FIG. 89a and in FIG. 90 (see the Materials and Methods for a detailed description of the experimental procedures). A sputtered layer of SiO$_2$ on indium tin oxide (ITO) glass substrates was engraved with electron beam lithography and reactive ion etching to create mixed DFB gratings with an area of 30×90 μm (FIG. 89b), and organic layers and a metallic cathode were vacuum deposited on the substrates to complete the devices. We designed the mixed-order DFB gratings to have first- and second-order Bragg scattering regions that provide strong optical feedback and efficient vertical outcoupling of the laser emission, respectively[17-18]. Grating periods ($\Lambda_1$ and $\Lambda_2$) of 140 and 280 nm were chosen for the first- and second-order regions, respectively, based on the Bragg condition[4,19], $m\lambda_{Bragg}=2n_{eff}\Lambda_m$, where m is the order of diffraction, $\lambda_{Bragg}$ is the Bragg wavelength, which was set to the reported maximum gain wavelength (477 nm) for BSBCz, and $n_{eff}$ is the effective refractive index of the gain medium, which was calculated to be 1.70 for BSBCz[20,21]. The lengths of the individual first- and second-order DFB grating regions were 1.12 and 1.68 μm, respectively, in the first set of devices characterized, hereafter referred to as OSLDs.

The scanning electron microscopy (SEM) images in FIGS. 89c and d confirm that the fabricated DFB gratings had periods of 140±5 and 280±5 nm with a grating depth of about 65±5 nm. Complete removal of the SiO$_2$ layer in the etched areas to expose the ITO is important for making good electrical contact with the organic layer and was verified with energy dispersive X-ray spectroscopy (EDX) analysis (FIGS. 90c, d). Cross-sectional SEM and EDX images of a complete OSLD are shown in FIGS. 89d and e. The surface morphologies of all layers present a grating structure with a surface modulation depth of 50-60 nm. Although the interaction of the resonating laser mode with the electrodes is expected to reduce the quality-factor of the feedback structure, such a grating structure on the metal electrode should also reduce the absorption losses of a mode guided within the device structure[22,23].

The OSLDs fabricated in this work have a simple inverted OLED structure of ITO (100 nm)/20 wt. % Cs:BSBCz (60 nm)/BSBCz (150 nm)/MoO$_3$ (10 nm)/Ag (10 nm)/Al (90 nm) with the energy levels as shown in FIG. 91a. Doping the BSBCz film with Cs in the region close to the ITO contact improves the electron injection into the organic layer, and MoO$_3$ is used as a hole injection layer (FIG. 92). While the most efficient OLEDs generally use multilayer architectures to optimize charge balance[24,25], charges can accumulate at organic hetero-interfaces at high current densities, which can be detrimental for device performance and stability[26]. The OSLDs fabricated in this work contained only BSBCz as the organic semiconductor layer and were specifically designed to minimize the number of organic hetero-interfaces. Reference devices without an SiO$_2$ DFB grating, hereafter referred to as OLEDs, were also fabricated to investigate the influence of the gratings on the EL properties.

FIG. 91b shows optical microscope images of an OSLD and a reference OLED under direct current (DC) operation at 3.0 V. In addition to the previously described DFB grating, five other DFB grating geometries (Table 1) were optimized and characterized in OSLDs. While the EL is emitted homogeneously from the active area of the reference OLEDs, more intense emission can be seen from the second-order DFB grating regions, which were specifically designed to promote vertical light outcoupling, in the OSLDs (FIG. 91b and FIG. 93). The current density-voltage (J-V) and/ EQE-J characteristics in an OSLD and OLED under pulsed conditions (voltage pulse width of 400 ns and repetition rate of 1 kHz) at ambient temperatures are shown in FIGS. 91c and d, and the characteristics obtained under DC conditions are displayed in FIG. 94. The active area used to calculate the current density of the OSLDs was estimated from SEM and laser microscope images.

The maximum current densities before device breakdown of the reference OLEDs increased from 6.6 A cm$^{-2}$ under DC operation to 5.7 kA cm$^{-2}$ under pulse operation because of reduced Joule heating with pulse operation[13,27]. Under DC operation, all of the devices exhibited maximum $\eta_{EQE}$ higher than 2% at low current densities and strong efficiency rolloff at current densities higher than 1 A cm$^{-2}$, which is presumably due to thermal degradation of the devices. On the other hand, efficiency rolloff in the OLEDs under pulse operation (FIGS. 91c, d) began at current densities higher than 110 A cm$^{-2}$, consistent with a previous report[13]. Efficiency rolloff was further suppressed in the OSLDs under pulse operation, and the EQE was even found to substantially increase above 200 A cm$^{-2}$ to reach a maximum value of 2.9%. The rapid decrease in EQE above a current density of 2.2 kA cm$^{-2}$ is likely due to thermal degradation of the device.

While the EL spectra of the OLEDs are similar to the steady-state PL spectrum of a neat BSBCz film (FIG. 94c) and did not change as a function of the current density, the EL spectra from the glass face of the OSLDs under pulse operation exhibited spectral line narrowing with increasing current density (FIG. 95a). A Bragg dip corresponding to the stopband of the DFB grating was observed at 478.0 nm for current densities below 650 A cm$^{-2}$ (FIG. 95b). As the current density increased above this value, strong spectral line narrowing occurs at 480.3 nm, suggesting the onset of lasing. The intensity of the narrow emission peak was found to increase faster than that of the EL emission background, which could be attributed to the non-linearity associated with stimulated emission.

The output intensity and full-width-at-half-maximum (FWHM) of an OSLD are plotted in FIG. 95c as a function of the current. While the FWHM of the steady-state PL spectrum of a neat BSBCz film is around 35 nm, the FWHM of the OSLD at high current densities decreases to values lower than 0.2 nm, which is close to the spectral resolution limit of our spectrometer (0.17 nm for a wavelength range of 57 nm). The slope efficiency of the output intensity abruptly changes with increasing current and can be used to determine a threshold of 600 A cm$^{-2}$ (8.1 mA). Above 4.0 kA cm$^{-2}$, the output intensity decreases with increasing current, presumably because of a strong increase of temperature leading to the onset of device breakdown, but the emission spectrum remains extremely sharp. This increase and subsequent decrease is consistent with the r/EQE-J curve. The maximum output power measured with a power meter placed in front of an OSLD at a distance of 3 cm away from the ITO glass substrate (FIG. 95d) was 0.50 mW at 3.3 kA cm$^{-2}$. These observed EL properties strongly suggest that light amplification occurs at high current densities and that electrically driven lasing is achieved above a current density threshold. Beam polarization and shape were characterized to provide further evidence that this is lasing[9]. The output beam of an OSLD is strongly linearly polarized along the grating pattern (FIG. 96a), which is expected for laser emission from a one-dimensional DFB. Spatial profiles of OSLD emission measured at different current densities above the lasing threshold (FIG. 96b) show the existence of well-defined Gaussian beams. Also, the appearance of speckles patterns, which should be present if this is lasing, provide initial evidence of spatial coherence.

Before we can claim lasing, several phenomena that have been misinterpreted as lasing in the past must be ruled out as the cause of the observed behavior[9]. The emission from our OSLDs is detected in the direction normal to the substrate plane and shows a clear threshold behavior, so line narrowing arising from edge emission of waveguided modes without laser amplification can be dismissed[20,28,29]. ASE can appear similar to lasing, but the FWHM in our OSLDs (<0.2 nm) is much narrower than the typical ASE linewidth of an organic thin film (a few nanometers) and is consistent with the typical FWHM of an optically pumped organic DFB lasers (<1 nm)[5]. A very narrow emission spectrum obtained by inadvertently exciting a transition in ITO has also been mistaken for emission from an organic layer[30]. However, the emission peak wavelength of the OSLD in FIG. 95a is 480.3 nm and cannot be attributed to emission from ITO, which has atomic spectral lines at 410.3, 451.3, and 468.5 nm.[31]

If this truly is lasing from a DFB structure, then the emission of the OSLD should be characteristic of the resonator modes and the output should be very sensitive to any modifications of the laser cavity. Thus, OSLDs with different DFB geometries, labeled OSLD-1 through OSLD-5 (Table 1), were fabricated and characterized (FIG. 93) to confirm that the emission wavelength could be predictably tuned, which is common in optically pumped organic DFB lasers[4,5,32,33]. The lasing peaks are nearly the same for OSLD, OSLD-1, OSLD-2, and OSLD-3 (480.3 nm, 479.6 nm, 480.5 nm, and 478.5 nm, respectively), which have the same DFB grating periods. Furthermore, OSLD-1, OSLD-2, and OSLD-3 all had low minimum FWHM (0.20 nm, 0.20 nm, and 0.21 nm, respectively) and clear thresholds (1.2 kA cm$^{-2}$, 0.8 kA cm$^{-2}$, and 1.1 kA cm$^{-2}$, respectively). On the other hand, OSLD-4 and OSLD-5, which have different DFB grating periods, exhibited lasing peaks at 459.0 nm with a FWHM of 0.25 nm and a threshold of 1.2 kA cm$^{-2}$ (OSLD-4) and 501.7 nm with a FWHM of 0.38 nm and a threshold of 1.4 kA cm$^{-2}$ (OSLD-5). These results clearly demonstrate that the lasing wavelength is being controlled by the DFB geometry.

To verify that the lasing threshold of the electrically driven OSLD is consistent with that obtained by optical pumping, the lasing characteristics of an OSLD (OLSD-6) optically pumped through the ITO side using a $N_2$ laser (excitation wavelength of 337 nm) delivering 3.0-ns pulses were measured (FIG. 97). The lasing peak of OLSD-6 under optical pumping (481 nm) is consistent with that of the OSLDs under electrical pumping (480.3 nm). The lasing threshold under optical pumping was measured to be around 430 W cm$^{-2}$. Though this value is higher than the value of 30 W cm$^{-2}$ obtained in optically pumped BSBCz-based DFB lasers without the two electrodes[17], the thicknesses of the layers in the present OSLD were optimized to minimize the optical losses arising from the presence of the electrodes. Assuming no additional loss mechanisms in OSLD-6 at high current densities, a lasing threshold of 1.1 kA cm$^{-2}$ under electrical pumping can be estimated from the threshold under optical pumping. This value reasonably agrees with the thresholds (0.6-0.8 kA cm$^{-2}$) measured in smaller devices with the same grating periods (OSLD and OSLD-2) under electrical pumping.

These results suggest that the additional losses (including exciton annihilation, triplet and polaron absorption, quenching by the high electric field, and Joule heating) generally taking place in OLEDs at high current densities[34] have been nearly suppressed in the BSBCz OSLDs. This is fully consistent with the fact that EL efficiency rolloff was not observed in the OSLDs under intense pulse electrical excitation. The suppression of losses can be explained based on the properties of BSBCz and the devices. As previously mentioned, BSBCz films do not show significant triplet losses[35], and a decrease of the device active area leads to a reduction of Joule-heat-assisted exciton quenching[36]. Furthermore, the overlap between the polaron absorption and emission spectrum is negligible for both radical cations and radical anions in BSBCz based on the measurement of composite films of BSBCz:MoO$_3$ and BSBCz:Cs, respectively (FIG. 98).

Electrical and optical simulations of the devices were performed to further confirm that current-injection lasing is occurring in the OSLDs (FIG. 99). Using carrier mobilities extracted from the fitting of experimental data for unipolar devices (FIGS. 99a, b), simulated J-V curves for devices with and without a grating agreed well with the experimental characteristics (FIGS. 99a, c, d), indicating sufficient etching for good electrical contact with ITO in the device with a grating. The recombination rate profile (FIGS. 99e, f) shows a periodic variation inside the device because of periodic injection of electrons from the ITO electrode through the insulating SiO$_2$ grating. Similar to the recombination, exciton density (FIG. 100a) is spread throughout the thickness of the organic layer but primarily concentrated in the regions where SiO$_2$ does not hinder the path from cathode to anode. The average exciton density of the OSLD and OLED (FIG. 99g) are similar, indicating that the high accumulation of excitons near the SiO$_2$ compensates for the low exciton density between the grating (no injection region) leading to a similar exciton density as for the reference device.

Light outcoupling from the second-order grating and light trapping in the ITO layer, which forms a waveguide loss, are clearly visible in the simulated electric field distribution E(x, y) of the optical field at the calculated resonant wavelength $\lambda_0$=483 nm in the OSLD (FIG. 100b). The DFB resonant cavity is characterized by a confinement factor Γ of 40% and a quality factor of 255. The modal gain ($g_m$), which is an indicator of the amplification of light in the laser mode, as a function of current density was calculated from the overlap of the exciton density distribution and optical field distribution (see Material and Methods for details) with a stimulated emission cross section $\sigma_{stim}$ for BSBCz[35] of 2.8 10$^{-16}$ cm$^2$ and is shown in FIG. 100c for the second-order region. The high and increasing modal gain above 500 A cm$^{-2}$ is consistent with the observation of lasing. The areas of strong spatial overlap between the exciton density and optical mode at J=500 A cm$^{-2}$ (FIG. 100d) correspond to areas where both the exciton density and optical fields (FIGS. 100a, b) are high. Thus, the DFB structure also helps to enhance coupling with the optical mode through localization of high exciton density in and above the valleys of the grating.

In conclusion, this study proves that lasing from a current-driven organic semiconductor is possible through proper design and choice of the resonator and organic semiconductor to suppress losses and enhance coupling. The lasing demonstrated here has been reproduced in multiple devices and fully characterized to exclude other phenomena that could be mistaken for lasing. The results fully support the claim that this is the first observation of electrically pumped lasing in organic semiconductors. The low losses in BSBCz are integral to enabling lasing, so the development of strategies to design new laser molecules with similar or improved properties is an important next step. This report opens new opportunities in organic photonics and serves as a basis for the future development of an organic semiconductor laser diode technology that is simple, cheap, and tunable and can enable fully and directly integrated organic-based optoelectronic platforms.

Materials and Methods
Device Fabrication

Indium tin oxide (ITO)-coated glass substrates (100-nm-thick ITO, Atsugi Micro Co.) were cleaned by ultrasonication using neutral detergent, pure water, acetone, and isopropanol followed by UV-ozone treatment. A 100-nm-thick layer of SiO$_2$, which would become the DFB grating, was sputtered at 100° C. onto the ITO-coated glass substrates. The argon pressure during the sputtering was 0.66 Pa. The RF power was set at 100 W. Substrates were again cleaned by ultrasonication using isopropanol followed by UV-ozone treatment. The SiO$_2$ surfaces were treated with hexamethyldisilazane (HMDS) by spin coating at 4,000 rpm for 15 s and annealed at 120° C. for 120 s. A resist layer with a thickness of around 70 nm was spin-coated on the substrates at 4,000 rpm for 30 s from a ZEP520A-7 solution (ZEON Co.) and baked at 180° C. for 240 s.

Electron beam lithography was performed to draw grating patterns on the resist layer using a JBX-5500SC system (JEOL) with an optimized dose of 0.1 nC cm$^{-2}$. After the electron beam irradiation, the patterns were developed in a developer solution (ZED-N50, ZEON Co.) at room temperature. The patterned resist layer was used as an etching mask while the substrate was plasma etched with CHF$_3$ using an EIS-200ERT etching system (ELIONIX). To completely remove the resist layer from the substrate, the substrate was plasma-etched with O$_2$ using a FA-1EA etching system (SAMCO). The etching conditions were optimized to completely remove the SiO$_2$ from the grooves in the DFB until the ITO was exposed. The gratings formed on the SiO$_2$ surfaces were observed with SEM (SU8000, Hitachi) (FIG. 89c). EDX (at 6.0 kV, SU8000, Hitachi) analysis was performed to confirm complete removal of SiO$_2$ from ditches in the DFB (FIGS. 90c, d). Cross section SEM and EDX were measured by Kobelco using a cold-field-emission SEM (SU8200, Hitachi High-Technologies), an energy dispersive X-ray spectrometry (XFlash Flad-Quad5060, Bruker), and a focused ion beam system (FB-2100, Hitachi High-Technologies) (FIGS. 89d, e).

The DFB substrates were cleaned by conventional ultra-sonication. Organic layers and a metal electrode were then vacuum-deposited by thermal evaporation under a pressure of 1.5×10$^4$ Pa with a total evaporation rate of 0.1-0.2 nm s$^{-1}$ on the substrates to fabricate OSLDs with the structure indium tin oxide (ITO) (100 nm)/20 wt % BSBCz:Cs (60 nm)/BSBCz (150 nm)/MoO$_3$ (10 nm)/Ag (10 nm)/Al (90 nm). The SiO$_2$ layers on the ITO surface acted as insulators in addition to a DFB grating. Therefore, the current flow regions of the OLEDs were limited to the DFB regions where BSBCz is in direct contact with ITO. Reference OLEDs with an active area of 30×45 μm were also prepared with same current flow region.

Device Characterization

All the devices were encapsulated in a nitrogen-filled glove box using glass lids and UV-cured epoxy to prevent any degradation resulting from moisture and oxygen. Current density-voltage-$\eta_{EQE}$ (J-V-$\eta_{EQE}$) characteristics (DC) of the OSLDs and OLEDs were measured using an integrating sphere system (A10094, Hamamatsu Photonics) at room temperature. For pulse measurements, rectangular pulses with a pulse width of 400 ns, pulse period of 1 µs, repetition frequency of 1 kHz, and varying peak currents were applied to the devices at ambient temperature using a pulse generator (NF, WF1945). The J-V-luminance characteristics under pulse driving were measured with an amplifier (NF, HSA4101) and a photomultiplier tube (PMT) (C9525-02, Hamamatsu Photonics). Both the PMT response and the driving square wave signal were monitored on a multi-channel oscilloscope (Agilent Technologies, MSO6104A). The r/EQE was calculated by dividing the number of photons, which was calculated from the PMT-response EL intensity with a correction factor, by the number of injected electrons, which was calculated from the current. Output power was measured using a laser power meter (OPHIR Optronics Solution Ltd., StarLite 7Z01565).

To measure the spectra, emitted laser light for both optically and electrically pumped OSLDs was collected normal to the device surface with an optical fiber connected to a multichannel spectrometer (PMA-50, Hamamatsu Photonics) and placed 3 cm away from the device. The beam profile of the OSLDs was checked by using a CCD camera (beam profiler WimCamD-LCM, DataRay). For characteristics of OSLD-6 under optical pumping, pulsed excitation light from a nitrogen-gas laser (NL100, $N_2$ laser, Stanford Research System) was focused in a $6\times10^{-3}$ cm² area of the device through a lens and slit. The excitation wavelength was 337 nm, pulse width was 3 ns, and repetition rate was 20 Hz. The excitation light was incident upon the devices at around 20° with respect to the normal to the device plane. Excitation intensities were controlled using a set of neutral density filters. Steady-state PL spectroscopy was monitored using a spectrofluorometer (FP-6500, JASCO) in FIG. 98 and a spectrometer (PMA-50) in FIG. 94.

Device Modeling and Parameters

The optical simulation of the resonant DFB cavity was performed using Comsol Multiphysics 5.2a software. The Helmholtz equation was solved for every frequency using the Finite Element Method (FEM) in the Radio Frequency module of Comsol software. Each layer was represented by its complex refractive index and thickness. The computation domain was limited to one supercell composed of a second-order grating surrounded by first-order gratings. The Floquet periodic boundary conditions were applied for lateral boundaries, and scattering boundary conditions were used for the top and bottom domains. Only TE modes were considered since TM modes are suppressed because they experience more losses than the TE modes (due to metal absorption).

The charge transport through the OSLD was described using the two-dimensional time-independent drift-diffusion equation coupled to the Poisson equation and the continuity equation for charge carriers using the Technology Computer Aided Design (TCAD) software from Silvaco. The electron and hole concentrations were expressed using parabolic density of states (DOS) and Maxwell-Boltzmann statistics. A Gaussian distribution was used to model the trap distribution within the organic semiconductor[37]. The charge carrier mobilities were assumed to be field dependent and have a Pool-Frenkel form[38-39]. In this model the energetic disorder was not taken into account, so we assumed the validity of Einstein's relation to calculate the charge carrier diffusion constant from the charge carrier mobility. The recombination rate R was given by the Langevin model[40].

The continuity equation for singlet excitons is solved by taking into account the exciton diffusion, the radiative and non-radiative processes.

Experimental data for hole-only and electron-only devices (energy diagrams and structures in FIG. 92) were fitted to extract the charge carrier mobilities. The values of the fitted mobility parameters and other input parameters used in the simulations are presented in Table 2. The extracted values were used to simulate bipolar OLED devices with the structure ITO/20 wt % Cs:BSBCz (10 nm)/BSBCz (190 nm)/MoO$_3$ (10 nm)/Al. The work function of the cathode (ITO/20 wt % Cs:BSBCz) was taken to be 2.6 eV and that of the anode (MoO$_3$/Al) 5.7 eV. The influence of the DFB grating on the electrical properties of the OSLD were calculated and compared to the reference device (without grating). The modal gain $g_m$ was calculated from S(x, y) and the optical mode intensity $|E(x, y)|^2$ using the equation $$g_m = \frac{\sigma_{stim} \int_0^L \int_0^d |E(x, y)|^2 S(x, y) dy dx}{\int_0^L \int_0^d |E(x, y)|^2 dy dx},$$

where L is cavity length (only the second-order grating region) and d is the active film thickness.

TABLE 1

| Parameters for the different OSLD geometries |

| Device | w (µm) | l (µm) | Λ$_1$ (nm) | Λ$_2$ (nm) | w$_1$ (µm) | w$_2$ (µm) | A (µm²) |
|---|---|---|---|---|---|---|---|
| OLED | 30 | 45 | — | — | — | — | 1,350 |
| OSLD | 30 | 90 | 140 | 280 | 1.68 | 1.12 | 1,350 |
| OSLD-1 | 35 | 90 | 140 | 280 | 14.00 | 7.00 | 1,575 |
| OSLD-2 | 90 | 30 | 140 | 280 | 1.68 | 1.12 | 1,350 |
| OSLD-3 | 101 | 30 | 140 | 280 | 45.36 | 10.08 | 1,515 |
| OSLD-4 | 30 | 90 | 134 | 268 | 1.608 | 1.072 | 1,350 |
| OSLD-5 | 30 | 90 | 146 | 292 | 1.752 | 1.168 | 1,350 |
| OSLD-6 | 560 | 800 | 140 | 280 | 1.68 | 1.12 | 224,000 |

Values of the different grating geometries for the parameters shown in FIG. 90 along with the total exposed ITO area A used for calculating current density.

TABLE 2

| Parameters for optical and electrical simulations. |

| Parameter | BSBCz | BSBCZ:Cs | Units |
|---|---|---|---|
| ε$_r$ | 4 | 4 | — |
| E$_{HOMO}$ | 5.8 | 5.8 | eV |
| E$_{LUMO}$ | 3.1 | 3.1 | eV |
| N$_{HOMO}$ | $2 \times 10^{-19}$ | $2 \times 10^{-19}$ | cm$^{-3}$ |
| N$_{LUMO}$ | $2 \times 10^{-19}$ | $2 \times 10^{-19}$ | cm$^{-3}$ |
| N$_{tp}$ | $2.8 \times 10^{-17}$ | — | cm$^{-3}$ |
| E$_{tp}$ | 0.375 | — | eV |
| σ$_{tp}$ | 0.017 | — | eV |
| µ$_{n0}$ | $6.55 \times 10^{-5}$ | $6.55 \times 10^{-5}$ | cm² V$^{-1}$ g$^{-1}$ |
| µ$_{p0}$ | $1.9 \times 10^{-4}$ | $1.9 \times 10^{-4}$ | cm² V$^{-1}$ s$^{-1}$ |
| F$_{n0}$ | 175,561 | 175,561 | V cm$^{-1}$ |
| F$_{p0}$ | 283,024 | 283,024 | V cm$^{-1}$ |
| k$_r$ | $10^9$ | $10^9$ | s$^{-1}$ |
| k$_{nr}$ | $0.11 \times 10^9$ | $0.11 \times 10^9$ | s$^{-1}$ |
| φ$_{PL}$ | 0.76 | 0.4 | — |
| L$_S$ | 18 | 18 | nm |

ε$_r$ is the relative permittivity of the material. E$_{HOMO}$ and E$_{LUMO}$ are the energy levels of the highest occupied molecular orbital (HOMO) and the lowest unoccupied molecular orbital (LUMO), respectively. $N_{HOMO}$ and $N_{LUMO}$ are the densities of states of the HOMO and the LUMO levels. $N_{tp}$ is the total density of trap, $E_{tp}$ is the energy depth of traps above the HOMO level and $\sigma_{tp}$ is the width of the Gaussian distribution. $\mu_{n0}$ and $\mu_{p0}$ are the zero-field mobility. $F_{n0}$ and $F_{p0}$ are the characteristic electric field for electron and hole, respectively. $k_r$ is the radiative decay constant and $k_{nr}$ is the non-radiative decay constant. $\varphi_{PL}$ is the photoluminescence quantum yield. $L_S$ is the exciton diffusion length.

REFERENCES

1. Tessler, N., Denton, G. J. & Friend, R. H. Lasing from conjugated-polymer microcavities. *Nature* 382, 695-697 (1996).
2. Kozlov, V. G., Bulović, V., Burrows, P. E. & Forrest, S. R. Laser action in organic semiconductor waveguide and double-heterostructure devices. *Nature* 389, 362-364 (1997).
3. Hide, F. et al. Semiconducting polymers: A new class of solid-state laser materials. *Science* 273, 1833 (1996).
4. Samuel, I. D. W. & Turnbull, G. A. Organic semiconductor lasers. *Chem. Rev.* 107, 1272-1295 (2007).
5. Kuehne, A. J. C. & Gather M. C. Organic lasers: Recent developments on materials, device geometries and fabrication techniques. *Chem. Rev.* 116, 12823-12864 (2016).
6. Tsiminis, G. et al. Nanoimprinted organic semiconductor lasers pumped by a light-emitting diode. *Adv. Mater.* 25, 2826-2830 (2013).
7. Baldo, M. A., Holmes, R. J. & Forrest, S. R. Prospects for electrically pumped organic lasers. *Phys. Rev. B* 66, 035321 (2002).
8. Bisri, S. Z., Takenobu, T. & Iwasa, Y. The pursuit of electrically-driven organic semiconductor lasers. *J. Mater Chem. C* 2, 2827-2836 (2014).
9. Samuel, I. D. W., Namdas, E. B. & Turnbull, G. A. How to recognize lasing. Nature Photon. 3, 546-549 (2009).
10. Sandanayaka, A. S. D. et al. Improvement of the quasi-continuous-wave lasing properties in organic semiconductor lasers using oxygen as triplet quencher. *Appl. Phys. Lett.* 108, 223301 (2016).
11. Zhang, Y. F. & Forrest, S. R. Existence of continuous-wave threshold for organic semiconductor lasers. *Phys. Rev. B* 84, 241301 (2011).
12. Schols, S. et al. Triplet excitation scavenging in films of conjugated polymers. *Chem. Phys. Chem.* 10, 1071-1076 (2009).
13. Hayashi, K. et al. Suppression of roll-off characteristics of organic light-emitting diodes by narrowing current injection/transport area to 50 nm. *Appl. Phys. Lett.* 106, 093301 (2015).
14. Gartner, C. et al. The influence of annihilation processes on the threshold current density of organic laser diodes. *J. Appl. Phys.* 101, 023107 (2007).
15. Sandanayaka, A. S. D. et al. Quasi-continuous-wave organic thin film distributed feedback laser. *Adv. Opt. Mater* 4, 834-839 (2016).
16. Aimono, T. et al. 100% fluorescence efficiency of 4,4'-bis[(N-carbazole)styryl]biphenyl in a solid film and the very low amplified spontaneous emission threshold. *Appl. Phys. Lett.* 86, 71110 (2005).
17. Sandanayaka, A. S. D. et al. Toward continuous-wave operation of organic semiconductor lasers. *Science Adv.* 3, e1602570 (2017).
18. Karnutsch, C. et al. Improved organic semiconductor lasers based on a mixed-order distributed feedback resonator design. *Appl. Phys. Lett.* 90, 131104 (2007).
19. Chénais, S. & Forget, S. Recent advances in solid-state organic lasers. *Polym. Int.* 61, 390-406 (2012).
20. Yokoyama, D. et al. Spectrally narrow emissions at cutoff wavelength from edges of optically and electrically pumped anisotropic organic films. *J. Appl. Phys.* 103, 123104 (2008).
21. Yamamoto, H. et al. Amplified spontaneous emission under optical pumping from an organic semiconductor laser structure equipped with transparent carrier injection electrodes. *Appl. Phys. Lett.* 84, 1401-1403 (2004).
22. Wallikewitz, B. H. et al. Lasing organic light-emitting diode. *Adv. Mater* 22, 531-534 (2010).
23. Song, M. H. et al. Optically-pumped lasing in hybrid organic-inorganic light-emitting diodes. *Adv. Funct. Mater.* 19, 2130-2136 (2009).
24. Kim, S. Y. et al. Organic light-emitting diodes with 30% external quantum efficiency based on horizontally oriented emitter. *Adv. Funct. Mater* 23, 3896-3900 (2013).
25. Uoyama, H. et al. Highly efficient organic light-emitting diodes from delayed fluorescence. *Nature* 492, 234-238 (2012).
26. Matsushima, T. & Adachi, C. Suppression of exciton annihilation at high current densities in organic light-emitting diode resulting from energy-level alignments of carrier transport layers. *Appl. Phys. Lett.* 92, 063306 (2008).
27. Kuwae, H. et al. Suppression of external quantum efficiency roll-off of nanopatterned organic light-emitting diodes at high current densities. *J. Appl. Phys.* 118, 155501 (2015).
28. Bisri, S. Z. et al. High mobility and luminescent efficiency in organic single-crystal light-emitting transistors. *Adv. Funct. Mater* 19, 1728-1735 (2009).
29. Tian, Y. et al. Spectrally narrowed edge emission from organic light-emitting diodes. *Appl. Phys. Lett.* 91, 143504 (2007).
30. El-Nadi, L. et al. Organic thin film materials producing novel blue laser. *Chem. Phys. Lett.* 286, 9-14 (1998).
31. Wang, X., Wolfe, B. & Andrews, L. Emission spectra of group 13 metal atoms and indium hybrids in solid $H_2$ and $D_2$. *J. Phys. Chem. A* 108, 5169-5174 (2004).
32. Ribierre, J. C. et al. Amplified spontaneous emission and lasing properties of bisfluorene-cored dendrimers. *Appl. Phys. Lett.* 91, 081108 (2007).
33. Schneider, D. et al. Ultrawide tuning range in doped organic solid-state lasers. *Appl. Phys. Lett.* 85, 1886-1888 (2004).
34. Murawski, C., Leo, K. & Gather, M. C. Efficiency roll-off in organic light-emitting diodes. *Adv. Mater* 25, 6801-6827 (2013).
35. Nakanotani, H. et al. Spectrally narrow emission from organic films under continuous-wave excitation. *Appl. Phys. Lett.,* 90, 231109 (2007).
36. Nakanotani, H., Sasabe, H. & Adachi, C. Singlet-singlet and singlet-heat annihilations in fluorescence-based organic light-emitting diodes under steady-state high current density. *Appl. Phys. Lett.,* 86, 213506 (2005).
37. Nicolai, H. T., Mandoc, M. M. & Blom, P. W. M. Electron traps in semiconducting polymers: Exponential versus Gaussian trap distribution. *Phys. Rev. B* 83, 195204 (2011).
38. Connell, G. A. N., Camphausen, D. L. & Paul, W. Theory of Poole-Frenkel conduction in low-mobility semiconductors. *Philos. Mag.* 26, 541-551 (1972).

39. Pautmeier, L., Richert, R. & Bassler, H. Poole-Frenkel behavior of charge transport in organic solids with off-diagonal disorder studied by Monte Carlo simulation. *Synth. Met.* 37, 271-281 (1990).

40. Pope, M. & Swenberg, C. E. *Electronic Processes in Organic Crystals and Polymers.* New York: Oxford Univ. Press, 1999.

41. Setoguchi, Y. & Adachi, C. Suppression of roll-off characteristics of electroluminescence at high current densities in organic light emitting diodes by introducing reduced carrier injection barriers. *J. Appl. Phys.* 108, 064516 (2010).

BRIEF DESCRIPTION OF DRAWINGS

FIG. 1. (a) Chemical structures of BSBCz and CBP, (b) schematic drawing of a BSBCz:CBP film embedded in a second-order DFB structure, (c) Schematic representation of the method used to fabricate the DFB resonator structure by e-beam lithography and dry etching, SEM images of the DFB structure at (d) 4500× and (e) 120000× magnification, and (f) absorption and photoluminescence spectra of the BSBCz and CBP neat films. The DFB structure was directly engraved onto a silicon dioxide surface. When a second-order mode (m=2) is used in the Bragg equation ($mL=2n_{eff}/l$), a diffracted beam is emitted in the direction perpendicular to the film plane as shown in (b). The large overlap of the CBP emission and BSBCz absorption enables efficient Förster-type energy transfer from CBP to BSBCz. In a BSBCz:CBP blend film, the CBP molecules are predominantly excited by the 337 nm light. Then, emission comes from BSBCz because of the efficient energy transfer, whereas no emission is observed from CBP.

FIG. 2. Emission spectra and plots of emission intensity and FWHM as a function of excitation intensity for a (a,c) BSBCz:CBP blend film and (b,d) BSBCz neat film embedded into the DFB structures when 0.8 ns-wide pulse excitation at 20 Hz was used. The insets in (a,b) show the emission spectra measured near the lasing threshold.

FIG. 3. (a) Streak camera images of laser oscillations and (b,c) temporal changes of laser intensities in the BSBCz:CBP blend film. The repetition rate was changed from 0.01 to 8 MHz. The excitation light intensity was fixed at about 0.44 µJ cm$^{-2}$, which is 1.8-fold higher than $E_{th}$=0.25 µJ cm$^{-2}$. The time scale was 500 µs for (a,b) and 2 µs for (c).

FIG. 4. (a) Plots of lasing threshold as a function of repetition rate and (b) operational stability of laser oscillations in organic DFB lasers based on a BSBCz:CBP blend film and BSBCz neat film. To measure the stability, the laser devices were continuously quasi-cw operated at 8 MHz. The excitation light intensities were 1.5-fold higher than the lasing threshold.

FIG. 5. (a) Chemical structures of the liquid carbazole (ECHz) host and the heptafluorene derivative. (b) Schematic representation of the liquid DFB laser prepared using a first-order 1D grating pattern. (c) SEM image of the PUA pattern with a period of 140 nm and a height of 100 nm. The scale bar represents 200 nm. (d) Emission spectra of the nitrogenated and oxygenated liquid DFB lasers measured above the thresholds at a repetition rate of 1 MHz. (e) Photograph of the oxygenated blue liquid DFB laser operating in the quasi-cw regime.

FIG. 6. (a,b) Streak camera images of the lasing emission and (c,d) temporal changes of the laser intensities in the nitrogenated and oxygenated EHCz:heptafluorene DFB lasers. The repetition rates were increased from 0.01 to 4 MHz. The excitation light intensity was kept constant at 2.5 µJ cm$^{-2}$ FIG. 7. Output emission intensity and full-width-at-half-maximum as a function of the excitation intensity at different repetition rates in the nitrogenated EHCz:heptafluorene DFB laser.

FIG. 8. Output emission intensity and full-width-at-half-maximum as a function of the excitation intensity at different repetition rates in the oxygenated EHCz:heptafluorene DFB laser.

FIG. 9. (a) Lasing threshold of the nitrogenated and oxygenated liquid DFB organic semiconductor lasers as a function of the repetition rate. (b) Photostability of the oxygenated and nitrogenated liquid organic semiconductor DFB lasers operating in the quasi-cw regime at a repetition rate of 1 MHz. The excitation light intensity was 2.5 µJ cm$^{-2}$ FIG. 10. (a) Triplet-triplet absorption spectrum of the heptafluorene in oxygenated and nitrogenated chloroform solution. Triplet-triplet absorption vanishes in the oxygenated solution due to a quenching of the triplets by molecular oxygen. A representative laser spectrum measured in the oxygenated DFB device is also displayed. (b) Transient decay of the triplet-triplet absorption contribution with a time constant well over 1 ms.

FIG. 11. Dynamics of the photoluminescence intensity measured at 0.5 kW cm$^{-2}$ in nitrogenated and oxygenated EHCz:heptafluorene blends for 4 different pulse durations varying from 50 to 800 µs. For this experiment, the gain medium was sandwiched between two identical flat fused silica substrates. The samples were then optically pumped by laser pulses coming from a cw HeCd laser emitting at 325 nm. Spot area was 2.0×10$^{-5}$ cm$^2$. The samples were irradiated in the direction normal to the substrate plane and the PL intensity was measured at an angle of 45° using a photomultiplier tube. These results clearly demonstrate that the oxygenation leads to a suppression of the STA losses due to the quenching of the triplets by molecular oxygen.

FIG. 12. Fabrication method of the organic semiconductor DFB lasers. Schematic representation of the method used to fabricate the organic DFB lasers. The different successive steps involve the fabrication of DFB resonator structure by e-beam lithography, thermal evaporation of the organic semiconductor thin film, and spin-coating of CYTOP polymer film followed by device sealing with a high thermal conductivity (TC) sapphire lid.

FIG. 13. Structure of the mixed-order DFB resonators. (A) Schematic representation of the mixed-order DFB grating structure used in this study. SEM images with (B) 2500× and (C) 100000× magnification and (D) SEM image and (E) cross-section SEM image of the device after the deposition of a 200-nm-thick BSBCz:CBP blend film.

FIG. 14. Lasing properties of organic DFB lasers in the quasi-CW regime. Streak camera images showing laser oscillations from a representative BSBCz:CBP encapsulated mixed-order DFB device at repetition rates from 0.01 to 80 MHz over a period of (A) 500 µs or (B) 200 ns (80 MHz only). Excitation intensity was fixed at ~0.5 µJ cm$^{-2}$, which is higher than the lasing threshold ($E_{th}$). (C) Temporal evolution of laser output intensity at various repetition rates (f) in an encapsulated BSBCz:CBP mixed-order DFB laser. (D) Lasing threshold in several types of DFB devices as a function of repetition rate. Lines are guidelines for the eye.

FIG. 15. Lasing properties of organic DFB lasers in the long pulse regime. (A) Streak camera images showing laser emission integrated over 100 pulses from an encapsulated mixed-order DFB device using a BSBCz:CBP (20:80 wt. %)

Figure 59A:
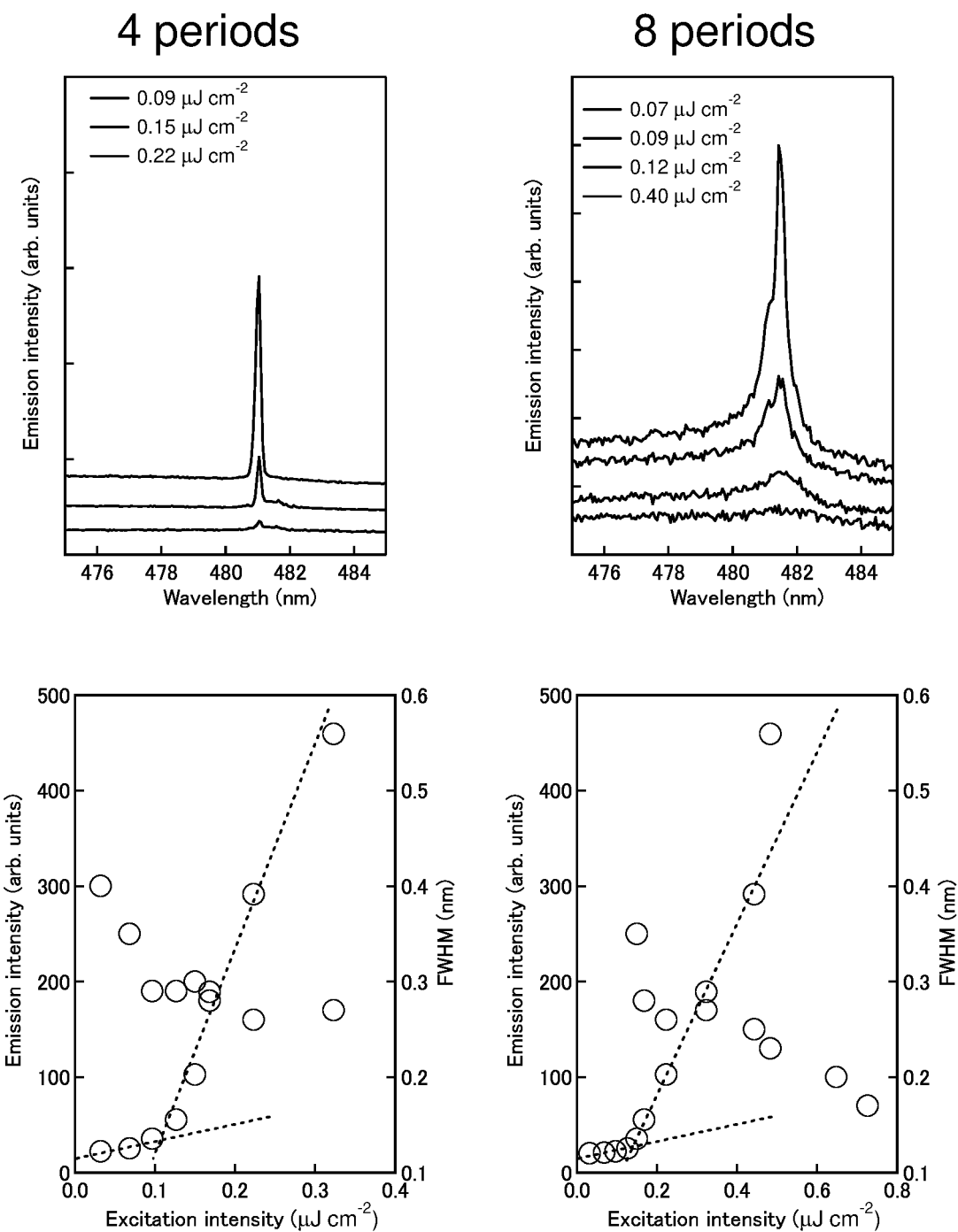

film as gain medium and optically pumped by pulses of 30 ms and 2.0 kW cm$^{-2}$ (top) or 800 µs and 200 W cm$^{-2}$ (bottom). (B) Photograph of DFB device operating in the long pulse regime (30 ms excitation). (C) Lasing threshold (Et$_h$) in various DFB devices as a function of excitation duration. Dotted lines are guidelines for the eye. (D) Change in laser output intensity from organic DFB lasers as a function of the number of incident pulses (100 µs, 200 W cm$^{-2}$).

FIG. 16. Schematic of the geometry used for optical simulation.

FIG. 17. Lasing threshold of mixed-order DFB lasers based on BSBCz:CBP (6:94 wt. %) 200 nm-thick film for different dimensions of the second-order gratings. The devices were optically pumped by nitrogen laser delivering 800 ps pulses at a repetition rate of 20 Hz and a wavelength of 337 nm.

FIG. 18. (A) Absorption spectra, (B) steady-state photoluminescence spectra and (C) transient photoluminescence decays of BSBCz:CBP (6:94 wt. %) films with and without encapsulation by a CYTOP film.

FIG. 19. Emission spectra of representative organic mixed-order DFB lasers based on (A) BSBCz:CBP (6:94 wt. %) and (B) BSBCz neat films at various pumping intensities below and above the lasing threshold. The insets show the emission spectra near the lasing threshold. Emission output intensity and FWHM as a function of the pumping intensity in the (C) blend and (D) neat film DFB lasers. In these experiments, the organic films were covered by spin-coated CYTOP films and a sapphire lid. The optical pumping source was a nitrogen laser emitting 0.8-ns-wide pulse excitation at a repetition rate of 20 Hz and a wavelength of 337 nm. The emission from the laser devices was collected in the direction normal to the substrate plane.

FIG. 20. Emission output intensity and FWHM as a function of the pumping intensity in a representative encapsulated blend mixed-order DFB laser at a repetition rate of (A) 0.01 MHz and (B) 80 MHz.

FIG. 21. Lasing threshold measured in forward (increasing repetition rate) and reverse (decreasing repetition rate) directions as a function of the repetition rate. The irreversible changes in lasing threshold are attributed to a degradation of the gain medium under intense photo-excitation.

FIG. 22. (A) Streak camera images and (B) corresponding emission spectra showing the emission from a non-encapsulated 2$^{nd}$ order, a non-encapsulated mixed-order and an encapsulated mixed-order DFB device at a repetition rate of 80 MHz and a pumping intensity of 0.5 µJ cm$^{-2}$.

FIG. 23. (A) Operational stability of the laser output oscillations from different organic DFB lasers based on BSBCz:CBP (6:94 wt. %) blend films. To measure the stability, the laser devices were continuously quasi-CW operated at 8 MHz or 80 MHz for 20 minutes. For each device, the excitation light intensity was 1.5 times that of its lasing threshold. (B) Photograph of the encapsulated blend DFB laser operating in the quasi-CW regime at 80 MHz.

FIG. 24. (A) Output intensity of the ASE centered at 472 nm as a function of the pump energy and the stripe length in a 200-nm-thick BSBCz:CBP (20:80 wt. %) film. The dash lines are fits to the data using equation reported in references (7, 8). The net gain of the waveguide was determined from the fits. (B) ASE intensity emitted from the edge of the waveguide film versus the distance between the pump stripe and the edge of the blend film. The ASE characteristics of the film were investigated using an inorganic laser diode emitting at 405 nm with different (0.1, 10 and 50 s) pulse widths.

FIG. 25. Emission spectra of encapsulated 20 wt. % blend mixed-order DFB lasers measured at a pumping intensity of 200 W cm$^{-2}$ and 2.0 kW cm$^{-2}$ for long pulse durations of 800 µs and 30 ms, respectively.

FIG. 26. Streak camera image showing laser emission integrated over 100 pulses from an encapsulated mixed-order DFB device during a 30 ms long photo-excitation with a pump power of 2.0 kW cm$^{-2}$. The gain medium was a BSBCz:CBP (20:80 wt. %). Excitation wavelength was 405 nm. To observe lasing during 30 ms with our streak camera system, the duty cycle percentage was changed into 2% to visualize the 30 ms pulse in a 1 ms frame (0.02×30 ms=0.6 ms).

FIG. 27. (A) Temporal evolution of the lasing output intensity, (B) emission spectra of the encapsulated mixed-order DFB laser measured after 10 and 500 average pulses with width of 30 ms and pumping intensities of 2.0 kW cm$^{-2}$. (C) Stimulated emission and triplet absorption cross section spectra of BSBCz. Emission spectra of DFB laser were measured from the BSBCz neat film above E$_{th}$. (D) Triplet absorption spectra were measured in a solution containing BSBCz under Ar. (E) Excitation power dependence of transient absorption spectra in a solution (BSBCz in dichloromethane and benzophenone in benzene).

FIG. 28. (A) Pictures showing the divergence of the emitted beam of a DFB laser near (B) and above (C) the threshold. The active gain medium was a BSBCz:CBP (20:80 wt. %) film. The device was pumped in a long pulse regime (10 ms excitation).

FIG. 29. (A) Emission spectra as a function of the polarization angle and (B) emission intensity as a function of the polarization angle. The device was based on a BSBCz:CBP (20:80 wt. %) blend and used a mixed-order DFB grating. The pumping intensity was 200 W cm$^{-2}$ and pump pulse duration was 800 µs. Note that 0° corresponds to the direction parallel to the grooves of the DFB grating.

FIG. 30. Emission spectra and laser output intensity and FWHM of an encapsulated mixed-order blend device as a function of the pumping intensities for long pulse excitation widths of (A, B) 1 µs and (C, D) 800 µs.

FIG. 31. Streak camera images showing laser emission from a mixed-order blend BSBCz:CBP (20:80 wt. %) DFB device encapsulated with a (A) sapphire or (B) glass lid. (C) Emission spectra of the device encapsulated with a glass lid for various pulse widths with a pumping intensity of 2.0 kW cm$^{-2}$. The emission spectra become broader as the pulse width is lengthened, which can be explained by the significant increase of the lasing threshold with the pulse width. For instance, in the case of the pulse widths of 2 and 3 ms, the device operates below the lasing threshold. (d) Lasing thresholds (E$_{th}$) measured in the DFB devices encapsulated with either a sapphire or glass lid as a function of the excitation pulse width. Dotted lines are guidelines for the eye.

FIG. 32. Laser microscope images of a non-encapsulated blend mixed-order DFB laser (A) before and (B) after irradiation by 100 excitation pulses with widths of 1 ms. The thickness profile in the inset of (B) shows that the organic thin film was ablated during the high intensity CW irradiation. Pumping intensity was 200 W cm$^{-2}$. The streak camera images in (C) and (D) show the emission from blend with and without encapsulation under the same irradiation conditions (1 ms pulse width, pumping intensity of 200 W cm$^{-2}$ and integration of the streak camera image over 100 pulses).

FIG. 33. Scheme of the DFB organic laser

FIG. 34. (a) Scheme of the 3-layer slab waveguide. (b) The effective refractive index ($n_{eff}$) for TE and TM modes as a function of film thickness d at the lasing wavelength 477 n FIG. 35. Numerically calculated (solid lines) and Fano-profile fitted (dashed lines) reflection spectra under normal incidence TE-polarized light for different values of the film thickness FIG. 36. (a) Experimental laser emission spectra of fabricated laser devices with different $d_f$. (b) Experimental lasing wavelengths and calculated resonance wavelengths.

FIG. 37. Plots of (a) $E_{th}$ (squares), Q-factor extracted from numerical calculation, $Q_{FEM\text{-}calc.}$ (triangles) and Fano fit, $Q_{Fano\text{-}fit}$ (stars), and $\Gamma$ (circles) as a function of $d_f$. (b) Experimental FWHM of laser emission and calculated ones from Fano resonance.

FIG. 38. Schematic of the geometry used for thermal simulation.

FIG. 39. Temperature maximum at the end of each pulse.

FIG. 40. Temperature rise as a function of time with different pulse widths: (A) 1, (B) 10, (C) 30 and (D) 40 ms in the gain region.

FIG. 41. Temperature rise as a function of time for a pulse width of 10 ms in the devices with and without encapsulation.

FIG. 42. Temperature rise as a function of time or number of pulse of $\tau_p$=30 ms in the gain region.

FIG. 43. Schematic representation of the method used to fabricate the DFB grating and the organic laser diode of an electrically driven organic semiconductor DFB laser diode. The different successive steps involve the sputtering of a 100 nm thick $SiO_2$ layer on top of the patterned ITO electrodes, the fabrication of a DFB resonator structure in $SiO_2$ by e-beam lithography and dry etching, and the thermal evaporation of the organic semiconductor thin film and the top electrodes.

FIGS. 44 (A)-44 (D). Schematic representation of the substrate after different steps of the DFB fabrication on ITO. FIG. 44 (A) Patterned ITO, FIG. 44 (B) after sputtering $SiO_2$ on ITO, FIG. 44 (C) after making DFB on ITO and FIG. 44 (D) DFB structure.

FIG. 45. Schematic representation of a method for fabricating a nanoimprint DFB grating. The different successive steps involve the preparation of a 70 nm thick polymer layer on top of the patterned ITO electrodes followed by the fabrication of a DFB resonator structure in polymer by simple nanoimprint lithography process with low cost.

FIG. 46. Structural characterization of the mixed-order DFB resonators used in organic laser diodes.
(A) Laser microscope and (B) SEM images (with 5000× and 200000× (in inset) magnification) of a mixed-order DFB $SiO_2$ grating structure prepared on top of an ITO patterned glass substrate. (C, D) EDX and SEM analysis of mixed-order DFB grating prepared on top of ITO. These images confirm the exposure of ITO for contact with the device.

FIG. 47. Structure and properties of electrically driven organic semiconductor DFB laser.
(A) Schematic representation and energy level diagram of the organic semiconductor laser diode. Photomicrographs of (B) an organic DFB laser diode and (C) a reference device (OLED without grating) with and without DC operation at 4 V. Device area is 140×200 □ m. (D) Current density-voltage (J-V) curves and (E) external quantum efficiency—current density (EQE-J) curves measured in the reference OLED device and in the organic DFB laser diode under DC and pulsed operation.

FIG. 48. Energy level diagram for (a) electron-only device, (b) hole-only device and (c) bipolar device.

FIG. 49. (a) Reported (symbol) and fitted (solid lines) mobilities to Pool-Frankel field dependent model (solid line) for hole (blue) and electron (red) for BSBCz. (b) Experimental (symbol) and simulated (solid line) J(V) curves for hole-only device (blue), electron-only device (red) and bipolar device (black).

FIG. 50. SEM (A, B) surface morphology images and (C, D) cross-section image of the laser diode structure after the deposition of all layers.

FIG. 51. Schematic representation of some possible configurations for the organic semiconductor laser diode. DFB resonator structure (second and mix order grating) could be fabricated (A) in $SiO_2$ by e-beam lithography and dry etching, (B) in ITO by e-beam lithography and dry etching, (C) in a polymer on top of the patterned ITO electrodes by nanoimprint lithography process, or (D) on top of the active layer by nanoimprint lithography.

FIG. 52. Schematic representation of an organic semiconductor laser diode with a two-dimensional DFB resonator structure (second and mixed-order grating) for 2D-DFB laser.

FIG. 53. Photomicrographs of (A-D) organic DFB laser diodes with and without DC operation at 4 V (the device in A, B was prepared with a DFB structure having 36 second-order periods surrounded by 324 first-order periods and the device in D, C with a repeated structure of 4 second-order periods surrounded by 12 first-order periods). Device area is 30×101 □ m. (E) Emission spectra of an electrically driven organic semiconductor DFB laser (grating periods of this device for the $1^{st}$ and $2^{nd}$ orders were 140 nm and 280 nm, respectively) collected normal to the substrate plane for different injected current densities and (F) the output intensity as a function of the current density.

FIG. 54. The electroluminescence and PL spectra of BSBCz (black—PL spectra, red—EL spectra of reference device, and blue—EL spectra with grating below lasing threshold)

FIG. 55. Lasing properties of an electrically driven organic semiconductor DFB laser diode.
(A) Emission spectra of an electrically driven organic semiconductor DFB laser (grating periods of this device for the $1^{st}$ and $2^{nd}$ orders were 140 nm and 280 nm, respectively) collected normal to the substrate plane for different injected current densities and (B) its output intensity as a function of the current density. (C) Emission spectra and (D) output intensity versus current density obtained in an organic DFB laser diode using grating periods for the $1^{st}$ and $2^{nd}$ orders of 150 nm and 300 nm, respectively FIG. 56. Lasing properties of an electrically driven organic semiconductor DFB laser diode.
(A) Emission spectra of an electrically driven organic semiconductor DFB laser (grating periods of this device for the $1^{st}$ and $2^{nd}$ orders were 140 nm and 280 nm, respectively) collected normal to the substrate plane for different injected current densities and (B) its output intensity as a function of the current density.

FIG. 57. (A) Current density-voltage (J-V) curves for with and without DFB. The device with DFB has grating periods for the $1^{st}$ and $2^{nd}$ orders of 150 nm and 300 nm, respectively. (B) External quantum efficiency versus current density in the electrically driven organic DFB solid state laser and without DFB under 500 ns pulse.

FIG. 58. SEM images (A, B, C, D and E) of a mixed-order grating with different numbers of periods in the first and second-order region. (F) Table of a mixed-order grating with different numbers of periods in the first and second-order region for the design DFB.

Figure 59A:
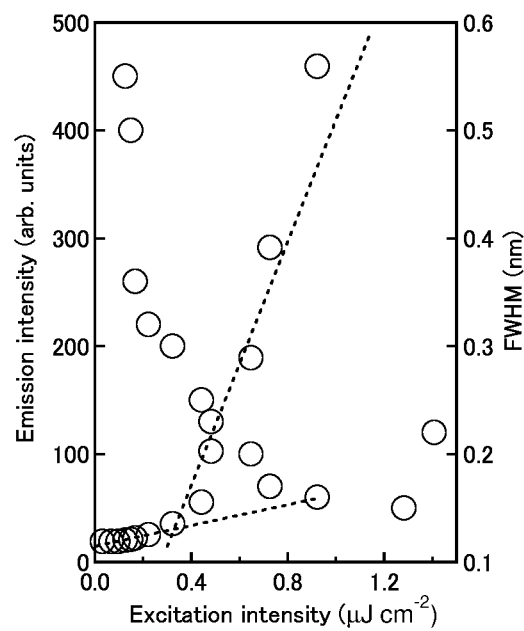
Figure 59B:
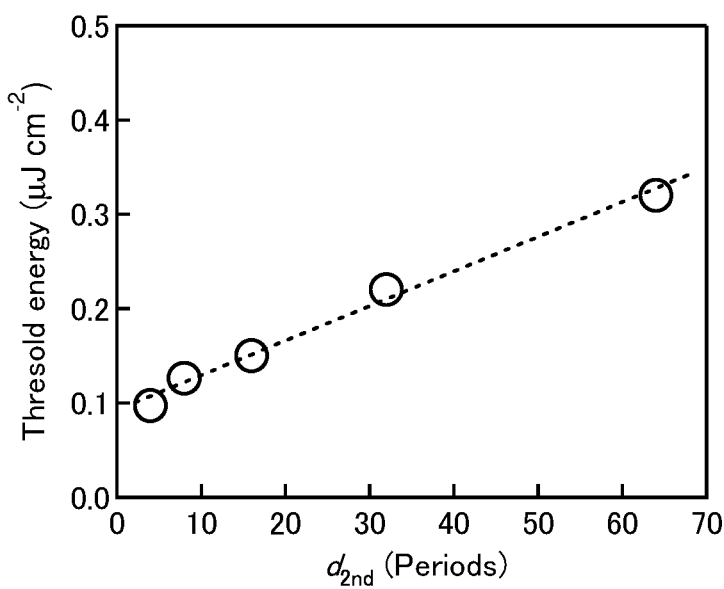

FIGS. 59 (A)-59 (B). FIG. 59 (A) Laser spectra for mixed-order gratings with different numbers of periods. The number of periods at the top of each graph corresponds to the number of $2^{nd}$ order periods, and the number of $1^{st}$ order periods can be found in FIG. 58. The bottom graphs show the output characteristics of the devices. FIG. 59 (B) Threshold energy of mixed-order grating lasers for different numbers of periods in the second-order region. In the case of optical pumping, using 4 and 12 periods in the first- and second-order regions, respectively, shows the lowest threshold values. The optical pumping source was a nitrogen laser emitting 0.8-ns-wide pulse excitation at a repetition rate of 20 Hz and a wavelength of 337 nm. The emission from the laser devices was collected in the direction normal to the substrate plane.

FIG. 60. (A) SEM image of a mixed-order grating with 12 and 4 periods in the first- and second-order regions, respectively. (B, C) an organic DFB laser diode with and without DC operation at 5 V. Device area is 2.9×10 □m. (D) Emission spectra for a reference OLED.

FIG. 61. (A) Schematic representation of the experimental setup for checking the polarization of the laser. Polarization dependence of the EL spectra (B) below lasing threshold (at 415 A cm$^{-2}$) and (C) above lasing threshold (at 823 A cm$^{-2}$) a DFB laser diode and (D) for a reference (at 800 A cm$^{-2}$, without DFB) (E) EL intensity as a function of the polarization angle. The EL is polarized in the plane of the device (TE mode)

FIG. 62. (A) Schematic of OLED structure with DFB. (B) Microscope images of a DFB on an ITO substrate with a device area is 560×800 □m. (C) Optically pump output intensity of the DFB laser as a function of the excitation density; excited with a CW laser at 405 nm.

FIG. 63. Photomicrographs of (A, B) an organic DFB laser diode with and without DC operation at 4 V and (C, D) a reference device (OLED without grating).

FIG. 64. Laser microscope images of a circular mixed-order DFB grating structure prepared using SiO$_2$ on ITO pattern substrate.

FIG. 65. Microscope images of and organic circular DFB laser with and without driving. Current density-voltage (J-V) curves for devices with and without circular DFB. External quantum efficiency versus current density in the OLED with and without DFB.

FIG. 66. (a) Schematic representation of the DFB grating OLED and (b) Experimental (symbol) and simulated (solid line) J(V) curves for the DFB grating and reference OLED.

FIG. 67. Spatial distribution of charge carrier density, n, p and electric field F at (a) 10 V and (b) 70 V.

FIG. 68. Cartography of the spatial distribution of (a) hole density, p (b) electron density, n, at 70V, (c) n, p cut line through 2D section at y=0.11 μm.

FIG. 69. Cartography of the profile of (a) the electric field, F, and (b) the current density, J, at 70V.

FIG. 70. (a) Cartography of the profile recombination rate, R, for the DFB device, (b) R of the reference device, (c) R cut line through 2D section at y=0.10 μm for the DFB device and (d) n, p cut line through 2D section at y=0.164 μm for the DFB device at 70V.

FIG. 71. (a) S(U) characteristics without and with EFQ (a) for different $E_b$ for the reference device and (b) for the DFB and the reference devices with $E_b$=0.6 eV.

FIG. 72. Exciton distribution (a) inside the reference device with and without EFQ, (b) inside the DFB device without EFQ, (c) inside the DFB device with EFQ, at 70V.

FIG. 73. Exciton density distribution inside the DFB device (left top) without quenching, (left bottom) with EFB, (right top) with PQ, (right bottom) with PQ and EFQ.

FIG. 74. Optical density distribution inside the DFB device (left top) Air/BSBCz/SiO$_2$, (right top) Air/BSBCz/SiO$_2$/ITO (bottom) actual device Al/Ag/MoO$_3$/BSBCz/SiO$_2$/ITO.

FIG. 75. (a) Chemical structure of the octafluorene derivative. (b) Absorption and steady-state PL spectra measured at room temperature in spin-coated octafluorene neat film. Excitation wavelength for the measurement of the PL spectrum was 376 nm. A picture of an octafluorene neat film under UV illumination is shown in the inset. (c) Ordinary and extraordinary optical constants (k and n) of the octafluorene neat film measured by variable angle spectroscopic ellipsometry. The film thickness was around 75 nm.

FIG. 76. (a) Absorption and (b) steady-state PL spectra of blend films containing 10 and 20 wt. % of octafluorene in a CBP host. The excitation wavelength used for the emission spectra was 424 nm for both films.

FIG. 77. PL decays measured in octafluorene neat films and in blend films containing 10 and 20 wt. % of octafluorene in a CBP host. Excitation wavelength was 365 nm.

FIG. 78. Experimental and simulated ellipsometric data W and A measured at different angles of incidence in a spin-coated octafluorene neat film.

FIG. 79. (a) Schematic representation of the experimental configuration used to characterize the ASE properties of the organic thin films. (b) Emission spectra of a 260-nm-thick octafluorene neat film collected from the edge of the organic layer for different excitation intensities below and above the ASE threshold. The steady-state PL spectrum is also shown with a dashed line. A picture of an octafluorene neat film under intense light irradiation is displayed in the inset. (c) Output intensity from the edge of the 260-nm-thick film (integrated over all wavelengths) as a function of the excitation density. (d) ASE threshold as a function of the octafluorene neat film thickness. Excitation wavelength was 337 nm.

FIG. 80. Output intensity from the edge of the organic layer (integrated over all wavelengths) as a function of the excitation density in several octafluorene neat films with various thicknesses ranging between 53 and 540 nm. These data were used to examine the thickness dependence of the ASE threshold displayed in FIG. 2d.

FIG. 81. ASE intensity plotted against the distance between the pump stripe and the edge of the 260-nm-thick octafluorene neat film. Solid line corresponds to the fit obtained from a single exponential decay function to determine the loss coefficient.

FIG. 82. Temporal decay of the emission intensity above the ASE threshold from a 260-nm-thick octafluorene neat film placed either in air or nitrogen atmosphere. The pumping intensity was 873 □J/cm$^2$ and 10 Hz.

FIG. 83. (a) Schematic representation of the experimental configuration used to characterize the properties of the octafluorene DFB lasers. (b) SEM image of the mixed-order DFB grating used in this work. (c) Emission spectra of a DFB laser based on an octafluorene neat film collected normal to the substrate plane for different excitation intensities below and above the lasing threshold. (d) Output intensity of the DFB laser as a function of the excitation density.

FIG. 84. (a) Schematic representation of the OLED structure used in this study. The HOMO and LUMO of the organic materials used in these devices are also provided. (b) External quantum efficiency versus current density in the OLEDs based on octafluorene neat and CBP blended films.

FIG. 85. Determination of the ionization potential of the octafluorene in neat film using photoelectron spectroscopy in air. Taking into account the optical bandgap value determined from the absorption spectrum of the neat film, the electron affinity of the octafluorene in neat film was then approximated. It is important to note however that Koopman's theorem, stating that the vertical ionization potential is identical to the calculated absolute value of the HOMO energy, is often not satisfied because of relaxation processes during the ionization process and the electronic correlation. Although the optical bandgap generally differs from the true electronic gap, the electron affinity and the LUMO can be approximated from the difference between the ionization potential and optical bandgap values.

FIG. 86. (a) EL spectra measured at a current density of 10 mA/cm$^2$ and (b) J-V-L curves in the OLEDs based on octafluorene neat and CBP blended films.

FIG. 87. CW ASE in octafluorene neat film.

FIG. 88. CW ASE in octafluorene neat film.

FIG. 89. Organic semiconductor DFB laser diode structure. a, Schematic representation of the organic laser diodes. b, c, Laser microscope (b) and SEM images (c) at 5,000× and 200,000× (inset) magnification of a DFB SiO$_2$ grating structure prepared on top of ITO. d, Cross-section SEM images of a complete OSLD. e, Cross-section EDX images of the OSLD. To improve visibility of the low-concentration Cs, contrast was enhanced.

FIG. 90. Fabrication and structure of the OSLDs. a, Schematic of the fabrication steps for the OSLDs. b, Structure of the ITO-coated glass substrates used in this study along with the general structure of the DFB gratings. Detailed values of the different grating parameters can be found in Table 1. c, d, EDX and SEM analysis of mixed-order DFB grating prepared on top of ITO. These images confirm the possibility to achieve electrical contact with ITO.

FIG. 91. Electrical properties of electrically pumped organic semiconductor DFB laser. a, Energy level diagram of the OSLDs with highest occupied and lowest unoccupied molecular orbital levels indicated for the organic and work functions for the inorganics. b, Photomicrographs of an OSLD and a reference OLED under DC operation at 3.0 V. The lengths of the individual first- and second-order grating regions are 1.68 and 1.12 µm. c, d, Current density-voltage (J-V) characteristics (c) and r/EQE-J characteristics (d) in the OLED and OSLD under pulsed operation (pulse width of 400 ns and repetition rate of 1 kHz).

FIG. 92. Hole and electron transport in the organic layers. a, b, Architectures of the hole-only device (a) and electron-only device (b) used to evaluate the transport. c, Representative current density-voltage (J-V) characteristics in the hole-only devices (HOD) and electron-only devices (EOD) under DC operation (filled symbols) and pulse operation (empty symbols) on log and linear (inset) scales. Device area is 200×200 µm. These J-V curves indicate good transport of holes and electrons in the high voltage region in the laser diodes fabricated in this study. Current at low voltages is higher for electrons than holes because of trap limiting of the hole current.

FIG. 93. Properties of OSLDs with different DFB geometries. a, Photomicrographs of OSLDs under DC operation at 3.0 V. b, c, d, Current density-voltage (J-V) and $\eta_{EQE}$-J characteristics of the OSLDs. e, Electroluminescence intensity and FWHM as a function of J. f, Emission spectra collected in the direction normal to the substrate plane as a function of J.

FIG. 94. Direct-current characteristics and emission spectra of devices. a, b, Current density-voltage (J-V) curves (a) and $\eta_{EQE}$-J curves (b) of the OLED and OSLD measured under DC operation. c, PL spectra of a neat BSBCz film (black line) and EL spectra of the OLED (red line) and OSLD below the lasing threshold (blue line).

FIG. 95. Lasing properties of OSLDs. a, Emission spectra of an OSLD collected in the direction normal to the substrate plane for different injected current densities. b, Emission spectra near the lasing threshold. c, Output intensity and FWHM as a function of the current. d, Output power as a function of the current. The inset is a photograph of an OSLD under pulsed operation at 50 V.

FIG. 96. Characterization of the emission from OSLDs. a, Emission spectra and emission intensity (inset) of an OSLD measured at different polarization angles. Here, 0° corresponds to the direction parallel to the grooves of the DFB grating. b, CCD camera images showing the spatial Gaussian profiles of the emission beam from an OSLD at different current densities.

FIG. 97. Characteristics of OSLD under optical pumping. a, Microscope image of the DFB grating used for optically pumped measurements. The same layers as for the other OSLDs (see FIG. 89a) were deposited on the grating before measurement. b, Emission spectra collected in the direction normal to the substrate plane for OSLD-6 under optical pumping with different photoexcitation densities. The geometry of OSLD-6 is given in Table 1. c, Output intensity and FWHM of OSLD-6 as a function of the photoexcitation density. Excitation was for 3.0 ns by a N$_2$ laser at 337 nm, and the device was at ambient temperature.

FIG. 98. Absorption spectra of the radical cations and anions of BSBCz. To investigate the spectral overlap between the components, the absorption spectra of neat films of BSBCz (50 nm) and composite films BSBCz:MoO$_3$ and BSBCz:Cs, (1:1 mol ratio, 50 nm) were measured. The differential absorption spectra for BSBCz cations and anions were calculated by subtracting the absorption spectra of the neat films from those of the MoO$_3$-doped and Cs-doped films, respectively. The ultraviolet/visible/near-infrared absorption spectra of the neat and composite films were measured using an absorption spectrometer (Lamda 950, PerkinElmer). The steady-state PL spectrum of a BSBCz neat film and a representative laser emission spectrum from a BSBCz DFB laser under optical pumping are also displayed to show that polaron absorption in BSBCz OSLDs should be negligible.

FIG. 99. Optical and electrical simulations. a, Experimental (symbol) and simulated (solid line) J-V curves for hole-only device (blue circles), electron-only device (red squares), and bipolar device (black triangles). Model parameters were extracted by fitting to the unipolar devices from FIG. 92, and those parameters were used for simulating the bipolar device. b, Comparison of mobilities calculated using the parameters extracted from the unipolar devices (solid lines) with reported[41] mobilities (symbols) for holes (blue) and electrons (red) in BSBCz. c, Experimental (symbols) and simulated (solid line) J-V curves for the OSLD. d, Schematic of the OSLD structure used for the calculations. e, Spatial distribution of the recombination rate profile, R, for the OSLD at J=500 mA cm$^{-2}$. f, Cross section through (e) at y=0.11 µm for the DFB device. g, Average exciton density as a function of the current density for the OSLD and OLED.

FIG. 100. Simulations of the OSLD. a, Spatial distribution of the exciton density, S. b, Electric field distribution of the passive DFB resonant cavity at the resonant wavelength $\lambda_0$=483 nm for a structure extended to include first-order regions. c, Modal gain as a function of current density. d, Spatial overlap between the exciton density S(x, y) and the optical mode |E(x, y)|$^2$ for one period in the second-order region at J=500 A cm$^{-2}$. Layers other than the grating were modeled as being flat (see FIG. 99$d$), and y=0 corresponds to the BSBCz/MoO$_3$ interface.

The invention claimed is:

1. A method for simulation modeling of an organic laser device having an organic optical gain layer, comprising at least one of (1) to (4) below:
    (1) calculating charge carrier mobility and charge carrier recombination rate in the device to perform electrical simulation;
    (2) solving Helmholtz equation to determine an optical propagation mode in the device to perform optical simulation;
    (3) calculating a temperature distribution in the device caused by heat conduction from a laser beam spot irradiated on the organic optical gain layer to perform temperature simulation and estimate an operation stability; and
    (4) calculating a rate equation comprising gain, exciton radiative decay constant $k_r$ and exciton non-radiative decay constant $k_{nr}$ to estimate laser characteristics.

2. The method according to claim 1, comprising (3).

3. The method according to claim 2, further comprising at least one of (1), (2) and (4).

4. The method according to claim 1, comprising (1), (2), (3) and (4).

5. The method according to claim 1, wherein the organic laser device is a current excitation type organic semiconductor laser device.

6. The simulation modeling method according to claim 1, wherein the organic laser device is an optically pumped organic laser device.

7. A computer-readable recording medium which records a program for making a computer perform the method according to claim 1.

8. The computer-readable recording medium according to claim 7, which further records a program for making the computer output at least one of a current density-voltage curve, electric field distribution, charge carrier density, exciton density, eigenmodes of an optical cavity structure, Q-factor and confinement factor of the optical cavity structure, and gain.

* * * * *